United States Patent
Ohsawa et al.

(10) Patent No.: US 12,545,834 B2
(45) Date of Patent: Feb. 10, 2026

(54) LIGHT-EMITTING DEVICE, DISPLAY DEVICE, ELECTRONIC DEVICE, ORGANIC COMPOUND, AND LIGHTING DEVICE

(71) Applicant: SEMICONDUCTOR ENERGY LABORATORY CO., LTD., Atsugi (JP)

(72) Inventors: Nobuharu Ohsawa, Kanagawa (JP); Satoshi Seo, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 1444 days.

(21) Appl. No.: 17/257,463

(22) PCT Filed: Jul. 4, 2019

(86) PCT No.: PCT/IB2019/055705
§ 371 (c)(1),
(2) Date: Dec. 31, 2020

(87) PCT Pub. No.: WO2020/012304
PCT Pub. Date: Jan. 16, 2020

(65) Prior Publication Data
US 2021/0280811 A1    Sep. 9, 2021

(30) Foreign Application Priority Data

Jul. 11, 2018    (JP) .................................. 2018-131254

(51) Int. Cl.
| | |
|---|---|
| C09K 11/06 | (2006.01) |
| H10K 50/11 | (2023.01) |
| H10K 59/30 | (2023.01) |
| H10K 59/38 | (2023.01) |
| H10K 85/30 | (2023.01) |
| H10K 85/60 | (2023.01) |
| C07D 209/82 | (2006.01) |
| C07D 333/76 | (2006.01) |
| C07D 403/10 | (2006.01) |
| C07D 471/04 | (2006.01) |
| H10K 59/12 | (2023.01) |
| H10K 101/00 | (2023.01) |
| H10K 101/10 | (2023.01) |
| H10K 101/20 | (2023.01) |

(52) U.S. Cl.
CPC .............. *C09K 11/06* (2013.01); *H10K 50/11* (2023.02); *H10K 59/38* (2023.02); *H10K 85/342* (2023.02); *H10K 85/621* (2023.02); *H10K 85/654* (2023.02); *H10K 85/6572* (2023.02); *C07D 209/82* (2013.01); *C07D 333/76* (2013.01); *C07D 403/10* (2013.01); *C07D 471/04* (2013.01); *H10K 59/12* (2023.02); *H10K 2101/10* (2023.02); *H10K 2101/20* (2023.02); *H10K 2101/27* (2023.02)

(58) Field of Classification Search
CPC .... H10K 50/11; H10K 85/654; H10K 85/621; H10K 85/342; H10K 59/38; H10K 85/6572; H10K 2101/10; H10K 2101/27; H10K 59/30; H10K 59/35; H10K 50/10; C07D 209/82; C07D 333/76; C07D 403/10; C07D 471/04; C09K 11/00; C09K 11/06; C09K 11/07
See application file for complete search history.

(56) References Cited

U.S. PATENT DOCUMENTS

| | | | |
|---|---|---|---|
| 5,759,444 A | 6/1998 | Enokida. et al. | |
| 6,097,147 A | 8/2000 | Baldo et al. | |
| 6,376,107 B1 | 4/2002 | Heuer et al. | |
| 6,863,997 B2 | 3/2005 | Thompson et al. | |
| 6,869,695 B2 | 3/2005 | Thompson et al. | |
| 6,951,694 B2 | 10/2005 | Thompson et al. | |
| 7,175,922 B2 | 2/2007 | Jarikov et al. | |
| 7,183,010 B2 | 2/2007 | Jarikov | |

(Continued)

FOREIGN PATENT DOCUMENTS

| | | |
|---|---|---|
| CN | 102439749 A | 5/2012 |
| CN | 105103326 A | 11/2015 |

(Continued)

OTHER PUBLICATIONS

International Search Report (Application No. PCT/IB2019/055705) Dated Oct. 1, 2019.

(Continued)

*Primary Examiner* — Haidung D Nguyen
(74) *Attorney, Agent, or Firm* — Fish & Richardson P.C.

(57) ABSTRACT

A multicolor light-emitting device having high luminous efficiency is provided. The light-emitting device contains a material serving as an energy donor, a fluorescent material, and a phosphorescent material in a light-emitting layer. The material serving as an energy donor has a function of converting triplet excitation energy into light emission. The molecular structure of the fluorescent material includes a luminophore and protecting groups, and five or more protecting groups are contained in one molecule of a guest material. Introduction of protecting groups into molecules inhibits triplet excitation energy transfer from the material serving as an energy donor to the light-emitting material by the Dexter mechanism. Each of the protecting groups is an alkyl group or a branched-chain alkyl group. In the light-emitting device, light emission is obtained from both the fluorescent material and the phosphorescent material.

17 Claims, 27 Drawing Sheets

(56) References Cited

U.S. PATENT DOCUMENTS

| | | |
|---|---|---|
| 7,332,857 B2 | 2/2008 | Seo et al. |
| 7,553,557 B2 | 6/2009 | Thompson et al. |
| 7,572,522 B2 | 8/2009 | Seo et al. |
| 7,597,967 B2 | 10/2009 | Kondakova et al. |
| 7,816,017 B2 | 10/2010 | Funahashi et al. |
| 7,943,925 B2 | 5/2011 | Yamazaki |
| 7,993,760 B2 | 8/2011 | Komori et al. |
| 8,034,465 B2 | 10/2011 | Liao et al. |
| 8,058,478 B2 | 11/2011 | Funahashi et al. |
| 8,247,086 B2 | 8/2012 | Inoue et al. |
| 8,274,214 B2 | 9/2012 | Ikeda et al. |
| 8,729,310 B2 | 5/2014 | Osaka et al. |
| 8,766,249 B2 | 7/2014 | Sawada. et al. |
| 8,803,134 B2 | 8/2014 | Inoue et al. |
| 8,853,680 B2 | 10/2014 | Yamazaki et al. |
| 8,963,127 B2 | 2/2015 | Pieh et al. |
| 8,981,355 B2 | 3/2015 | Seo |
| 8,993,129 B2 | 3/2015 | Endo et al. |
| 8,994,263 B2 | 3/2015 | Shitagaki et al. |
| 9,054,317 B2 | 6/2015 | Monkman et al. |
| 9,159,942 B2 | 10/2015 | Seo et al. |
| 9,175,213 B2 | 11/2015 | Seo et al. |
| 9,356,250 B2 | 5/2016 | Ohsawa et al. |
| 9,362,517 B2 | 6/2016 | Ohsawa et al. |
| 9,515,279 B2 | 12/2016 | Ishisone et al. |
| 9,604,928 B2 | 3/2017 | Shitagaki et al. |
| 9,634,279 B2 | 4/2017 | Seo et al. |
| 10,910,565 B2 | 2/2021 | Ogiwara et al. |
| 11,302,882 B2 | 4/2022 | Tabata et al. |
| 2003/0175553 A1 | 9/2003 | Thompson et al. |
| 2004/0253478 A1 | 12/2004 | Thompson et al. |
| 2005/0048310 A1 | 3/2005 | Cocchi et al. |
| 2005/0221116 A1 | 10/2005 | Cocchi et al. |
| 2006/0134464 A1 | 6/2006 | Nariyuki |
| 2006/0186376 A1 | 8/2006 | Yamamoto et al. |
| 2006/0202190 A1 | 9/2006 | Funahashi |
| 2006/0210830 A1 | 9/2006 | Funahashi et al. |
| 2006/0228577 A1 | 10/2006 | Nagara |
| 2007/0007884 A1 | 1/2007 | Iwanaga et al. |
| 2007/0090756 A1 | 4/2007 | Okada et al. |
| 2007/0244320 A1 | 10/2007 | Inoue et al. |
| 2007/0252511 A1 | 11/2007 | Funahashi |
| 2008/0160345 A1 | 7/2008 | Inoue et al. |
| 2008/0286604 A1 | 11/2008 | Inoue et al. |
| 2009/0166563 A1 | 7/2009 | Yokoyama et al. |
| 2010/0052527 A1 | 3/2010 | Ikeda et al. |
| 2010/0145044 A1 | 6/2010 | Inoue et al. |
| 2010/0301318 A1 | 12/2010 | Kuma et al. |
| 2010/0314644 A1 | 12/2010 | Nishimura et al. |
| 2011/0001146 A1 | 1/2011 | Yamazaki et al. |
| 2011/0127503 A1* | 6/2011 | Takahashi .............. C09B 57/00 252/301.16 |
| 2011/0210316 A1 | 9/2011 | Kadoma et al. |
| 2011/0215714 A1 | 9/2011 | Seo et al. |
| 2012/0098417 A1 | 4/2012 | Inoue et al. |
| 2012/0205632 A1 | 8/2012 | Shitagaki et al. |
| 2012/0205687 A1 | 8/2012 | Yamazaki et al. |
| 2012/0206035 A1 | 8/2012 | Shitagaki et al. |
| 2012/0217486 A1 | 8/2012 | Takemura. et al. |
| 2012/0217487 A1 | 8/2012 | Yamazaki et al. |
| 2012/0235127 A1 | 9/2012 | Takasu et al. |
| 2012/0242219 A1 | 9/2012 | Seo et al. |
| 2012/0248421 A1 | 10/2012 | Yamazaki et al. |
| 2012/0248968 A1 | 10/2012 | Ogiwara et al. |
| 2012/0256535 A1 | 10/2012 | Seo et al. |
| 2012/0263648 A1 | 10/2012 | Shapiro et al. |
| 2013/0048964 A1 | 2/2013 | Takeda et al. |
| 2013/0049579 A1 | 2/2013 | Kaiser et al. |
| 2013/0056720 A1 | 3/2013 | Kim et al. |
| 2013/0207088 A1 | 8/2013 | Seo |
| 2013/0270531 A1 | 10/2013 | Seo et al. |
| 2013/0277653 A1 | 10/2013 | Osaka et al. |
| 2013/0277655 A1 | 10/2013 | Seo et al. |
| 2013/0277656 A1 | 10/2013 | Seo et al. |
| 2013/0292656 A1 | 11/2013 | Seo et al. |
| 2013/0306945 A1 | 11/2013 | Seo |
| 2014/0014930 A1 | 1/2014 | Hirose et al. |
| 2014/0034925 A1 | 2/2014 | Osaka et al. |
| 2014/0034926 A1 | 2/2014 | Matsubara et al. |
| 2014/0034927 A1 | 2/2014 | Seo et al. |
| 2014/0034930 A1 | 2/2014 | Seo et al. |
| 2014/0034931 A1 | 2/2014 | Inoue et al. |
| 2014/0034932 A1 | 2/2014 | Seo et al. |
| 2014/0048784 A1 | 2/2014 | Inoue. et al. |
| 2014/0061604 A1 | 3/2014 | Seo et al. |
| 2014/0103329 A1 | 4/2014 | Ogiwara et al. |
| 2014/0336379 A1 | 11/2014 | Adachi et al. |
| 2015/0069352 A1 | 3/2015 | Kim et al. |
| 2016/0028022 A1 | 1/2016 | Seo et al. |
| 2016/0056401 A1 | 2/2016 | Lee et al. |
| 2016/0064684 A1 | 3/2016 | Seo et al. |
| 2016/0093823 A1 | 3/2016 | Seo et al. |
| 2016/0104847 A1 | 4/2016 | Xia et al. |
| 2016/0104855 A1 | 4/2016 | Ohsawa et al. |
| 2016/0172601 A1 | 6/2016 | Kawamura et al. |
| 2016/0172602 A1 | 6/2016 | Ogiwara et al. |
| 2016/0172605 A1 | 6/2016 | Seo et al. |
| 2016/0190500 A1 | 6/2016 | Watabe et al. |
| 2016/0248031 A1 | 8/2016 | Seo |
| 2016/0248032 A1 | 8/2016 | Seo et al. |
| 2016/0268513 A1 | 9/2016 | Ishisone et al. |
| 2016/0268534 A1 | 9/2016 | Hosoumi et al. |
| 2016/0301014 A1 | 10/2016 | Kawamura et al. |
| 2016/0315274 A1 | 10/2016 | Lennartz et al. |
| 2016/0343949 A1 | 11/2016 | Seo et al. |
| 2016/0343954 A1 | 11/2016 | Seo et al. |
| 2016/0351833 A1 | 12/2016 | Hosoumi et al. |
| 2017/0012207 A1 | 1/2017 | Seo et al. |
| 2017/0062731 A1 | 3/2017 | Ogiwara et al. |
| 2017/0133617 A1 | 5/2017 | Seo et al. |
| 2017/0271610 A1 | 9/2017 | Takahashi |
| 2017/0324054 A1 | 11/2017 | Ishisone et al. |
| 2017/0324055 A1 | 11/2017 | Ishisone et al. |
| 2019/0040314 A1 | 2/2019 | Ito et al. |
| 2019/0140027 A1 | 5/2019 | Ishisone et al. |
| 2019/0173038 A1 | 6/2019 | Seo et al. |
| 2019/0280236 A1* | 9/2019 | Tabata .................. H10K 71/00 |
| 2020/0388781 A1 | 12/2020 | Tabata et al. |
| 2021/0043840 A1 | 2/2021 | Seo et al. |
| 2021/0057667 A1 | 2/2021 | Ohsawa et al. |
| 2021/0104680 A1 | 4/2021 | Ogiwara et al. |
| 2022/0199934 A1 | 6/2022 | Tabata et al. |

FOREIGN PATENT DOCUMENTS

| | | |
|---|---|---|
| CN | 105514288 A | 4/2016 |
| DE | 112019002407 | 1/2021 |
| EP | 1202608 A | 5/2002 |
| EP | 1860096 A | 11/2007 |
| EP | 2442379 A | 4/2012 |
| EP | 2958158 A | 12/2015 |
| JP | 2686418 | 12/1997 |
| JP | 2002-256168 A | 9/2002 |
| JP | 2005-514754 | 5/2005 |
| JP | 2008-288344 A | 11/2008 |
| JP | 4188369 | 11/2008 |
| JP | 4188401 | 11/2008 |
| JP | 2011-213643 A | 10/2011 |
| JP | 2014-045179 A | 3/2014 |
| KR | 2012-0034646 A | 4/2012 |
| KR | 2015-0120447 A | 10/2015 |
| KR | 2016-0043505 A | 4/2016 |
| TW | 201106780 | 2/2011 |
| WO | WO-2003/059015 | 7/2003 |
| WO | WO-2006/098080 | 9/2006 |
| WO | WO-2010/143434 | 12/2010 |
| WO | WO-2015/098975 | 7/2015 |
| WO | WO-2015/198988 | 12/2015 |
| WO | WO-2017/170812 | 10/2017 |
| WO | WO-2018/097153 | 5/2018 |

(56) References Cited

FOREIGN PATENT DOCUMENTS

| WO | WO-2018/186462 | 10/2018 |
|----|----------------|---------|
| WO | WO-2019/142555 | 7/2019  |

OTHER PUBLICATIONS

Written Opinion (Application No. PCT/IB2019/055705) Dated Oct. 1, 2019.

Baldo.M et al., "High-Efficiency Fluorescent Organic Light-Emitting Devices Using a Phosphorescent Sensitizer", Nature, Feb. 17, 2000, vol. 403, No. 6771, pp. 750-753.

Itano.K et al., "Exciplex formation at the organic solid-state interface: Yellow emission in organic light-emitting diodes using green-fluorescent tris(8-quinolinolato)aluminum and hole-transporting molecular materials with low ionization potentials", APPL. PHYS. LETT. (Applied Physics Letters), Feb. 9, 1998, vol. 72, No. 6, pp. 636-638.

Endo.A et al., "Efficient Up-Conversion of Triplet Excitons Into a Singlet State and Its Application for Organic Light Emitting Diodes", APPL. PHYS. LETT. (Applied Physics Letters), Feb. 24, 2011, vol. 98, No. 8, pp. 083302-1-083302-3.

Kondakova.M et al., "High-efficiency, low-voltage phosphorescent organic light-emitting diode devices with mixed host", J. APPL. PHYS. (Journal of Applied Physics), Nov. 4, 2008, vol. 104, pp. 094501-1-094501-17.

Hino.Y et al., "Red Phosphorescent Organic Light-Emitting Diodes Using Mixture System of Small-Molecule and Polymer Host", JPN. J. APPL. PHYS. (Japanese Journal of Applied Physics), Apr. 21, 2005, vol. 44, No. 4B, pp. 2790-2794.

Su.S et al., "RGB Phosphorescent Organic Light-Emitting Diodes by Using Host Materials with Heterocyclic Cores:Effect of Nitrogen Atom Orientations", CHEM. MATER. (Chemistry of Materials), 2011, vol. 23, No. 2, pp. 274-284.

Fujita.M et al., "Reduction of operating voltage in organic light-emitting diode by corrugated photonic crystal structure", APPL. PHYS. LETT. (Applied Physics Letters), Dec. 6, 2004, vol. 85, No. 23, pp. 5769-5771.

Tsuboyama.A et al., "Homoleptic Cyclometalated Iridium Complexes with Highly Efficient Red Phosphorescence and Application to Organic Light-Emitting Diode", J. AM. CHEM. SOC. (Journal of the American Chemical Society), 2003, vol. 125, No. 42, pp. 12971-12979.

Yoshida.K et al., "High efficiency reverse intersystem crossing of exciplex states", The 71st Autumn Meeting of the Japan Society of Applied Physics and Related Societies, 2010, p. 319, The Japan Society of Applied Physics.

Goushi.K et al., "Delayed fluorescence organic light-emitting diodes based on exciplex", The 59th Spring Meeting of the Japan Society of Applied Physics and Related Societies Preliminary Drafts, 2012, p. 251.

Nakagawa. T et al., "Electroluminescence based on thermally activated delayed fluorescence generated by a spirobifluorene donor-acceptor structure", Chemical Communications, Apr. 17, 2012, vol. 48, No. 77, pp. 9580-9582, RSC Publishing.

Yokoyama.D et al., "Dual efficiency enhancement by delayed fluorescence and dipole orientation in high-efficiency fluorescent organic light-emitting diodes", APPL. PHYS. LETT. (Applied Physics Letters), Sep. 22, 2011, vol. 99, No. 12, pp. 1-4, AIP Publishing.

Mehes.G et al., "Thermally Activated Delayed Fluorescence and its Application for OLED", The 2nd Phoenics International Symposium, Mar. 5, 2012.

Sajoto. T et al., "Temperature Dependence of Blue Phosphorescent Cyclometalated Ir(III) Complexes", J. AM. CHEM. SOC. (Journal of the American Chemical Society), Jun. 18, 2009, vol. 131, No. 28, pp. 9813-9822.

Gong.X et al., "Phosphorescence from iridium complexes doped into polymer blends", J. APPL. PHYS. (Journal of Applied Physics), Feb. 1, 2004, vol. 95, No. 3, pp. 948-953.

Lee.J et al., "Stabilizing the efficiency of phosphorescent organic light-emitting diodes", SPIE Newsroom, Apr. 21, 2008, pp. 1-3.

D'Andrade.B et al., "High-efficiency yellow double-doped organic light-emitting devices based on phosphor-sensitized fluorescence", APPL. PHYS. LETT. (Applied Physics Letters), Aug. 13, 2001, vol. 79, No. 7, pp. 1045-1047.

Cheng.G et al., "Improved efficiency for white organic light-emitting devices based on phosphor sensitized fluorescence", APPL. PHYS. LETT. (Applied Physics Letters), Feb. 20, 2006, vol. 88, No. 8, pp. 083512-1-083512-3.

Kanno.H et al., "White organic light-emitting device based on a compound fluorescent phosphor-sensitized-fluorescent emission layer", APPL. PHYS. LETT. (Applied Physics Letters), Oct. 2, 2006, vol. 89, No. 14, pp. 143516-1-143516-3.

Matsumoto.N et al., "Exciplex Formations between Tris(8-hydoxyquinolate)aluminum and Hole Transport Materials and Their Photoluminescence and Electroluminescence Characteristics", J. PHYS. CHEM. C (The Journal of Physical Chemistry C), May 22, 2008, vol. 112, No. 20, pp. 7735-7741.

Tokito.S et al., "Improvement in performance by doping", Organic EL Display, Aug. 20, 2004, pp. 67-99, Ohmsha.

Jeon.W et al., "Ideal host and guest system in phosphorescent OLEDs", Organic Electronics, 2009, vol. 10, pp. 240-246, Elsevier.

Rausch.A et al., "Matrix Effects on the Triplet State of the OLED Emitter Ir(4,6-dFppy)2(pic)(Flrpic): Investigations by High-Resolution Optical Spectroscopy", INORG. CHEM. (Inorganic Chemistry), 2009, vol. 48, No. 5, pp. 1928-1937.

Zhao.Q et al., "Synthesis and Photophysical, Electrochemical, and Electrophosphorescent Properties of a Series of Iridium(III) Complexes Based on Quinoline Derivatives and Different β-Diketonate Ligands", Organometallics, Jun. 14, 2006, vol. 25, No. 15, pp. 3631-3638.

Park. Y et al., "Efficient triplet harvesting by fluorescent molecules through exciplexes for high efficiency organic light-emitting diodes", APPL. PHYS. LETT. (Applied Physics Letters), Apr. 18, 2013, vol. 102, No. 15, pp. 153306-1-153306-5.

Nakanotani.H et al., "High-efficiency organic light-emitting diodes with fluorescent emitters", Nature Communications, May 30, 2014, vol. 5, pp. 4016-1-4016-7.

Noda.H et al., "Excited state engineering for efficient reverse intersystem crossing", Science Advances, Jul. 22, 2018, vol. 4, No. 6, p. 6910.

Wang.S et al., "Highly Efficient Near-Infrared Delayed Fluorescence Organic Light Emitting Diodes Using a Phenanthrene-Based Charge-Transfer Compound", ANGEW. CHEM. INT. ED. (Angewandte Chemie International Edition), Oct. 26, 2015, vol. 54, No. 44, pp. 13068-13072.

German Office Action (Application No. 112019003481.2) Dated Aug. 28, 2023.

* cited by examiner

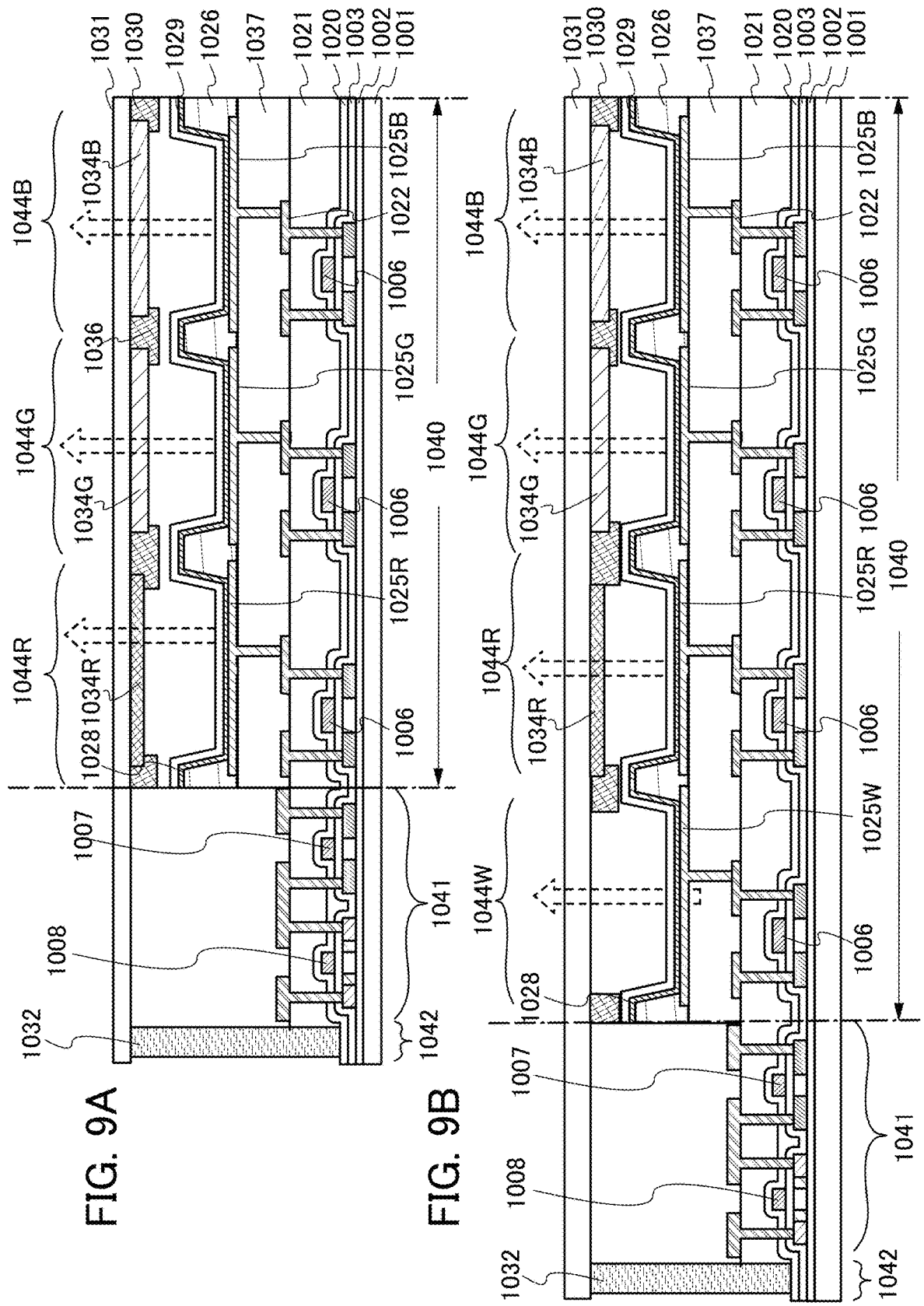

LIGHT-EMITTING DEVICE, DISPLAY DEVICE, ELECTRONIC DEVICE, ORGANIC COMPOUND, AND LIGHTING DEVICE

CROSS REFERENCE TO RELATED APPLICATIONS

This application is a U.S. National Phase Application under 35 U.S.C. § 371 of International Application PCT/IB2019/055705, filed on Jul. 4, 2019, which claims the benefit of a foreign priority application filed in Japan on Jul. 11, 2018, as Application No. 2018-131254, both of which are incorporated by reference.

TECHNICAL FIELD

Embodiments of the present invention relate to a light-emitting device, an organic compound, and a display device, an electronic device, and a lighting device each including the light-emitting device.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting apparatus, a lighting device, a power storage device, a memory device, a method for driving any of them, and a method for manufacturing any of them.

BACKGROUND ART

In recent years, research and development of light-emitting devices using electroluminescence (EL) have been actively conducted. In the basic structure of such a light-emitting device, a layer containing a light-emitting substance (EL layer) is provided between a pair of electrodes. Voltage application between the electrodes of this device can cause light emission from the light-emitting substance.

Since the above light-emitting device is a self-luminous device, a display device using this light-emitting device has advantages such as high visibility, no necessity of a backlight, and low power consumption. Furthermore, such a light-emitting device also has advantages in that the device can be formed to be thin and lightweight and has high response speed, for example.

In a light-emitting device where an EL layer containing an organic compound as a light-emitting substance is provided between a pair of electrodes (e.g., an organic EL device), by voltage application between the pair of electrodes, electrons from a cathode and holes from an anode are injected into the EL layer having a light-emitting property; thus, current flows. By recombination of the injected electrons and holes, the light-emitting organic compound is brought into an excited state to provide light emission.

Excited states that can be formed by an organic compound are a singlet excited state (S*) and a triplet excited state (T*). Light emission from the singlet excited state is referred to as fluorescence, and light emission from the triplet excited state is referred to as phosphorescence. The statistical generation ratio of S* to T* in a light-emitting device is 1:3. Thus, a light-emitting device including a compound that emits phosphorescence (phosphorescent material) has higher luminous efficiency than a light-emitting device including a compound that emits fluorescence (fluorescent material). Therefore, light-emitting devices including phosphorescent materials capable of converting triplet excitation energy into light emission have been actively developed in recent years.

Among light-emitting devices including phosphorescent materials, a light-emitting device that emits blue light in particular has not yet been put into practical use because it is difficult to develop a stable compound having a high triplet excitation energy level. For this reason, the development of a light-emitting device including a more stable fluorescent material has been conducted and a technique for increasing the luminous efficiency of a light-emitting device including a fluorescent material (fluorescent device) has been searched.

As a material capable of partly or entirely converting triplet excitation energy into light emission, a thermally activated delayed fluorescent (TADF) material is known in addition to a phosphorescent compound. In a TADF material, a singlet excited state is generated from a triplet excited state by reverse intersystem crossing, and the singlet excited state is converted into light emission.

In order to increase the luminous efficiency of a light-emitting device using a TADF material, in addition to efficient generation of a singlet excited state from a triplet excited state, efficient light emission from a singlet excited state, that is, high fluorescence quantum yield is important in a TADF material. It is, however, difficult to design a light-emitting material that meets these two.

Patent Document 1 discloses a method: in a light-emitting device including a TADF material and a fluorescent material, the singlet excitation energy of the TADF material is transferred to the fluorescent material and light emission is obtained from the fluorescent material.

REFERENCES

Patent Document

[Patent Document 1] Japanese Published Patent Application No. 2014-045179

Non-Patent Document

[Non-Patent Document 1] Hiroki Noda et al., Sci. Adv. 2018, 4, eaao6910.
[Non-Patent Document 2] S. Wang et al., Angew. Chem., Int. Ed. 2015, 54, 13068.

DISCLOSURE OF INVENTION

A multicolor light-emitting device typified by a white light-emitting device is expected to be applied to a display and the like. An example of a device structure for the multicolor light-emitting device is the structure of a light-emitting device in which a plurality of EL layers are provided with a charge-generation layer therebetween (such a light-emitting device is also referred to as a tandem device). The tandem device, which can use materials that emit light of different colors for different EL layers, is suitable for fabrication of a multicolor light-emitting device. However, the tandem device has a problem in that its many layers increase the number of manufacturing steps.

In view of the above, a light-emitting device where one EL layer emits light of a plurality of colors is needed. In order to obtain a plurality of emission colors, two or more kinds of guest materials are used in a light-emitting layer, and the development of a multicolor light-emitting device using a fluorescent material is demanded in terms of reliability.

As described above, the efficiency of a light-emitting device using a fluorescent material is increased as follows, for example: triplet excitons of a host material are converted into singlet excitons, and then, singlet excitation energy is transferred to a fluorescent material, which is a guest material. However, in the case where a fluorescent material is used as a guest material in a light-emitting layer of a light-emitting device, the lowest triplet excitation energy level (T1 level) of the fluorescent material does not contribute to light emission but might be a deactivation pathway of triplet excitation energy. Therefore, it has been difficult to increase the efficiency of a light-emitting device using a fluorescent material.

In order to increase the luminous efficiency and reliability of a light-emitting device using a fluorescent material, it is preferred that triplet excitation energy in a light-emitting layer be efficiently converted into singlet excitation energy and be efficiently transferred as singlet excitation energy to a fluorescent material. Hence, it is required to develop a method for generating a singlet excited state of a guest material from a triplet excited state of a host material to further increase the luminous efficiency and reliability of a light-emitting device.

Therefore, an object of one embodiment of the present invention is to provide a light-emitting device where one EL layer emits light of a plurality of colors. Another object of one embodiment of the present invention is to provide a light-emitting device having high luminous efficiency. Another object of one embodiment of the present invention is to provide a light-emitting device with low power consumption. Another object of one embodiment of the present invention is to provide a novel light-emitting device. Another object of one embodiment of the present invention is to provide a novel light-emitting apparatus. Another object of one embodiment of the present invention is to provide a novel display device.

Note that the descriptions of the above objects does not preclude the existence of other objects. One embodiment of the present invention does not need to achieve all the objects. Objects other than the above objects will be apparent from and can be derived from the descriptions of the specification and the like.

As described above, the development of a method for efficiently converting triplet excitation energy into light emission in a light-emitting device that emits fluorescence is required. Thus, it is necessary to increase energy transfer efficiency between materials used in a light-emitting layer. This needs inhibition of the transfer of triplet excitation energy by the Dexter mechanism between an energy donor and an energy acceptor. At the same time, the development of a light-emitting device that efficiently exhibits multicolor light emission is demanded.

One embodiment of the present invention is that in a light-emitting device including a light-emitting layer between the pair of electrodes, the light-emitting layer contains a first material capable of converting triplet excitation energy into light emission, a second material capable of converting singlet excitation energy into light emission, and a third material capable of converting triplet excitation energy into light emission; the second material contains a luminophore and five or more protecting groups; the luminophore is a condensed aromatic ring or a condensed heteroaromatic ring; the five or more protecting groups each independently have any one of an alkyl group having 1 to 10 carbon atoms, a substituted or unsubstituted cycloalkyl group having 3 to 10 carbon atoms, and a trialkylsilyl group having 3 to 12 carbon atoms; the T1 level of the first material is higher than the T1 level of the third material; and light emission is obtained from both the second material and the third material.

In the above structure, at least four of the five protecting groups are each independently any one of an alkyl group having 3 to 10 carbon atoms, a substituted or unsubstituted cycloalkyl group having 3 to 10 carbon atoms, and a trialkylsilyl group having 3 to 12 carbon atoms.

Another embodiment of the present invention is that in a light-emitting device including a light-emitting layer between the pair of electrodes, the light-emitting layer contains a first material capable of converting triplet excitation energy into light emission, a second material capable of converting singlet excitation energy into light emission, and a third material capable of converting triplet excitation energy into light emission; the second material contains a luminophore and four protecting groups; the luminophore is a condensed aromatic ring or a condensed heteroaromatic ring; the four protecting groups are not directly bonded to the condensed aromatic ring or the condensed heteroaromatic ring; the four protecting groups each independently have any one of an alkyl group having 3 to 10 carbon atoms, a substituted or unsubstituted cycloalkyl group having 3 to 10 carbon atoms, and a trialkylsilyl group having 3 to 12 carbon atoms; the T1 level of the first material is higher than the T1 level of the third material; and light emission is obtained from both the second material and the third material.

Another embodiment of the present invention is that in a light-emitting device including a light-emitting layer between the pair of electrodes, the light-emitting layer contains a first material capable of converting triplet excitation energy into light emission and a second material capable of converting singlet excitation energy into light emission; the second material contains a luminophore and two or more diarylamino groups; the luminophore is a condensed aromatic ring or a condensed heteroaromatic ring; the two or more diarylamino groups are bonded to the condensed aromatic ring or the condensed heteroaromatic ring; the two or more diarylamino groups each independently have at least one protecting group; the protecting groups each independently have any one of an alkyl group having 3 to 10 carbon atoms, a substituted or unsubstituted cycloalkyl group having 3 to 10 carbon atoms, and a trialkylsilyl group having 3 to 12 carbon atoms; and light emission is obtained from both the first material and the second material.

Another embodiment of the present invention is that in a light-emitting device including a light-emitting layer between the pair of electrodes, the light-emitting layer contains a first material capable of converting triplet excitation energy into light emission, a second material capable of converting singlet excitation energy into light emission, and a third material capable of converting triplet excitation energy into light emission; the second material contains a luminophore and two or more diarylamino groups; the luminophore is a condensed aromatic ring or a condensed heteroaromatic ring; the two or more diarylamino groups are bonded to the condensed aromatic ring or the condensed heteroaromatic ring; the two or more diarylamino groups each independently have at least two protecting groups; the protecting groups each independently have any one of an alkyl group having 3 to 10 carbon atoms, a substituted or unsubstituted cycloalkyl group having 3 to 10 carbon atoms, and a trialkylsilyl group having 3 to 12 carbon atoms; the T1 level of the first material is higher than the T1 level of the third material; and light emission is obtained from both the second material and the third material.

In the above structure, the diarylamino group is preferably a diphenylamino group.

In any of the above structures, the alkyl group is preferably a branched-chain alkyl group.

Another embodiment of the present invention is in a light-emitting device including a light-emitting layer between the pair of electrodes, the light-emitting layer contains a first material capable of converting triplet excitation energy into light emission, a second material capable of converting singlet excitation energy into light emission, and a third material capable of converting triplet excitation energy into light emission; the second material contains a luminophore and a plurality of protecting groups; the luminophore is a condensed aromatic ring or a condensed heteroaromatic ring; at least one of atoms of the plurality of protecting groups is positioned directly on one plane of the condensed aromatic ring or the condensed heteroaromatic ring and at least one of the other atoms of the plurality of protecting groups is positioned directly on the other plane of the condensed aromatic ring or the condensed heteroaromatic ring; the T1 level of the first material is higher than the T1 level of the third material; and light emission is obtained from both the second material and the third material.

Another embodiment of the present invention is that in a light-emitting device including a light-emitting layer between the pair of electrodes, the light-emitting layer contains a first material capable of converting triplet excitation energy into light emission, a second material capable of converting singlet excitation energy into light emission, and a third material capable of converting triplet excitation energy into light emission; the second material contains a luminophore and two or more diphenylamino groups; the luminophore is a condensed aromatic ring or a condensed heteroaromatic ring; the two or more diphenylamino groups are bonded to the condensed aromatic ring or the condensed heteroaromatic ring; phenyl groups in the two or more diphenylamino groups each independently have protecting groups at 3- and 5-positions; the protecting groups each independently have any one of an alkyl group having 3 to 10 carbon atoms, a substituted or unsubstituted cycloalkyl group having 3 to 10 carbon atoms, and a trialkylsilyl group having 3 to 12 carbon atoms; the T1 level of the first material is higher than the T1 level of the third material; and light emission is obtained from both the second material and the third material.

In the above structure, the alkyl group is preferably a branched-chain alkyl group.

In the above structure, the branched-chain alkyl group preferably has quaternary carbon.

In any of the above structures, the condensed aromatic ring or the condensed heteroaromatic ring preferably contains any one of naphthalene, anthracene, fluorene, chrysene, triphenylene, tetracene, pyrene, perylene, coumarin, quinacridone, and naphthobisbenzofuran.

In any of the above structures, it is preferred that the first material contain a first organic compound and a second organic compound and the first organic compound and the second organic compound form an exciplex. The first organic compound preferably emits phosphorescence.

In any of the above structures, the peak wavelength of the emission spectrum of the first material is preferably located on the shorter wavelength side than the peak wavelength of the emission spectrum of the second material.

In any of the above structures, the first material is preferably a compound that emits phosphorescence or delayed fluorescence.

In any of the above structures, the emission spectrum of the first material preferably overlaps with an absorption band on the longest wavelength side of the absorption spectrum of the second material.

In any of the above structures, the concentration of the second material is preferably higher than the concentration of the third material in the light-emitting layer.

In any of the above structures, the third material is preferably a compound that emits phosphorescence.

In any of the above structures, the peak wavelength of the emission spectrum of the second material is preferably located on the shorter wavelength side than the peak wavelength of the emission spectrum of the third material.

Another embodiment of the present invention is a display device including the light-emitting device having any of the above structures and at least one of a color filter and a transistor. Another embodiment of the present invention is an electronic device including the display device and at least one of a housing and a touch sensor. Another embodiment of the present invention is a lighting device including the light-emitting device having any of the above structures and at least one of a housing and a touch sensor. The category of one embodiment of the present invention includes not only a light-emitting apparatus including a light-emitting device but also an electronic device including a light-emitting device. Accordingly, the light-emitting device in this specification refers to an image display device or a light source (including a lighting device). The light-emitting device may include, in its category, a display module in which a connector such as a flexible printed circuit (FPC) or a tape carrier package (TCP) is connected to a light-emitting device, a display module in which a printed wiring board is provided on the tip of a TCP, or a display module in which an integrated circuit (IC) is directly mounted on a light-emitting device by a chip on glass (COG) method.

One embodiment of the present invention can provide a light-emitting device where one EL layer emits light of a plurality of colors. One embodiment of the present invention can provide a light-emitting device that has high luminous efficiency. One embodiment of the present invention can provide a light-emitting device with low power consumption. One embodiment of the present invention can provide a novel light-emitting device. One embodiment of the present invention can provide a novel light-emitting apparatus. One embodiment of the present invention can provide a novel display device.

Note that the description of these effects does not preclude the existence of other effects. Note that one embodiment of the present invention does not need to achieve all the effects. Other effects will be apparent from and can be derived from the descriptions of the specification, the drawings, the claims, and the like.

BRIEF DESCRIPTION OF DRAWINGS

FIGS. 9A and 9B are schematic cross-sectional views each illustrating a display device of one embodiment of the present invention.

BEST MODE FOR CARRYING OUT THE INVENTION

Figure 1A:
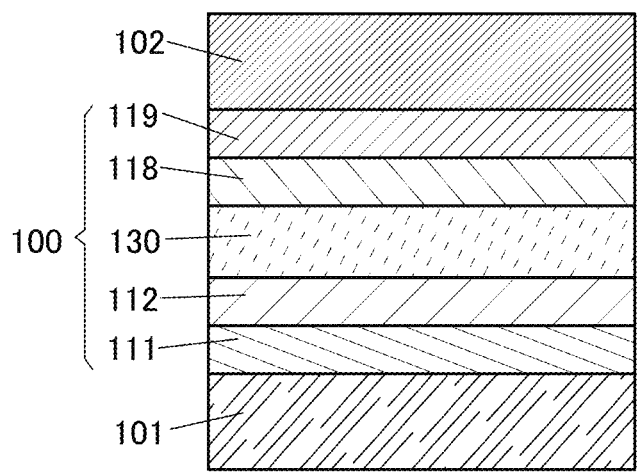
FIGS. 1A and 1B are schematic cross-sectional views of a light-emitting layer in a light-emitting device of one embodiment of the present invention.

Embodiments and Examples of the present invention will be described in detail below with reference to the drawings. Note that the present invention is not limited to the following description, and the modes and details of the present invention can be modified in various ways without departing from the spirit and scope of the present invention. Accordingly, the present invention should not be interpreted as being limited to the contents of the embodiments below.

Note that the position, size, range, or the like of each component illustrated in drawings and the like is not accurately represented in some cases for easy understanding. Therefore, the disclosed invention is not necessarily limited to the position, size, range, or the like disclosed in the drawings and the like.

Note that the ordinal numbers such as first and second in this specification and the like are used for convenience and do not denote the order of steps or the stacking order of layers in some cases. Therefore, for example, description can be made even when "first" is replaced with "second" or "third", as appropriate. In addition, the ordinal numbers in this specification and the like are not necessarily the same as those used to specify one embodiment of the present invention.

In the description of modes of the present invention in this specification and the like with reference to the drawings, the same components in different drawings are denoted by the same reference numeral in some cases.

In this specification and the like, the terms "film" and "layer" can be interchanged with each other. For example, the term "conductive layer" can be changed to the term "conductive film" in some cases. Also, for example, the term "insulating film" can be changed to the term "insulating layer" in some cases.

In this specification and the like, a singlet excited state (S*) refers to a singlet state having excitation energy. An S1 level refers to the lowest level of the singlet excitation energy level, that is, the excitation energy level of the lowest singlet excited state (S1 state). A triplet excited state (T*) refers to a triplet state having excitation energy. A T1 level refers to the lowest level of the triplet excitation energy level, that is, the excitation energy level of the lowest triplet excited state (T1 state). Note that in this specification and the like, simple expressions "singlet excited state" and "singlet excitation energy level" sometimes mean the S1 state and the S1 level, respectively. In addition, expressions "triplet excited state" and "triplet excitation energy level" sometimes mean the T1 state and the T1 level, respectively.

In this specification and the like, a fluorescent material refers to a compound that emits light in a visible light region when the relaxation from a singlet excited state to a ground state occurs. A phosphorescent material refers to a compound that emits light in a visible light region at room temperature when the relaxation from a triplet excited state to a ground state occurs. That is, a phosphorescent material refers to a compound that can convert triplet excitation energy into visible light.

Note that room temperature in this specification and the like refers to a temperature higher than or equal to 0° C. and lower than or equal to 40° C.

In this specification and the like, a blue wavelength range refers to a wavelength range of greater than or equal to 400 nm and less than 490 nm, and blue light has at least one emission spectrum peak in the wavelength range. A green wavelength range refers to a wavelength range of greater than or equal to 490 nm and less than 580 nm, and green light has at least one emission spectrum peak in the wavelength range. A red wavelength range refers to a wavelength range of greater than or equal to 580 nm and less than or equal to 680 nm, and red light has at least one emission spectrum peak in the wavelength range. In the case where two kinds of emission spectra have emission spectrum peaks in the same wavelength range and the peak wavelengths are different from each other, the two kinds of emission spectra are regarded as those of light emission of different colors in some cases. It is assumed that the emission spectrum peak includes the local maximum value or a shoulder.

Embodiment 1

In this embodiment, a light-emitting device of one embodiment of the present invention will be described below with reference to FIGS. 1A to 1C, FIGS. 2A and 2B, FIGS. 3A and 3B, FIGS. 4A to 4D, and FIGS. 5A to 5C.
<Structure Example of Light-Emitting Device>

First, the structure of the light-emitting device of one embodiment of the present invention will be described below with reference to FIGS. 1A to 1C.

FIG. 1A is a schematic cross-sectional view of a light-emitting device 150 of one embodiment of the present invention.

The light-emitting device 150 includes a pair of electrodes (an electrode 101 and an electrode 102) and an EL layer 100 between the pair of electrodes. The EL layer 100 includes at least a light-emitting layer 130.

The EL layer 100 illustrated in FIG. TA includes functional layers such as a hole-injection layer 111, a hole-transport layer 112, an electron-transport layer 118, and an electron-injection layer 119, in addition to the light-emitting layer 130.

Although description in this embodiment is given assuming that the electrode 101 and the electrode 102 of the pair of electrodes serve as an anode and a cathode, respectively, they are not limited thereto for the structure of the light-emitting device 150. That is, the electrode 101 may be a cathode, the electrode 102 may be an anode, and the stacking order of the layers between the electrodes may be reversed. In other words, the hole-injection layer 111, the hole-transport layer 112, the light-emitting layer 130, the electron-transport layer 118, and the electron-injection layer 119 may be stacked in this order from the anode side.

The structure of the EL layer 100 is not limited to the structure illustrated in FIG. TA, and a structure including at least one layer selected from the hole-injection layer 111, the hole-transport layer 112, the electron-transport layer 118, and the electron-injection layer 119 is employed. Alternatively, the EL layer 100 may include a functional layer which has a function of lowering a hole- or electron-injection barrier, improving a hole- or electron-transport property, inhibiting a hole- or electron-transport property, or inhibiting quenching by an electrode, for example. Note that the functional layer may be either a single layer or stacked layers.
<Light Emission Mechanism of Light-Emitting Device>

Next, the light emission mechanism of the light-emitting layer 130 will be described below.

In the light-emitting device 150 of one embodiment of the present invention, voltage application between a pair of electrodes (the electrodes 101 and 102) causes electrons and holes to be injected from the cathode and the anode, respectively, into the EL layer 100 and thus current flows. The ratio of singlet excitons to triplet excitons (hereinafter referred to as exciton generation probability) which are generated by the carrier (electrons and holes) recombination is approximately 1:3 according to the statistically obtained probability. In other words, the probability of generation of singlet excitons is 25%, and the probability of generation of triplet excitons is 75%; thus, making triplet excitons contribute to the light emission is important to increase the luminous efficiency of the light-emitting device. For this reason, a material that has a function of converting triplet excitation energy into light emission is preferably used in the light-emitting layer 130.

An example of a material having a function of converting triplet excitation energy into light emission is a compound that can emit phosphorescence (hereinafter, also referred to as a phosphorescent material). A phosphorescent material in this specification and the like is a compound that emits phosphorescence but does not emit fluorescence at a temperature higher than or equal to a low temperature (e.g., 77 K) and lower than or equal to room temperature (i.e., higher than or equal to 77 K and lower than or equal to 313 K). The phosphorescent material preferably contains a metal element with large spin-orbit interaction, specifically, a transition metal element. It is particularly preferred that the phosphorescent material contain a platinum group element (ruthenium (Ru), rhodium (Rh), palladium (Pd), osmium (Os), iridium (Ir), or platinum (Pt)), especially iridium, in which case the probability of direct transition between the singlet ground state and the triplet excited state can be increased.

Another example of a material having a function of converting triplet excitation energy into light emission is a TADF material. Note that a TADF material is a material having a small difference between the S1 level and the T1 level and a function of converting triplet excitation energy into singlet excitation energy by reverse intersystem crossing. Thus, a TADF material can upconvert triplet excitation energy into singlet excitation energy (i.e., reverse intersystem crossing) using a small amount of thermal energy and efficiently generate a singlet excited state. An exciplex whose excited state is formed by two kinds of substances has an extremely small difference between the S1 level and the T1 level and functions as a TADF material capable of converting triplet excitation energy into singlet excitation energy.

A phosphorescent spectrum observed at a low temperature (e.g., 10 K) is used for an index of the T1 level. When the level of energy with a wavelength of the line obtained by extrapolating a tangent to the fluorescent spectrum at a tail on the short wavelength side is the S1 level and the level of energy with a wavelength of the line obtained by extrapolating a tangent to the phosphorescent spectrum at a tail on the short wavelength side is the T1 level, the difference between the S1 level and the T1 level of the TADF material is preferably less than or equal to 0.2 eV.

An example of a material having a function of converting triplet excitation energy into light emission is a nanostructure of a transition metal compound having a perovskite structure. In particular, a nano-structure of a metal-halide perovskite material is preferably used. The nano-structure is preferably a nanoparticle or a nanorod.

Figure 1B:
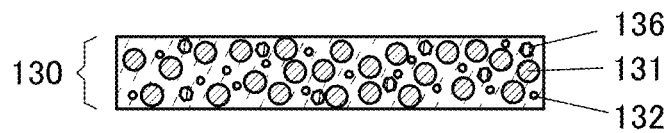

FIG. 1B is a schematic cross-sectional view illustrating the light-emitting layer 130 of the light-emitting device of one embodiment of the present invention. In one embodiment of the present invention, the light-emitting layer 130 includes a compound 131, a compound 132, and a compound 136. The compound 131 has a function of converting triplet excitation energy into light emission, the compound 132 has a function of converting singlet excitation energy into light emission, and the compound 136 has a function of converting triplet excitation energy into light emission. A fluorescent material, which has high stability, is preferably used as the compound 132 in order to obtain a light-emitting device with high reliability. The compound 131 has a function of converting triplet excitation energy into light emission; thus, it is preferred that carrier recombination occur in the compound 131 in order to obtain a light-emitting device having high luminous efficiency. Therefore, it is preferred that both the singlet excitation energy and the triplet excitation energy of excitons generated by carrier recombination in the compound 131 be finally transferred to the singlet excited state of the compound 132 and the excited state of the compound 136 (the triplet excited state when a phosphorescent material is used, or the singlet excited state when a TADF material is used), and the compound 132 and the compound 136 emit light. In the light-emitting layer 130, the compound 131 serves as an energy donor, and a compound 132 and a compound 136 each serve as an energy acceptor. In FIG. 1C, the light-emitting layer 130 is a fluorescent layer containing the compound 131 as a host material and the compound 132 and the compound 136 as guest materials. That is, in FIG. 1C, the host material serves as an energy donor, and the guest materials each serve as an energy acceptor. In addition, the light-emitting layer 130 can emit light from the compound 132 and the compound 136, which are guest materials.

<Structure Example 1 of Light-Emitting Layer>

Figure 1C:
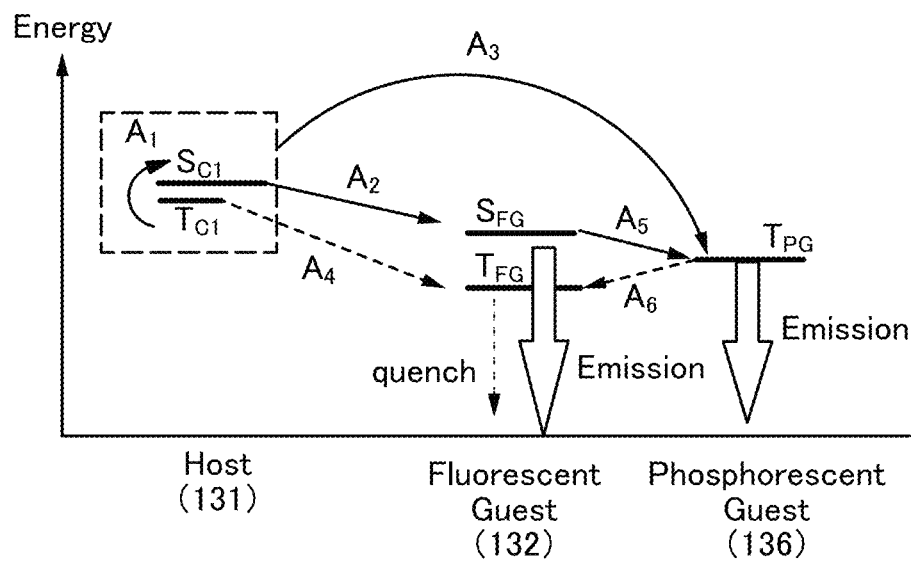
FIG. 1C shows the correlation of energy levels in the light-emitting layer of the light-emitting device of one embodiment of the present invention.

FIG. 1C shows an example of the correlation of energy levels in the light-emitting layer of the light-emitting device of one embodiment of the present invention. In this structure example, a TADF material is used as the compound 131, and a phosphorescent material is used as the compound 136.

FIG. 1C shows the correlation of the energy levels of the compounds 131, 132, and 136 in the light-emitting layer 130. The following explain what terms and signs in FIG. 1C represent:

Host (131): the compound 131;
Fluorecent Guest (132): the compound 132;
Phosphorecent Guest (136): the compound 136;
$T_{C1}$: the T1 level of the compound 131;
$S_{C1}$: the S1 level of the compound 131;
$S_{FG}$: the S1 level of the compound 132;
$T_{FG}$: the T1 level of the compound 132; and
$T_PG$: the T1 level of the compound 136.

Here, the triplet excitation energy of the compound 131 generated by current excitation is focused on. The compound 131 has a TADF property and thus has a function of converting triplet excitation energy into singlet excitation energy by upconversion (Route $A_1$ in FIG. 1C). The singlet excitation energy of the compound 131 can be rapidly transferred to the compound 132 (Route $A_2$ in FIG. 1C). At this time, $S_{C1} \geq S_{FG}$ is preferably satisfied. Specifically, when the level of energy with a wavelength of the line obtained by extrapolating a tangent to the fluorescent spectrum of the compound 131 at a tail on the short wavelength side is $S_{C1}$ and the level of energy with a wavelength of the absorption edge of the absorption spectrum of the compound 132 is $S_{FG}$, $S_{C1} \geq S_{FG}$ is preferably satisfied. Since the compound 136 is a phosphorescent material, it can receive the singlet excitation energy and the triplet excitation energy of the compound 131 (Route $A_3$ in FIG. 1C). At this time, $S_{C1} \geq T_{C1} \geq T_{PG}$ is preferably satisfied. Note that the level of energy with a wavelength of the absorption edge of the absorption spectrum of the compound 136 can be regarded as $T_{PG}$. The level of energy with a wavelength of the emission edge of the emission spectrum on the short wavelength side of the compound 131 at a low temperature (e.g., 10 K) can be regarded as $T_{C1}$.

The triplet excitation energy generated in the compound 131 is transferred to the S1 level of the compound 132, which is a guest material, through Routes $A_1$ and $A_2$ described above and the compound 132 emits light, whereby the triplet excitation energy can be converted into fluorescence; thus, the luminous efficiency of the light-emitting device can be increased. Furthermore, the compound 136 can also convert triplet excitation energy into light emission; therefore, the compound 132 and the compound 136 emit light of different emission colors from each other, whereby multicolor light emission can be efficiently obtained.

Here, in the light-emitting layer 130, the compound 131, the compound 132, and the compound 136 are mixed. Thus, a process where the triplet excitation energy of the compound 131 is converted into the triplet excitation energy of the compound 132 (Route $A_4$ in FIG. 1C) can be caused conflicting with Routes $A_1$, $A_2$, and $A_3$. The triplet excitation energy of the compound 132, which is a fluorescent material, does not contribute to light emission. That is, when the energy transfer of Route $A_4$ occurs, the luminous efficiency of the light-emitting device is decreased. Note that in practice, the energy transfer process Route $A_4$ can be, not a direct route from $T_{C1}$ to $T_{FG}$, a pathway where $T_{C1}$ is once transferred to the triplet excited state at a level higher than $T_{FG}$ of the compound 132 and then the triplet excited state is converted into $T_{FG}$ by internal conversion; the process is omitted in the drawing. The same applies to all undesired thermal deactivation processes, that is, all the deactivation processes to $T_{FG}$ in this specification.

In the case where $S_{FG}$ $T_{PG}$ is satisfied as in FIG. 1C, a process where the singlet excitation energy of the compound 132 is converted into fluorescence and a process where the singlet excitation energy of the compound 132 is transferred to $T_{PG}$ (Route $A_5$ in FIG. 1C) conflict with each other. That is, the compound 136 receives excitation energy through Routes $A_3$ and $A_5$. Therefore, in order to obtain a high proportion of light emission from both of the compounds 132 and 136, the concentration of the compound 132 in the light-emitting layer 130 is preferably higher than that of the compound 136. Furthermore, the concentration of the compound 136 in the light-emitting layer 130 is preferably low because carriers are less likely to be recombined in the compound 136.

A process where the triplet excitation energy of the compound 136 is converted into light emission and a process where the triplet excitation energy of the compound 136 is converted into the triplet excitation energy of the compound 132 (Route $A_6$ in FIG. 1C) can conflict with each other. The triplet excitation energy of the compound 132, which is a fluorescent material, does not contribute to light emission.

That is, when the energy transfer through Route $A_6$ occurs, the luminous efficiency of the light-emitting device is decreased.

Note that a compound that emits light with a shorter emission wavelength is excited with higher energy. For this reason, it is preferred that a light-emitting material with a high emission rate constant, that is, a fluorescent material is preferably used as a compound that emits light with a short wavelength, in order to achieve high reliability of the light-emitting device. In other words, light emission from the compound 132 preferably has an emission peak at a shorter wavelength than light emission from the compound 136.

As mechanisms of the intermolecular energy transfer, the Förster mechanism (dipole-dipole interaction) and the Dexter mechanism (electron exchange interaction), are known. Since the compound 132 serving as an energy acceptor is a fluorescent material, the Dexter mechanism is dominant as the mechanism of energy transfer through Route $A_4$ and energy transfer through Route $A_6$. In general, the Dexter mechanism occurs significantly when the distance between the compound 132, which is an energy acceptor, and each of the compound 131 and the compound 136, which donate energy, is less than or equal to 1 nm. Therefore, to inhibit energy transfer through Route $A_4$ and energy transfer through Route $A_6$, it is important that the energy donor and the energy acceptor be made away from each other.

Note that since the direct transition from a singlet ground state to a triplet excited state in the compound 132 is forbidden, the process of energy transfer from the singlet excitation energy level ($S_{C1}$) of the compound 131 to the triplet excitation energy level ($T_FG$) of the compound 132 is unlikely to be a main energy transfer process; thus, the energy transfer process is not illustrated in the drawing.

Note that $T_{FG}$ in FIG. 1C is the energy level derived from a luminophore of a fluorescent compound in many cases. Therefore, specifically, to inhibit the energy transfer through Route $A_4$ and the energy transfer through Route $A_6$, it is important that the energy donor and the luminophore of the fluorescent compound, which accepts energy, be made away from each other. A general method for making the energy donor and the luminophore of the fluorescent compound away from each other is to lower the concentration of the fluorescent compound in a mixed film of these compounds. However, lowering the concentration of an energy acceptor in the mixed film inhibits not only energy transfer by the Dexter mechanism from the energy donor to the fluorescent compound but also energy transfer by the Förster mechanism from the energy donor to the fluorescent compound. In that case, the luminous efficiency and reliability of the light-emitting device decline because Route $A_2$ is based on the Förster mechanism.

In view of the above, the present inventors have found that the use of a fluorescent material, as an energy acceptor, having protecting groups for keeping a distance from the energy donor can inhibit a decrease in the luminous efficiency. The present inventors have also found that the use of the fluorescent material allows both fluorescence and phosphorescence to be obtained from a light-emitting layer in which the fluorescent material and a phosphorescent material are mixed.

<Concept of Fluorescent Material Having Protecting Groups>

Figure 2A:
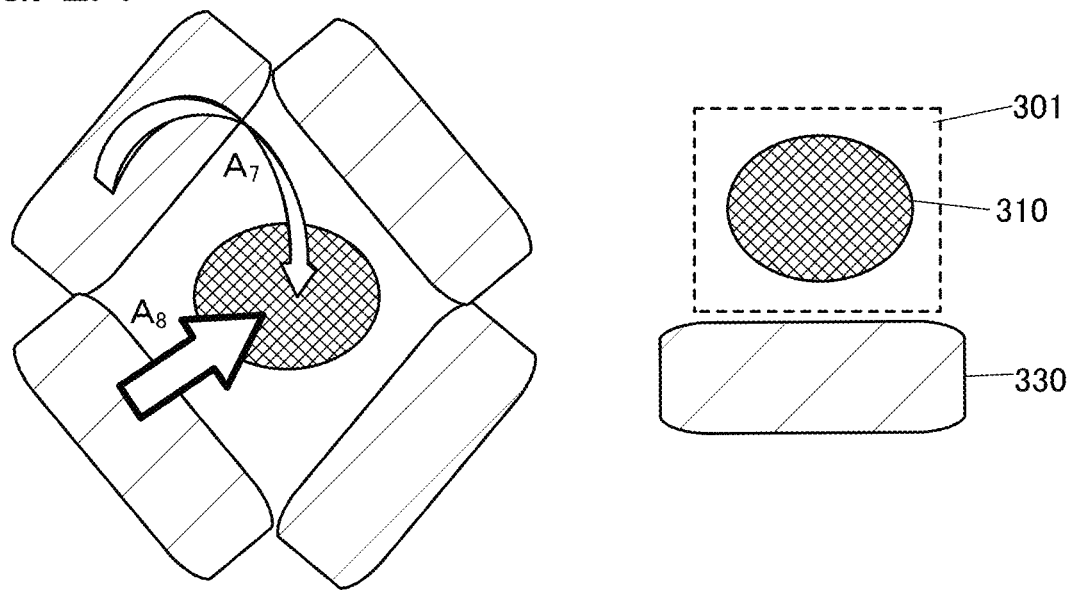
FIG. 2A is a conceptual diagram of a conventional guest material.
Figure 2B:
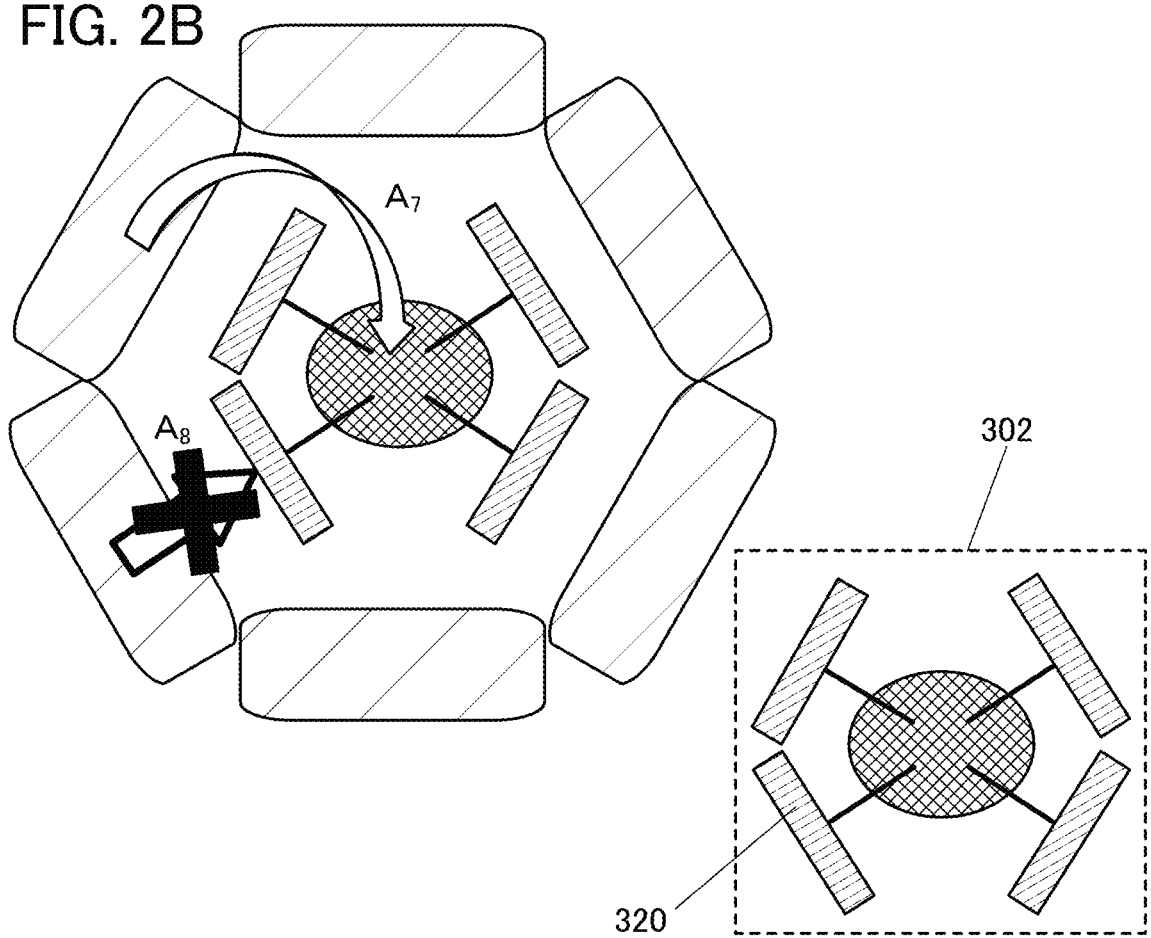
FIG. 2B is a conceptual diagram of a guest material used for a light-emitting device of one embodiment of the present invention.

FIG. 2A is a conceptual diagram illustrating the case where a typical fluorescent material having no protecting group is dispersed as a guest material to a host material. FIG. 2B is a conceptual diagram illustrating the case where the fluorescent material having protecting groups, which is used for the light-emitting device of one embodiment of the present invention, is dispersed as a guest material to a host material. The host material may be replaced with an energy donor, and the guest material may be replaced with an energy acceptor. Here, the protecting groups have a function of making a luminophore and the host material away from each other. In FIG. 2A, a guest material 301 includes a luminophore 310. The guest material 301 serves as an energy acceptor. In FIG. 2B, a guest material 302 includes the luminophore 310 and protecting groups 320. In FIGS. 2A and 2B, the guest material 301 and the guest material 302 are surrounded by host materials 330. Since the luminophore is close to the host materials in FIG. 2A, both energy transfer by the Förster mechanism (Route $A_7$ in FIGS. 2A and 2B) and energy transfer by the Dexter mechanism (Route $A_8$ in FIGS. 2A and 2B) can occur as the energy transfer from the host materials 330 to the guest material 301. When the guest material is a fluorescent material, the triplet excitation energy transfer from the host material to the guest material is caused by the Dexter mechanism, and the triplet excited state of the guest material is generated, non-radiative decay of the triplet excitation energy is caused, contributing to a reduction in the luminous efficiency of the light-emitting device.

In contrast, the guest material 302 in FIG. 2B includes the protecting groups 320. Thus, the luminophore 310 and each of the host materials 330 can be kept away from each other. This helps inhibit energy transfer by the Dexter mechanism (Route $A_8$). Therefore, the use of a fluorescent material having protecting groups, like the guest material 302, for the light-emitting layer 130 in FIGS. 1A and 1B can inhibit the energy transfer through Route $A_4$ and the energy transfer through Route $A_6$ in FIG. 1C.

Here, in order that the guest material 302 emits light, the guest material 302 needs to receive energy from the host materials 330 by the Förster mechanism because the Dexter mechanism is inhibited. In other words, it is preferred that energy transfer by the Förster mechanism be efficiently utilized while energy transfer by the Dexter mechanism is inhibited. It is known that energy transfer by the Förster mechanism is also affected by the distance between a host material and a guest material. In general, the Dexter mechanism is dominant when the distance between the host material 330 and the guest material 302 is less than or equal to 1 nm, and the Förster mechanism is dominant when the distance therebetween is greater than or equal to 1 nm and less than or equal to 10 nm. In addition, energy transfer is generally less likely to occur when the distance between the host material 330 and the guest material 302 is greater than or equal to 10 nm. Note that the distance between the host material 330 and the guest material 302 can be rephrased as the distance between the host material 330 and the luminophore 310.

Thus, the protecting groups 320 preferably extend within a range from 1 nm to 10 nm, more preferably from 1 nm to 5 nm, from the luminophore 310. With such a structure, energy transfer from the host material 330 to the guest material 302 by the Förster mechanism can be efficiently utilized while energy transfer by the Dexter mechanism is inhibited. Thus, the light-emitting device can have high luminous efficiency.

Furthermore, in order to increase the efficiency of energy transfer (energy transfer rate) by the Förster mechanism, the concentration of the guest material 301 or the guest material 302 with respect to the host material 330 is preferably increased. However, as the concentration of the guest material is increased, the rate of energy transfer by the Dexter mechanism is usually increased, resulting in a decrease in luminous efficiency. It is thus difficult to increase the concentration of the guest material. As a fluorescent device using a material having a function of converting triplet excitation energy into light emission as a host material, a light-emitting device having a small guest material concentration of lower than or equal to 1 wt % has been reported.

In contrast, in the light-emitting device of one embodiment of the present invention, a fluorescent material in which a luminophore has protecting groups is used for a light-emitting layer. Therefore, energy transfer by the Förster mechanism can be efficiently utilized while inhibiting energy transfer by the Dexter mechanism; thus, the concentration of the fluorescent material, which is an energy acceptor, can be increased. As a result, an originally conflicting phenomenon in which the rate of energy transfer by the Förster mechanism is increased while energy transfer by the Dexter mechanism is inhibited can be caused. The concentration of the fluorescent material with respect to the host material is preferably higher than or equal to 1 wt % and lower than or equal to 30 wt %, more preferably higher than or equal to 5 wt % and lower than or equal to 20 wt %, still more preferably higher than or equal to 5 wt % and lower than or equal to 15 wt %. With such a structure, the rate of energy transfer by the Förster mechanism can be increased; thus, a light-emitting device having high luminous efficiency can be obtained. In addition, the use of a material having a function of converting triplet excitation energy into light emission as a host material allows fabrication of a fluorescent device having luminous efficiency as high as that of a phosphorescent device. Since the luminous efficiency can be increased using a fluorescent material having high stability, a light-emitting device with high reliability can be fabricated. The light-emitting device of one embodiment of the present invention also includes a phosphorescent material. Accordingly, both fluorescence and phosphorescence can be obtained with high luminous efficiency.

In particular, the effect of the light-emitting device of one embodiment of the present invention is not only an increase in reliability owing to the use of a fluorescent material with high stability. The energy transfer described above always conflicts with a quenching process due to the influence of a depleted material and an impurity. As the quenching rate constant of the quenching process increases over time, the proportion of light emission from the light-emitting device decreases. That is, the luminance of the light-emitting device deteriorates. However, as described above, the rate of energy transfer by the Förster mechanism can be increased compared with a conventional light-emitting device while the energy transfer by the Dexter mechanism is inhibited in one embodiment of the present invention; thus, the influence of conflict with the quenching process can be reduced, so that the lifetime of the device can be increased.

Here, the luminophore refers to an atomic group (skeleton) that causes light emission in a fluorescent material. The luminophore generally has a π bond and preferably contains an aromatic ring, more preferably a condensed aromatic ring or a condensed heteroaromatic ring. As another embodiment, the luminophore can be regarded as an atomic group (skeleton) containing an aromatic ring having a transition dipole vector on a ring plane.

Examples of a condensed aromatic ring or a condensed heteroaromatic ring include a phenanthrene skeleton, a stilbene skeleton, an acridone skeleton, a phenoxazine skeleton, and a phenothiazine skeleton. Specifically, a fluorescent material having any of a naphthalene skeleton, an anthracene skeleton, a fluorene skeleton, a chrysene skeleton, a triphenylene skeleton, a tetracene skeleton, a pyrene skeleton, a perylene skeleton, a coumarin skeleton, a quinacridone skeleton, and a naphthobisbenzofuran skeleton is preferred because of its high fluorescence quantum yield.

The protecting groups need to have a triplet excitation energy level higher than the T1 levels of the luminophore and the host material. Thus, a saturated hydrocarbon group is preferably used. That is because a substituent having no π bond has a high triplet excitation energy level. In addition, a substituent having no π bond does not have a function of transporting carriers (electrons or holes). Thus, a saturated hydrocarbon group can make the luminophore and the host material away from each other with substantially no influence on the excited state or the carrier-transport property of the host material. In an organic compound including a substituent having no π bond and a substituent having a π-conjugated system, frontier orbitals (the highest occupied molecular orbital (HOMO) and the lowest unoccupied molecular orbital (LUMO)) are present on the side of the substituent having a π-conjugated system in many cases; in particular, the luminophore tends to have frontier orbitals. As will be described later, the overlap of the HOMOs of the energy donor and the energy acceptor and the overlap of the LUMOs of the energy donor and the energy acceptor are important for energy transfer by the Dexter mechanism. Therefore, the use of saturated hydrocarbon groups as the protecting groups enables a large distance between the frontier orbitals of the host material, which serves as an energy donor, and the frontier orbitals of the guest material, which serves as an energy acceptor, and thus, energy transfer by the Dexter mechanism can be inhibited.

A specific example of the protecting group is an alkyl group having 1 to 10 carbon atoms. In addition, the protecting group is preferably a bulky substituent because it needs to make the luminophore and the host material away from each other. Thus, an alkyl group having 3 to 10 carbon atoms, a substituted or unsubstituted cycloalkyl group having 3 to 10 carbon atoms, or a trialkylsilyl group having 3 to 10 carbon atoms can favorably be used. In particular, the alkyl group is preferably a bulky branched-chain alkyl group. Furthermore, it is particularly preferred that the substituent have quinternary carbon to be bulky.

One luminophore preferably has five or more protecting groups. With such a structure, the luminophore can be entirely covered with the protecting groups, so that the distance between the host material and the luminophore can be appropriately adjusted. In FIG. 2B, the protecting groups are directly bonded to the luminophore; however, the protecting groups are preferably not directly bonded to the luminophore. For example, the protecting groups may each be bonded to the luminophore via a substituent with a valence of 2 or more, such as an arylene group or an amino group. Bonding of each of the protecting groups to the luminophore via the substituent can effectively make the luminophore away from the host material. Thus, in the case where the protecting groups are not directly bonded to the luminophore, four or more protecting groups for one luminophore help effectively inhibit energy transfer by the Dexter mechanism.

Furthermore, the substituent with a valence of 2 or more that bonds the luminophore and each of the protecting groups is preferably a substituent having a π-conjugated system. With such a structure, the physical properties of the guest material, such as the emission color, the HOMO level, and the glass transition point, can be adjusted. Note that the protecting groups are preferably positioned on the outermost side when the molecular structure is seen around the luminophore.

<Examples of Fluorescent Material Having Protecting Groups and its Molecular Structure>

The structure of N,N-[(2-tert-butylanthracene)-9,10-diyl]-N,N-bis(3,5-di-tert-butylphenyl)amine (abbreviation: 2tBu-mmtBuDPhA2Anth), a fluorescent material that is represented by Structural Formula (102) and can be used for the light-emitting device of one embodiment of the present invention, is shown. In 2tBu-mmtBuDPhA2Anth, an anthracene ring is a luminophore and tertiary butyl (tBu) groups serve as protecting groups.

[Chemical formula 1]

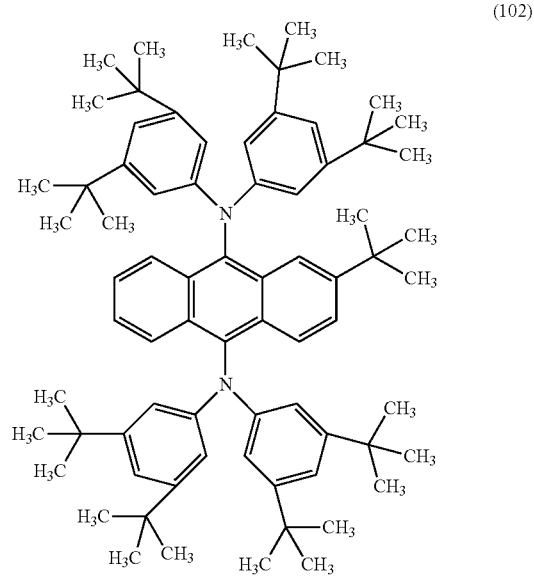

(102)

Figure 3A:
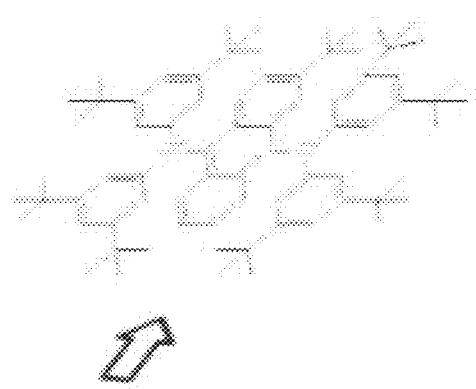
FIG. 3A shows the structural formula of a guest material used for a light-emitting device of one embodiment of the present invention.
Figure 3B:
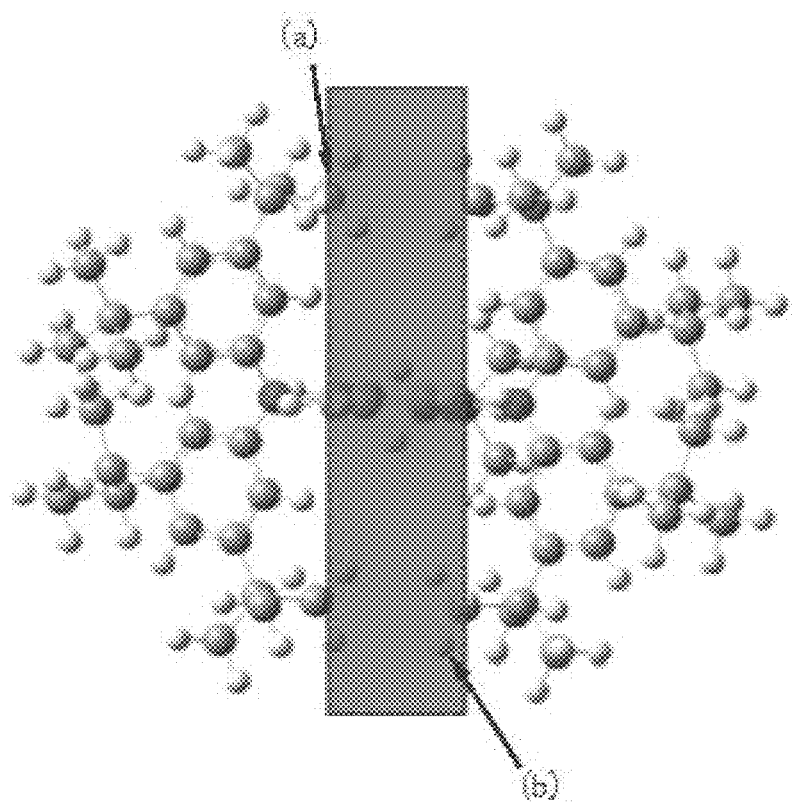
FIG. 3B shows a ball-and-stick image of a guest material used for a light-emitting device of one embodiment of the present invention.

FIG. 3B shows a ball-and-stick model image of 2tBu-mmtBuDPhA2Anth. Note that FIG. 3B shows the state where 2tBu-mmtBuDPhA2Anth is seen from the direction of the arrow in FIG. 3A (the direction parallel to the anthracene ring plane). The hatched portion in FIG. 3B represents an overhead portion of the plane of the anthracene ring, which is a luminophore, and the overhead portion includes a region overlapping with tBu groups, which are protecting groups. For example, in FIG. 3B, an atom denoted by the arrow (a) is a carbon atom of the tBu group overlapping with the hatched portion, and an atom denoted by the arrow (b) is a hydrogen atom of the tBu group overlapping with the hatched portion. That is, in 2tBu-mmtBuDPhA2Anth, atoms included in protecting groups are positioned directly on one plane of the luminophore, and atoms included in protecting groups are also positioned directly on the other plane. With such a structure, even in the state where a guest material is dispersed into a host material, the anthracene ring, which is a luminophore, and the host material can be away from each other in the horizontal direction and the vertical direction of the anthracene ring, leading to inhibition of energy transfer by the Dexter mechanism.

In addition, for example, when the transition related to energy transfer is transition between HOMO and LUMO, the overlap of the HOMOs of the host material and the guest material and the overlap of LUMOs thereof are important for energy transfer by the Dexter mechanism. The overlap of the HOMOs of both of the materials and the overlap of LUMOs thereof significantly cause the Dexter mechanism. Therefore, it is important to prevent the overlap of the HOMOs of both of the materials and the overlap of LUMOs thereof to inhibit the Dexter mechanism. That is, it is important that the distance between the skeleton related to the excited state and the host material be large. In a fluorescent material, both HOMO and LUMO are included in the luminophore in many cases. For example, in the case where the HOMO and LUMO of a guest material extend above and below the luminophore plane (above and below the anthracene ring in 2tBu-mmtBuDPhA2Anth), it is important that the upper and lower planes of the luminophore be covered with protecting groups.

A condensed aromatic ring and a condensed heteroaromatic ring serving as a luminophore, such as a pyrene ring and an anthracene ring, have a transition dipole vector on the ring plane. Thus, in FIG. 3B, 2tBu-mmtBuDPhA2Anth preferably include a region overlapping with a tBu group, which is a protecting group, on a plane where a transition dipole vector is present, that is, directly on the plane of the anthracene ring. Specifically, at least one of atoms of a plurality of protecting groups (tBu groups in FIG. 3B) is positioned directly on one plane of a condensed aromatic ring or a condensed heteroaromatic ring (an anthracene ring in FIG. 3B), and at least one of atoms of the plurality of protecting groups is positioned directly on the other plane of the condensed aromatic ring or the condensed heteroaromatic ring. With such a structure, even in the state where a guest material is dispersed in a host material, the luminophore and the host material can be away from each other, leading to inhibition of energy transfer by the Dexter mechanism. Furthermore, tBu groups are preferably positioned to cover a luminophore such as an anthracene ring.

<Structure Example 2 of Light-Emitting Layer>

Figure 4A:
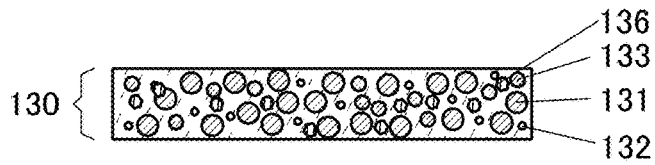
FIG. 4A is a schematic cross-sectional view of a light-emitting layer in a light-emitting device of one embodiment of the present invention, and FIGS. 4B to 4D each show the correlation of energy levels in a light-emitting layer of a light-emitting device of one embodiment of the present invention.
Figure 4B:
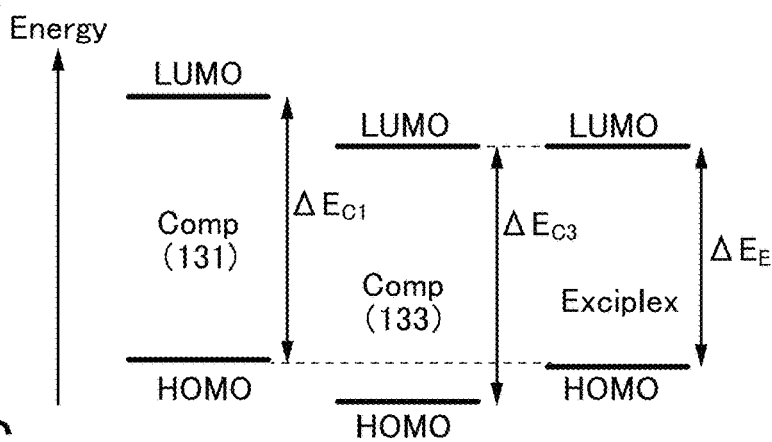
Figure 4C:
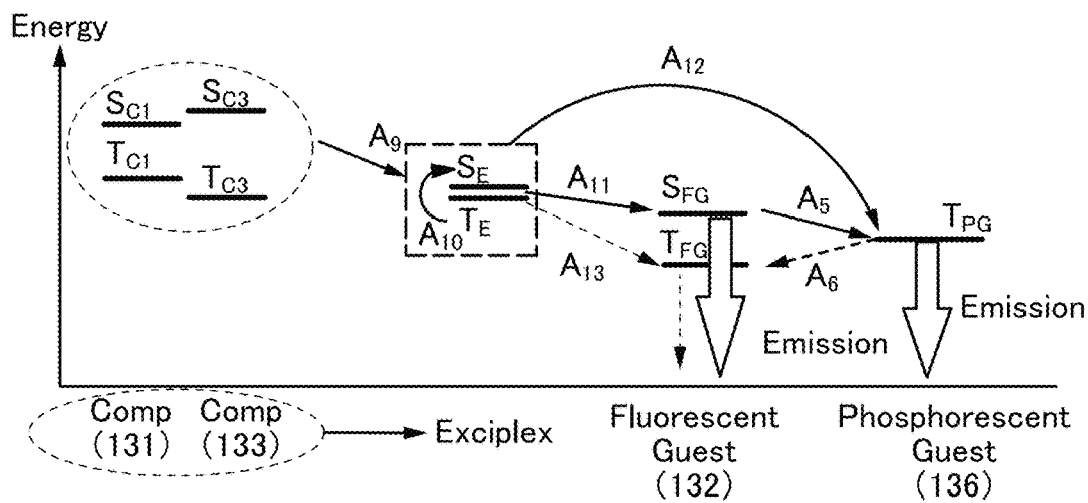

FIG. 4C shows an example of the correlation of energy levels in the light-emitting layer 130 of the light-emitting device 150 of one embodiment of the present invention. The light-emitting layer 130 illustrated in FIG. 4A contains the compound 131, the compound 132, the compound 136, and a compound 133. In one embodiment of the present invention, it is preferred that the compound 132 be a fluorescent material and the compound 136 be a phosphorescent material. In this structure example, the compounds 131 and 133 form an exciplex in combination.

Although any combination of the compound 131 and the compound 133 that can form an exciplex is acceptable, it is preferred that one of them be a compound having a hole-transport property and the other be a compound having an electron-transport property. In that case, a donor-acceptor exciplex is easily formed; thus, efficient formation of an exciplex is possible. When the compounds 131 and 133 are a combination of a compound having a hole-transport property and a compound having an electron-transport property, the carrier balance can be easily controlled depending on the mixing ratio. Specifically, the weight ratio of the compound having a hole-transport property to the compound having an electron-transport property is preferably within a range of 1:9 to 9:1. Since the carrier balance can be easily controlled with the above composition, a carrier recombination region can also be controlled easily.

For the combination of host materials for forming an exciplex efficiently, it is preferred that the HOMO level of one of the compounds 131 and 133 be higher than that of the other compound and the LUMO level of the one of the compounds be higher than that of the other compound. Note that the HOMO level of the compound 131 may be equivalent to that of the compound 133, or the LUMO level of the compound 131 may be equivalent to that of the compound 133.

Note that the LUMO levels and the HOMO levels of the compounds can be derived from the electrochemical characteristics (the reduction potentials and the oxidation potentials) of the compounds that are measured by cyclic voltammetry (CV).

When the compound 131 has a hole-transport property and the compound 133 has an electron-transport property, for example, it is preferred that the HOMO level of the compound 131 be higher than that of the compound 133 and the LUMO level of the compound 131 be higher than that of the compound 133, as in an energy band diagram in FIG. 2A. Such correlation of energy levels is suitable because electrons and holes, which are carriers injected from the pair of electrodes (the electrodes 101 and 102), are easily injected into the compound 131 and the compound 133.

In FIG. 4B, Comp (131) represents the compound 131; Comp (133) represents the compound 133; $\Delta E_{C1}$ represents the energy difference between the LUMO level and the HOMO level of the compound 131; $\Delta E_{C3}$ represents the energy difference between the LUMO level and the HOMO level of the compound 133; and $\Delta E_E$ represents the energy difference between the LUMO level of the compound 133 and the HOMO level of the compound 131.

The exciplex formed by the compound 131 and the compound 133 has HOMO in the compound 131 and LUMO in the compound 133. The excitation energy of the exciplex substantially corresponds to the energy difference between the LUMO level of the compound 133 and the HOMO level of the compound 131 ($\Delta E_E$), which is smaller than the energy difference between the LUMO level and the HOMO level of the compound 131 ($\Delta E_{C1}$) and the energy difference between the LUMO level and the HOMO level of the compound 133 ($\Delta E_{C3}$). Thus, when the compound 131 and the compound 133 form an exciplex, an excited state can be formed with lower excitation energy. Having lower excitation energy, the exciplex can form a stable excited state.

FIG. 4C shows the correlation of the energy levels of the compounds 131, 132, and 133 in the light-emitting layer 130. The following explain what terms and signs in FIG. 4C represent:

Comp (131): the compound 131;
Comp (133): the compound 133;
Fluorescent Guest (132): the compound 132;
$S_{C1}$: the S1 level of the compound 131;
$T_{C1}$: the T1 level of the compound 131;
$S_{C3}$: the S1 level of the compound 133;
$T_{C3}$: the T1 level of the compound 133;
$S_{FG}$: the S1 level of the compound 132;
$T_FG$: the T1 level of the compound 132;
SE: the S1 level of the exciplex; and
$T_E$: the T1 level of the exciplex.

The compound 131 and the compound 133 contained in the light-emitting layer 130 form the exciplex in the light-emitting device of one embodiment of the present invention. The S1 level ($S_E$) and the T1 level ($T_E$) of the exciplex are close to each other (see Route $A_9$ in FIG. 4C).

Since the excitation energy levels ($S_E$ and $T_E$) of the exciplex are lower than the S1 levels ($S_{C1}$ and $S_{C3}$) of the substances (the compounds 131 and 133) that form the exciplex, an excited state can be formed with lower excitation energy. Accordingly, the driving voltage of the light-emitting device 150 can be reduced.

Since the S1 level ($S_E$) and the T1 level ($T_E$) of the exciplex are adjacent to each other, reverse intersystem crossing occurs easily; the exciplex has a TADF property. Thus, the exciplex has a function of converting triplet excitation energy into singlet excitation energy by upconversion (Route $A_{10}$ in FIG. 4C). The singlet excitation energy of the exciplex can be rapidly transferred to the compound 132 (Route $A_{11}$ in FIG. 4C). At this time, $S_E$ $S_{FG}$ is preferably satisfied. In Route $A_{11}$, the exciplex serves as an energy donor, and the compound 132 serves as an energy acceptor. Specifically, when the level of energy with a wavelength of the line obtained by extrapolating a tangent to the fluorescent spectrum of the exciplex at a tail on the short wavelength side is $S_E$ and the level of energy with a wavelength of the absorption edge of the absorption spectrum of the compound 132 is $S_{FG}$, $S_E \geq S_{FG}$ is preferably satisfied. Since the compound 136 is a phosphorescent material, it can receive the singlet excitation energy and triplet excitation energy of the exciplex (Route $A_{12}$ in FIG. 4C). That is, energy transfer from each of $S_E$ and $T_E$ to $T_{PG}$ can occur. At this time, $S_E \geq T_{PG}$ and $T_E \geq T_{PG}$ are preferably satisfied. In the case where $S_{FG} \geq T_{PG}$ is satisfied, a process where the singlet excitation energy of the compound 132 is converted into fluorescence and a process where the singlet excitation energy of the compound 132 is transferred to $T_{PG}$ (Route $A_5$ in FIG. 4C) conflict with each other. That is, the compound 136 can receive excitation energy through Routes $A_{12}$ and $A_5$. Therefore, light emission of both the compound 132 and the compound 136 can be obtained from the light-emitting layer 130.

Although not particularly illustrated, energy transfer from the compound 131 and the compound 133 to the compound 132 and/or the compound 136 is also possible.

Note that in order to improve the TADF property, it is preferred that the T1 levels of both of the compounds 131 and 133, that is, $T_{C1}$ and $T_{C3}$ be higher than or equal to $T_E$. As the index for such $T_{C1}$ and $T_{C3}$, the emission peak wavelengths of the phosphorescent spectra of the compound 131 and the compound 133 on the shortest wavelength side are each preferably less than or equal to the maximum emission peak wavelength of the exciplex. When the level of energy with a wavelength of the line obtained by extrapolating a tangent to the fluorescent spectrum of the exciplex at a tail on the short wavelength side is $S_E$, the level of energy with a wavelength of the line obtained by extrapolating a tangent to the phosphorescent spectrum of the compound 131 at a tail on the short wavelength side is $T_{C1}$, and the level of energy with a wavelength of the line obtained by extrapolating a tangent to the phosphorescent spectrum of the compound 133 at a tail on the short wavelength side is $T_{C3}$, $S_E - T_{C1} \leq 0.2$ eV and $S_E - T_{C3} \leq 0.2$ eV are preferably satisfied.

The transfer of triplet excitation energy generated in the light-emitting layer 130 through Route $A_9$ and the energy transfer process from the S1 level of the exciplex to the S1 level of the compound 132 (Route $A_{11}$) allow light emission of the compound 132. Thus, the use of a combination of materials that form an exciplex in the light-emitting layer 130 can increase the luminous efficiency of the light-emitting device.

In the light-emitting device of one embodiment of the present invention, a fluorescent material in which a luminophore has protecting groups is used as the compound 132. Such a structure can inhibit energy transfer by the Dexter mechanism that is represented by Routes $A_{13}$ and $A_6$ as described above, leading to inhibition of deactivation of triplet excitation energy. Thus, a light-emitting device with high luminous efficiency can be obtained.

The above-described process through Route $A_9$ and Route $A_n$ may be referred to as exciplex-singlet energy transfer (ExSET) or exciplex-enhanced fluorescence (ExEF) in this specification and the like. In other words, in the light-emitting layer 130, excitation energy is supplied from the exciplex to the fluorescent material.

<Structure Example 3 of Light-Emitting Layer>

In this structure example, a phosphorescent material is used as the compound 133 of the light-emitting device utilizing ExEF described above. That is, a phosphorescent material is used as one of compounds that form an exciplex.

In this structure example, a compound containing a heavy atom is used as one of compounds that form an exciplex. Thus, intersystem crossing between a singlet state and a triplet state is promoted. Consequently, an exciplex capable of transition from a triplet excited state to a singlet ground state (that is, capable of emitting phosphorescence) can be formed. In this case, unlike in the case of a typical exciplex, the triplet excitation energy level ($T_E$) of the exciplex is the level of an energy donor; thus, $T_E$ is preferably higher than or equal to the singlet excitation energy level ($S_{FG}$) of the compound 132, which is a light-emitting material. Specifically, when the level of energy with a wavelength of the line obtained by extrapolating a tangent to the emission spectrum of the exciplex containing a heavy atom at a tail on the short wavelength side is $T_E$ and the level of energy with a wavelength of the absorption edge of the absorption spectrum of the compound 132 is $S_FG$, $T_E \geq S_{FG}$ is preferably satisfied.

With such correlation of energy levels, the triplet excitation energy of the formed exciplex can be transferred from the triplet excitation energy level of the exciplex ($T_E$) to the singlet excitation energy level of the compound 132 ($S_{FG}$). Note that it is sometimes difficult to clearly distinguish fluorescence and phosphorescence from each other in an emission spectrum because the S1 level and the T1 level ($S_E$ and $T_E$) of the exciplex are close to each other. In that case, fluorescence and phosphorescence can sometimes be distinguished from each other by the emission lifetime.

Note that the phosphorescent material used in the above structure preferably contains a heavy atom such as Ir, Pt, Os, Ru, or Pd. In contrast, in this structure example, the compound 133, which is a phosphorescent material, serves as an energy donor; thus, the quantum yield does not matter. That is, energy transfer from the triplet excitation energy level of the exciplex to the singlet excitation energy level of the fluorescent material is acceptable as long as it is allowable transition. The energy transfer from the phosphorescent material or the exciplex formed using a phosphorescent material to the fluorescent material is preferred, in which case energy transfer from the triplet excitation energy level of the energy donor to the singlet excitation energy level of the guest material (energy acceptor) is allowable transition. Thus, without through the process of Route $A_{10}$ in FIG. 4C, the triplet excitation energy of the exciplex can be transferred to the S1 level ($S_{FG}$) of the guest material through the process of Route $A_{11}$. That is, triplet excitation energy and singlet excitation energy can be transferred to the S1 level of the guest material only through the process of Route $A_9$ and Route $A_{11}$. In Route $A_{11}$, the exciplex serves as an energy donor, and the compound 132 and/or the compound 136 serves as an energy acceptor.

In the light-emitting device of one embodiment of the present invention, a fluorescent material in which a luminophore has protecting groups is used as the compound 132.

Such a structure can inhibit energy transfer by the Dexter mechanism that is represented by Routes $A_{13}$ and $A_6$ as described above, leading to inhibition of deactivation of triplet excitation energy. Thus, a light-emitting device with high luminous efficiency can be obtained.

<Structure Example 4 of Light-Emitting Layer>

In this structure example, the case where a material having a TADF property is used as the compound 133 of the light-emitting device utilizing ExEF described above will be described with reference to FIG. 4D.

Figure 4D:
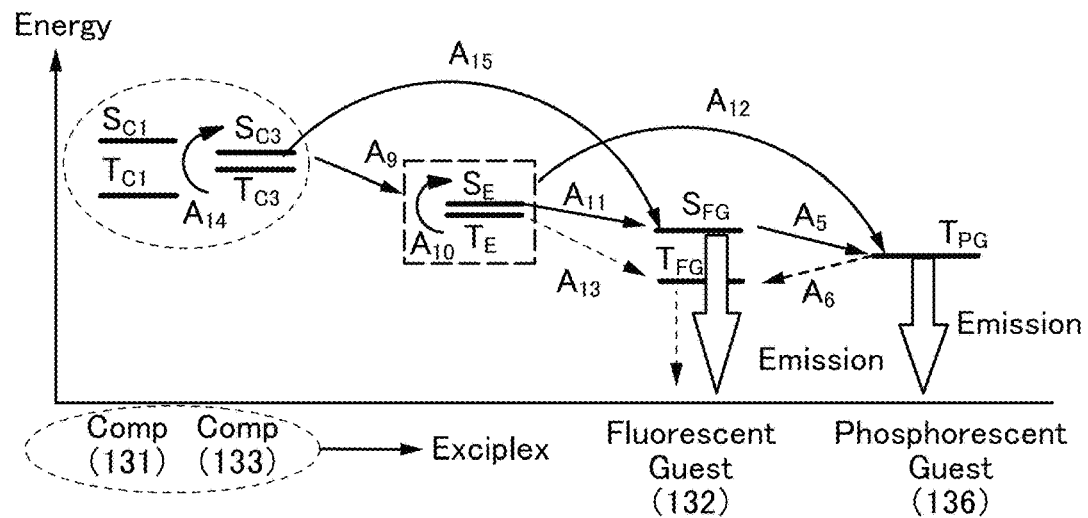

Since the compound 133 is the TADF material, the compound 133 that does not form an exciplex has a function of converting triplet excitation energy into singlet excitation energy by upconversion (Route $A_{14}$ in FIG. 4D). The singlet excitation energy of the compound 133 can be rapidly transferred to the compound 132 (Route $A_{15}$ in FIG. 4D). At this time, $S_{C3} S_{FG}$ is preferably satisfied.

As described in the above structure example of the light-emitting layer, the light-emitting device of one embodiment of the present invention has a pathway where the triplet excitation energy is transferred to the compound 132, which is a fluorescent material, through Route $A_9$ to Route $A_n$ in FIG. 4D and a pathway where the triplet excitation energy is transferred to the compound 132 through Route $A_{14}$ and Route $A_{15}$ in FIG. 4D. A plurality of pathways through each of which the triplet excitation energy is transferred to the fluorescent material can further increase the luminous efficiency.

Although not particularly illustrated, energy transfer from the compound 131 to the compound 132 and/or the compound 136 is also possible. Furthermore, energy transfer from the compound 133 to the compound 136 is also possible.

<Structure Example 5 of Light-Emitting Layer>

Figure 5A:
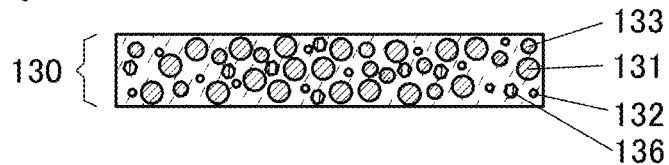
FIG. 5A is a schematic cross-sectional view of a light-emitting layer in a light-emitting device of one embodiment of the present invention, and FIGS. 5B and 5C each show the correlation of energy levels in a light-emitting layer of a light-emitting device of one embodiment of the present invention.
Figure 5B:
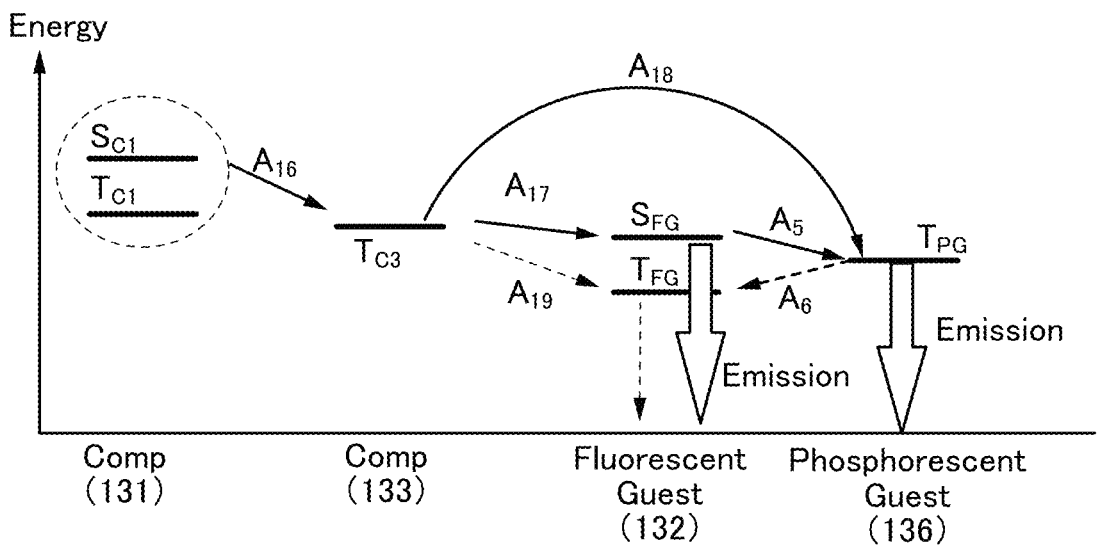

FIG. 5B shows an example of the correlation of energy levels in the light-emitting layer 130 of the light-emitting device 150 of one embodiment of the present invention. The light-emitting layer 130 illustrated in FIG. 5A contains the compound 131, the compound 132, the compound 136, and the compound 133. In one embodiment of the present invention, the compound 132 is a fluorescent material having protecting groups and the compound 136 is a phosphorescent material. The compound 133 has a function of converting triplet excitation energy into light emission. In this structure example, the compound 133 is a phosphorescent material. Note that terms and signs in FIG. 5B are the same as those in FIG. 4C.

In the light-emitting device of one embodiment of the present invention, when carrier recombination mainly occurs in the compound 131 contained in the light-emitting layer 130, singlet excitons and triplet excitons are generated. Since the compound 133 is a phosphorescent material, selecting materials that have a relation of $T_{C3} \leq T_{C1}$ allows both the singlet excitation energy and triplet excitation energy generated in the compound 131 to be transferred to $T_{C3}$ of the compound 133 (Route $A_{16}$ in FIG. 5B). Some of the carriers can be recombined in the compound 133.

Note that the phosphorescent material used in the above structure preferably contains a heavy atom such as Ir, Pt, Os, Ru, or Pd. In contrast, in this structure example, the compound 133, which is a phosphorescent material, serves as an energy donor; thus, the quantum yield does not matter. That is, a phosphorescent material is preferably used as the compound 133, in which case energy transfer from the triplet excitation energy level of the energy donor to the singlet excitation energy level of the guest material (energy acceptor) is allowable transition. Thus, the triplet excitation energy of the compound 133 can be transferred to the S1 level ($S_{FG}$) of the guest material through the process of Route $A_{17}$. In Route $A_{17}$, the compound 133 serves as an energy donor and the compound 132 serves as an energy acceptor. In that case, $T_{C3} \geq S_{FG}$ is preferably satisfied because the excitation energy of the compound 133 is efficiently transferred to the singlet excited state of the compound 132, which is a guest material. Specifically, when the level of energy with a wavelength of the line obtained by extrapolating a tangent to the phosphorescent spectrum of the compound 133 at a tail on the short wavelength side is $T_{C3}$ and the level of energy with a wavelength of the absorption edge of the absorption spectrum of the compound 132 is $S_{FG}$, $T_{C3} \geq S_{FG}$ is preferably satisfied. Since the compound 136 is a phosphorescent material, it can receive the triplet excitation energy of the compound 133 (Route $A_{18}$ in FIG. 5B). That is, energy transfer from $T_{C3}$ to $T_{PG}$ can be caused. At this time, $T_{C3} \geq T_{PG}$ is preferably satisfied. In the case where $S_{FG} \geq T_{PG}$ is satisfied, a process where the singlet excitation energy of the compound 132 is converted into fluorescence and a process where the singlet excitation energy of the compound 132 is transferred to $T_{PG}$ (Route $A_5$ in FIG. 5B) conflict with each other. That is, the compound 136 can receive excitation energy through Routes $A_{18}$ and $A_5$. Therefore, light emission of both the compound 132 and the compound 136 can be obtained from the light-emitting layer 130.

Although not particularly illustrated, energy transfer from the compound 131 to the compound 132 and/or the compound 136 is also possible.

In the light-emitting device of one embodiment of the present invention, a guest material in which a luminophore has protecting groups is used as the compound 132. Such a structure can inhibit energy transfer by the Dexter mechanism that is represented by Routes $A_{19}$ and $A_6$ as described above, leading to inhibition of deactivation of triplet excitation energy. Thus, a fluorescent device with high luminous efficiency can be obtained.

<Structure Example 6 of Light-Emitting Layer>

Figure 5C:
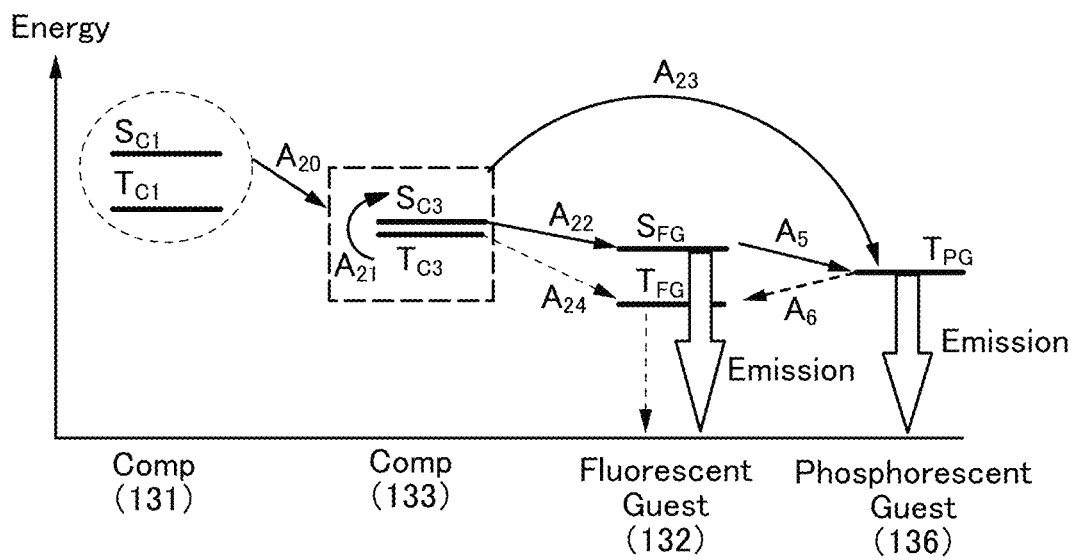

FIG. 5C shows an example of the correlation of energy levels in the light-emitting layer 130 of the light-emitting device 150 of one embodiment of the present invention. The light-emitting layer 130 illustrated in FIG. 5A contains the compound 131, the compound 132, the compound 136, and the compound 133. In one embodiment of the present invention, the compound 132 is a fluorescent material having protecting groups and the compound 136 is a phosphorescent material. The compound 133 has a function of converting triplet excitation energy into light emission. In this structure example, the compound 133 is a compound having a TADF property. Note that terms and signs in FIG. 5C are the same as those in FIG. 4C.

In the light-emitting device of one embodiment of the present invention, when carrier recombination mainly occurs in the compound 131 contained in the light-emitting layer 130, singlet excitons and triplet excitons are generated. Here, selecting materials that have relations of $S_{C3} \leq S_{C1}$ and $T_{C3} \leq T_{C1}$ allows both the singlet excitation energy and triplet excitation energy generated in the compound 131 to be transferred to $S_{C3}$ and $T_{C3}$ of the compound 133 (Route $A_{20}$ in FIG. 5C). Some carriers can be recombined in the compound 133.

The compound 133 is a TADF material and thus has a function of converting triplet excitation energy into singlet excitation energy by upconversion (Route $A_{21}$ in FIG. 5C). The singlet excitation energy of the compound 133 can be rapidly transferred to the compound 132 (Route $A_{22}$ in FIG. 5C). At this time, $S_{C3} \geq S_{FG}$ is preferably satisfied. Specifically, when the level of energy with a wavelength of the line obtained by extrapolating a tangent to the fluorescent spectrum of the compound 133 at a tail on the short wavelength side is $S_{C3}$ and the level of energy with a wavelength of the absorption edge of the absorption spectrum of the compound 132 is $S_{FG}$, $S_{C3} \geq S_{FG}$ is preferably satisfied. Through Routes $A_{20}$ to $A_{22}$, triplet excitation energy in the light-emitting layer 130 can be converted into fluorescence of the compound 132. In Route $A_{22}$, the compound 133 serves as an energy donor and the compound 132 serves as an energy acceptor. Since the compound 136 is a phosphorescent material, it can receive both the singlet excitation energy and triplet excitation energy of the compound 133 (Route $A_{23}$ in FIG. 5C). That is, energy transfer from $S_{C3}$ and $T_{C3}$ to $T_{PG}$ can be caused. In the case where $S_{FG} \geq T_{PG}$ is satisfied, a process where the singlet excitation energy of the compound 132 is converted into fluorescence and a process where the singlet excitation energy of the compound 132 is transferred to $T_{PG}$ (Route $A_5$ in FIG. 5C) conflict with each other. That is, the compound 136 can receive excitation energy through Routes $A_{23}$ and $A_5$. Therefore, light emission of both the compound 132 and the compound 136 can be obtained from the light-emitting layer 130.

Although not particularly illustrated, energy transfer from the compound 131 to the compound 132 and/or the compound 136 is also possible.

In the light-emitting device of one embodiment of the present invention, a guest material in which a luminophore has protecting groups is used as the compound 132. Such a structure can inhibit energy transfer by the Dexter mechanism that is represented by Routes $A_{24}$ and $A_6$ as described above, leading to inhibition of deactivation of triplet excitation energy. Thus, a fluorescent device with high luminous efficiency can be obtained.

<Energy Transfer Mechanism>

Here, the Förster mechanism and the Dexter mechanism will be described. Here, as for supply of excitation energy from a first material in an excited state to a second material in a ground state, an energy transfer process between molecules of the first material and the second material is described; the same can be applied to the case where one of the materials is an exciplex.

<<Förster Mechanism>>

In the Förster mechanism, energy transfer does not require direct contact between molecules and energy is transferred through a resonant phenomenon of dipolar oscillation between a first material and a second material. By the resonant phenomenon of dipolar oscillation, the first material provides energy to the second material, and thus, the first material in an excited state is brought into a ground state and the second material in a ground state is brought into an excited state. Note that the rate constant $k_{h^* \to g}$ of the Förster mechanism is expressed by Formula (1).

[Formula 1]

$$k_{h^* \to g} = \frac{9000c^4 K^2 \phi \ln 10}{128\pi^5 n^4 N \tau R^6} \int \frac{f'_h(v)\varepsilon_g(v)}{v^4} dv \qquad (1)$$

In Formula (1), v denotes a frequency, $f'_h(v)$ denotes a normalized emission spectrum of the first material (a fluorescent spectrum in the case where energy transfer from a singlet excited state is discussed, and a phosphorescent spectrum in the case where energy transfer from a triplet excited state is discussed), $\varepsilon_g(v)$ denotes a molar absorption coefficient of the second material, N denotes Avogadro's number, n denotes a refractive index of a medium, R denotes an intermolecular distance between the first material and the second material, τ denotes a measured lifetime of an excited state (fluorescence lifetime or phosphorescence lifetime), c denotes the speed of light, ϕ denotes an emission quantum yield (a fluorescence quantum yield in the case where energy transfer from a singlet excited state is discussed, and a phosphorescence quantum yield in the case where energy transfer from a triplet excited state is discussed), and $K^2$ denotes a coefficient (0 to 4) of orientation of a transition dipole moment between the first material and the second material. Note that $K^2=2/3$ in random orientation.

<<Dexter Mechanism>>

In the Dexter mechanism, the first material and the second material are close to a contact effective range where their orbitals overlap, and the first material in an excited state and the second material in a ground state exchange their electrons, which leads to energy transfer. Note that the rate constant $k_{h^* \to g}$ of the Dexter mechanism is expressed by Formula (2).

[Formula 2]

$$k_{h^* \to g} = \left(\frac{2\pi}{h}\right) K^2 \exp\left(-\frac{2R}{L}\right) \int f'_h(v) \varepsilon'_g(v) dv \quad (2)$$

In Formula (2), h denotes a Planck constant, K denotes a constant having an energy dimension, v denotes a frequency, $f'_h(v)$ denotes a normalized emission spectrum of the first material (the fluorescent spectrum in the case where energy transfer from a singlet excited state is discussed, and the phosphorescent spectrum in the case where energy transfer from a triplet excited state is discussed), $\varepsilon'_g(v)$ denotes a normalized absorption spectrum of the second material, L denotes an effective molecular radius, and R denotes an intermolecular distance between the first material and the second material.

Here, the efficiency of energy transfer from the first material to the second material (energy transfer efficiency $\phi_{ET}$) is expressed by Formula (3). In the formula, $k_r$ denotes a rate constant of a light-emission process (fluorescence in the case where energy transfer from a singlet excited state is discussed, and phosphorescence in the case where energy transfer from a triplet excited state is discussed) of the first material, $k_n$ denotes a rate constant of a non-light-emission process (thermal deactivation or intersystem crossing) of the second material, and t denotes a measured lifetime of an excited state of the first material.

[Formula 3]

$$\phi_{ET} = \frac{k_{h^* \to g}}{k_r + k_n + k_{h^* \to g}} = \frac{k_{h^* \to g}}{\left(\frac{1}{\tau}\right) + k_{h^* \to g}} \quad (3)$$

According to Formula (3), it is found that the energy transfer efficiency $\phi_{ET}$ can be increased by increasing the rate constant $k_{h^* \to g}$ of energy transfer so that another competing rate constant $k_r+k_n$ (=1/τ) becomes relatively small.

<<Concept for Promoting Energy Transfer>>

First, energy transfer by the Förster mechanism is discussed. When Formula (1) is substituted into Formula (3), r can be eliminated. Thus, in the Förster mechanism, the energy transfer efficiency $\phi_{ET}$ does not depend on the lifetime r of the excited state of the first material. Furthermore, it can be said that high energy transfer efficiency $\phi_{ET}$ is obtained when the emission quantum yield ϕ is high.

Furthermore, it is preferred that the emission spectrum of the first material largely overlap with the absorption spectrum of the second material (absorption corresponding to transition from a singlet ground state to a singlet excited state). Moreover, it is preferred that the molar absorption coefficient of the second material be also high. This means that the emission spectrum of the first material overlaps with the absorption band of the second material which is on the longest wavelength side. Since direct transition from the singlet ground state to the triplet excited state of the second material is forbidden, the molar absorption coefficient of the second material in the triplet excited state can be ignored. Thus, a process of energy transfer from an excited state of the first material to a triplet excited state of the second material by the Förster mechanism can be ignored, and only a process of energy transfer to a singlet excited state of the second material is considered.

The rate of energy transfer by the Förster mechanism is inversely proportional to the 6th power of the intermolecular distance R between the first material and the second material, according to Formula (1). As described above, when R is less than or equal to 1 nm, energy transfer by the Dexter mechanism is dominant. Therefore, to increase the rate of energy transfer by the Forster mechanism while inhibiting energy transfer by the Dexter mechanism, the intermolecular distance is preferably greater than or equal to 1 nm and less than or equal to 10 nm. This requires the above protecting groups to be not too bulky; thus, the number of carbon atoms of the protecting groups is preferably 3 to 10.

Next, energy transfer by the Dexter mechanism is discussed. According to Formula (2), in order to increase the rate constant $k_{h^* \to g}$, it is preferred that the emission spectrum of the first material (the fluorescent spectrum in the case where energy transfer from a singlet excited state is discussed, and the phosphorescent spectrum in the case where energy transfer from a triplet excited state is discussed) largely overlap with an absorption spectrum of the second material (absorption corresponding to transition from a singlet ground state to a singlet excited state). Therefore, the energy transfer efficiency can be optimized by making the emission spectrum of the first material overlap with the absorption band of the second material which is on the longest wavelength side.

When Formula (2) is substituted into Formula (3), it is found that the energy transfer efficiency $\phi_{ET}$ in the Dexter mechanism depends on r. In the Dexter mechanism, which is a process of energy transfer based on the electron exchange, as well as the energy transfer from the singlet excited state of the first material to the singlet excited state of the second material, energy transfer from the triplet excited state of the first material to the triplet excited state of the second material occurs.

In the light-emitting device of one embodiment of the present invention in which the second material is a fluorescent compound, the efficiency of energy transfer to the triplet excited state of the second material is preferably low. That is, the energy transfer efficiency based on the Dexter mechanism from the first material to the second material is preferably low and the energy transfer efficiency based on the Förster mechanism from the first material to the second material is preferably high.

As described above, the energy transfer efficiency in the Förster mechanism does not depend on the lifetime r of the excited state of the first material. In contrast, the energy transfer efficiency in the Dexter mechanism depends on the excitation lifetime r of the first material. To reduce the energy transfer efficiency in the Dexter mechanism, the excitation lifetime T of the first material is preferably short.

Thus, in one embodiment of the present invention, an exciplex, a phosphorescent material, or a TADF material is used as the first material. These materials each have a function of converting triplet excitation energy into light emission. The energy transfer efficiency of the Forster mechanism depends on the emission quantum yield of the energy donor; thus, the excitation energy of the first material capable of converting triplet excitation energy into light emission, such as a phosphorescent material, an exciplex, or a TADF material, can be transferred to the second material by the Förster mechanism. With the structure of one embodiment of the present invention, reverse intersystem crossing from the triplet excited state to the singlet excited state of the first material (an exciplex or a TADF material) can be promoted, and the excitation lifetime t of the triplet excited state of the first material can be short. Alternatively, transition from the triplet excited state to the singlet ground state of the first material (a phosphorescent material or an exciplex formed using a phosphorescent material) can be promoted, and the excitation lifetime t of the triplet excited state of the first material can be short. As a result, the efficiency of energy transfer by the Dexter mechanism from the triplet excited state of the first material to the triplet excited state of the fluorescent material (second material) can be reduced.

In the light-emitting device of one embodiment of the present invention, a fluorescent material having protecting groups is used as the second material, as described above. Therefore, the intermolecular distance between the first material and the second material can be large. In the light-emitting device of one embodiment of the present invention, a material having a function of converting triplet excitation energy into light emission is used as the first material, and a fluorescent material having protecting groups is used as the second material, whereby the energy transfer efficiency of the Dexter mechanism can be reduced. As a result, non-radiative decay of the triplet excitation energy in the light-emitting layer 130 can be inhibited, and a light-emitting device with high luminous efficiency can be provided.

<Material>

Next, components of a light-emitting device of one embodiment of the present invention will be described in detail below.

<<Light-Emitting Layer>>

Materials that can be used for the light-emitting layer 130 will be described below. In the light-emitting layer of the light-emitting device of one embodiment of the present invention, an energy acceptor having a function of converting triplet excitation energy into light emission and an energy donor in which a luminophore has protecting groups are used. Examples of the material having a function of converting triplet excitation energy into light emission include a TADF material and a phosphorescent material.

Examples of the luminophore included in the compound 132 serving as an energy acceptor include a phenanthrene skeleton, a stilbene skeleton, an acridone skeleton, a phenoxazine skeleton, and a phenothiazine skeleton. Specifically, a fluorescent compound having any of a naphthalene skeleton, an anthracene skeleton, a fluorene skeleton, a chrysene skeleton, a triphenylene skeleton, a tetracene skeleton, a pyrene skeleton, a perylene skeleton, a coumarin skeleton, a quinacridone skeleton, and a naphthobisbenzofuran skeleton is preferred because of its high fluorescence quantum yield.

The protecting group is preferably an alkyl group having 1 to 10 carbon atoms, a cycloalkyl group having 3 to 10 carbon atoms, a branched-chain alkyl group having 3 to 10 carbon atoms, or a trialkylsilyl group having 3 to 12 carbon atoms.

Examples of an alkyl group having 1 to 10 carbon atoms include a methyl group, an ethyl group, a propyl group, a pentyl group, and a hexyl group, and a branched-chain alkyl group having 3 to 10 carbon atoms, which is described later, is particularly preferred. Note that the alkyl group is not limited thereto.

Examples of a cycloalkyl group having 3 to 10 carbon atoms include a cyclopropyl group, a cyclobutyl group, a cyclohexyl group, a norbornyl group, and an adamantyl group. The cycloalkyl group is not limited thereto. In the case where the cycloalkyl group has a substituent, examples of the substituent include an alkyl group having 1 to 7 carbon atoms, such as a methyl group, an ethyl group, a propyl group, an isopropyl group, a butyl group, an isobutyl group, a sec-butyl group, a tert-butyl group, a pentyl group, or a hexyl group, a cycloalkyl group having 5 to 7 carbon atoms, such as a cyclopentyl group, a cyclohexyl group, a cycloheptyl group, or a 8,9,10-trinorbornanyl group, and an aryl group having 6 to 12 carbon atoms, such as a phenyl group, a naphthyl group, or a biphenyl group.

Examples of a branched-chain alkyl group having 3 to 10 carbon atoms include an isopropyl group, a sec-butyl group, an isobutyl group, a tert-butyl group, an isopentyl group, a sec-pentyl group, a tert-pentyl group, a neopentyl group, an isohexyl group, a 3-methylpentyl group, a 2-methylpentyl group, a 2-ethylbutyl group, a 1,2-dimethylbutyl group, and a 2,3-dimethylbutyl group. The branched-chain alkyl group is not limited thereto.

Examples of a trialkylsilyl group having 3 to 12 carbon atoms include a trimethylsilyl group, a triethylsilyl group, and a tert-butyl dimethylsilyl group. The trialkylsilyl group is not limited thereto.

In the molecular structure of the energy acceptor, it is preferred that two or more diarylamino groups be bonded to a luminophore and aryl groups of the diarylamino groups each have at least one protecting group. It is further preferred that at least two protecting groups be bonded to each of the aryl groups. This is because a larger number of protecting groups more effectively inhibit energy transfer by the Dexter mechanism in the case where the guest material is used for the light-emitting layer. To inhibit an increase in molecular weight and keep the sublimation property, the diarylamino groups are preferably diphenylamino groups.

Furthermore, when two or more diarylamino groups are bonded to a luminophore, a fluorescent material whose emission color can be adjusted and which has high quantum yield can be obtained. The diarylamino groups are preferably bonded to the luminophore at symmetric positions. With such a structure, the fluorescent material can have high quantum yield.

The protecting groups may be introduced to the luminophore via the aryl groups of the diarylamino groups, not directly introduced to the luminophore. Such a structure is preferred because the protecting groups can be arranged to cover the luminophore, allowing the host material and the luminophore to be away from each other from any direction. In the case where the protecting groups are not directly bonded to the luminophore, four or more protecting groups are preferably introduced to one luminophore.

Furthermore, it is preferred that at least one of atoms of the plurality of protecting groups be positioned directly on one plane of the luminophore, that is, the condensed aromatic ring or the condensed heteroaromatic ring, and at least one of atoms of the plurality of protecting groups be positioned directly on the other plane of the condensed aromatic ring or the condensed heteroaromatic ring, as illustrated in FIGS. 3A and 3B. A specific example of such a structure is as follows: the condensed aromatic ring or the condensed heteroaromatic ring, which is a luminophore, is bonded to two or more diphenylamino groups, and the phenyl groups of the two or more diphenylamino groups each independently have protecting groups at the 3- and 5-positions.

Such a structure enables a steric configuration where the protecting groups at the 3- and 5-positions of the phenyl groups are positioned directly on the condensed aromatic ring or the condensed heteroaromatic ring, which is a luminophore, as shown in FIGS. 3A and 3B. As a result, the upper and lower planes of the condensed aromatic ring or the condensed heteroaromatic ring can be efficiently covered, inhibiting energy transfer by the Dexter mechanism.

As the energy acceptor described above, the organic compound represented by General Formula (G1) or (G2) can be favorably used, for example.

[Chemical Formula 12]

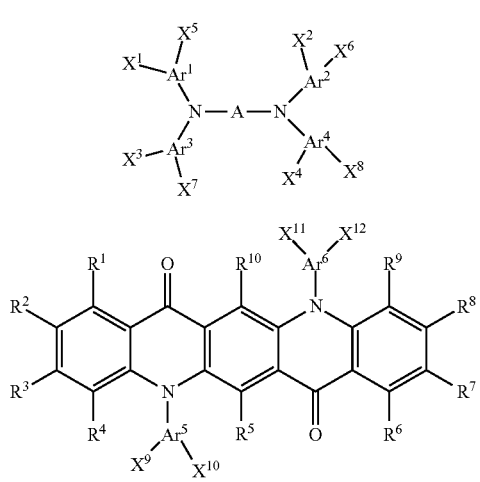

In General Formulae (G1) and (G2), A represents a substituted or unsubstituted condensed aromatic ring having 10 to 30 carbon atoms or a substituted or unsubstituted condensed heteroaromatic ring having 10 to 30 carbon atoms, $Ar^1$ to $Ar^6$ each independently represent a substituted or unsubstituted aromatic hydrocarbon group having 6 to 13 carbon atoms, $X^1$ to $X^{12}$ each independently represent any one of a branched-chain alkyl group having 3 to 10 carbon atoms, a substituted or unsubstituted cycloalkyl group having 3 to 10 carbon atoms, and a trialkylsilyl group having 3 to 10 carbon atoms, and $R^1$ to $R^{10}$ each independently represent any one of hydrogen, an alkyl group having 3 to 10 carbon atoms, a substituted or unsubstituted cycloalkyl group having 3 to carbon atoms, and a trialkylsilyl group having 3 to 12 carbon atoms.

Examples of an aromatic hydrocarbon group having 6 to 13 carbon atoms include a phenyl group, a biphenyl group, a naphthyl group, and a fluorenyl group. Note that the aromatic hydrocarbon group is not limited thereto. In the case where the aromatic hydrocarbon group has a substituent, examples of the substituent include an alkyl group having 1 to 7 carbon atoms, such as a methyl group, an ethyl group, a propyl group, an isopropyl group, a butyl group, an isobutyl group, a sec-butyl group, a tert-butyl group, a pentyl group, or a hexyl group, a cycloalkyl group of carbon having 5 to 7 carbon, such as a cyclopentyl group, a cyclohexyl group, a cycloheptyl group, or 8,9,10-trinorbornanyl group, and an aryl group having 6 to 12 carbon atoms, such as a phenyl group, a naphthyl group, or a biphenyl group.

In General Formula (G1), the substituted or unsubstituted condensed aromatic ring having to 30 carbon atoms or the substituted or unsubstituted condensed heteroaromatic ring having 10 to 30 carbon atoms represents the luminophore; any of the above skeletons can be used. In General Formulae (G1) and (G2), $X^1$ to $X^{12}$ represent protecting groups.

In General Formula (G2), the protecting groups are bonded to a quinacridone skeleton, which is a luminophore, via arylene groups. With this structure, the protecting groups can be arranged to cover the luminophore; thus, energy transfer by the Dexter mechanism can be inhibited. Note that any of the protecting groups may be directly bonded to the luminophore.

As the energy acceptor material, an organic compound represented by General Formula (G3) or (G4) can favorably be used.

[Chemical Formula 3]

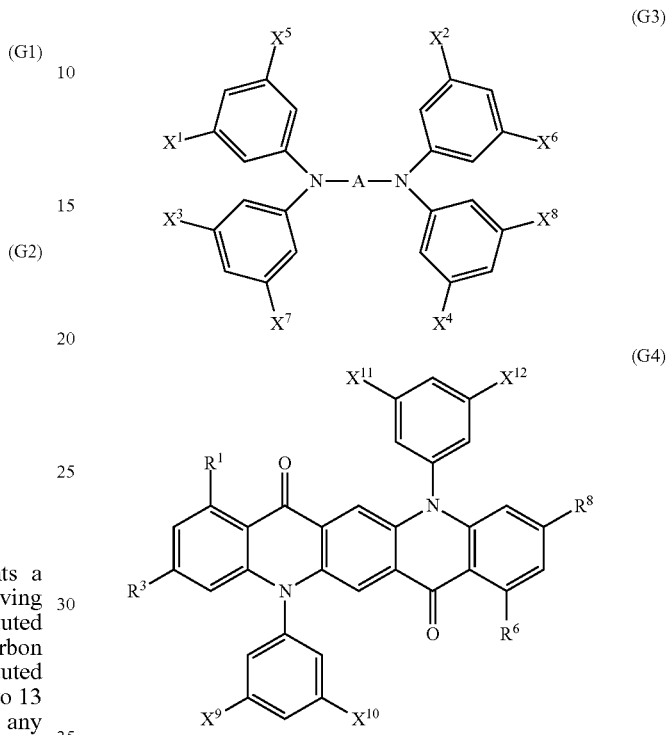

In General Formulae (G3) and (G4), A represents a substituted or unsubstituted condensed aromatic ring having 10 to 30 carbon atoms or a substituted or unsubstituted condensed heteroaromatic ring having 10 to 30 carbon atoms, and $X^1$ to $X^{12}$ each independently represent any one of a branched-chain alkyl group having 3 to 10 carbon atoms, a substituted or unsubstituted cycloalkyl group having 3 to 10 carbon atoms, and a trialkylsilyl group having 3 to 10 carbon atoms.

The protecting groups are each preferably bonded to the luminophore via a phenyl group. With this structure, the protecting groups can be arranged to cover the luminophore; thus, energy transfer by the Dexter mechanism can be inhibited. In the case where the protecting groups are each bonded to the luminophore via a phenylene group and two protecting groups are bonded to the phenylene group, the two protecting groups are preferably bonded to the phenylene group at meta-positions as shown in General Formulae (G3) and (G4). With such a structure, the luminophore can be efficiently covered; thus, energy transfer by the Dexter mechanism can be inhibited. An example of the organic compound represented by General Formula (G3) is 2tBu-mmtBuDPhA2Anth described above. That is, in one embodiment of the present invention, General Formula (G3) is particularly preferred.

As the energy acceptor material, an organic compound represented by General Formula (G5) below can favorably be used.

[Chemical Formula 4]

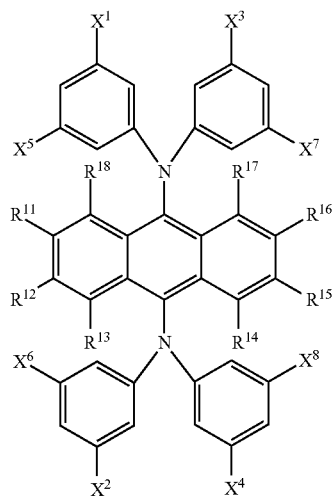

(G5)

[Chemical Formula 5]

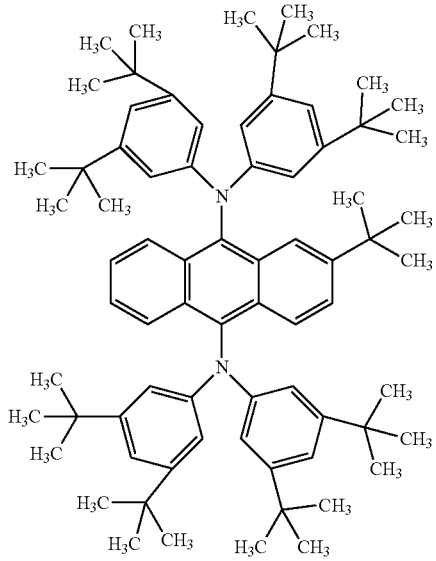

(102)

In General Formula (G5), $X^1$ to $X^8$ each independently represent any one of a branched-chain alkyl group having 3 to 10 carbon atoms, a substituted or unsubstituted cycloalkyl group having 3 to 10 carbon atoms, and a trialkylsilyl group having 3 to 10 carbon atoms, and $R^{11}$ to $R^{18}$ each independently represent any one of hydrogen, a branched-chain alkyl group having 3 to 10 carbon atoms, a substituted or unsubstituted cycloalkyl group having 3 to 10 carbon atoms, a trialkylsilyl group having 3 to 10 carbon atoms, and a substituted or unsubstituted aryl group having 6 to 25 carbon atoms.

Examples of an aryl group having 6 to 25 carbon atoms include a phenyl group, a naphthyl group, a biphenyl group, a fluorenyl group, and a spirofluorenyl group. Note that an aryl group having 6 to 25 carbon atoms is not limited thereto. In the case where the aryl group has a substituent, examples of the substituent include the alkyl group having 1 to 10 carbon atoms, the branched-chain alkyl group having 3 to 10 carbon atoms, the substituted or unsubstituted cycloalkyl group having 3 to 10 carbon atoms, and the trialkylsilyl group having 3 to 10 carbon atoms, which are described above.

An anthracene compound has a high emission quantum yield and a small area of the luminophore; therefore, the upper and lower planes of anthracene can be efficiently covered with the protecting groups. An example of the organic compound represented by General Formula (G5) is 2tBu-mmtBuDPhA2Anth described above.

Examples of the compounds represented by General Formulae (G1) to (G5) are shown by Structural Formulae (102) to (105) and (200) to (284) below. Note that the compounds represented by General Formulae (G1) to (G5) are not limited thereto. The compounds represented by Structural Formulae (102) to (105) and (200) to (284) can be favorably used as a guest material of the light-emitting device of one embodiment of the present invention. Note that the guest material is not limited thereto.

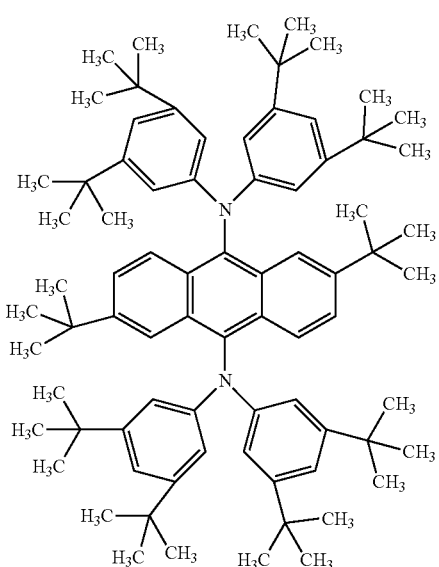

(103)

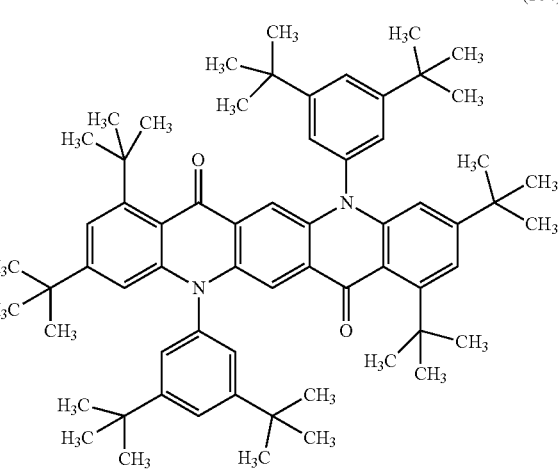

(104)

[Chemical Formula 6]
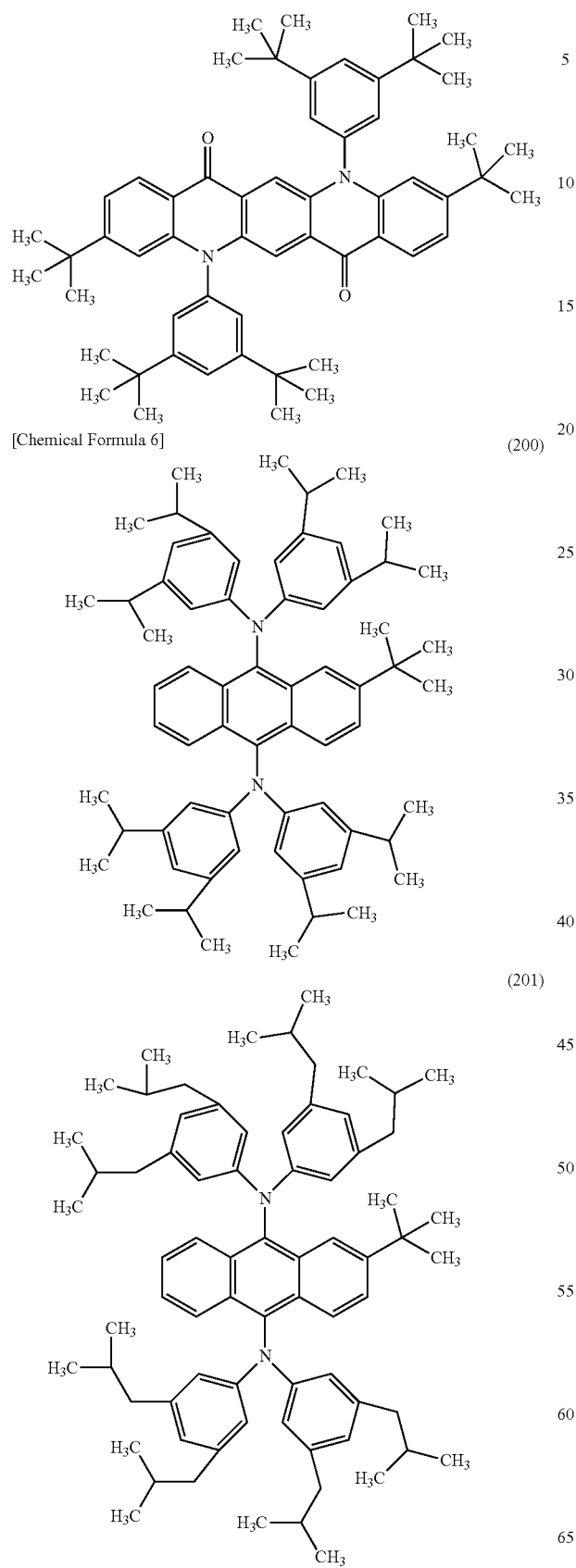
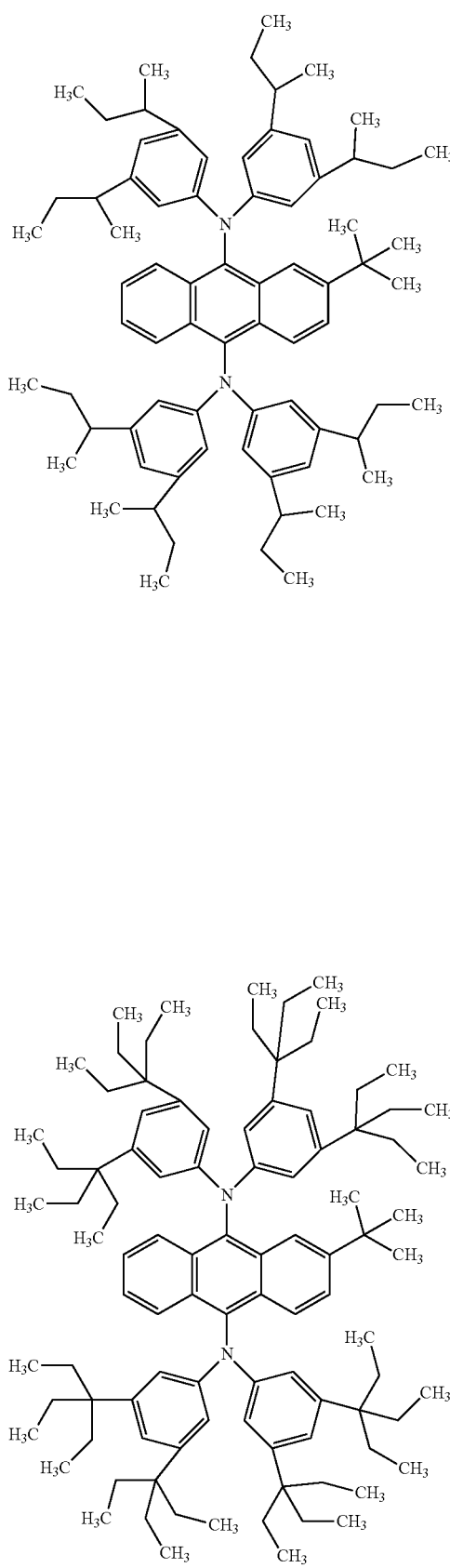

[Chemical Formula 7]
(204)
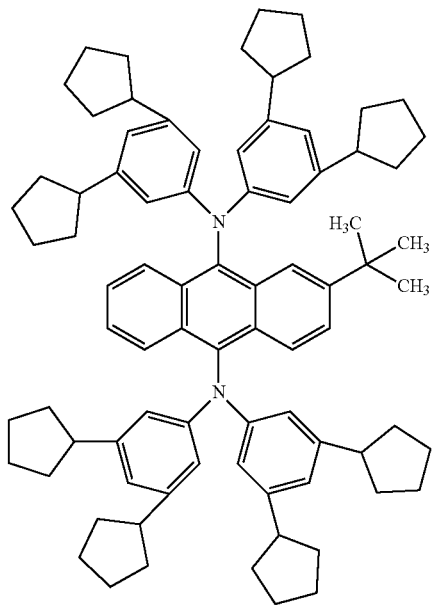
(205)
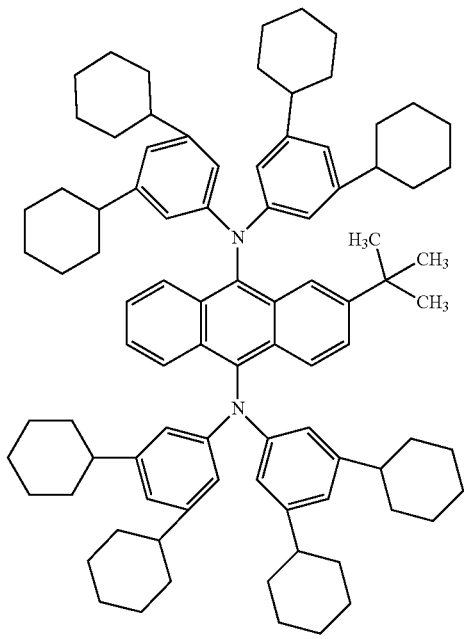
(206)
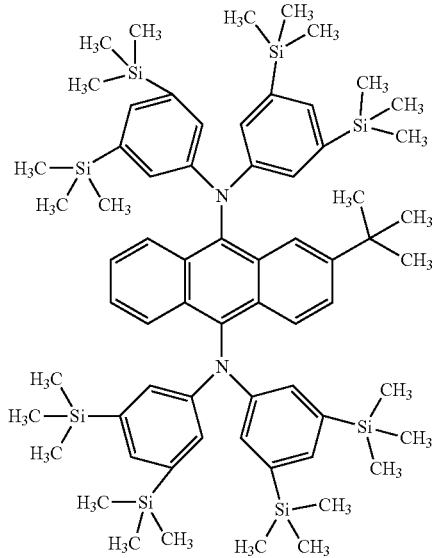
(207)
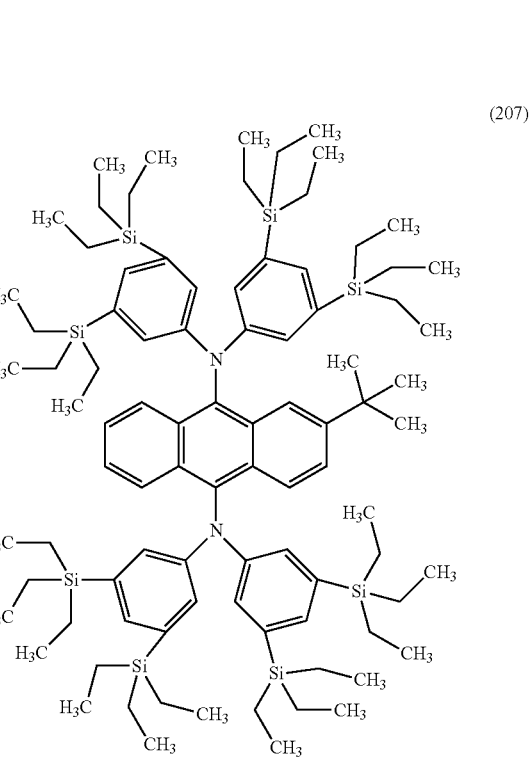

[Chemical Formula 8]
(208)
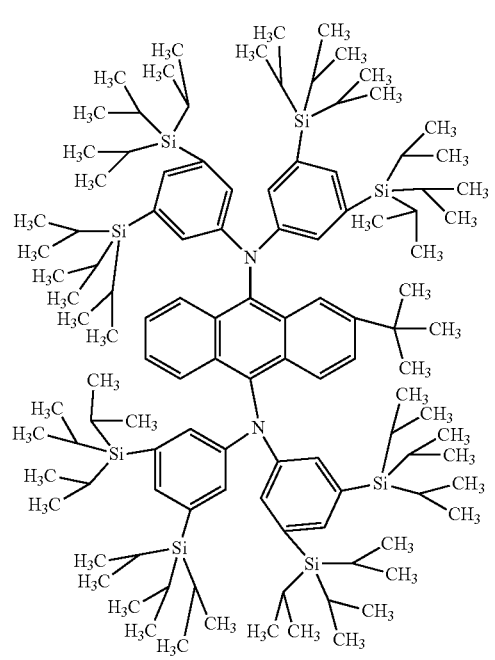
(209)
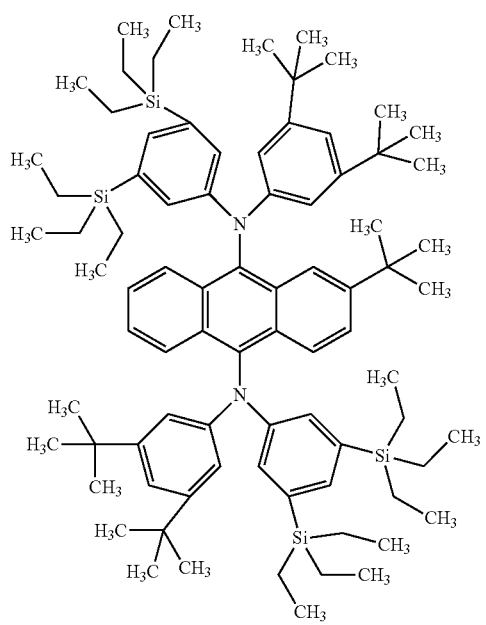
(210)
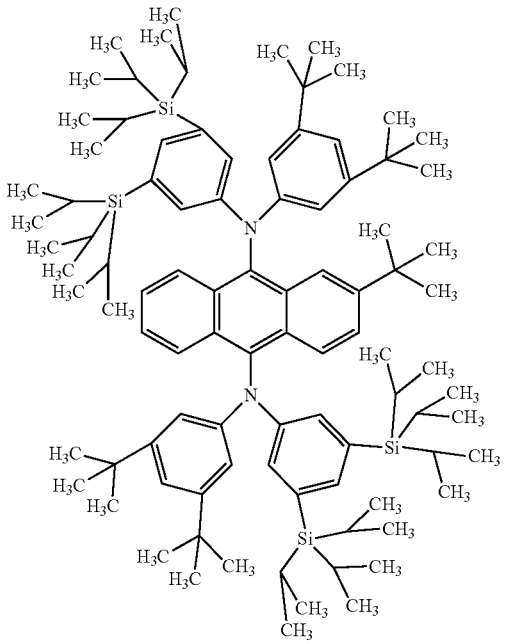
(211)
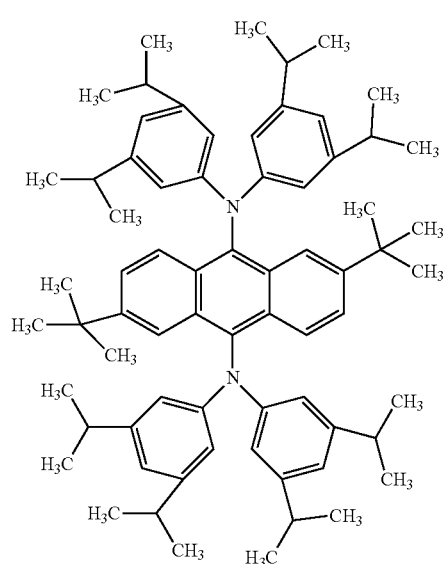

[Chemical Formula 9]
(212)
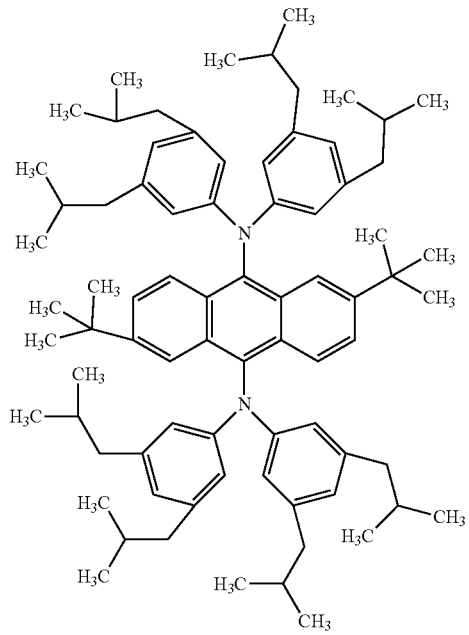
(213)
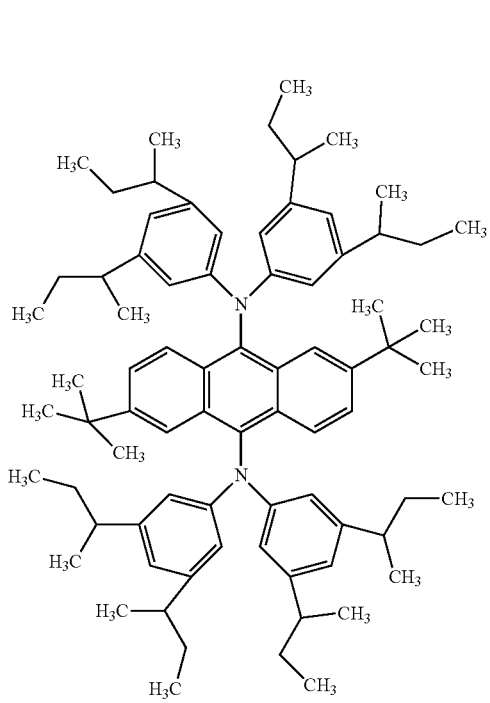
(214)
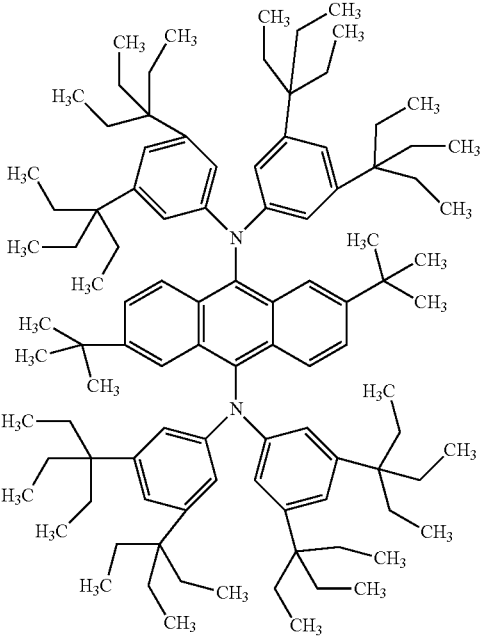
(215)
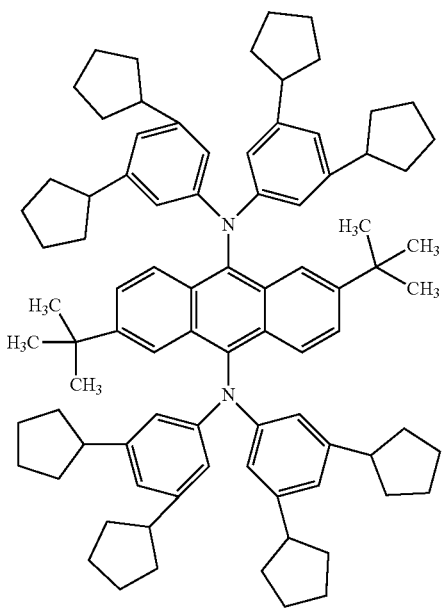

[Chemical Formula 10]
(216)
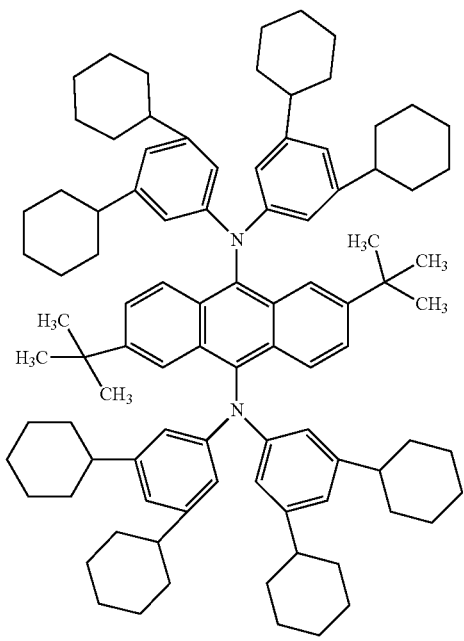
(217)
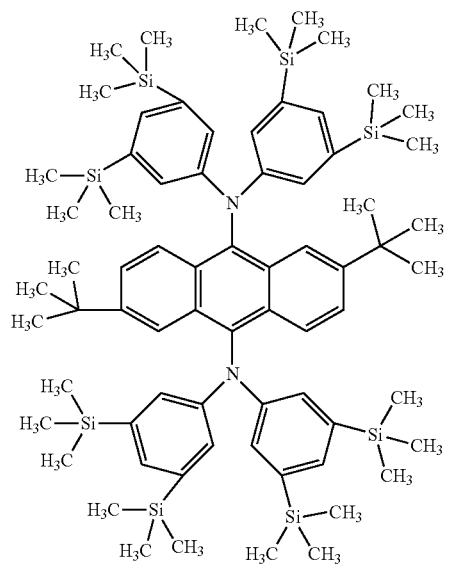
(218)
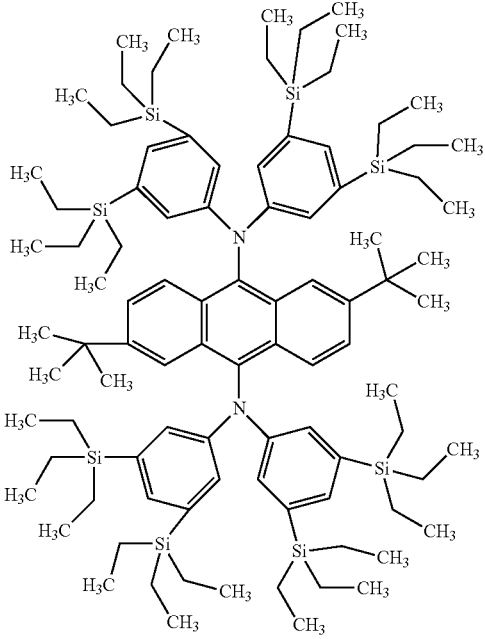
(219)
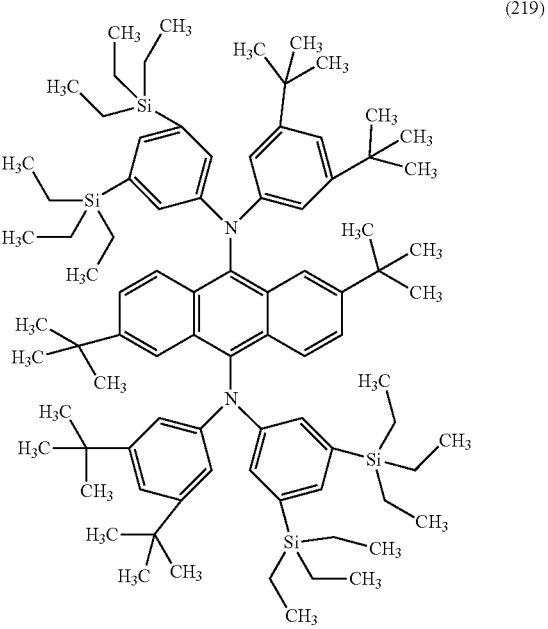 [SMILES: CC[Si](CC)(CC)c1cc(N(c2cc(C(C)(C)C)cc(C(C)(C)C)c2)c2c3ccc(C(C)(C)C)cc3c(N(c3cc(C(C)(C)C)cc(C(C)(C)C)c3)c3cc([Si](CC)(CC)CC)cc([Si](CC)(CC)CC)c3)c3ccc(C(C)(C)C)cc23)cc([Si](CC)(CC)CC)c1]

[Chemical Formula 11]
(220)
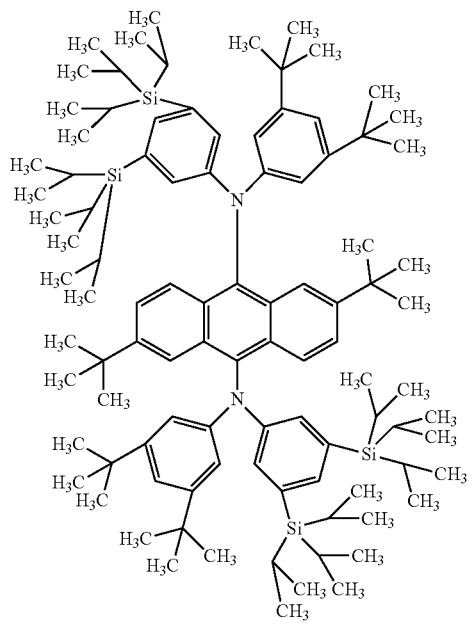
(221)
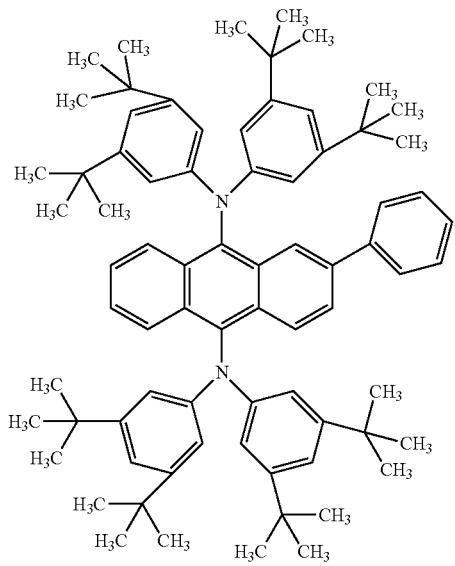
(222)
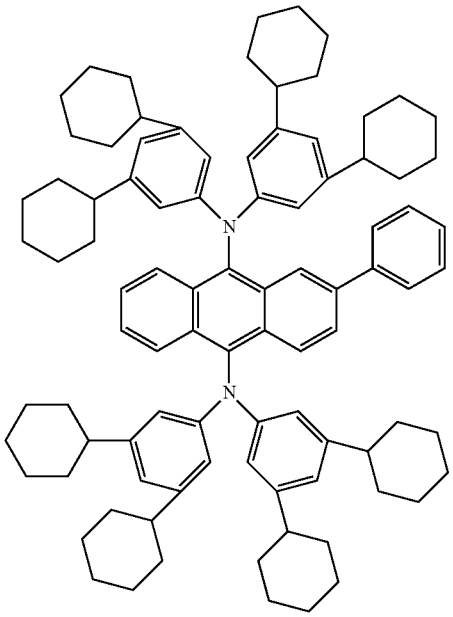
(223)
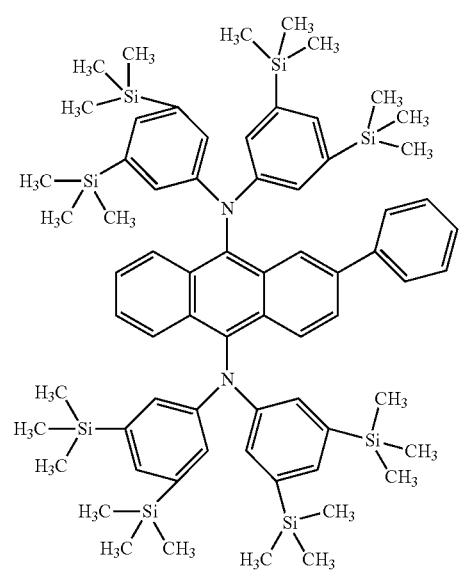

[Chemical Formula 12]
(224)
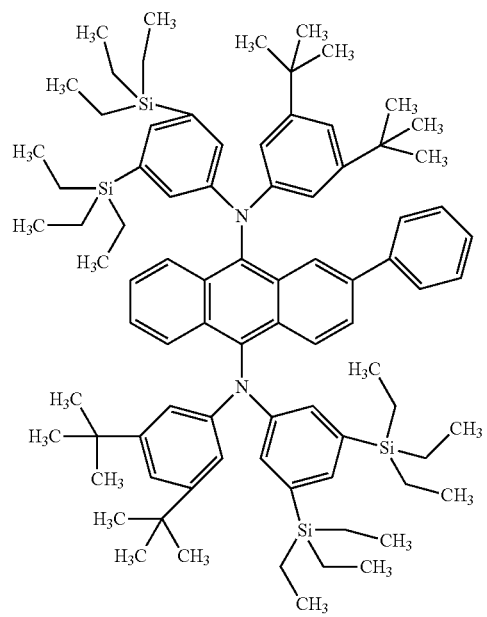
(225)
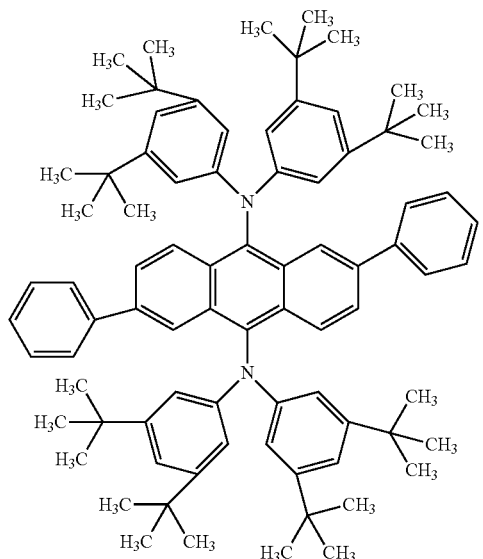
(226)
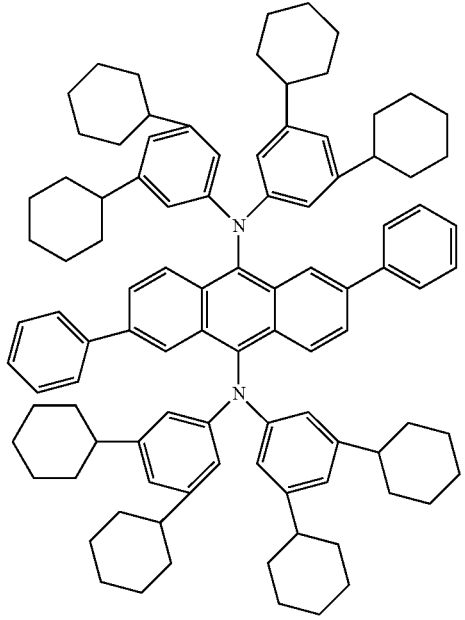
(227)
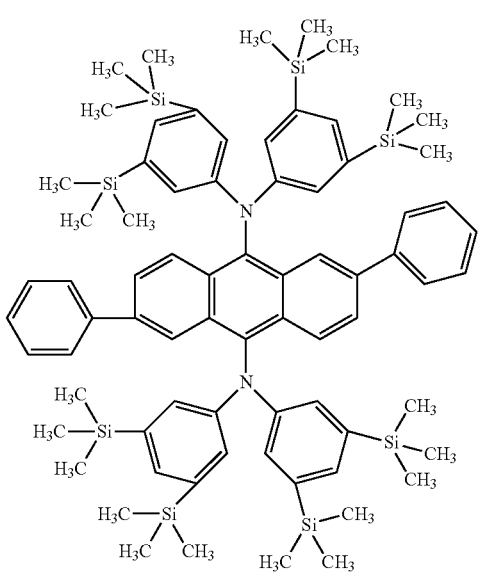

[Chemical Formula 13]
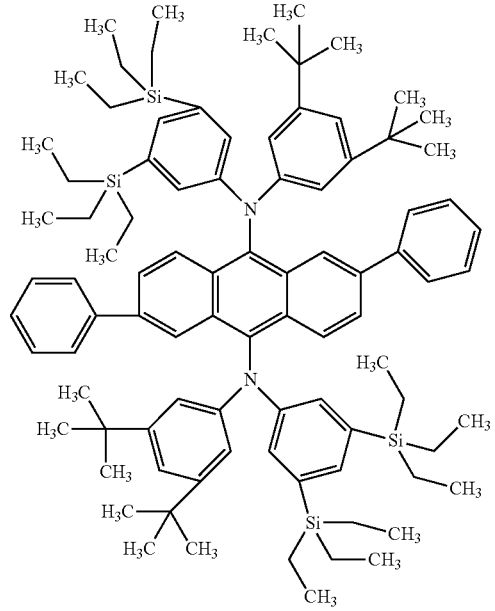
(228)
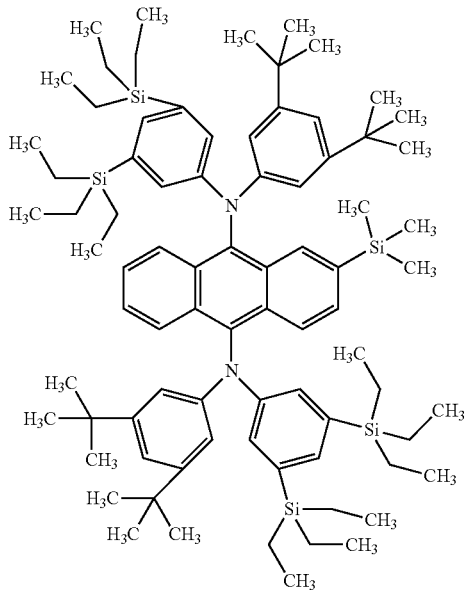
(230)
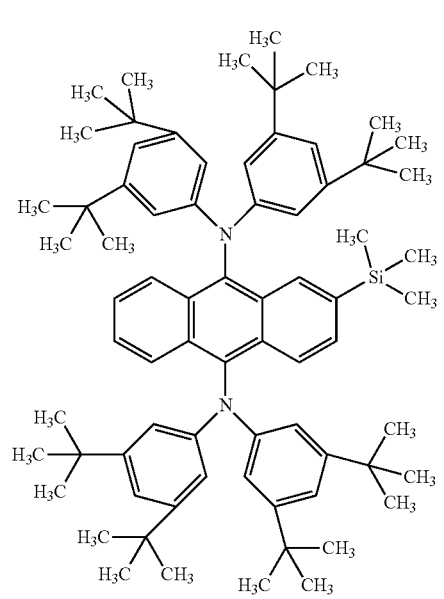
(229)
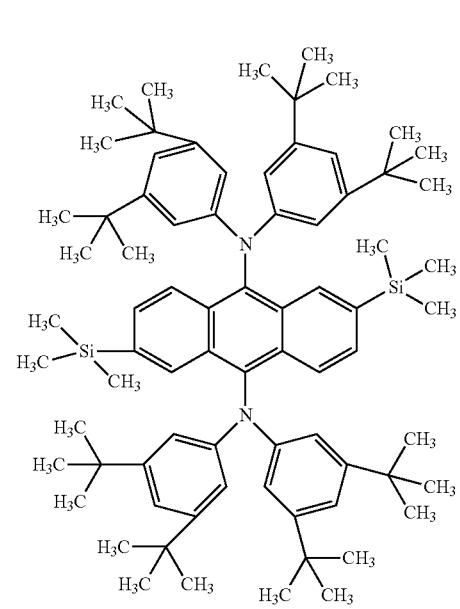
(231)

[Chemical Formula 14]
(232)
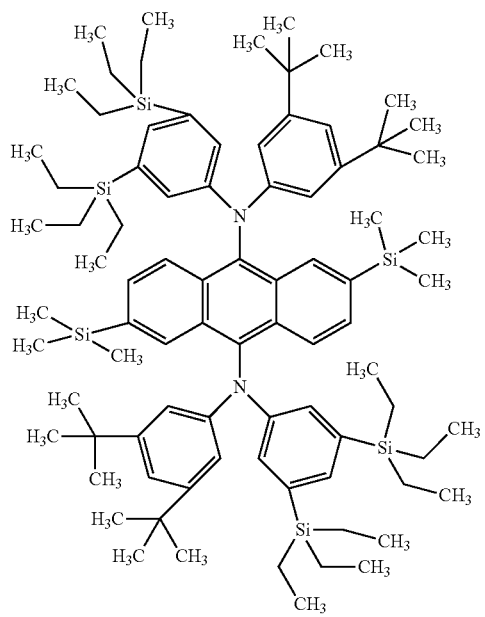
(233)
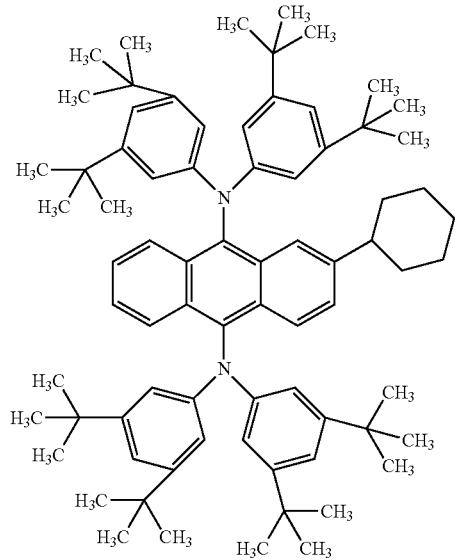
(234)
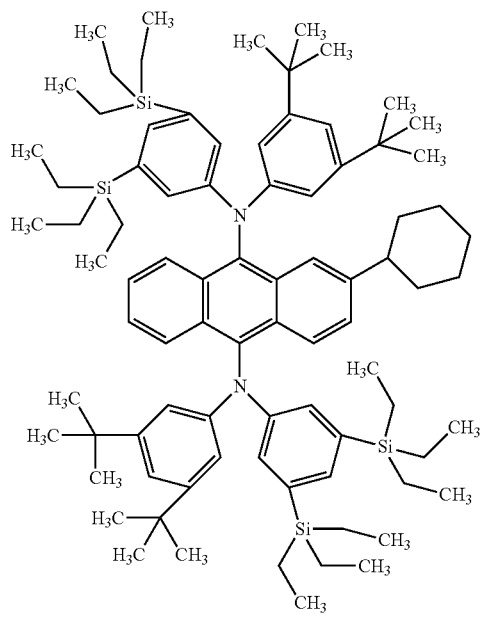
(235)
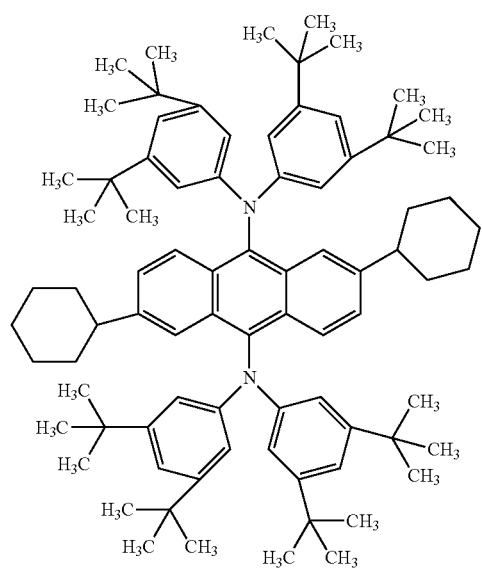

[Chemical Formula 15]
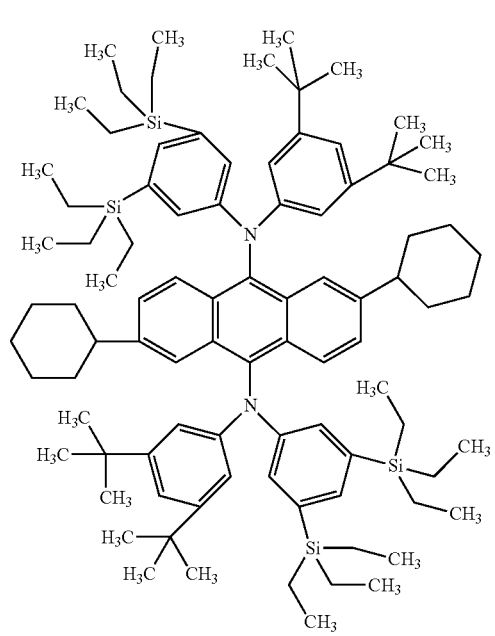
(236)
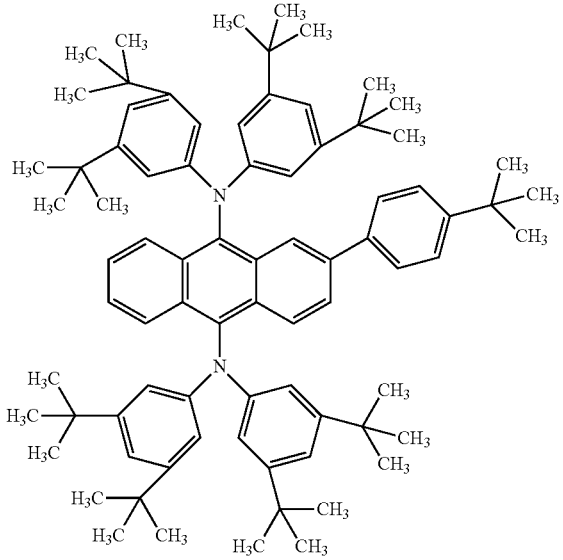
(238)
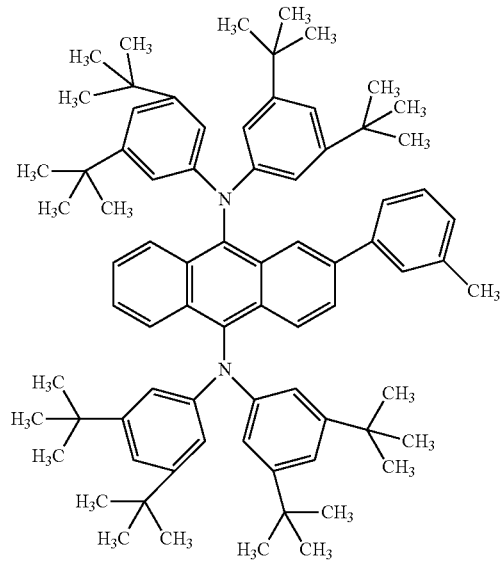
(237)
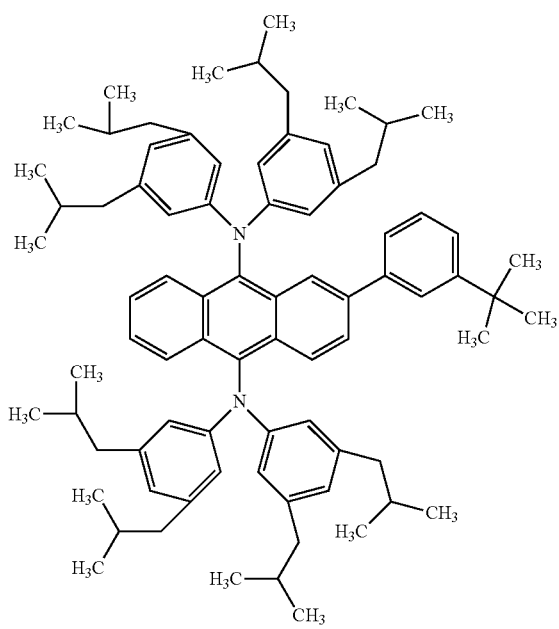
(239)

[Chemical Formula 16]
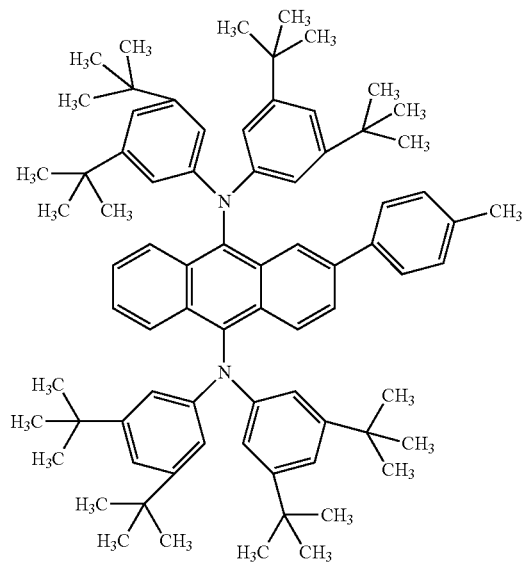
(240)
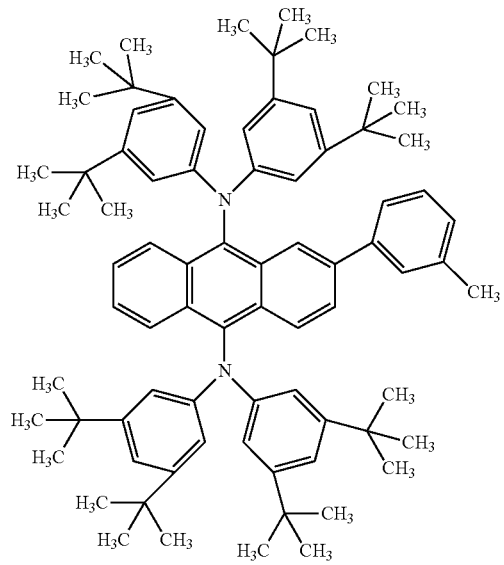
(241)
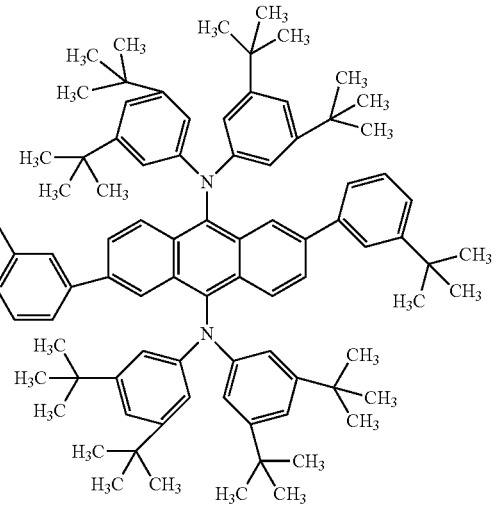
(242)
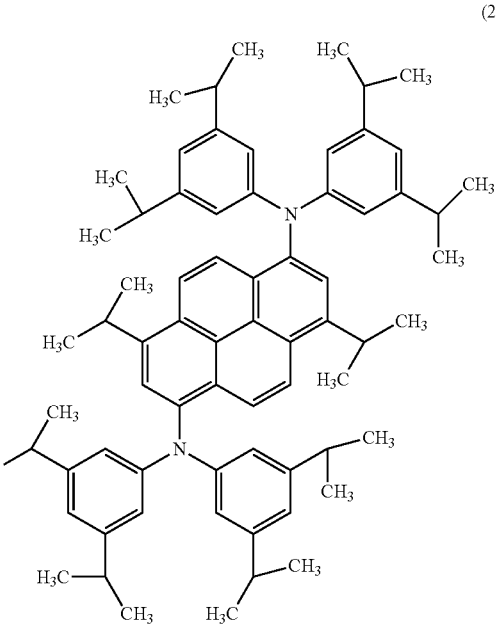
(243)

(244) 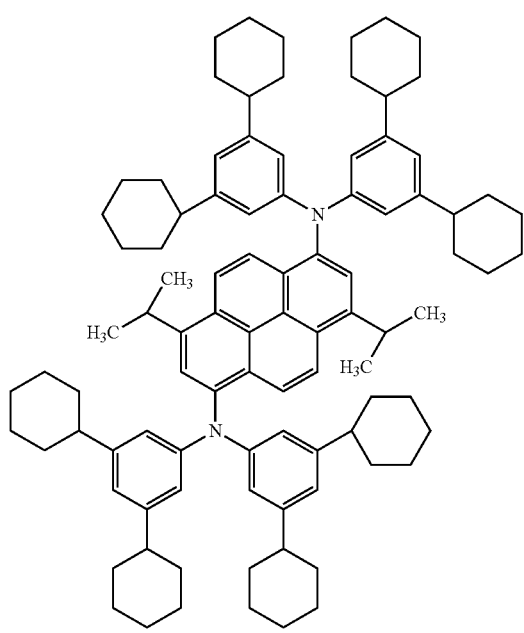
(245) 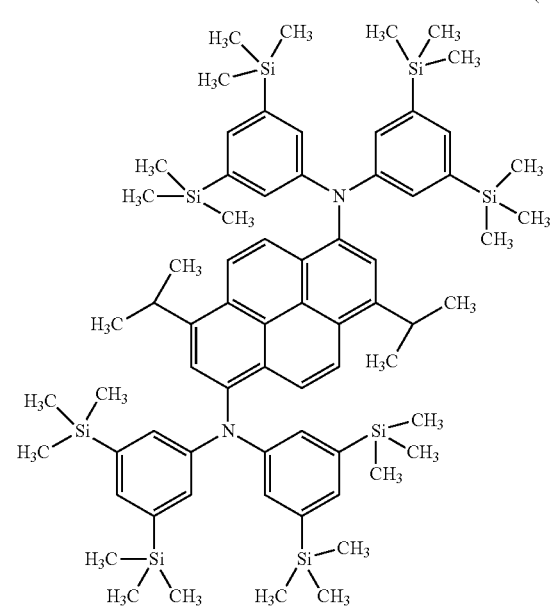
[Chemical Formula 17]
(246) 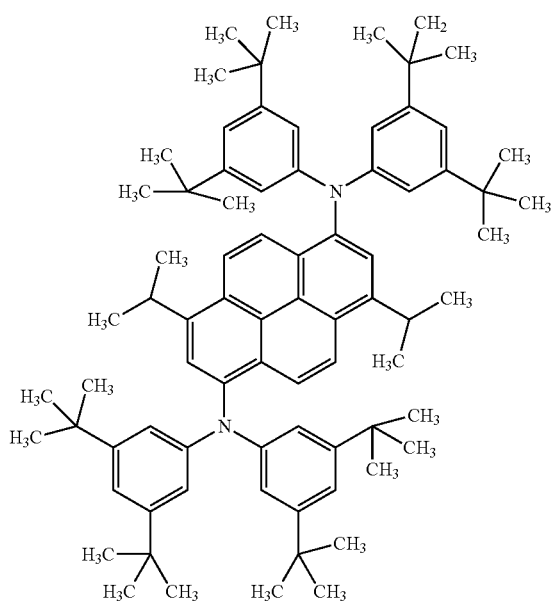
(247) 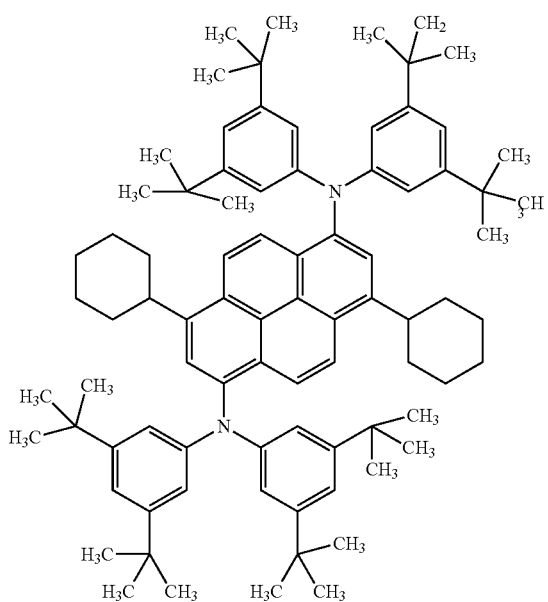

(248)
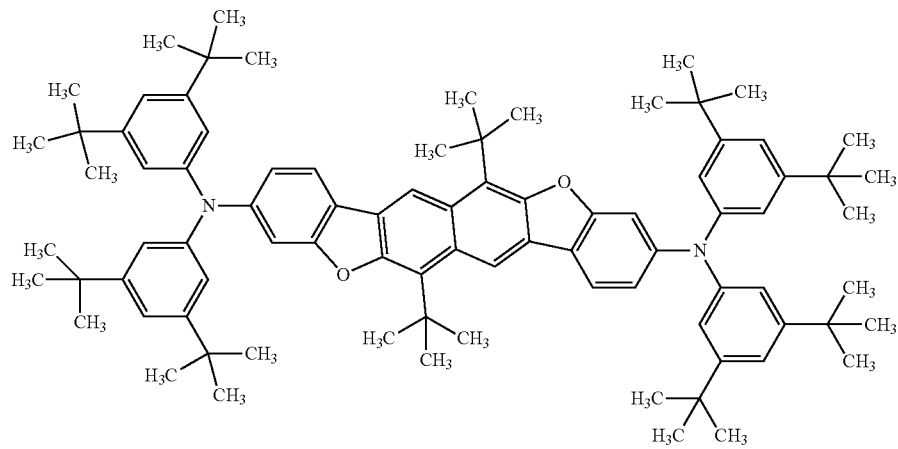
(249)
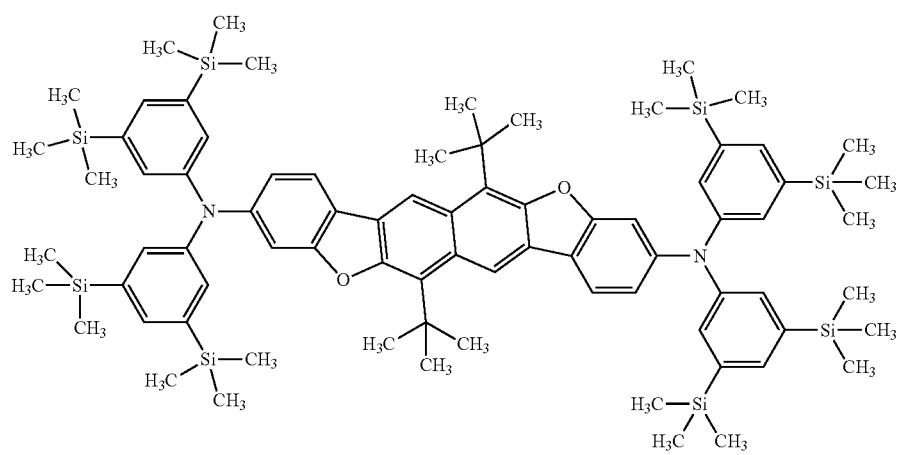
[Chemical Formula 18]
(250)
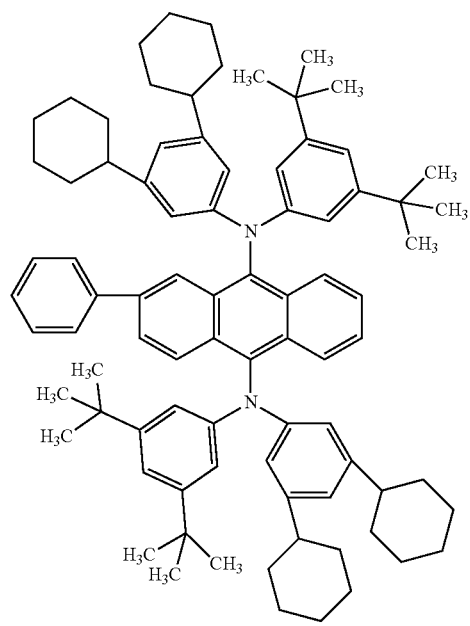
(251)
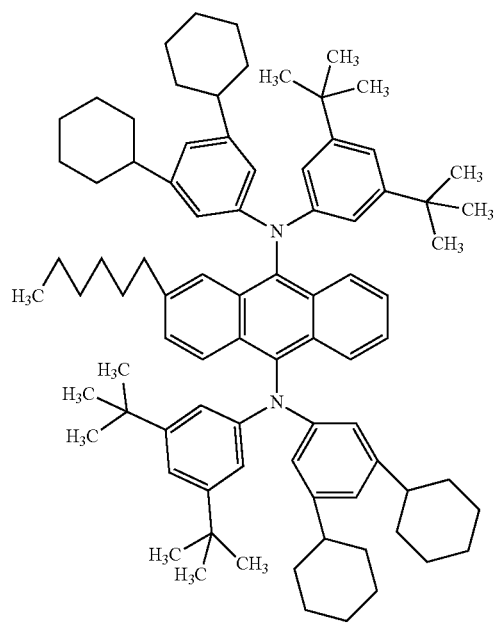

-continued
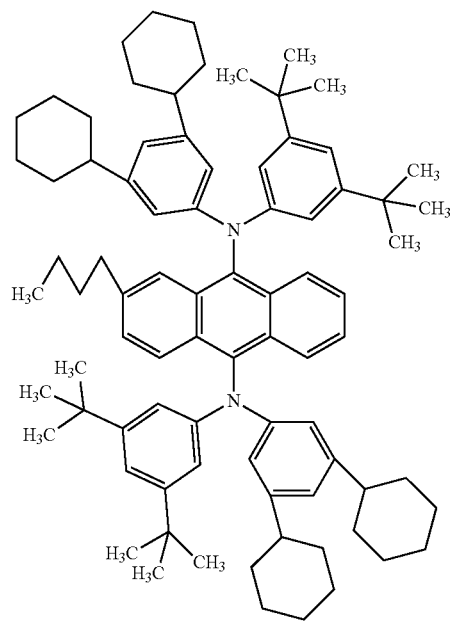
(252)
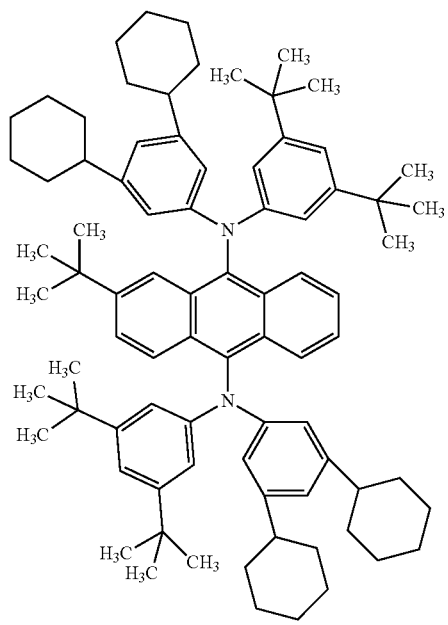
(253)
[Chemical Formula 19]
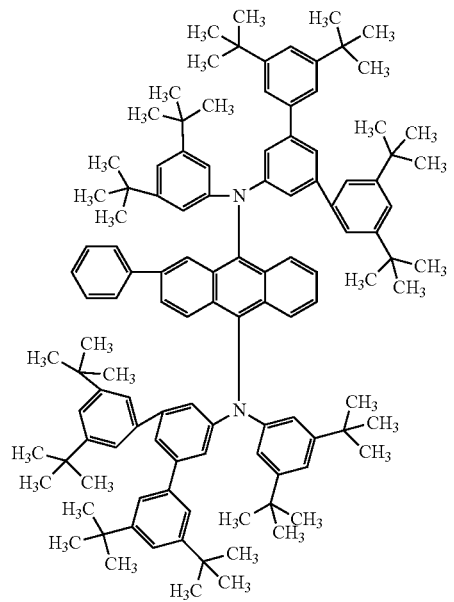
(254)
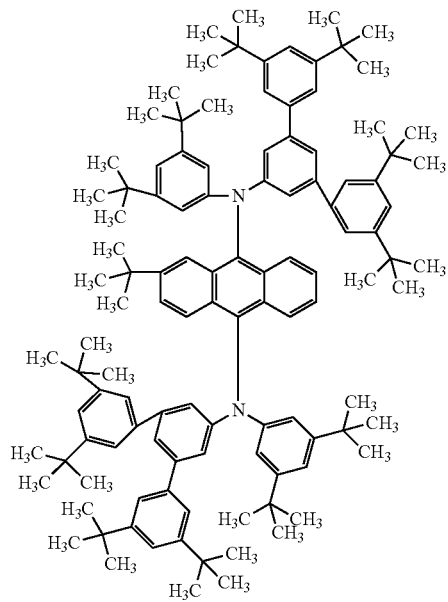
(255)

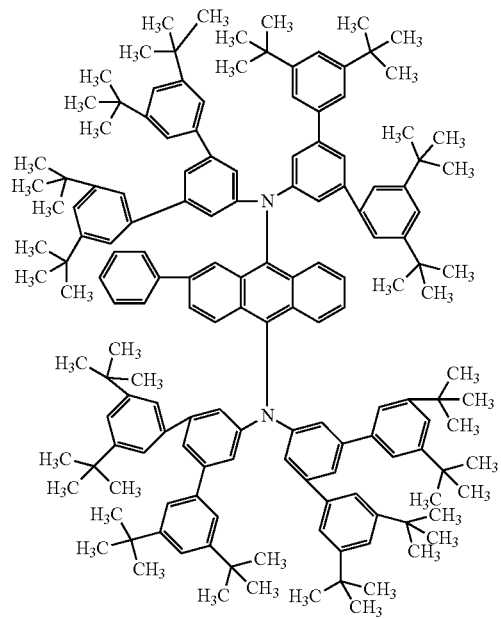
(256)
[Chemical Formula 20]
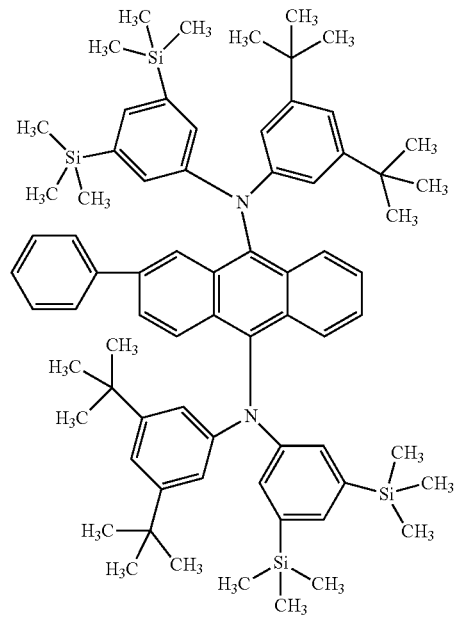
(257)
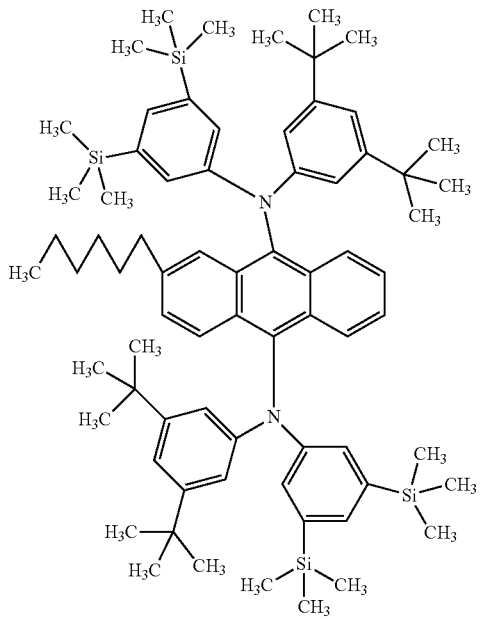
(258)

-continued
(259)
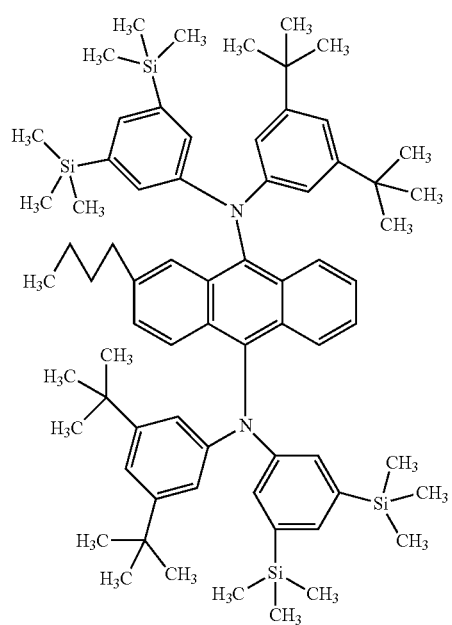
(260)
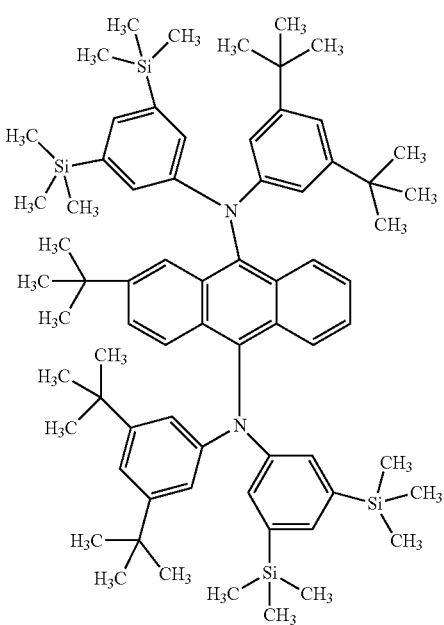
[Chemical Formula 21]
(262)
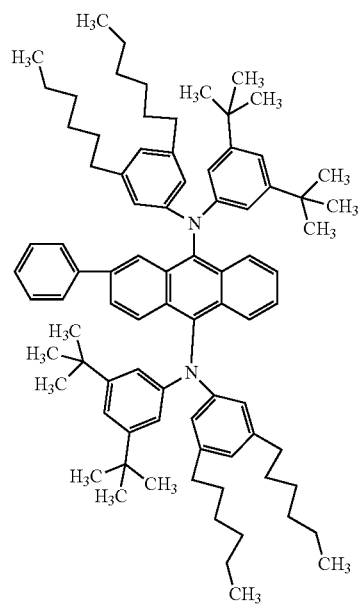
(262)
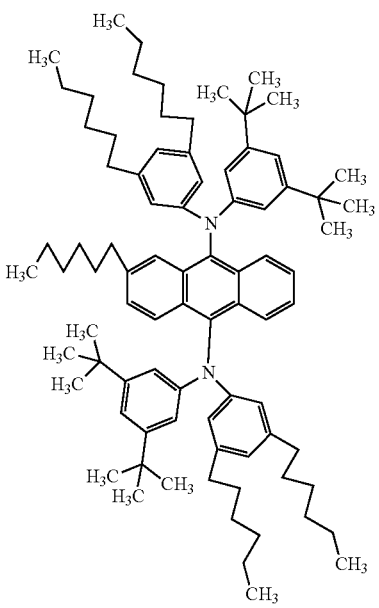

(262)
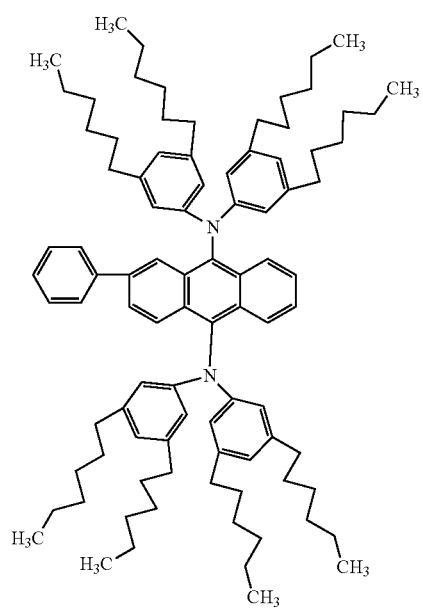
(263)
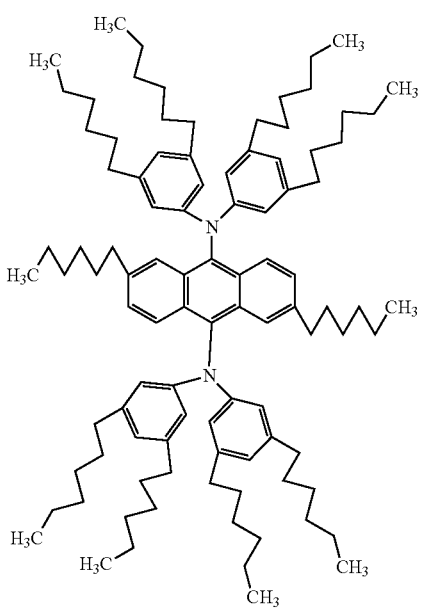
[Chemical Formula 22]
(264)
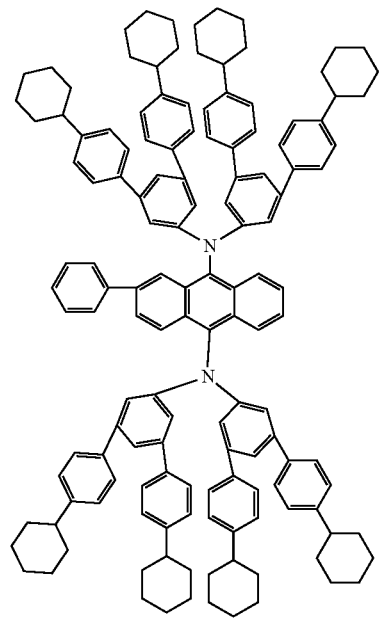
(265)
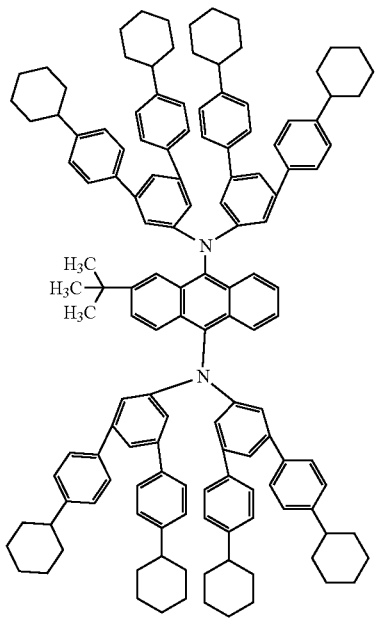

-continued
(267)
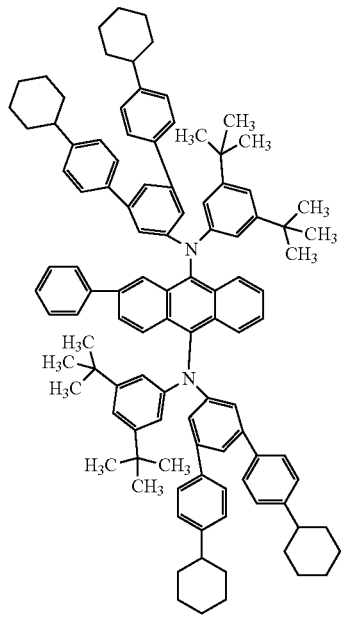
(268)
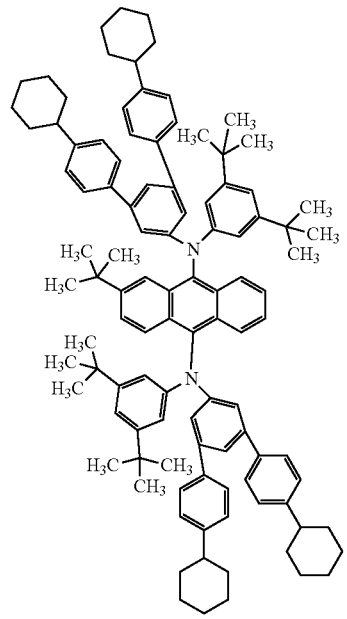
[Chemical Formula 23]
(269)
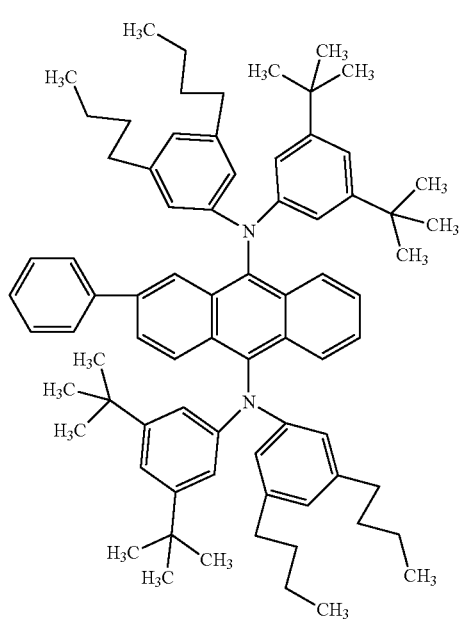
(270)
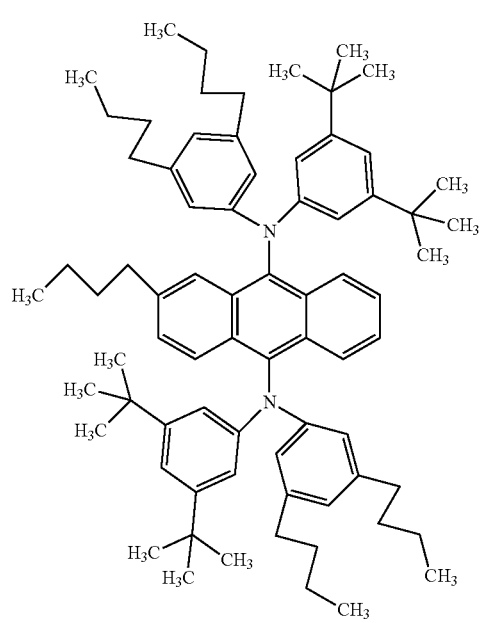

-continued
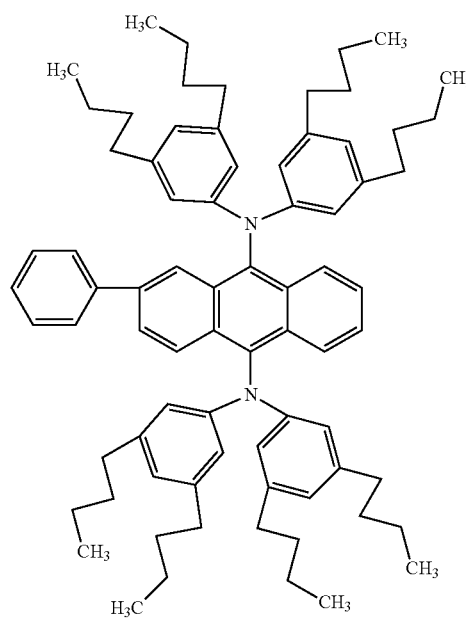
(271)
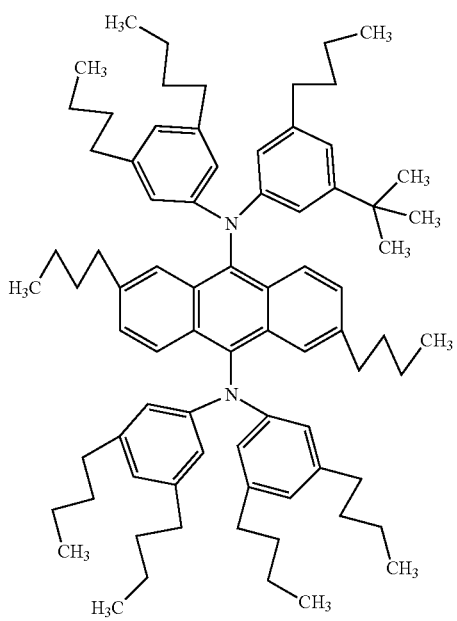
(272)
[Chemical Formula 24]
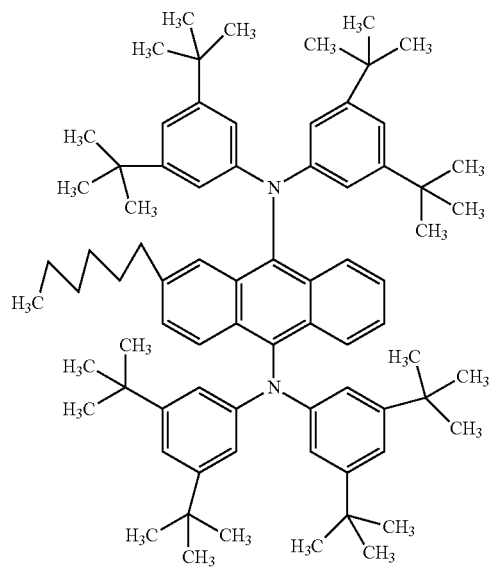
(273)
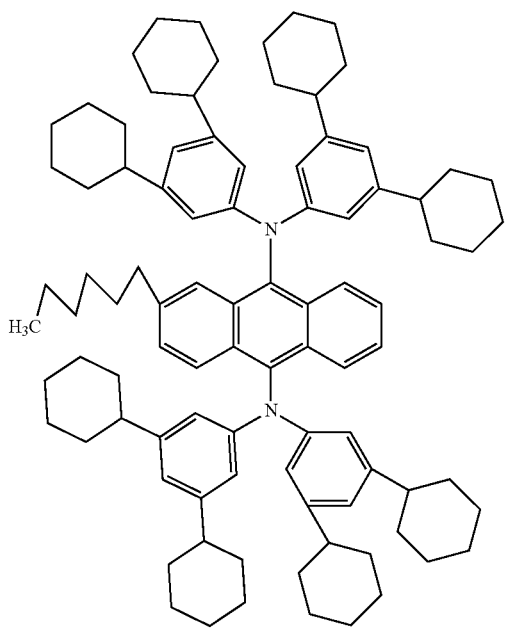
(274)

(275)
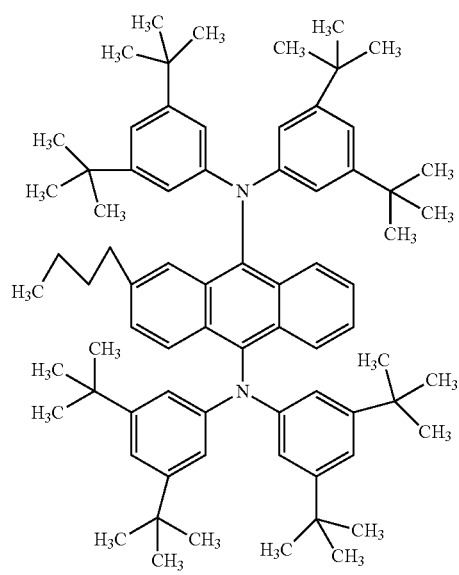
(276)
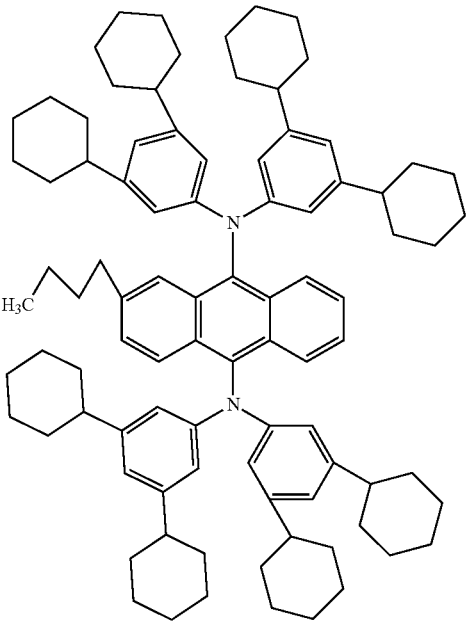
[Chemical Formula 25]
(277)
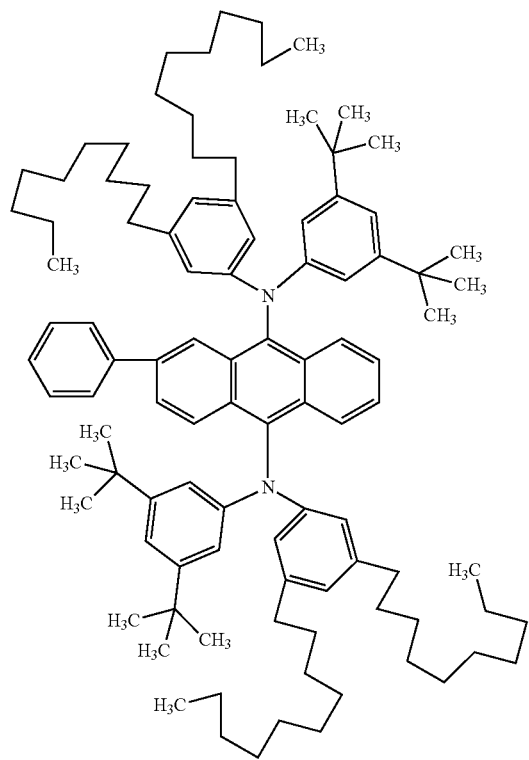
(278)
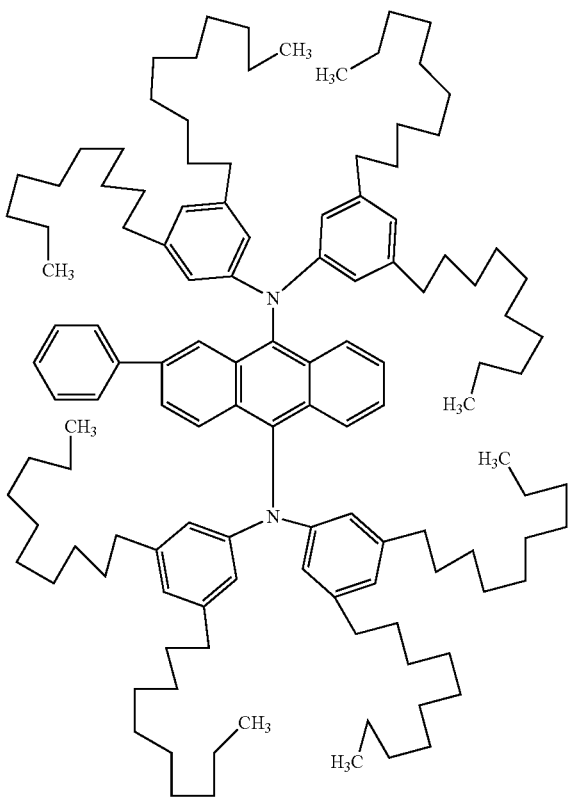

(279)
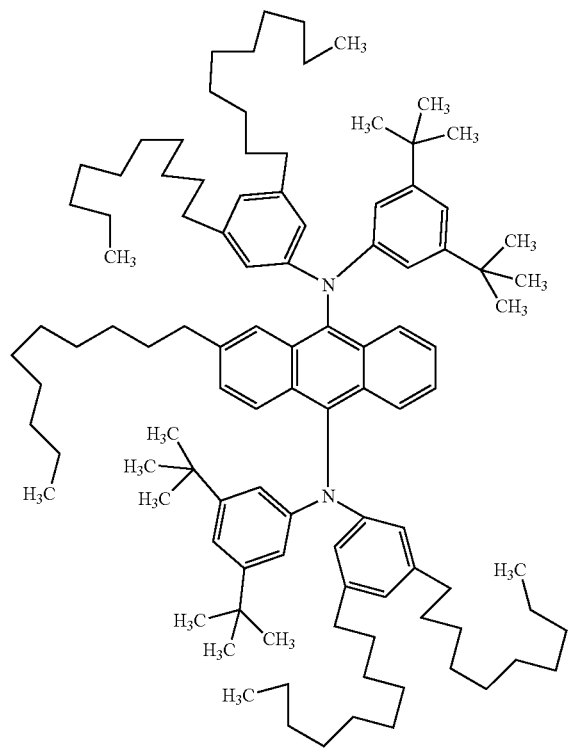
(280)
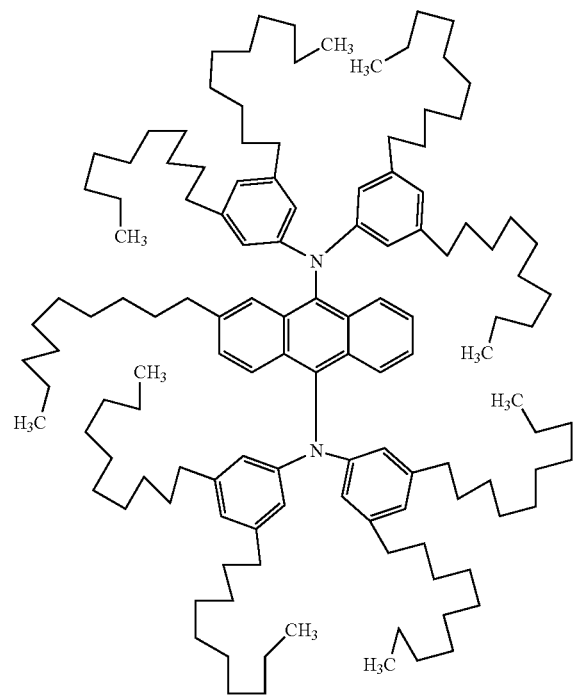
[Chemical Formula 26]
(281)
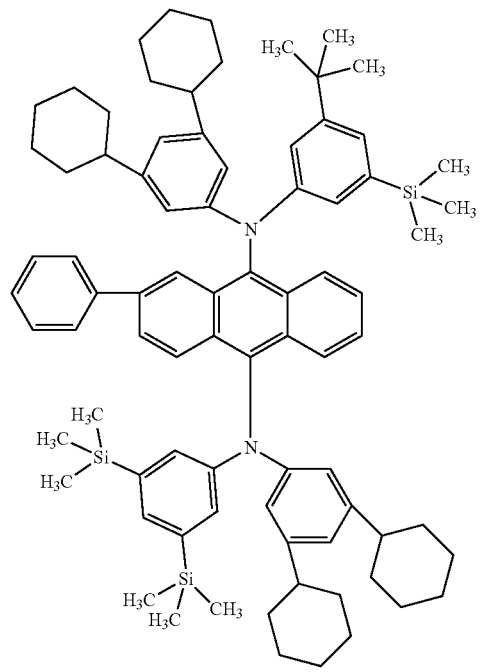
(282)
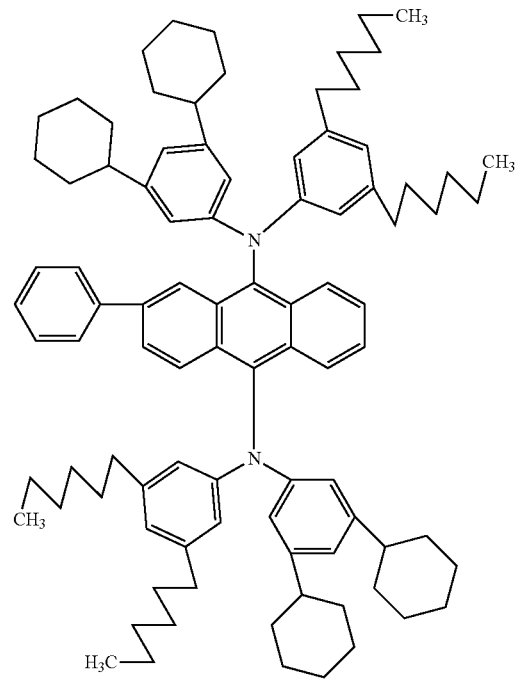

(283)

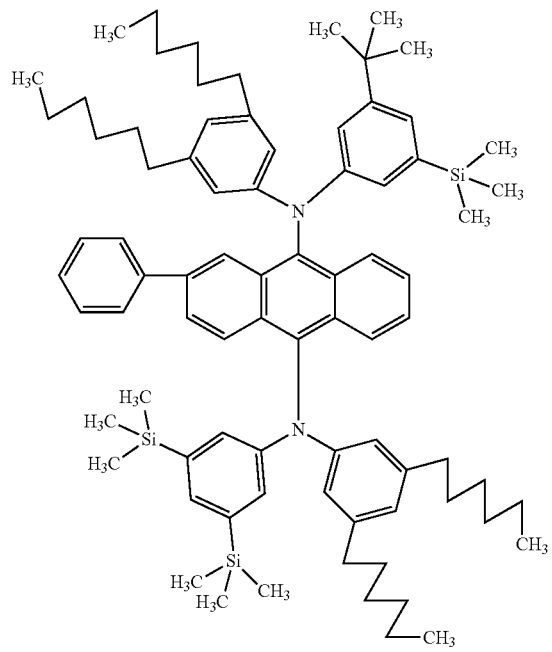

(284)

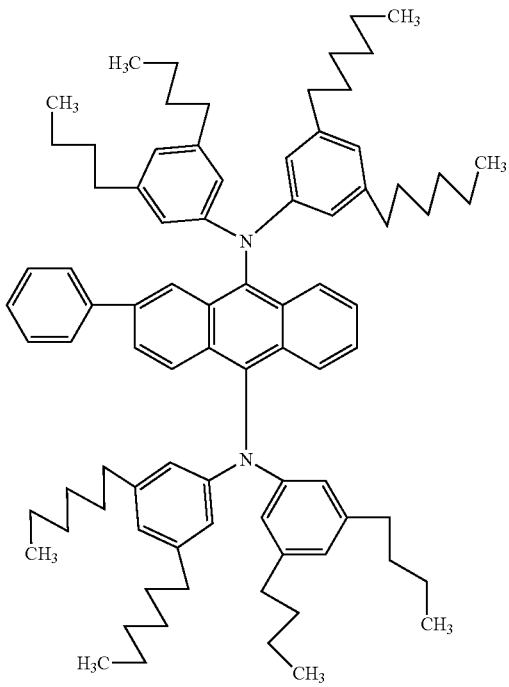

Examples of materials that can be favorably used as a guest material of the light-emitting device of one embodiment of the present invention are shown by Structural Formulae (100) and (101). Note that the guest material is not limited thereto.

[Chemical Formula 27]

(100)

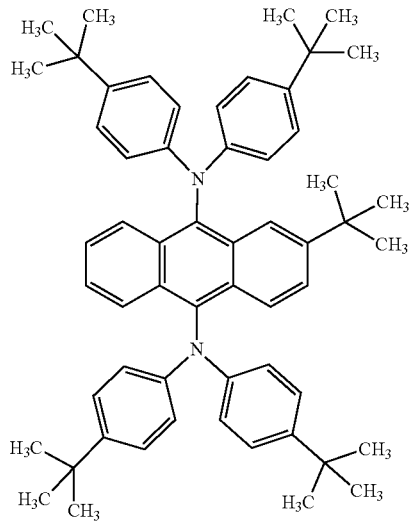

(101)

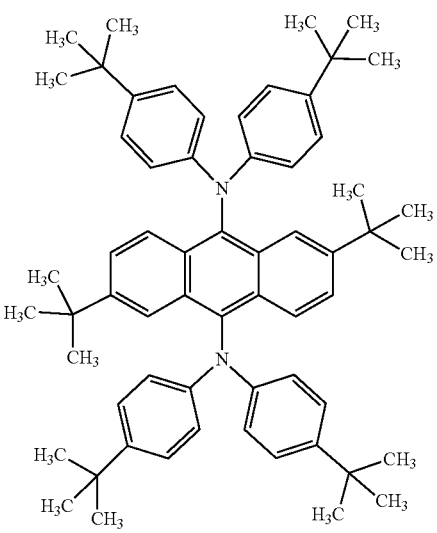

When the compound 133 serves as an energy donor, a TADF material can be used, for example. The energy difference between the S1 level and the T1 level of the compound 133 is preferably small, and specifically, greater than 0 eV and less than or equal to 0.2 eV. A TADF material can also be used as the compound 136.

The compound 133 and/or the compound 136 preferably includes a skeleton having a hole-transport property and a skeleton having an electron-transport property. Alternatively, the compound 133 and/or the compound 136 preferably includes a π-electron deficient skeleton and one of a π-electron rich skeleton and an aromatic amine skeleton. In that case, a donor-acceptor excited state is easily formed in a molecule. Furthermore, to increase both the donor property and the acceptor property in the molecule of the compound 133 and/or the compound 136, the skeleton having an electron-transport property and the skeleton having a hole-transport property are preferably directly bonded to each other. Alternatively, the π-electron deficient skeleton is preferably directly bonded to one of the π-electron rich skeleton and the aromatic amine skeleton. By improving both the donor property and the acceptor property in the molecule, an overlap between a region where the HOMO is distributed and a region where the LUMO is distributed in the compound 133 and/or the compound 136 can be small, and the energy difference between the singlet excitation energy level and the triplet excitation energy level of the compound 133 and/or the compound 136 can be small. Moreover, the triplet excitation energy level of the compound 133 and/or the compound 136 can be kept high.

In the case where the TADF material is composed of one kind of material, any of the following materials can be used, for example.

First, a fullerene, a derivative thereof, an acridine derivative such as proflavine, eosin, and the like can be enumerated. Other examples include a metal-containing porphyrin such as a porphyrin containing magnesium (Mg), zinc (Zn), cadmium (Cd), tin (Sn), platinum (Pt), indium (In), or palladium (Pd). Examples of the metal-containing porphyrin include a protoporphyrin-tin fluoride complex ($SnF_2$(Proto IX)), a mesoporphyrin-tin fluoride complex ($SnF_2$(Meso IX)), a hematoporphyrin-tin fluoride complex ($SnF_2$(Hemato IX)), a coproporphyrin tetramethyl ester-tin fluoride complex ($SnF_2$(Copro III-4Me)), an octaethylporphyrin-tin fluoride complex ($SnF_2$(OEP)), an etioporphyrin-tin fluoride complex ($SnF_2$(Etio I)), and an octaethylporphyrin-platinum chloride complex ($PtCl_2$(OEP)).

[Chemical Formula 28]

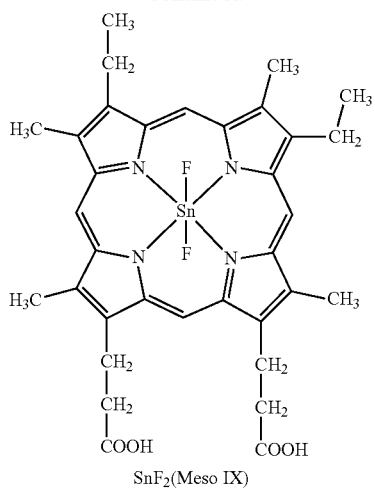

$SnF_2$(Meso IX)

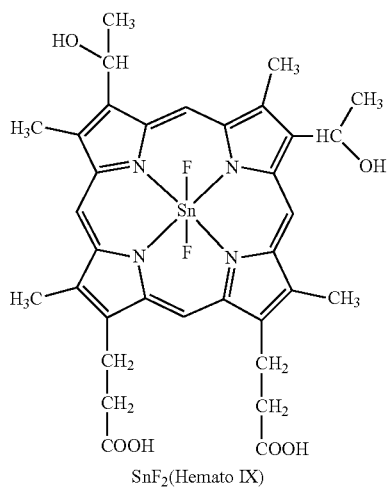

$SnF_2$(Hemato IX)

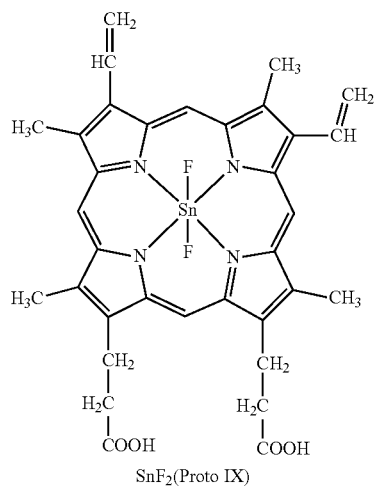

$SnF_2$(Proto IX)

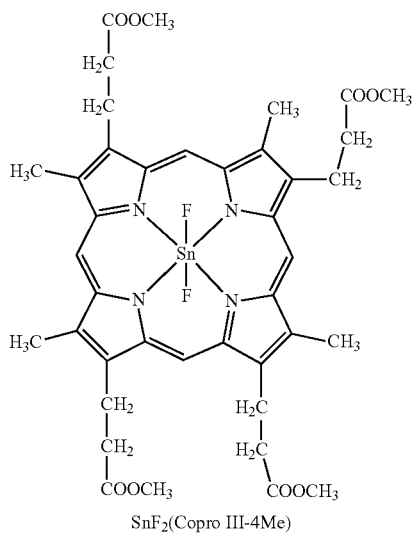

$SnF_2$(Copro III-4Me)

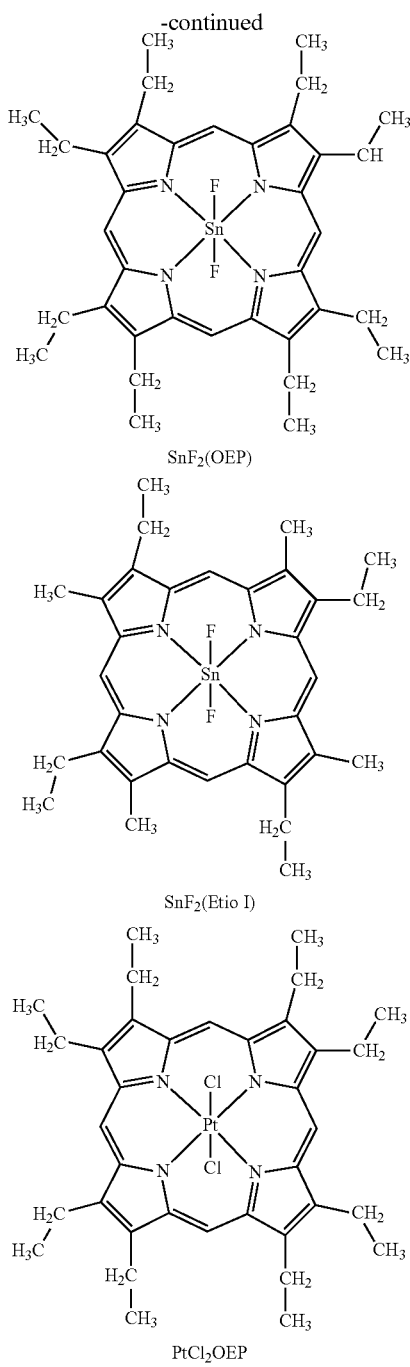

SnF$_2$(OEP)

SnF$_2$(Etio I)

PtCl$_2$OEP

As the TADF material composed of one kind of material, a heterocyclic compound having one or both a π-electron rich skeleton and a π-electron deficient skeleton can also be used. Specific examples include 2-(biphenyl-4-yl)-4,6-bis (12-phenylindolo[2,3-a]carbazol-11-yl)-1,3,5-triazine (abbreviation: PIC-TRZ), 2-{4-[3-(N-phenyl-9H-carbazol-3-yl)-9H-carbazol-9-yl]phenyl}-4,6-diphenyl-1,3,5-triazine (abbreviation: PCCzPTzn), 2-[4-(10H-phenoxazin-10-yl) phenyl]-4,6-diphenyl-1,3,5-triazine (abbreviation: PXZ-TRZ), 3-[4-(5-phenyl-5,10-dihydrophenazin-10-yl)phenyl]-4,5-diphenyl-1,2,4-triazole (abbreviation: PPZ-3TPT), 3-(9, 9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DPS), 10-phenyl-10H,10'H-spiro[acridin-9,9'-anthracen]-10'-one (abbreviation: ACRSA), 4-(9'-phenyl-3,3'-bi-9H-carbazol-9-yl)benzofuro[3,2-d]pyrimidine (abbreviation: 4PCCzBfpm), 4-[4-(9'-phenyl-3,3'-bi-9H-carbazol-9-yl) phenyl]benzofuro[3,2-d]pyrimidine (abbreviation: 4PCCzPBfpm), and 9-[3-(4,6-diphenyl-1,3,5-triazin-2-yl) phenyl]-9'-phenyl-2,3'-bi-9H-carbazole (abbreviation: mPCCzPTzn-02). The heterocyclic compound is preferred because of its high electron-transport and hole-transport properties due to the π-electron rich skeleton and the π-electron deficient skeleton contained therein. Among skeletons having the π-electron deficient heteroaromatic ring, a pyridine skeleton, a diazine skeleton (a pyrimidine skeleton, a pyrazine skeleton, and a pyridazine skeleton), and a triazine skeleton are preferable because of their high stability and reliability. In particular, a benzofuropyrimidine skeleton, a benzothienopyrimidine skeleton, a benzofuropyrazine skeleton, and a benzothienopyrazine skeleton are preferable because of their high acceptor properties and reliability. Among skeletons having the π-electron rich heteroaromatic ring, an acridine skeleton, a phenoxazine skeleton, a phenothiazine skeleton, a furan skeleton, a thiophene skeleton, and a pyrrole skeleton have high stability and reliability; therefore, at least one of these skeletons is preferably included. As a furan skeleton, a dibenzofuran skeleton is preferable. As a thiophene skeleton, a dibenzothiophene skeleton is preferable. As a pyrrole skeleton, an indole skeleton, a carbazole skeleton, a bicarbazole skeleton, and a 3-(9-phenyl-9H-carbazol-3-yl)-9H-carbazole skeleton are particularly preferable. Note that a substance in which a π-electron rich heteroaromatic ring is directly bonded to a it-electron deficient heteroaromatic ring is particularly preferably used because the donor property of the it-electron rich heteroaromatic ring and the acceptor property of the π-electron deficient heteroaromatic ring are both increased and the difference between the level of the singlet excited state and the level of the triplet excited state becomes small. Note that an aromatic ring to which an electron-withdrawing group such as a cyano group is bonded may be used instead of the π-electron deficient heteroaromatic ring.

[Chemical Formula 29]

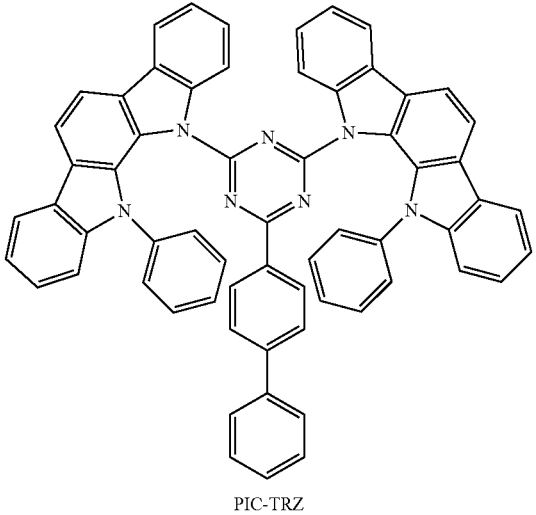

PIC-TRZ

-continued

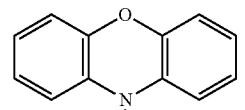

PXZ-TRZ

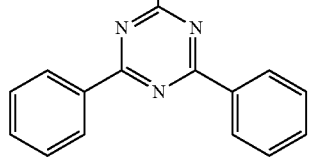

PPZ-3TPT

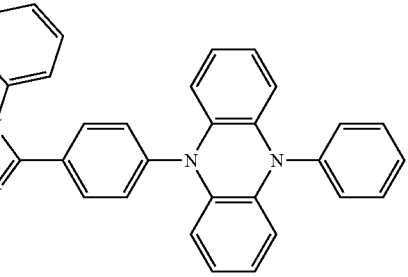

PCCzPTzn

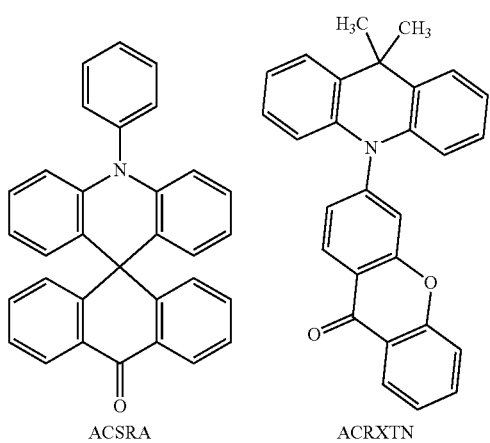

ACSRA          ACRXTN

-continued

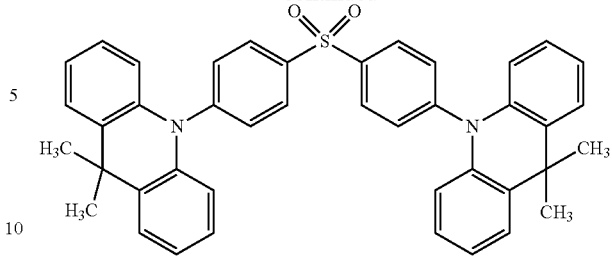

DMAC-DPS

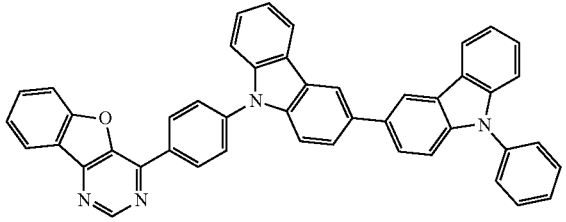

4PCCzPBfpm

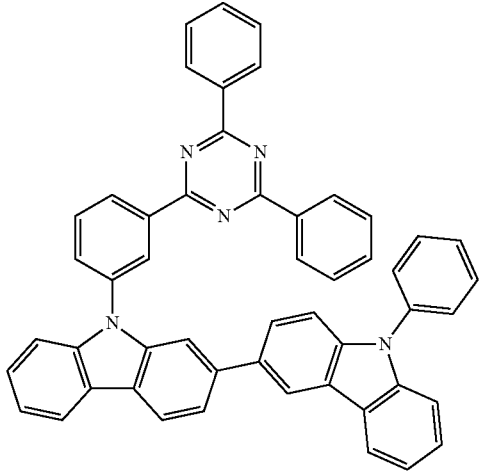

mPCCzPTzn-02

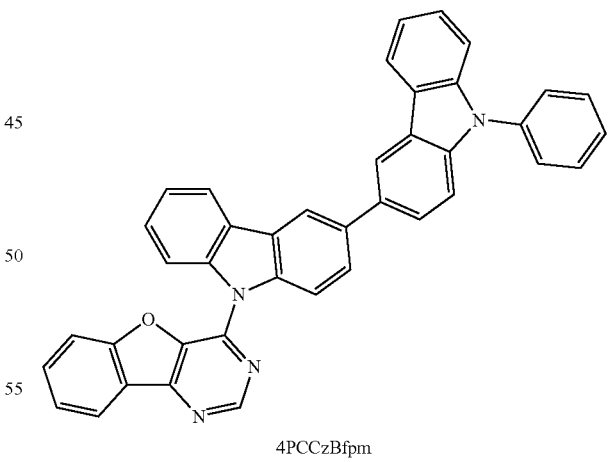

4PCCzBfpm

In the case where the compound 133 does not have a function of converting triplet excitation energy into light emission, compounds that form an exciplex in combination are preferably used as the compound 131 and the compound 133; however, there is no particular limitation on the compounds. It is preferred that one of the compounds have a function of transporting electrons and the other have a function of transporting holes.

Examples of the compound 131 include a zinc- or aluminum-based metal complex, an oxadiazole derivative, a triazole derivative, a benzimidazole derivative, a quinoxaline derivative, a dibenzoquinoxaline derivative, a dibenzothiophene derivative, a dibenzofuran derivative, a pyrimidine derivative, a triazine derivative, a pyridine derivative, a bipyridine derivative, a phenanthroline derivative, and the like. Other examples are an aromatic amine and a carbazole derivative.

Alternatively, any of the following hole-transport materials and electron-transport materials can be used as the compound 131.

A material having a property of transporting more holes than electrons can be used as a hole-transport material, and a material having a hole mobility of $1 \times 10^{-6}$ cm$^2$Vs or higher is preferred. Specifically, an aromatic amine, a carbazole derivative, an aromatic hydrocarbon, a stilbene derivative, or the like can be used. Furthermore, the hole-transport material may be a high molecular compound.

Examples of the material having a high hole-transport property include aromatic amine compounds such as N,N-di(p-tolyl)-N,N-diphenyl-p-phenylenediamine (abbreviation: DTDPPA), 4,4'-bis[N-(4-diphenylaminophenyl)-N-phenylamino]biphenyl (abbreviation: DPAB), N,N-bis{4-[bis(3-methylphenyl)amino]phenyl}-N,N'-diphenyl-(1,1'-biphenyl)-4,4'-diamine (abbreviation: DNTPD), and 1,3,5-tris[N-(4-diphenylaminophenyl)-N-phenylamino]benzene (abbreviation: DPA3B).

Specific examples of the carbazole derivative include 3-[N-(4-diphenylaminophenyl)-N-phenylamino]-9-phenylcarbazole (abbreviation: PCzDPA1), 3,6-bis[N-(4-diphenylaminophenyl)-N-phenylamino]-9-phenylcarbazole (abbreviation: PCzDPA2), 3,6-bis[N-(4-diphenylaminophenyl)-N-(1-naphthyl)amino]-9-phenylcarbazole (abbreviation: PCzTPN2), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), and 3-[N-(1-naphthyl)-N-(9-phenylcarbazol-3-yl)amino]-9-phenylcarbazole (abbreviation: PCzPCN1).

Other examples of the carbazole derivative include 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), and 1,4-bis[4-(N-carbazolyl)phenyl]-2,3,5,6-tetraphenylbenzene.

Examples of the aromatic hydrocarbon include 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, and 2,5,8,11-tetra(tert-butyl)perylene. Other examples include pentacene and coronene. The aromatic hydrocarbon having a hole mobility of $1 \times 10^{-6}$ cm$^2$Vs or higher and having 14 to 42 carbon atoms is particularly preferable.

The aromatic hydrocarbon may have a vinyl skeleton. Examples of the aromatic hydrocarbon having a vinyl group include 4,4'-bis(2,2-diphenylvinyl)biphenyl (abbreviation: DPVBi) and 9,10-bis[4-(2,2-diphenylvinyl)phenyl]anthracene (abbreviation: DPVPA).

Other examples include high molecular compounds such as poly(N-vinylcarbazole) (abbreviation: PVK), poly(4-vinyltriphenylamine) (abbreviation: PVTPA), poly[N-(4-{V-[4-(4-diphenylamino)phenyl]phenyl-N-phenylamino}phenyl)methacrylamide](abbreviation: PTPDMA), and poly[N,N'-bis(4-butylphenyl)-N,N'-bis(phenyl)benzidine](abbreviation: poly-TPD).

Examples of the material having a high hole-transport property include aromatic amine compounds such as 4,4'-bis[N-(1-naphthyl)-N-phenylamino]biphenyl (abbreviation: NPB or α-NPD), N,N-bis(3-methylphenyl)-N,N-diphenyl-[1,1'-biphenyl]-4,4'-diamine (abbreviation: TPD), 4,4',4"-tris(carbazol-9-yl)triphenylamine (abbreviation: TCTA), 4,4',4"-tris[N-(1-naphthyl)-N-phenylamino]triphenylamine (abbreviation: 1'-TNATA), 4,4',4"-tris(N,N-diphenylamino)triphenylamine (abbreviation: TDATA), 4,4',4"-tris[N-(3-methylphenyl)-N-phenylamino]triphenylamine (abbreviation: m-MTDATA), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), N-(9,9-dimethyl-9H-fluoren-2-yl)-N-{9,9-dimethyl-2-[N-phenyl-N-(9,9-dimethyl-9H-fluoren-2-yl)amino]-9H-fluoren-7-yl}phenylamine (abbreviation: DFLADFL), N-(9,9-dimethyl-2-diphenylamino-9H-fluoren-7-yl)diphenylamine (abbreviation: DPNF), 2-[N-(4-diphenylaminophenyl)-N-phenylamino]spiro-9,9'-bifluorene (abbreviation: DPASF), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), 4-phenyldiphenyl-(9-phenyl-9H-carbazol-3-yl)amine (abbreviation: PCA1BP), N,N'-bis(9-phenylcarbazol-3-yl)-N,N-diphenylbenzene-1,3-diamine (abbreviation: PCA2B), N,N,N"-triphenyl-N,N,N'-tris(9-phenylcarbazol-3-yl)benzene-1,3,5-triamine (abbreviation: PCA3B), N-(4-biphenyl)-N-(9,9-dimethyl-9H-fluoren-2-yl)-9-phenyl-9H-carbazol-3-amine (abbreviation: PCBiF), N-(1,1'-biphenyl-4-yl)-N-[4-(9-phenyl-9H-carbazol-3-yl)phenyl]-9,9-dimethyl-9H-fluoren-2-amine (abbreviation: PCBBiF), 9,9-dimethyl-N-phenyl-N-[4-(9-phenyl-9H-carbazol-3-yl)phenyl]fluoren-2-amine (abbreviation: PCBAF), N-phenyl-N-[4-(9-phenyl-9H-carbazol-3-yl)phenyl]spiro-9,9'-bifluoren-2-amine (abbreviation: PCBASF), 2-[N-(9-phenylcarbazol-3-yl)-N-phenylamino]spiro-9,9'-bifluorene (abbreviation: PCASF), 2,7-bis[N-(4-diphenylaminophenyl)-N-phenylamino]-spiro-9,9'-bifluorene (abbreviation: DPA2SF), N-[4-(9H-carbazol-9-yl)phenyl]-N-(4-phenyl)phenylaniline (abbreviation: YGA1BP), and N,N-bis[4-(carbazol-9-yl)phenyl]-N,N-diphenyl-9,9-dimethylfluorene-2,7-diamine (abbreviation: YGA2F). Other examples include amine compounds, carbazole compounds, thiophene compounds, furan compounds, fluorene compounds, triphenylene compounds, phenanthrene compounds, and the like such as 3-[4-(1-naphthyl)-phenyl]-9-phenyl-9H-carbazole (abbreviation: PCPN), 3-[4-(9-phenanthryl)-phenyl]-9-phenyl-9H-carbazole (abbreviation: PCPPn), 3,3'-bis(9-phenyl-9H-carbazole) (abbreviation: PCCP), 1,3-bis(N-carbazolyl)benzene (abbreviation: mCP), 3,6-bis(3,5-diphenylphenyl)-9-phenylcarbazole (abbreviation: CzTP), 4-{3-[3-(9-phenyl-9H-fluoren-9-yl)phenyl]phenyl}dibenzofuran (abbreviation: mmDBFFLBi-II), 4,4',4"-(benzene-1,3,5-triyl)tri(dibenzofuran) (abbreviation: DBF3P-II), 1,3,5-tri(dibenzothiophen-4-yl)-benzene (abbreviation: DBT3P-II), 2,8-diphenyl-4-[4-(9-phenyl-9H-fluoren-9-yl)phenyl]dibenzothiophene (abbreviation: DBTFLP-III), 4-[4-(9-phenyl-9H-fluoren-9-yl)phenyl]-6-phenyldibenzothiophene (abbreviation: DBTFLP-IV), and 4-[3-(triphenylen-2-yl)phenyl]dibenzothiophene (abbreviation: mDBTPTp-II). The substances described here are mainly substances having a hole mobility of $1\times10^{-6}$ cm$^2$Vs or higher. Note that other than these substances, any substance that has a property of transporting more holes than electrons may be used.

A material having a property of transporting more electrons than holes can be used as the electron-transport material, and a material having an electron mobility of $1\times10^{-6}$ cm$^2$/Vs or higher is preferable. As a material that easily accepts electrons (the material having an electron-transport property), a π-electron deficient heteroaromatic compound such as a nitrogen-containing heteroaromatic compound, a metal complex, or the like can be used. Specific examples include a metal complex having a quinoline ligand, a benzoquinoline ligand, an oxazole ligand, or a thiazole ligand; an oxadiazole derivative; a triazole derivative; a phenanthroline derivative; a pyridine derivative; a bipyridine derivative; and a pyrimidine derivative.

Examples of the electron-transport material include metal complexes having a quinoline skeleton or a benzoquinoline skeleton, such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq2), bis(2-methyl-8-quinolinolato)(4-phenylphenolato)aluminum(III) (abbreviation: BAlq), and bis(8-quinolinolato)zinc(II) (abbreviation: Znq). Alternatively, a metal complex having an oxazole-based or thiazole-based ligand, such as bis[2-(2-benzoxazolyl)phenolato]zinc(II) (abbreviation: ZnPBO) or bis[2-(2-benzothiazolyl)phenolato]zinc(II) (abbreviation: ZnBTZ) can be used. Other than such metal complexes, any of the following can be used: heterocyclic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 3-(4-biphenylyl)-4-phenyl-5-(4-tert-butylphenyl)-1,2,4-triazole (abbreviation: TAZ), 2,2',2''-(1,3,5-benzenetriyl)tris(1-phenyl-1H-benzimidazole) (abbreviation: TPBI), 2-[3-(dibenzothiophen-4-yl)phenyl]-1-phenyl-1H-benzimidazole (abbreviation: mDBTBIm-II), bathophenanthroline (abbreviation: BPhen), 2,9-bis(naphthalen-2-yl)-4,7-diphenyl-1,10-phenanthroline (abbreviation: NBPhen), and bathocuproine (abbreviation: BCP); heterocyclic compounds having a diazine skeleton, such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 2-[4-(3,6-diphenyl-9H-carbazol-9-yl)phenyl]dibenzo[f,h]quinoxaline (abbreviation: 2CzPDBq-III), 7-[3-(dibenzothiophen-4-yl)phenyl]dibenzo[f,h]quinoxaline (abbreviation: 7mDBTPDBq-II), 6-[3-(dibenzothiophen-4-yl)phenyl]dibenzo[f,h]quinoxaline (abbreviation: 6mDBTPDBq-II), 4,6-bis[3-(phenanthren-9-yl)phenyl]pyrimidine (abbreviation: 4,6mPnP2Pm), 4,6-bis[3-(4-dibenzothienyl)phenyl]pyrimidine (abbreviation: 4,6mDBTP2Pm-II), and 4,6-bis[3-(9H-carbazol-9-yl)phenyl]pyrimidine (abbreviation: 4,6mCzP2Pm); heterocyclic compounds having a triazine skeleton, such as 2-{4-[3-(N-phenyl-9H-carbazol-3-yl)-9H-carbazol-9-yl]phenyl}-4,6-diphenyl-1,3,5-triazine (abbreviation: PCCzPTzn); heterocyclic compounds having a pyridine skeleton, such as 3,5-bis[3-(9H-carbazol-9-yl)phenyl]pyridine (abbreviation: 35DCzPPy) and 1,3,5-tri[3-(3-pyridyl)phenyl]benzene (abbreviation: TmPyPB); and heteroaromatic compounds such as 4,4'-bis(5-methylbenzoxazol-2-yl)stilbene (abbreviation: BzOs). Further alternatively, a high molecular compound such as poly(2,5-pyridinediyl) (abbreviation: PPy), poly[(9,9-dihexylfluorene-2,7-diyl)-co-(pyridine-3,5-diyl)](abbreviation: PF-Py), or poly[(9,9-dioctylfluorene-2,7-diyl)-co-(2,2'-bipyridine-6,6'-diyl)](abbreviation: PF-BPy) can be used. The substances described here are mainly substances having an electron mobility of $1\times10^{-6}$ cm$^2$/Vs or higher. Note that other than these substances, any substance that has a property of transporting more electrons than holes may be used.

As the compound 133, a material that can form an exciplex together with the compound 131 is preferably used. Specifically, any of the above hole-transport materials and the above electron-transport materials can be used. In that case, it is preferred that the compound 131, the compound 133, and the compound 132 (fluorescent material) be selected such that the emission peak of the exciplex formed by the compound 131 and the compound 133 overlaps with an absorption band on the longest wavelength side (low energy side) of the compound 132 (fluorescent material). This makes it possible to provide a light-emitting device with drastically improved luminous efficiency.

A phosphorescent material can be used as the compound 133 and/or the compound 136. An example of a phosphorescent material is an iridium-, rhodium-, or platinum-based organometallic complex or metal complex. Another example is a platinum complex or organoiridium complex having a porphyrin ligand; in particular, an organoiridium complex such as an iridium-based ortho-metalated complex is preferable. As an ortho-metalated ligand, a 4H-triazole ligand, a 1H-triazole ligand, an imidazole ligand, a pyridine ligand, a pyrimidine ligand, a pyrazine ligand, an isoquinoline ligand, and the like can be used. In this case, the compound 133 (phosphorescent material) has an absorption band of triplet metal to ligand charge transfer (MLCT) transition. It is preferred that the compound 133 and the compound 132 (fluorescent material) be selected so that the emission peak of the compound 133 overlaps with an absorption band on the longest wavelength side (low energy side) of the compound 132 (fluorescent material). This allows the light-emitting device to have drastically improved luminous efficiency. Even in the case where the compound 133 is a phosphorescent material, it may form an exciplex together with the compound 131. When an exciplex is formed, the phosphorescent material does not need to emit light at room temperature and emits light at room temperature after an exciplex is formed. In this case, for example, tris[2-(1H-pyrazol-1-yl-κN$^2$)phenyl-κC]iridium(III) (abbreviation: Ir(ppz)$_3$) can be used as the phosphorescent material. It is preferred that the compound 132 and the compound 136 be selected so that the emission peak of the compound 132 overlaps with an absorption band on the longest wavelength side (low energy side) of the compound 136. In that case, a multicolor light-emitting device with high luminous efficiency can be fabricated.

Examples of a substance that has an emission peak in the blue or green wavelength range include organometallic iridium complexes having a 4H-triazole skeleton, such as tris{2-[5-(2-methylphenyl)-4-(2,6-dimethylphenyl)-4H-1,2,4-triazol-3-yl-xN]phenyl-κC}iridium(III) (abbreviation: Ir(mpptz-dmp)$_3$), tris(5-methyl-3,4-diphenyl-4H-1,2,4-triazolato)iridium(III) (abbreviation: Ir(Mptz)$_3$), tris[4-(3-biphenyl)-5-isopropyl-3-phenyl-4H-1,2,4-triazolato]iridium(III) (abbreviation: Ir(iPrptz-3b)$_3$), and tris[3-(5-biphenyl)-5-isopropyl-4-phenyl-4H-1,2,4-triazolato]iridium(III) (abbreviation: Ir(iPr5btz)$_3$); organometallic iridium complexes having a 1H-triazole skeleton, such as tris[3-methyl-1-(2-methylphenyl)-5-phenyl-1H-1,2,4-triazolato]iridium (III) (abbreviation: Ir(Mptzl-mp)$_3$) and tris(1-methyl-5-phenyl-3-propyl-1H-1,2,4-triazolato)iridium(III) (abbreviation: Ir(Prptzl-Me)$_3$); organometallic iridium complexes having an imidazole skeleton, such as fac-tris[1-(2,6-diisopropylphenyl)-2-phenyl-TH-imidazole]iridium(III) (abbreviation: Ir(iPrpmi)$_3$) and tris[3-(2,6-dimethylphenyl)-7-methylimidazo[1,2-f]phenanthridinato]iridium(III) (abbreviation: Ir(dmpimpt-Me)$_3$); and organometallic iridium complexes in which a phenylpyridine derivative having an electron-withdrawing group is a ligand, such as bis[2-(4',6'- difluorophenyl)pyridinato-N,C²']iridium(III) tetrakis(1-pyrazolyl)borate (abbreviation: FIr6), bis[2-(4',6'-difluorophenyl)pyridinato-N,C²]iridium(III) picolinate (abbreviation: Firpic), bis{2-[3',5'-bis(trifluoromethyl)phenyl]pyridinato-N,C²'}iridium(III) picolinate (abbreviation: Ir(CF$_3$ppy)$_2$(pic)), and bis[2-(4',6'-difluorophenyl)pyridinato-N,C²']iridium(III) acetylacetonate (abbreviation: FIr(acac)). Among the materials given above, the organometallic iridium complexes having a nitrogen-containing five-membered heteroaromatic ring skeleton, such as a 4H-triazole skeleton, a 1H-triazole skeleton, or an imidazole skeleton have high triplet excitation energy, reliability, and luminous efficiency and are thus particularly preferable.

Examples of a substance that has an emission peak in the green or yellow wavelength range include organometallic iridium complexes having a pyrimidine skeleton, such as tris(4-methyl-6-phenylpyrimidinato)iridium(III) (abbreviation: Ir(mppm)$_3$), tris(4-t-butyl-6-phenylpyrimidinato)iridium(III) (abbreviation: Ir(tBuppm)$_3$), (acetylacetonato)bis(6-methyl-4-phenylpyrimidinato)iridium(III) (abbreviation: Ir(mppm)$_2$(acac)), (acetylacetonato)bis(6-tert-butyl-4-phenylpyrimidinato)iridium(III) (abbreviation: Ir(tBuppm)$_2$(acac)), (acetylacetonato)bis[4-(2-norbornyl)-6-phenylpyrimidinato]iridium(III) (abbreviation: Ir(nbppm)$_2$(acac)), (acetylacetonato)bis[5-methyl-6-(2-methylphenyl)-4-phenylpyrimidinato]iridium(III) (abbreviation: Ir(mpmppm)$_2$(acac)), (acetylacetonato)bis{4,6-dimethyl-2-[6-(2,6-dimethylphenyl)-4-pyrimidinyl-KN³]phenyl-κC}iridium(III) (abbreviation: Ir(dmppm-dmp)$_2$(acac)), and (acetylacetonato)bis(4,6-diphenylpyrimidinato)iridium(III) (abbreviation: Ir(dppm)$_2$(acac)); organometallic iridium complexes having a pyrazine skeleton, such as (acetylacetonato)bis(3,5-dimethyl-2-phenylpyrazinato)iridium(III) (abbreviation: Ir(mppr-Me)$_2$(acac)) and (acetylacetonato)bis(5-isopropyl-3-methyl-2-phenylpyrazinato)iridium(III) (abbreviation: Ir(mppr-iPr)$_2$(acac)); organometallic iridium complexes having a pyridine skeleton, such as tris(2-phenylpyridinato-N,C²)iridium(III) (abbreviation: Ir(ppy)$_3$), bis(2-phenylpyridinato-N,C²)iridium(III) acetylacetonate (abbreviation: Ir(ppy)$_2$(acac)), bis(benzo[h]quinolinato)iridium(III) acetylacetonate (abbreviation: Ir(bzq)$_2$(acac)), tris(benzo[h]quinolinato)iridium(III) (abbreviation: Ir(bzq)$_3$), tris(2-phenylquinolinato-N,C²')iridium(III) (abbreviation: Ir(pq)$_3$), and bis(2-phenylquinolinato-N,C²')iridium(III) acetylacetonate (abbreviation: Ir(pq)$_2$(acac)); organometallic iridium complexes such as bis(2,4-diphenyl-1,3-oxazolato-N,C²)iridium(III) acetylacetonate (abbreviation: Ir(dpo)$_2$(acac)), bis{2-[4'-(perfluorophenyl)phenyl]pyridinato-N,C²'}iridium(III) acetylacetonate (abbreviation: Ir(p-PF-ph)$_2$(acac)), and bis(2-phenylbenzothiazolato-N,C²)iridium(III) acetylacetonate (abbreviation: Ir(bt)$_2$(acac)); and a rare earth metal complex such as tris(acetylacetonato)(monophenanthroline)terbium(III) (abbreviation: Tb(acac)$_3$(Phen)). Among the materials given above, the organometallic iridium complexes having a pyrimidine skeleton have distinctively high reliability and luminous efficiency and are thus particularly preferable.

Examples of a substance that has an emission peak in the yellow or red wavelength range include organometallic iridium complexes having a pyrimidine skeleton, such as (diisobutyrylmethanato)bis[4,6-bis(3-methylphenyl)pyrimidinato]iridium(III) (abbreviation: Ir(5mdppm)$_2$(dibm)), bis[4,6-bis(3-methylphenyl)pyrimidinato](dipivaloylmethanato)iridium(III) (abbreviation: Ir(5mdppm)$_2$(dpm)), and bis[4,6-di(naphthalen-1-yl)pyrimidinato](dipivaloylmethanato)iridium(III) (abbreviation: Ir(dlnpm)$_2$(dpm)); organometallic iridium complexes having a pyrazine skeleton, such as (acetylacetonato)bis(2,3,5-triphenylpyrazinato)iridium(III) (abbreviation: Ir(tppr)$_2$(acac)), bis(2,3,5-triphenylpyrazinato)(dipivaloylmethanato)iridium(III) (abbreviation: Ir(tppr)$_2$(dpm)), (acetylacetonato)bis[2,3-bis(4-fluorophenyl)quinoxalinato]iridium(III) (abbreviation: Ir(Fdpq)$_2$(acac)), and bis{4,6-dimethyl-2-[5-(2,6-dimethylphenyl)-3-(3,5-dimethylphenyl)-2-pyrazinyl-kN]phenyl-kC}(2,2',6,6'-tetramethyl-3,5-heptanedionato-k2O,O')iridium(III) (abbreviation: Ir(dmdppr-dmp)2(dpm)); organometallic iridium complexes having a pyridine skeleton, such as tris(1-phenylisoquinolinato-N,C²')iridium(III) (abbreviation: Ir(piq)$_3$) and bis(1-phenylisoquinolinato-N,C²)iridium(III) acetylacetonate (abbreviation: Ir(piq)$_2$(acac)); a platinum complex such as 2,3,7,8,12,13,17,18-octaethyl-21H,23H-porphyrin platinum(II) (abbreviation: PtOEP); and rare earth metal complexes such as tris(1,3-diphenyl-1,3-propanedionato)(monophenanthroline)europium(III) (abbreviation: Eu(DBM)$_3$(Phen)) and tris[1-(2-thenoyl)-3,3,3-trifluoroacetonato](monophenanthroline)europium(III) (abbreviation: Eu(TTA)$_3$(Phen)). Among the materials given above, the organometallic iridium complexes having a pyrimidine skeleton have distinctively high reliability and luminous efficiency and are thus particularly preferable. Furthermore, the organometallic iridium complexes having a pyrazine skeleton can provide red light emission with favorable chromaticity.

Examples of a material that can be used as the above-described energy donor include metal-halide perovskite materials. The metal-halide perovskite materials can be represented by any of General Formulae (g1) to (g3) below.

$$(SA)MX_3: \quad (g1)$$

$$(LA)_2(SA)_{n-1}M_nX_{3n+1}: \quad (g2)$$

$$(PA)(SA)_{n-1}M_nX_{3n+1}: \quad (g3)$$

In the above general formulae, M represents a divalent metal ion, and X represents a halogen ion.

Specific examples of the divalent metal ion are divalent cations of lead, tin, or the like.

Specific examples of the halogen ion are anions of chlorine, bromine, iodine, fluorine, or the like.

Note that n represents an integer of 1 to 10. In the case where n is larger than 10 in General Formula (g2) or (g3), the metal-halide perovskite material has properties close to those of the metal-halide perovskite material represented by General Formula (g1).

In addition, LA is an ammonium ion represented by $R^{30}$—$NH_3^+$.

In the ammonium ion represented by the general formula $R^{30}$—$NH_3^+$, $R^{30}$ represents any one of an alkyl group having 2 to 20 carbon atoms, an aryl group having 2 to 20 carbon atoms, and a heteroaryl group having 2 to 20 carbon atoms. Alternatively, $R^{30}$ represents a group in which an alkyl group having 2 to 20 carbon atoms, an aryl group having 2 to 20 carbon atoms, or a heteroaryl group having 2 to 20 carbon atoms is combined with an alkylene group having 1 to 12 carbon atoms, a vinylene group having 1 to 12 carbon atoms, an arylene group having 6 to 13 carbon atoms, and a heteroarylene group having 6 to 13 carbon atoms. In the latter case, a plurality of alkylene groups, vinylene groups, arylene groups, and heteroarylene groups may be coupled, and a plurality of groups of the same kind may be included. In the case where a plurality of alkylene groups, vinylene groups, arylene groups, and heteroarylene groups are coupled, the total number of alkylene groups, vinylene groups, arylene groups, and heteroarylene groups is preferably smaller than or equal to 35.

Furthermore, SA represents a monovalent metal ion or an ammonium ion represented by $R^{31}$—$NH_3^+$ in which $R^{31}$ is an alkyl group having 1 to 6 carbon atoms.

Moreover, PA represents $NH_3^+$—$R^{32}$—$NH_3^+$, $NH_3^+$-$R^{33}$-$R^{34}$-$R^{35}$—$NH_3^+$, or a part or whole of branched polyethyleneimine including ammonium cations, and the valence of PA is +2. Note that charges are roughly in balance in the general formula.

Here, charges of the metal-halide perovskite material are not necessarily in balance strictly in every portion of the material in the above formula as long as the neutrality is roughly maintained in the material as a whole. In some cases, other ions such as a free ammonium ion, a free halogen ion, or an impurity ion exist locally in the material and neutralize the charges. In addition, in some cases, the neutrality is not maintained locally also at a surface of a particle or a film, a crystal grain boundary, or the like; thus, the neutrality is not necessarily maintained in every location.

Note that in the above formula (g2), (LA) can be any of substances represented by General Formulae (a-1) to (a-11) and General Formulae (b-1) to (b-6) shown below, for example.

[Chemical Formula 30]

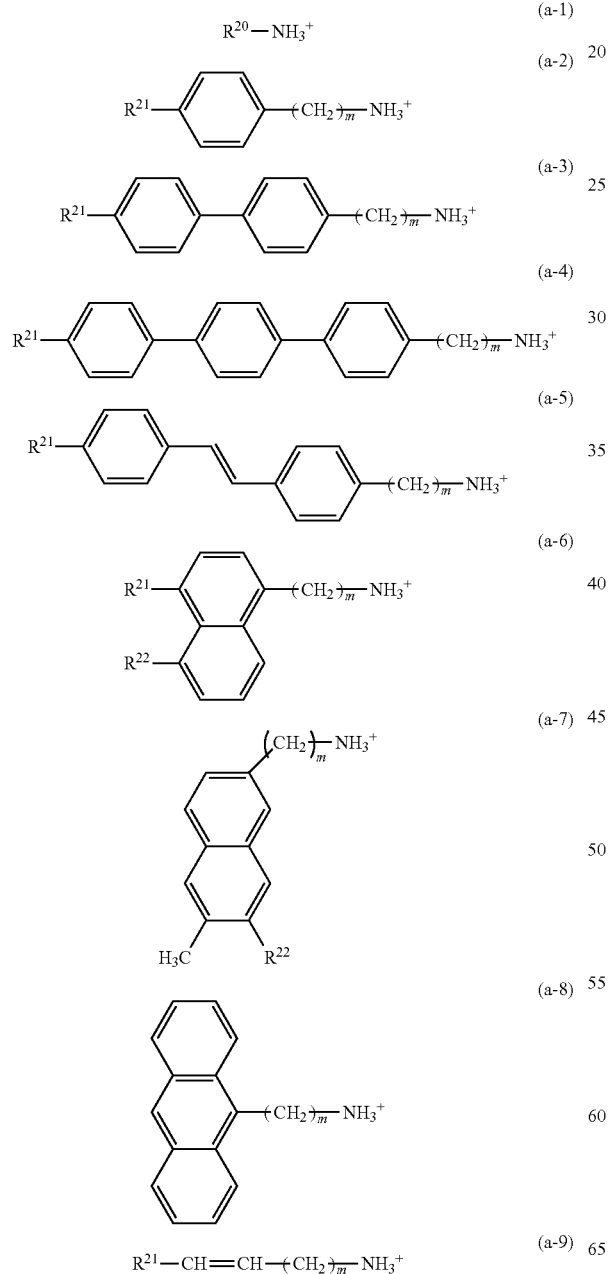

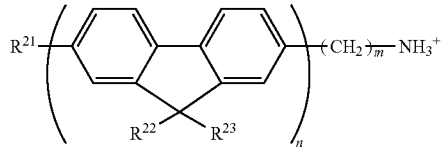

[Chemical Formula 31]

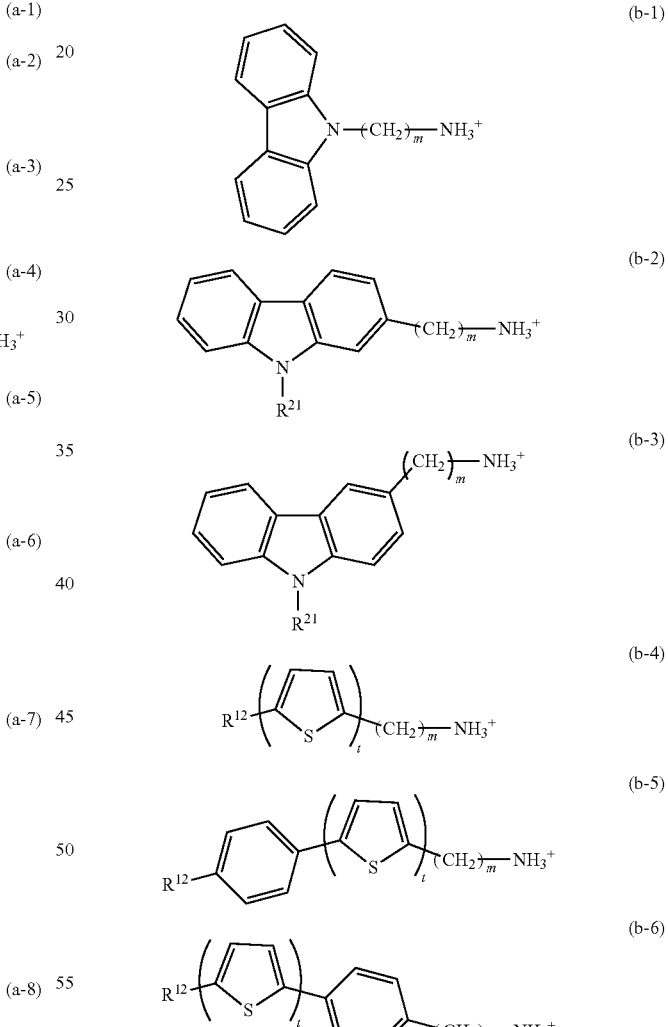

Furthermore, (PA) in General Formula (g3) is typically any of substances represented by General Formulae (c-1), (c-2), and (d) shown below or a part or whole of branched polyethyleneimine including ammonium cations, and the valence of (PA) is +2. These polymers may neutralize charges over a plurality of unit cells. Alternatively, one charge of each of two different polymer molecules may neutralize charges of one unit cell.

[Chemical Formula 32]

(c-1)

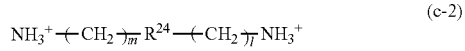
(c-2)

[Chemical Formula 33]

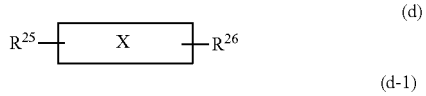
(d)

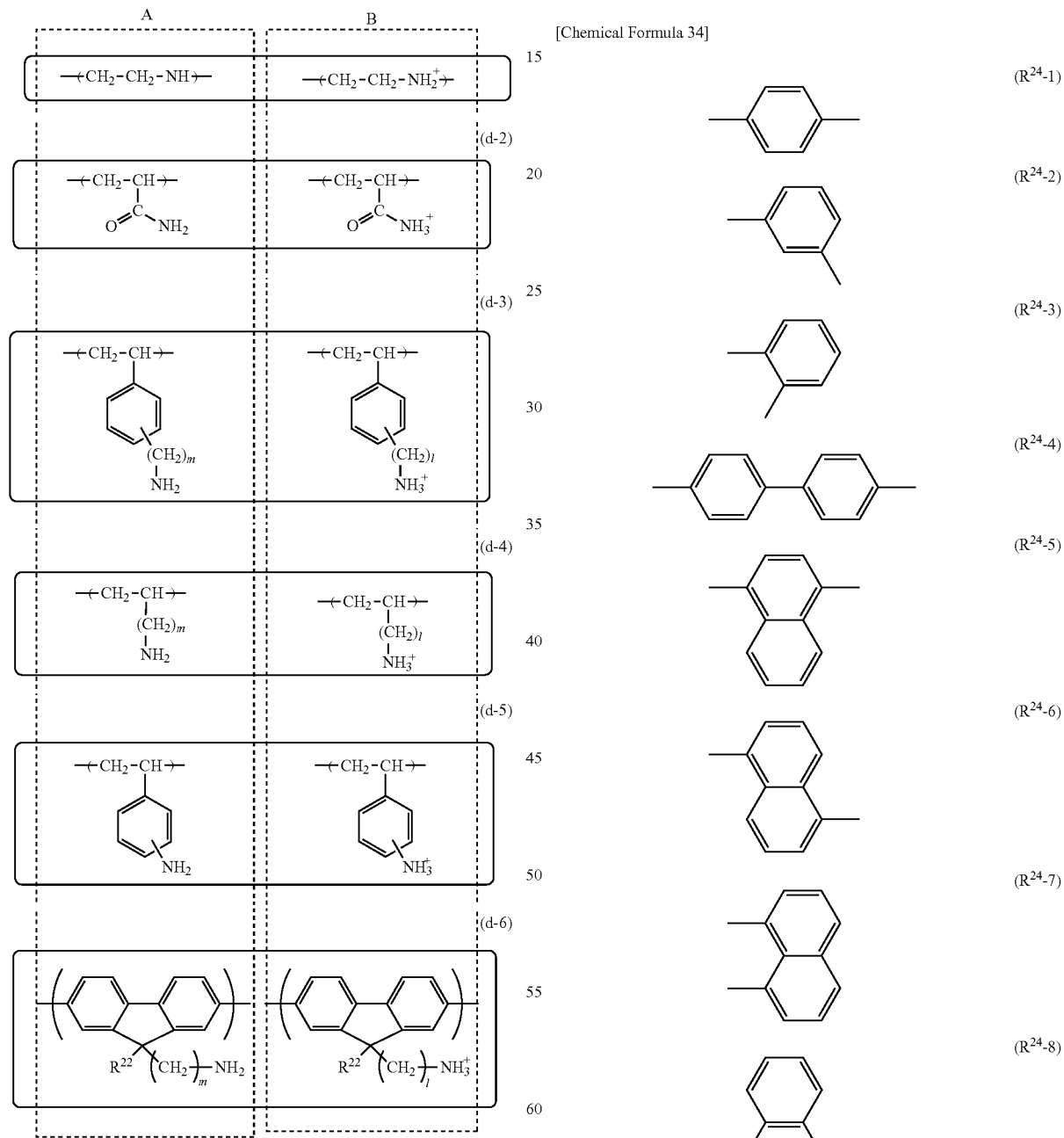

Note that in the above general formulae, $R^{20}$ represents an alkyl group having 2 to 18 carbon atoms, $R^{21}$, $R^{22}$, and $R^{23}$ represent hydrogen or an alkyl group having 1 to 18 carbon atoms, and $R^{24}$ represents any of Structural or General Formulae ($R^{24}$-1) to ($R^{24}$-14) shown below. Furthermore, $R^{21}$ and $R^{26}$ each independently represent hydrogen or an alkyl group having 1 to 6 carbon atoms. In addition, X represents a combination of a monomer unit A and a monomer unit B represented by any of General Formulae (d-1) to (d-6) shown above, and has a structure including u monomer units A and v monomer units B. Note that the arrangement order of the monomer units A and B is not limited. Furthermore, m and l are each independently an integer of 0 to 12, and t is an integer of 1 to 18. In addition, u is an integer of 0 to 17, v is an integer of 1 to 18, and u+v is an integer of 1 to 18.

[Chemical Formula 34]

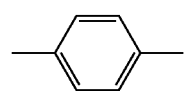
($R^{24}$-1)

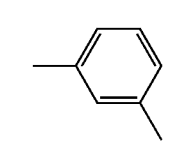
($R^{24}$-2)

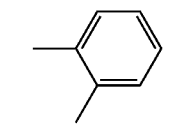
($R^{24}$-3)

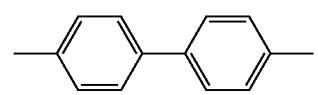
($R^{24}$-4)

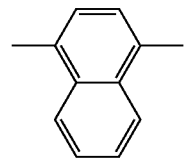
($R^{24}$-5)

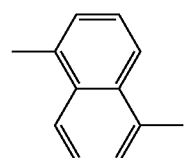
($R^{24}$-6)

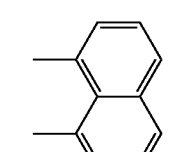
($R^{24}$-7)

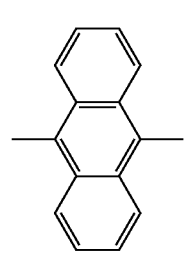
($R^{24}$-8)

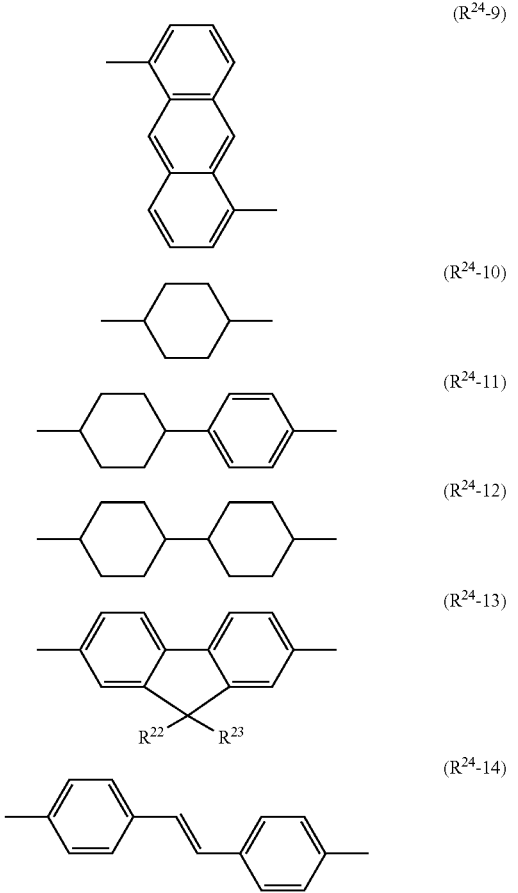

The substances that can be used as (LA) and (PA) may be, but not limited to, the above-described examples.

The metal-halide perovskite material having a three-dimensional structure including the composition (SA)MX$_3$ represented by General Formula (g1) includes regular octahedral structures each of which has a metal atom M at the center and six halogen atoms at the vertexes. Such regular octahedron structures are three-dimensionally arranged by sharing the halogen atoms at the vertexes, so that a skeleton is formed. This regular octahedral structure unit including a halogen atom at each vertex is referred to as a perovskite unit. There are a zero-dimensional structure body in which a perovskite unit exists in isolation, a linear structure body in which perovskite units are one-dimensionally coupled with a halogen atom at the vertex, a sheet-shaped structure body in which perovskite units are two-dimensionally coupled, a structure body in which perovskite units are three-dimensionally coupled, a complicated two-dimensional structure body formed of a stack of a plurality of sheet-shaped structure bodies in each of which perovskite units are two-dimensionally coupled, and a more complicated structure body. All of these structure bodies having a perovskite unit are collectively defined as a metal-halide perovskite material.

The light-emitting layer 130 can include two or more layers. For example, in the case where the light-emitting layer 130 is formed by stacking a first light-emitting layer and a second light-emitting layer in this order from the hole-transport layer side, the first light-emitting layer is formed using a substance having a hole-transport property as the host material and the second light-emitting layer is formed using a substance having an electron-transport property as the host material.

The light-emitting layer 130 may contain a material (compound 135) other than the compounds 131, 132, and 133. In that case, in order for the compound 131 and the compound 133 to efficiently form an exciplex, it is preferred that the HOMO level of one of the compound 131 and the compound 133 be the highest of the materials in the light-emitting layer 130, and the LUMO level of the other be the lowest of the materials in the light-emitting layer 130. With such a correlation of energy levels, the reaction for forming an exciplex by the compound 131 and the compound 135 can be inhibited.

In the case where, for example, the compound 131 has a hole-transport property and the compound 133 has an electron-transport property, the HOMO level of the compound 131 is preferably higher than the HOMO level of the compound 133 and the HOMO level of the compound 135, and the LUMO level of the compound 133 is preferably lower than the LUMO level of the compound 131 and the LUMO level of the compound 135. In this case, the LUMO level of the compound 135 is either higher or lower than the LUMO level of the compound 131. Furthermore, the HOMO level of the compound 135 is either higher or lower than the HOMO level of the compound 133.

Although there is no particular limitation on a material (compound 135) that can be used in the light-emitting layer 130, any of the following materials can be used, for example: metal complexes such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato) (4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), and bis[2-(2-benzothiazolyl)phenolato]zinc(II) (abbreviation: ZnBTZ); heterocyclic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2"-(1,3,5-benzenetriyl)-tris(1-phenyl-TH-benzimidazole) (abbreviation: TPBI), bathophenanthroline (abbreviation: BPhen), bathocuproine (abbreviation: BCP), and 9-[4-(5-phenyl-1,3,4-oxadiazol-2-yl)phenyl]-9H-carbazole (abbreviation: CO11); and aromatic amine compounds such as 4,4'-bis[N-(1-naphthyl)-N-phenylamino]biphenyl (abbreviation: NPB or a-NPD), N,N'-bis(3-methylphenyl)-N,N'-diphenyl-[1,1'-biphenyl]-4,4'-diamine (abbreviation: TPD), and 4,4'-bis[N-(spiro-9,9'-bifluoren-2-yl)-N-phenylamino]biphenyl (abbreviation: BSPB). Condensed polycyclic aromatic compounds such as anthracene derivatives, phenanthrene derivatives, pyrene derivatives, chrysene derivatives, and dibenzo[g,p]chrysene derivatives can also be used; specific examples include 9,10-diphenylanthracene (abbreviation: DPAnth), N,N-diphenyl-9-[4-(10-phenyl-9-anthryl)phenyl]-9H-carbazol-3-amine (abbreviation: CzATPA), 4-(10-phenyl-9-anthryl)triphenylamine (abbreviation: DPhPA), 4-(9H-carbazol-9-yl)-4'-(10-phenyl-9-anthryl)triphenylamine (abbreviation: YGAPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), N,9-diphenyl-N-(9,10-diphenyl-2-anthryl)-9H-carbazol-3-amine (abbreviation: 2PCAPA), 6,12-dimethoxy-5,11-diphenylchrysene, N,N,N',N'N",N",N''',N'''-octaphenyldibenzo[g,p]chrysene-2,7,10,15-tetramine (abbreviation: DBC1), 9-[4-(10-phenyl-9-anthryl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 3,3',3''-(benzene-1,3,5-triyl)tripyrene (abbreviation: TPB3), and the like. One or more substances having a wider energy gap than the compound 131 and the compound 132 are selected from these substances and known substances.

<<Pair of Electrodes>>

The electrode 101 and the electrode 102 have functions of injecting holes and electrons into the light-emitting layer 130. The electrode 101 and the electrode 102 can be formed using a metal, an alloy, or a conductive compound, a mixture or a stack thereof, or the like. A typical example of the metal is aluminum (Al); besides, a transition metal such as silver (Ag), tungsten, chromium, molybdenum, copper, or titanium, an alkali metal such as lithium (Li) or cesium, or a Group 2 metal such as calcium or magnesium (Mg) can be used. As a transition metal, a rare earth metal such as ytterbium (Yb) may be used. An alloy containing any of the above metals can be used as the alloy, and MgAg and AlLi can be given as examples. Examples of the conductive compound include metal oxides such as indium tin oxide (hereinafter, referred to as ITO), indium tin oxide containing silicon or silicon oxide (ITSO), indium zinc oxide, and indium oxide containing tungsten and zinc. It is also possible to use an inorganic carbon-based material such as graphene as the conductive compound. As described above, the electrode 101 and/or the electrode 102 may be formed by stacking two or more of these materials.

Light emitted from the light-emitting layer 130 is extracted through the electrode 101 and/or the electrode 102. Therefore, at least one of the electrodes 101 and 102 transmits visible light. As the conductive material transmitting light, a conductive material having a visible light transmittance higher than or equal to 40% and lower than or equal to 100%, preferably higher than or equal to 60% and lower than or equal to 100%, and a resistivity lower than or equal to $1\times10^{-2}$ Ω·cm can be used. The electrode on the light extraction side may be formed using a conductive material having functions of transmitting light and reflecting light. As the conductive material, a conductive material having a visible light reflectivity higher than or equal to 20% and lower than or equal to 80%, preferably higher than or equal to 40% and lower than or equal to 70%, and a resistivity lower than or equal to $1\times10^{-2}$ Ω·cm can be used. In the case where the electrode through which light is extracted is formed using a material with low light transmittance, such as metal or alloy, the electrode 101 and/or the electrode 102 is formed to a thickness that is thin enough to transmit visible light (e.g., a thickness of 1 nm to 10 nm).

In this specification and the like, as the electrode transmitting light, a material that transmits visible light and has conductivity is used. Examples of the material include, in addition to the above-described oxide conductor layer typified by an ITO, an oxide semiconductor layer and an organic conductive layer containing an organic substance. Examples of the organic conductive layer containing an organic substance include a layer containing a composite material in which an organic compound and an electron donor (donor) are mixed and a layer containing a composite material in which an organic compound and an electron acceptor (acceptor) are mixed. The resistivity of the transparent conductive layer is preferably lower than or equal to $1\times10^5$ Ω·cm, further preferably lower than or equal to $1\times10^4$ Ω·cm.

As a method for forming the electrode 101 and the electrode 102, a sputtering method, an evaporation method, a printing method, a coating method, a molecular beam epitaxy (MBE) method, a CVD method, a pulsed laser deposition method, an atomic layer deposition (ALD) method, or the like can be used as appropriate.

<<Hole-Injection Layer>>

The hole-injection layer 111 has a function of reducing a barrier for hole injection from one of the pair of electrodes (the electrode 101 or the electrode 102) to promote hole injection and is formed using a transition metal oxide, a phthalocyanine derivative, or an aromatic amine, for example. As the transition metal oxide, molybdenum oxide, vanadium oxide, ruthenium oxide, tungsten oxide, manganese oxide, or the like can be given. As the phthalocyanine derivative, phthalocyanine, metal phthalocyanine, or the like can be given. As the aromatic amine, a benzidine derivative, a phenylenediamine derivative, or the like can be given. It is also possible to use a high molecular compound such as polythiophene or polyaniline; a typical example thereof is poly(ethylenedioxythiophene)/poly(styrenesulfonic acid), which is self-doped polythiophene.

As the hole-injection layer 111, a layer containing a composite material of a hole-transport material and a material having a property of accepting electrons from the hole-transport material can also be used. Alternatively, a stack of a layer containing a material having an electron accepting property and a layer containing a hole-transport material may also be used. In a steady state or in the presence of an electric field, electric charge can be transferred between these materials. As examples of the material having an electron-accepting property, organic acceptors such as a quinodimethane derivative, a chloranil derivative, and a hexaazatriphenylene derivative can be given. A specific example is a compound having an electron-withdrawing group (in particular, a cyano group or a halogen group such as a fluoro group), such as 7,7,8,8-tetracyano-2,3,5,6-tetrafluoroquinodimethane (abbreviation: $F_4$-TCNQ), chloranil, 2,3,6,7,10,11-hexacyano-1,4,5,8,9,12-hexaazatriphenylene (abbreviation: HAT-CN), or 1,3,4,5,7,8-hexafluorotetracyano-naphthoquinodimethane (abbreviation: F6-TCNNQ). A compound in which electron-withdrawing groups are bonded to a condensed aromatic ring having a plurality of heteroatoms, such as HAT-CN, is particularly preferable because it is thermally stable. A [3]radialene derivative including an electron-withdrawing group (in particular, a cyano group or a halogen group such as a fluoro group) has a very high electron-accepting property and thus is preferred. Specific examples include α,α',α''-1,2,3-cyclopropanetriylidenetris[4-cyano-2,3,5,6-tetrafluorobenzeneacetonitrile], α,α',α''-1,2,3-cyclopropanetriylidenetris[2,6-dichloro-3,5-difluoro-4-(trifluoromethyl)benzeneacetonitrile], and α,α',α''-1,2,3-cyclopropanetriylidenetris[2,3,4,5,6-pentafluorobenzeneacetonitrile]. Alternatively, a transition metal oxide such as an oxide of a metal from Group 4 to Group 8 can be used. Specifically, vanadium oxide, niobium oxide, tantalum oxide, chromium oxide, molybdenum oxide, tungsten oxide, manganese oxide, rhenium oxide, or the like can be used. In particular, molybdenum oxide is preferable because it is stable in the air, has a low hygroscopic property, and is easily handled.

A material having a property of transporting more holes than electrons can be used as the hole-transport material, and a material having a hole mobility of $1\times10^{-6}$ cm$^2$/Vs or higher is preferable. Specifically, any of the aromatic amines, carbazole derivatives, aromatic hydrocarbons, stilbene derivatives, and the like which are given above as examples of the hole-transport material that can be used in the light-emitting layer 130 can be used. Furthermore, the hole-transport material may be a high molecular compound.

Examples of the aromatic hydrocarbon include 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation:

t-BuAnth), 9,10-bis(4-methyl-1-naphthyl)anthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, and 2,5,8,11-tetra(tert-butyl)perylene. Other examples include pentacene and coronene. The aromatic hydrocarbon having a hole mobility of $1\times10^{-6}$ cm$^2$/Vs or higher and having 14 to 42 carbon atoms is particularly preferable.

The aromatic hydrocarbon may have a vinyl skeleton. Examples of the aromatic hydrocarbon having a vinyl group include 4,4'-bis(2,2-diphenylvinyl)biphenyl (abbreviation: DPVBi) and 9,10-bis[4-(2,2-diphenylvinyl)phenyl]anthracene (abbreviation: DPVPA).

Other examples include high molecular compounds such as poly(N-vinylcarbazole) (abbreviation: PVK), poly(4-vinyltriphenylamine) (abbreviation: PVTPA), poly[N-(4-{N-[4-(4-diphenylamino)phenyl]phenyl-N-phenylamino}phenyl)methacrylamide](abbreviation: PTPDMA), and poly[N,N'-bis(4-butylphenyl)-N,N-bis(phenyl)benzidine](abbreviation: poly-TPD).

<<Hole-Transport Layer>>

The hole-transport layer 112 is a layer containing a hole-transport material and can be formed using any of the materials given as examples of the material of the hole-injection layer 111. In order that the hole-transport layer 112 has a function of transporting holes injected into the hole-injection layer 111 to the light-emitting layer 130, the HOMO level of the hole-transport layer 112 is preferably equal or close to the HOMO level of the hole-injection layer 111.

As the hole-transport material, any of the materials given as examples of the materials of the hole-injection layer 111 can be used. As the hole-transport material, a substance having a hole mobility of $1\times10^{-6}$ cm$^2$/Vs or higher is preferably used. Note that other than these substances, any substance that has a property of transporting more holes than electrons may be used. The layer containing a substance having a high hole-transport property is not limited to a single layer, and two or more layers containing the aforementioned substances may be stacked.

<<Electron-Transport Layer>>

The electron-transport layer 118 has a function of transporting, to the light-emitting layer 130, electrons injected from the other of the pair of electrodes (the electrode 101 or the electrode 102) through the electron-injection layer 119. A material having a property of transporting more electrons than holes can be used as the electron-transport material, and a material having an electron mobility of $1\times10^{-6}$ cm$^2$/Vs or higher is preferable. As the compound which easily accepts electrons (the material having an electron-transport property), a π-electron deficient heteroaromatic compound such as a nitrogen-containing heteroaromatic compound, a metal complex, or the like can be used. Specifically, a metal complex having a quinoline ligand, a benzoquinoline ligand, an oxazole ligand, or a thiazole ligand, which is described as the electron-transport material that can be used in the light-emitting layer 130, can be given. Other examples include an oxadiazole derivative, a triazole derivative, a phenanthroline derivative, a pyridine derivative, a bipyridine derivative, and a pyrimidine derivative. As the electron-transport material, a substance having an electron mobility of $1\times10^{-6}$ cm$^2$/Vs or higher is preferably used. Note that other than these substances, any substance that has a property of transporting more electrons than holes may be used for the electron-transport layer. The electron-transport layer 118 is not limited to a single layer and may be a stack of two or more layers each containing any of the aforementioned substances.

Between the electron-transport layer 118 and the light-emitting layer 130, a layer that controls transfer of electron carriers may be provided. The layer that controls transfer of electron carriers is formed by addition of a small amount of a substance having a high electron-trapping property to the aforementioned material having a high electron-transport property, and is capable of adjusting carrier balance by inhibiting transfer of electron carriers. Such a structure is very effective in preventing a problem (such as a reduction in device lifetime) caused when electrons pass through the light-emitting layer.

<<Electron-Injection Layer>>

The electron-injection layer 119 has a function of reducing a barrier for electron injection from the electrode 102 to promote electron injection and can be formed using a Group 1 metal or a Group 2 metal, or an oxide, a halide, or a carbonate of any of the metals, for example. Alternatively, a composite material containing the aforementioned electron-transport material and a material having a property of donating electrons to the electron-transport material can be used. As the material having an electron-donating property, a Group 1 metal, a Group 2 metal, an oxide of any of the metals, or the like can be given. Specifically, an alkali metal, an alkaline earth metal, or a compound thereof, such as lithium fluoride (LiF), sodium fluoride (NaF), cesium fluoride (CsF), calcium fluoride (CaF$_2$), or lithium oxide (LiO$_x$), can be used. Alternatively, a rare earth metal compound like erbium fluoride (ErF$_3$) can be used. Electride may be used for the electron-injection layer 119. Examples of the electride include a substance in which electrons are added at a high concentration to a mixed oxide of calcium oxide and aluminum oxide. The electron-injection layer 119 may be formed using the substance that can be used for the electron-transport layer 118.

A composite material in which an organic compound and an electron donor (donor) are mixed may be used for the electron-injection layer 119. Such a composite material is excellent in an electron-injection property and an electron-transport property because electrons are generated in the organic compound by the electron donor. In this case, the organic compound is preferably a material that is excellent in transporting the generated electrons. Specifically, the above-listed substances for forming the electron-transport layer 118 (e.g., the metal complexes and heteroaromatic compounds) can be used, for example. As the electron donor, a substance showing an electron-donating property with respect to the organic compound may be used. Specifically, an alkali metal, an alkaline earth metal, and a rare earth metal are preferable, and lithium, cesium, magnesium, calcium, erbium, ytterbium, and the like are given. In addition, an alkali metal oxide or an alkaline earth metal oxide is preferable, and lithium oxide, calcium oxide, barium oxide, and the like are given. Alternatively, a Lewis base such as magnesium oxide can be used. Further alternatively, an organic compound such as tetrathiafulvalene (abbreviation: TTF) can be used.

Note that the light-emitting layer, the hole-injection layer, the hole-transport layer, the electron-transport layer, and the electron-injection layer described above can each be formed by an evaporation method (including a vacuum evaporation method), an inkjet method, a coating method, a nozzle printing method, a gravure printing method, or the like. Other than the above-mentioned materials, an inorganic compound such as a quantum dot or a high molecular compound (e.g., an oligomer, a dendrimer, and a polymer) may be used in the light-emitting layer, the hole-injection layer, the hole-transport layer, the electron-transport layer, and the electron-injection layer.

The quantum dot may be a colloidal quantum dot, an alloyed quantum dot, a core-shell quantum dot, or a core quantum dot, for example. The quantum dot containing elements belonging to Groups 2 and 16, elements belonging to Groups 13 and 15, elements belonging to Groups 13 and 17, elements belonging to Groups 11 and 17, or elements belonging to Groups 14 and 15 may be used. Alternatively, the quantum dot containing an element such as cadmium (Cd), selenium (Se), zinc (Zn), sulfur (S), phosphorus (P), indium (In), tellurium (Te), lead (Pb), gallium (Ga), arsenic (As), or aluminum (Al) may be used.

Examples of the liquid medium used for the wet process include organic solvents of ketones such as methyl ethyl ketone and cyclohexanone; fatty acid esters such as ethyl acetate; halogenated hydrocarbons such as dichlorobenzene; aromatic hydrocarbons such as toluene, xylene, mesitylene, and cyclohexylbenzene; aliphatic hydrocarbons such as cyclohexane, decalin, and dodecane; dimethylformamide (DMF); dimethyl sulfoxide (DMSO); and the like.

Examples of the high molecular compound that can be used for the light-emitting layer include a polyphenylenevinylene (PPV) derivative such as poly[2-methoxy-5-(2-ethylhexyloxy)-1,4-phenylenevinylene](abbreviation: MEH-PPV) or poly(2,5-dioctyl-1,4-phenylenevinylene); a polyfluorene derivative such as poly(9,9-di-n-octylfluorenyl-2,7-diyl) (abbreviation: PF8), poly[(9,9-di-n-octylfluorenyl-2,7-diyl)-alt-(benzo[2,1,3]thiadiazole-4,8-diyl)](abbreviation: F8BT), poly[(9,9-di-n-octylfluorenyl-2,7-diyl)-alt-(2,2'-bithiophene-5,5'-diyl)](abbreviation: F8T2), poly[(9,9-dioctyl-2,7-divinylenefluorenylene)-alt-(9,10-anthracene)], or poly[(9,9-dihexylfluorene-2,7-diyl)-alt-(2,5-dimethyl-1,4-phenylene)]; a polyalkylthiophene (PAT) derivative such as poly(3-hexylthiophene-2,5-diyl) (abbreviation: P3HT); and a polyphenylene derivative. These high molecular compounds, PVK, poly(2-vinylnaphthalene), poly[bis(4-phenyl)(2,4,6-trimethylphenyl)amine](abbreviation: PTAA), or the like may be doped with a light-emitting compound and used for the light-emitting layer. As the light-emitting compound, any of the above-described light-emitting compounds can be used.

<<Substrate>>

A light-emitting device of one embodiment of the present invention may be formed over a substrate of glass, plastic, or the like. As the way of stacking layers over the substrate, layers may be sequentially stacked from the electrode 101 side or sequentially stacked from the electrode 102 side.

For the substrate over which the light-emitting device of one embodiment of the present invention can be formed, glass, quartz, plastic, or the like can be used, for example. Alternatively, a flexible substrate can be used. The flexible substrate is a substrate that can be bent, such as a plastic substrate made of polycarbonate or polyarylate, for example. A film, an inorganic vapor deposition film, or the like can also be used. Another material may be used as long as the substrate functions as a support in a manufacturing process of the light-emitting device and an optical device (e.g., a color filter) or has a function of protecting the light-emitting device and the optical device.

In this specification and the like, a light-emitting device can be formed using any of a variety of substrates, for example. The type of a substrate is not limited particularly. Examples of the substrate include a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, cellulose nanofiber (CNF) and paper which include a fibrous material, and a base material film. Examples of the glass substrate include a barium borosilicate glass substrate, an aluminoborosilicate glass substrate, and a soda lime glass substrate. Examples of the flexible substrate, the attachment film, the base material film, and the like include substrates of plastics typified by polyethylene terephthalate (PET), polyethylene naphthalate (PEN), polyether sulfone (PES), and polytetrafluoroethylene (PTFE). Another example is a resin such as acrylic. Furthermore, polypropylene, polyester, polyvinyl fluoride, and polyvinyl chloride can be given as examples. Other examples include polyamide, polyimide, aramid, epoxy, an inorganic vapor deposition film, and paper.

Alternatively, a flexible substrate may be used as the substrate such that the light-emitting device is provided directly on the flexible substrate. Further alternatively, a separation layer may be provided between the substrate and the light-emitting device. The separation layer can be used when part or the whole of a light-emitting device formed over the separation layer is separated from the substrate and transferred onto another substrate. In such a case, the light-emitting device can be transferred to a substrate having low heat resistance or a flexible substrate as well. For the above separation layer, a stack including inorganic films, which are a tungsten film and a silicon oxide film, or a structure in which a resin film of polyimide or the like is formed over a substrate can be used, for example.

In other words, after the light-emitting device is formed using a substrate, the light-emitting device may be transferred to another substrate. Examples of the substrate to which the light-emitting device is transferred include, in addition to the above substrates, a cellophane substrate, a stone substrate, a wood substrate, a cloth substrate (including a natural fiber (e.g., silk, cotton, and hemp), a synthetic fiber (e.g., nylon, polyurethane, and polyester), a regenerated fiber (e.g., acetate, cupra, rayon, and regenerated polyester), and the like), a leather substrate, and a rubber substrate. With the use of such a substrate, a light-emitting device with high durability, high heat resistance, reduced weight, or reduced thickness can be formed.

The light-emitting device 150 may be formed over an electrode electrically connected to, for example, a field-effect transistor (FET) that is formed over the above-described substrate. Accordingly, an active matrix display device in which the FET controls the driving of the light-emitting device 150 can be fabricated.

The structure described above in this embodiment can be combined with any of the structures described in the other embodiments as appropriate.

Embodiment 2

In this embodiment, examples of a synthesis method of an organic compound that can be favorably used for a light-emitting device of one embodiment of the present invention will be described giving the organic compounds represented by General Formulae (G1) and (G2) as examples.

<Method for Synthesizing Organic Compound Represented by General Formula (G1)>

The organic compound represented by General Formula (G1) can be synthesized by a synthesis method in which any of a variety of reactions is used. For example, the organic compound can be synthesized by Synthesis Schemes (S-1) and (S-2) below. First, a compound 1, an arylamine (compound 2), and an arylamine (compound 3) are coupled, whereby a diamine compound (compound 4) is obtained.

Next, the diamine compound (compound 4), halogenated aryl (compound 5), and halogenated aryl (compound 6) are coupled, whereby the organic compound represented by General Formula (G1) can be obtained.

[Chemical Formula 35]

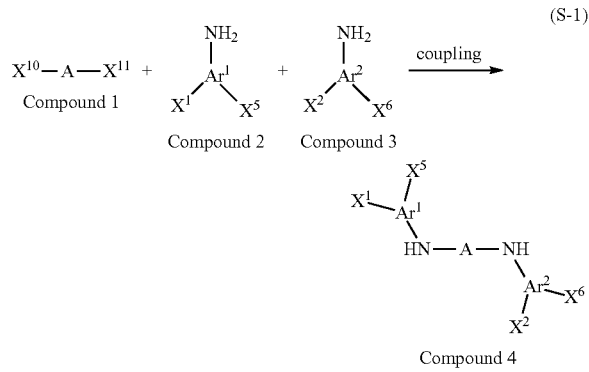

[Chemical Formula 36]

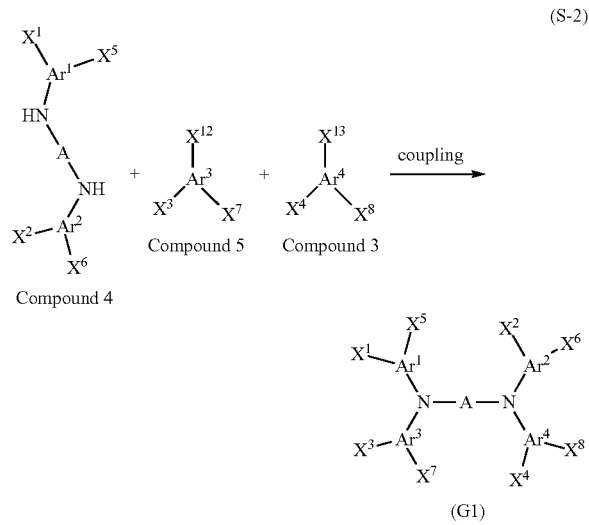

In Synthesis Schemes (S-1) and (S-2), A represents a substituted or unsubstituted condensed aromatic ring having 10 to 30 carbon atoms or a substituted or unsubstituted condensed heteroaromatic ring having 10 to 30 carbon atoms, $Ar^1$ to $Ar^4$ each independently represent a substituted or unsubstituted aromatic hydrocarbon group having 6 to 13 carbon atoms, X to $X^8$ each independently represent any one of an alkyl group having 3 to 10 carbon atoms, a substituted or unsubstituted cycloalkyl group having 3 to 10 carbon atoms, and a trialkylsilyl group having 3 to 12 carbon atoms. Examples of the condensed aromatic ring or condensed heteroaromatic ring include chrysene, phenanthrene, stilbene, acridone, phenoxazine, and phenothiazine. The following are particularly preferred: anthracene, pyrene, coumarin, quinacridone, perylene, tetracene, and naphthobisbenzofuran.

In the case where a Buchwald-Hartwig reaction using a palladium catalyst is employed in Synthesis Schemes (S-1) and (S-2), $X^{10}$ to $X^{13}$ represent a halogen group or a triflate group. As the halogen, iodine, bromine, or chlorine is preferable. In the reaction, a palladium compound such as bis(dibenzylideneacetone)palladium(0) or palladium(II) acetate and a ligand such as tri(tert-butyl)phosphine, tri(n-hexyl)phosphine, tricyclohexylphosphine, di(1-adamantyl)-n-butylphosphine, or 2-dicyclohexylphosphino-2',6'-dimethoxy-1,1'-biphenyl can be used. In addition, an organic base such as sodium tert-butoxide, an inorganic base such as potassium carbonate, cesium carbonate, or sodium carbonate, or the like can be used. Furthermore, toluene, xylene, benzene, tetrahydrofuran, dioxane, or the like can be used as a solvent. Reagents that can be used in the reaction are not limited thereto.

The reaction employed in Synthesis Schemes (S-1) and (S-2) is not limited to the Buchwald-Hartwig reaction. A Migita-Kosugi-Stille coupling reaction using an organotin compound, a coupling reaction using a Grignard reagent, an Ullmann reaction using copper or a copper compound, or the like can be used.

In the case where the compound 2 and the compound 3 have different structures in Synthesis Scheme (S-1), it is preferred that the compound 1 and the compound 2 be reacted first to form a coupling product and then the coupling product and the compound 3 be reacted. In the case where the compound 1 is reacted with the compound 2 and the compound 3 in different stages, it is preferred that the compound 1 be a dihalogen compound and $X^{10}$ and $X^{11}$ be different halogens and selectively subjected to amination reactions one by one.

Furthermore, in the case where the compound 5 and the compound 6 have different structures in Synthesis Scheme (S-2), it is preferred that the compound 4 and the compound 5 be reacted first to form a coupling product and then the coupling product and the compound 6 be reacted.

Embodiment 3

Figure 6:
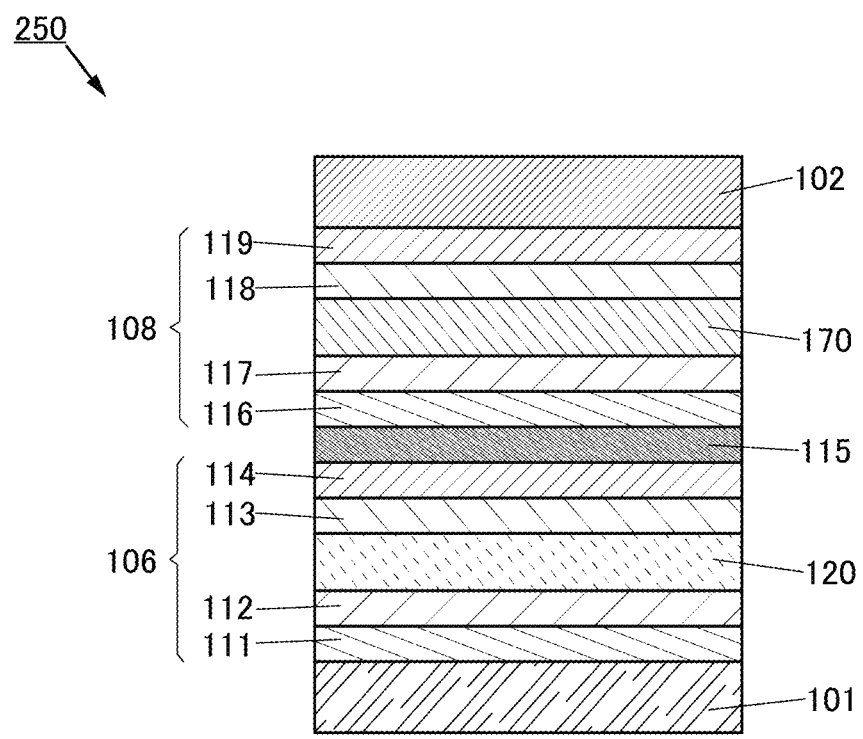
FIG. 6 is a schematic cross-sectional view of a light-emitting layer in a light-emitting device of one embodiment of the present invention.

In this embodiment, a light-emitting device having a structure different from that described in Embodiment 1 will be described below with reference to FIG. 6. In FIG. 6, a portion having a function similar to that in FIG. TA is represented by the same hatch pattern as that in FIG. TA and not especially denoted by a reference numeral in some cases. In addition, common reference numerals are used for portions having similar functions, and detailed description of the portions is omitted in some cases.

<Structure Example 2 of Light-Emitting Device>

FIG. 6 is a schematic cross-sectional view of a light-emitting device 250.

The light-emitting device 250 illustrated in FIG. 6 includes a plurality of light-emitting units (a light-emitting unit 106 and a light-emitting unit 108) between a pair of electrodes (the electrode 101 and the electrode 102). One of the light-emitting units preferably has a structure similar to that of the EL layer 100 illustrated in FIG. TA. That is, it is preferred that the light-emitting device 150 illustrated in FIG. TA include one light-emitting unit while the light-emitting device 250 include a plurality of light-emitting units. Note that the electrode 101 functions as an anode and the electrode 102 functions as a cathode in the following description of the light-emitting device 250; however, the functions may be interchanged in the light-emitting device 250.

In the light-emitting device 250 illustrated in FIG. 6, the light-emitting unit 106 and the light-emitting unit 108 are stacked, and a charge-generation layer 115 is provided between the light-emitting unit 106 and the light-emitting unit 108. Note that the light-emitting unit 106 and the light-emitting unit 108 may have the same structure or different structures. For example, a structure similar to that of the EL layer 100 is preferably used in the light-emitting unit 108.

The light-emitting device 250 includes a light-emitting layer 120 and a light-emitting layer 170. The light-emitting unit 106 includes the hole-injection layer 111, the hole-transport layer 112, an electron-transport layer 113, and an electron-injection layer 114 in addition to the light-emitting layer 120. The light-emitting unit 108 includes a hole-injection layer 116, a hole-transport layer 117, the electron-transport layer 118, and the electron-injection layer 119 in addition to the light-emitting layer 170.

In the light-emitting device 250, any layer in each of the light-emitting units 106 and 108 contains the organic compound of one embodiment of the present invention. Note that the layer containing the organic compound is preferably the light-emitting layer 120 or the light-emitting layer 170.

The charge-generation layer 115 may have either a structure in which an acceptor substance (electron acceptor) is added to a hole-transport material or a structure in which a donor substance (electron donor) is added to an electron-transport material. Alternatively, the charge-generation layer 115 may be a stack of both of these structures.

When the charge-generation layer 115 contains a composite material of an organic compound and an acceptor substance, the composite material can be any composite material usable for the hole-injection layer 111 described in Embodiment 1. As the organic compound, a variety of compounds such as an aromatic amine compound, a carbazole compound, an aromatic hydrocarbon, and a high molecular compound (e.g., an oligomer, a dendrimer, and a polymer) can be used. The organic compound preferably has a hole mobility of $1\times10^{-6}$ cm$^2$Vs or higher. Note that any other substance may be used as long as it has a property of transporting more holes than electrons. Since the composite material of an organic compound and an acceptor substance has excellent carrier-injection and carrier-transport properties, low-voltage driving or low-current driving can be achieved. Note that when a surface of a light-emitting unit on the anode side is in contact with the charge-generation layer 115, the charge-generation layer 115 can also serve as a hole-injection layer or a hole-transport layer of the light-emitting unit; thus, a hole-injection layer or a hole-transport layer is not necessarily included in the light-emitting unit. Alternatively, when a surface of the light-emitting unit on the cathode side is in contact with the charge-generation layer 115, the charge-generation layer 115 can also serve as an electron-injection layer or an electron-transport layer of the light-emitting unit; thus, an electron-injection layer or an electron-transport layer is not necessarily included in the light-emitting unit.

The charge-generation layer 115 may have a stacked structure of a layer containing the composite material of an organic compound and an acceptor substance and a layer containing another material. For example, the charge-generation layer 115 may be formed using a combination of a layer containing the composite material of an organic compound and an acceptor substance with a layer containing one compound selected from among electron-donating substances and a compound having a high electron-transport property. Alternatively, the charge-generation layer 115 may be formed using a combination of a layer containing the composite material of an organic compound and an acceptor substance with a layer including a transparent conductive film.

The charge-generation layer 115 placed between the light-emitting unit 106 and the light-emitting unit 108 is configured to inject electrons into one of the light-emitting units and inject holes into the other light-emitting unit when a voltage is applied to the electrode 101 and the electrode 102. For example, in FIG. 6, the charge-generation layer 115 injects electrons into the light-emitting unit 106 and holes into the light-emitting unit 108 when a voltage is applied such that the potential of the electrode 101 is higher than that of the electrode 102.

Note that in terms of light extraction efficiency, the charge-generation layer 115 preferably has a visible light transmittance (specifically, a visible light transmittance of 40% or higher). The charge-generation layer 115 functions even with conductivity lower than those of the pair of electrodes (the electrodes 101 and 102).

The charge-generation layer 115 formed using any of the above materials can inhibit an increase in driving voltage caused by the stack of the light-emitting layers.

Although FIG. 6 illustrates the light-emitting device including two light-emitting units, a similar structure can be used for a light-emitting device including three or more light-emitting units stacked. When a plurality of light-emitting units partitioned by the charge-generation layer are arranged between a pair of electrodes as in the light-emitting device 250, it is possible to provide a light-emitting device that is capable of emitting high-luminance light with the current density kept low and has a long lifetime. Moreover, a light-emitting device with low power consumption can be obtained.

Note that in each of the above structures, the emission colors of the guest materials used in the light-emitting unit 106 and the light-emitting unit 108 may be the same or different. When guest materials having a function of emitting light of the same color are used for the light-emitting unit 106 and the light-emitting unit 108, the light-emitting device 250 advantageously obtains high luminance at a small current value. Meanwhile, when guest materials having a function of emitting light of different colors are used for the light-emitting unit 106 and the light-emitting unit 108, the light-emitting device 250 advantageously exhibits multi-color light emission. In that case, when a plurality of light-emitting materials with different emission wavelengths are used in one or both of the light-emitting layers 120 and 170, the light-emitting device 250 emits light obtained by synthesizing lights with different emission spectrum peaks. That is, the emission spectrum of the light-emitting device 250 has at least two local maximum values.

The above structure is also suitable for obtaining white light emission. White light emission can be obtained when the light-emitting layer 120 and the light-emitting layer 170 emit light of complementary colors. It is particularly favorable to select the guest materials so that white light emission with high color rendering properties or light emission of at least red, green, and blue can be obtained.

One or both of the light-emitting layers 120 and 170 preferably have the structure of the light-emitting layer 130 described in Embodiment 1, in which case a light-emitting device having high reliability and luminous efficiency can be obtained. Guest materials contained in the light-emitting layer 130 are a fluorescent material and a phosphorescent material or a TADF material; hence, when the structure of the light-emitting layer 130 described in Embodiment 1 is employed for one or both of the light-emitting layers 120 and 170, a highly efficient, highly reliable light-emitting device that exhibits multicolor light emission can be obtained.

In the case of a light-emitting device in which three or more light-emitting units are stacked, colors of light emitted from guest materials used in the light-emitting units may be the same or different from each other. When the light-emitting device includes a plurality of light-emitting units that emit light of the same color, these light-emitting units can emit light with high intensity at a small current. Such a structure can be favorably used to adjust emission colors. The structure is particularly favorably used when guest materials that emit light of different colors with different emission efficiencies are used. For example, when the light-emitting device includes three light-emitting units, the intensity of fluorescence and phosphorescence can be adjusted with two light-emitting units that contain a fluorescent material for the same color and one light-emitting unit that contains a phosphorescent material that emits light of a color different from the emission color of the fluorescent material. That is, the intensity of emitted light of each color can be adjusted by changing the number of light-emitting units.

When a light-emitting device includes two fluorescent units and one phosphorescent unit in the above manner, the following light-emitting devices are preferred: a light-emitting device including two light-emitting units containing a blue fluorescent material and one light-emitting unit containing a yellow phosphorescent material; a light-emitting device including two light-emitting units containing a blue fluorescent material and one light-emitting unit containing a red phosphorescent material and a green phosphorescent material; and a light-emitting device including two light-emitting units containing a blue fluorescent material and one light-emitting unit containing a red phosphorescent material, a yellow phosphorescent material, and a green phosphorescent material. Such light-emitting devices can efficiently emit white light. Thus, the light-emitting device of one embodiment of the present invention can be combined with a phosphorescent layer, as appropriate.

At least one of the light-emitting layers 120 and 170 may be divided into layers and each of the divided layers may contain different light-emitting materials. That is, at least one of the light-emitting layers 120 and 170 may consist of two or more layers. For example, when the light-emitting layer is formed by stacking a first light-emitting layer and a second light-emitting layer in this order from the hole-transport layer side, the first light-emitting layer is formed using a material having a hole-transport property as the host material and the second light-emitting layer is formed using a material having an electron-transport property as the host material. In this structure, a light-emitting material contained in the first light-emitting layer may be the same as or different from a light-emitting material contained in the second light-emitting layer, and the materials may have functions of emitting light of the same color or light of different colors. White light emission with high color rendering properties that is formed of three primary colors or four or more colors can be obtained by using a plurality of light-emitting materials with functions of emitting light of different colors.

Note that this embodiment can be combined with any of the other embodiments as appropriate.

Embodiment 4

In this embodiment, light-emitting apparatuses including the light-emitting devices described in Embodiment 1 and Embodiment 3 will be described with reference to FIGS. 7A and 7B.

Figure 7A:
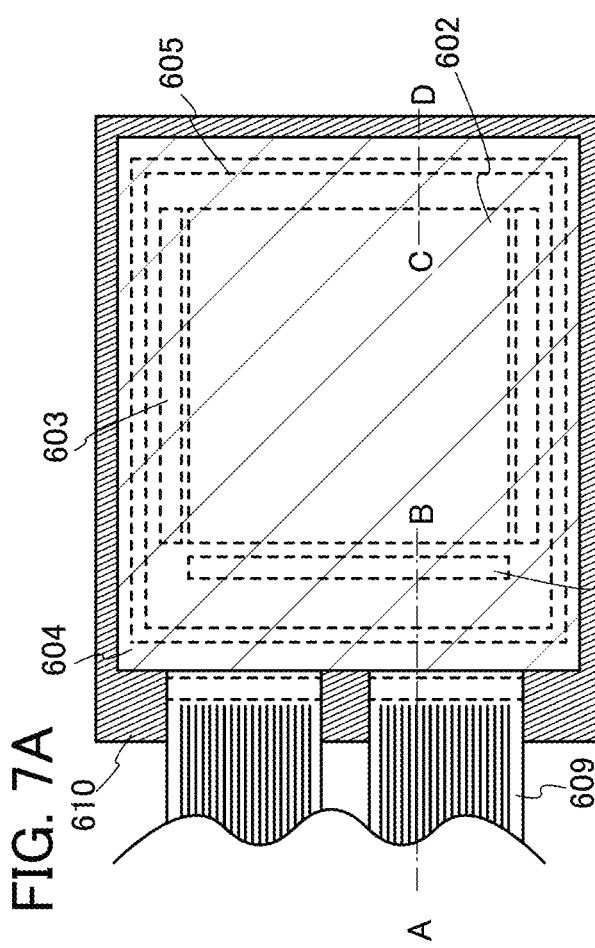
FIG. 7A is a top view illustrating a display device of one embodiment of the present invention.
Figure 7B:
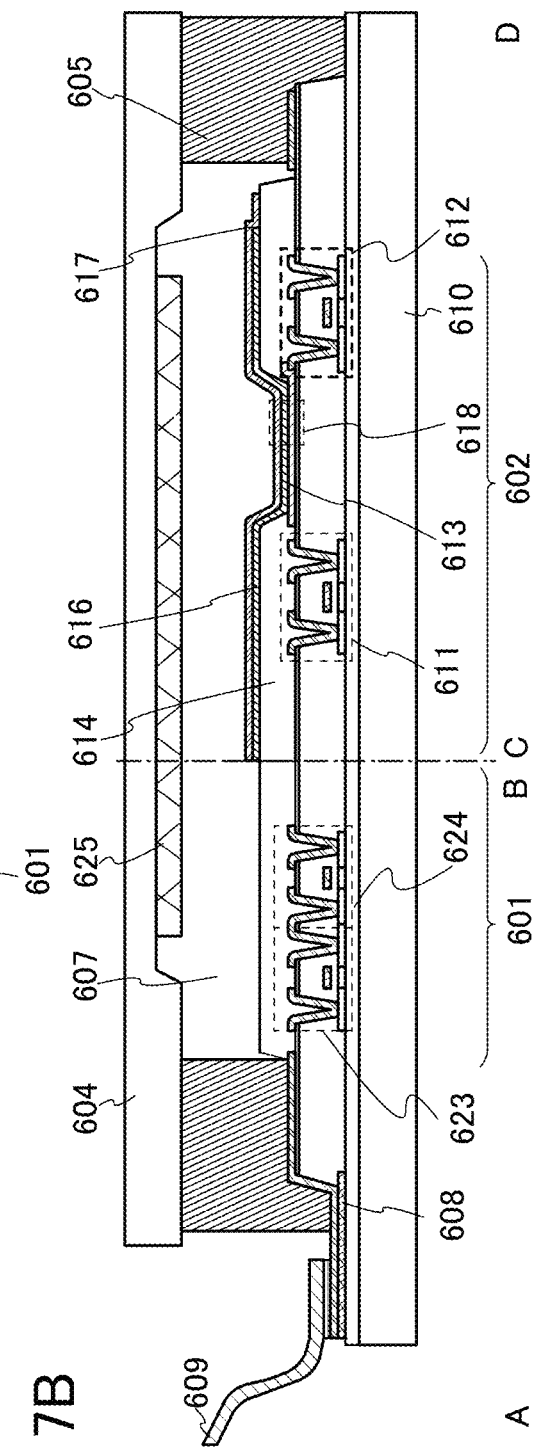
FIG. 7B is a schematic cross-sectional view illustrating a display device of one embodiment of the present invention.

FIG. 7A is a top view of the light-emitting apparatus and FIG. 7B is a cross-sectional view taken along the lines A-B and C-D in FIG. 7A. The light-emitting apparatus includes a driver circuit portion (source driver circuit) 601, a pixel portion 602, and a driver circuit portion (gate driver circuit) 603, which control light emission of a light-emitting device and are illustrated with dotted lines. Moreover, a reference numeral 604 denotes a sealing substrate, a reference numeral 625 denotes a desiccant, and a reference numeral 605 denotes a sealant. A portion surrounded by the sealant 605 is a space 607.

Note that a lead wiring 608 is a wiring for transmitting signals to be input to the source driver circuit 601 and the gate driver circuit 603 and for receiving a video signal, a clock signal, a start signal, a reset signal, and the like from a flexible printed circuit (FPC) 609 functioning as an external input terminal. Although only the FPC is illustrated here, a printed wiring board (PWB) may be attached to the FPC. The light-emitting apparatus in this specification includes, in its category, not only the light-emitting apparatus itself but also the light-emitting apparatus provided with the FPC or the PWB.

Next, a cross-sectional structure of the light-emitting apparatus will be described with reference to FIG. 7B. The driver circuit portion and the pixel portion are formed over an element substrate 610. Here, the source driver circuit 601, which is the driver circuit portion, and one pixel of the pixel portion 602 are illustrated.

In the source driver circuit 601, a CMOS circuit is formed in which an n-channel TFT 623 and a p-channel TFT 624 are combined. The driver circuit may be formed using various circuits such as a CMOS circuit, a PMOS circuit, or an NMOS circuit. Although a driver-integrated type in which the driver circuit is formed over the substrate is described in this embodiment, the driver circuit is not necessarily formed over the substrate and may be formed outside the substrate.

The pixel portion 602 includes pixels each including a switching TFT 611, a current controlling TFT 612, and a first electrode 613 electrically connected to a drain of the current controlling TFT 612. Note that an insulator 614 is formed to cover an end portion of the first electrode 613. The insulator 614 can be formed using a positive photosensitive resin film.

In order to improve coverage with a film that is formed over the insulator 614, the insulator 614 is formed to have a curved surface with curvature at its upper or lower end portion. For example, in the case where photosensitive acrylic is used as a material of the insulator 614, only the upper end portion of the insulator 614 preferably has a curved surface. The radius of curvature of the curved surface is preferably greater than or equal to 0.2 m and less than or equal to 0.3 m. As the insulator 614, either a negative photosensitive material or a positive photosensitive material can be used.

An EL layer 616 and a second electrode 617 are formed over the first electrode 613. As a material used for the first electrode 613 which functions as an anode, a material having a high work function is preferably used. For example, a single-layer film of an ITO film, an indium tin oxide film containing silicon, an indium oxide film containing zinc oxide at 2 wt % to 20 wt %, a titanium nitride film, a chromium film, a tungsten film, a Zn film, a Pt film, or the like, a stack including a titanium nitride film and a film containing aluminum as its main component, a stack including three layers of a titanium nitride film, a film containing aluminum as its main component, and a titanium nitride film, or the like can be used. The stacked structure achieves low wiring resistance, a favorable ohmic contact, and a function of an anode.

The EL layer 616 is formed by any of a variety of methods such as an evaporation method using an evaporation mask, an inkjet method, and a spin coating method. As a material included in the EL layer 616, a low molecular compound or a high molecular compound (including an oligomer or a dendrimer) may be used.

As a material used for the second electrode 617, which is formed over the EL layer 616 and functions as a cathode, a material having a low work function (e.g., Al, Mg, Li, Ca, or an alloy or a compound thereof, such as MgAg, MgIn, or AlLi) is preferably used. In the case where light generated in the EL layer 616 passes through the second electrode 617, a stack including a thin metal film and a transparent conductive film (e.g., ITO, indium oxide containing zinc oxide at 2 wt % or higher and 20 wt % or lower, indium tin oxide containing silicon, or zinc oxide (ZnO)) is preferably used for the second electrode 617.

Note that a light-emitting device 618 is formed with the first electrode 613, the EL layer 616, and the second electrode 617. The light-emitting device 618 preferably has the structure described in Embodiment 1 and Embodiment 3. In the light-emitting apparatus of this embodiment, the pixel portion, which includes a plurality of light-emitting devices, may include both the light-emitting device with the structure described in Embodiment 1 and Embodiment 3 and a light-emitting device with a different structure.

The sealing substrate 604 is attached to the element substrate 610 with the sealant 605, so that the light-emitting device 618 is provided in the space 607 surrounded by the element substrate 610, the sealing substrate 604, and the sealant 605. The space 607 is filled with a filler. The filler may be an inert gas (such as nitrogen or argon), or a resin and/or a desiccant.

An epoxy-based resin or glass frit is preferably used for the sealant 605. It is preferred that such a material transmit as less moisture or oxygen as possible. As the sealing substrate 604, a glass substrate, a quartz substrate, or a plastic substrate formed of fiber reinforced plastic (FRP), polyvinyl fluoride (PVF), polyester, acrylic, or the like can be used.

In the above manner, the light-emitting apparatus including the light-emitting devices described in Embodiment 1 and Embodiment 3 can be obtained.

<Structure Example 1 of Light-Emitting Apparatus>

Figure 8A:
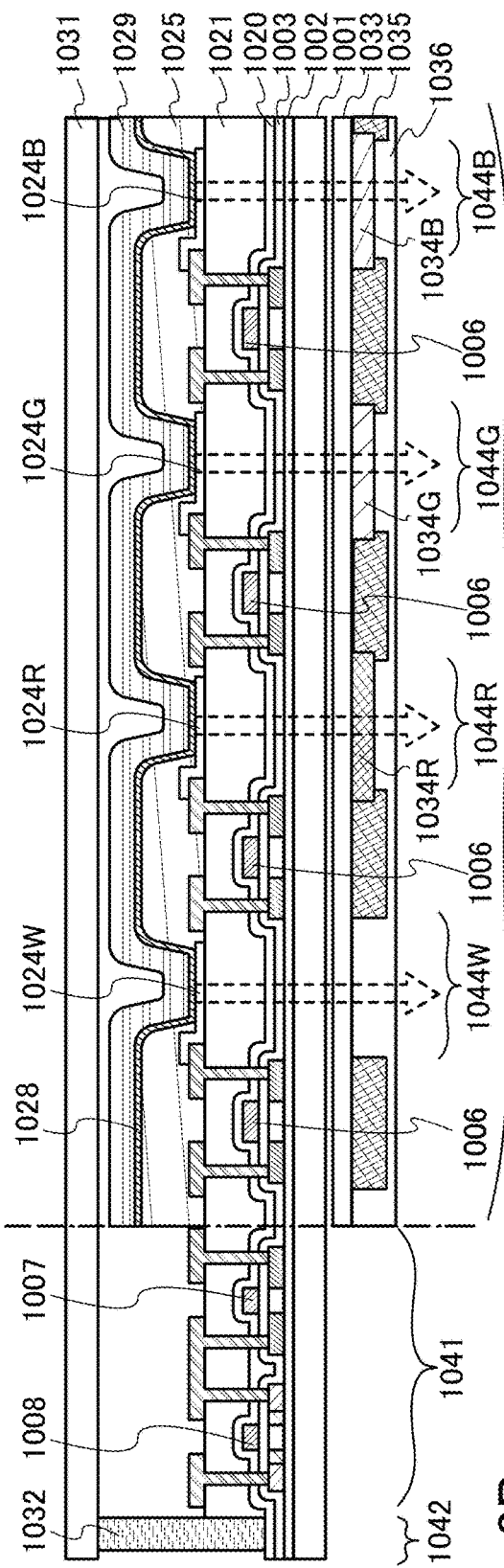
FIGS. 8A and 8B are schematic cross-sectional views each illustrating a display device of one embodiment of the present invention.
Figure 8B:
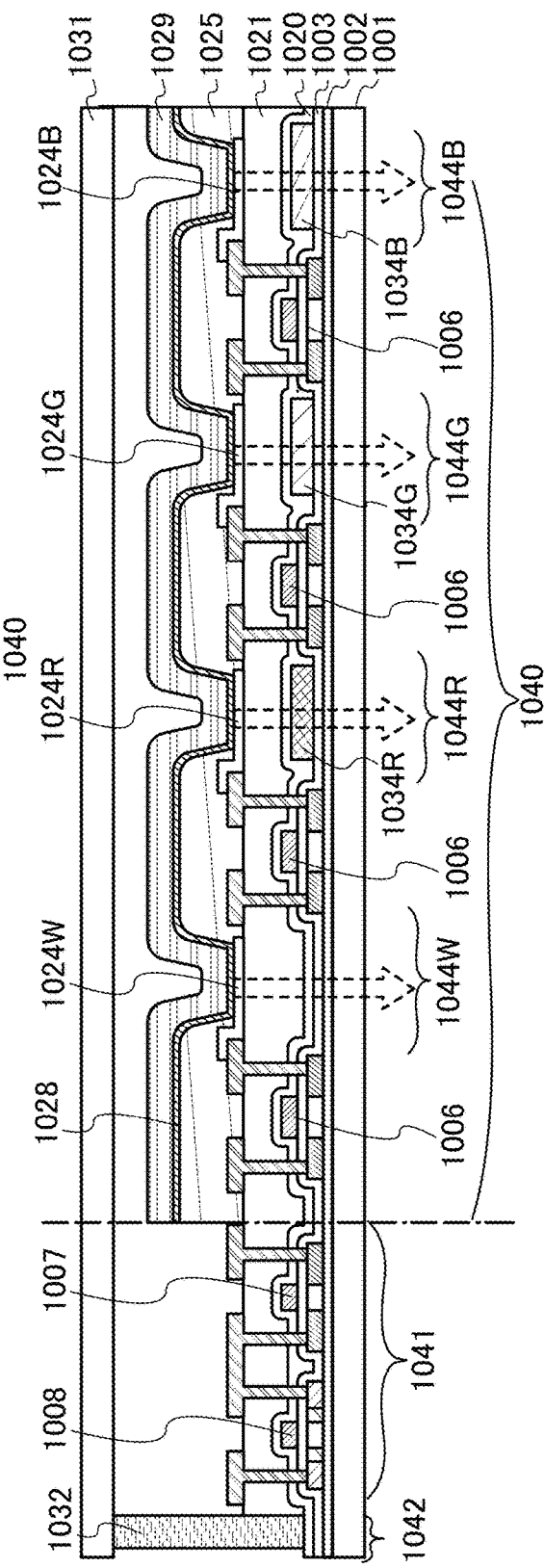

As an example of a display device, FIGS. 8A and 8B each illustrate a light-emitting apparatus including a light-emitting device exhibiting white light emission and a coloring layer (color filter).

FIG. 8A illustrates a substrate 1001, a base insulating film 1002, a gate insulating film 1003, gate electrodes 1006, 1007, and 1008, a first interlayer insulating film 1020, a second interlayer insulating film 1021, a peripheral portion 1042, a pixel portion 1040, a driver circuit portion 1041, first electrodes 1024W, 1024R, 1024G, and 1024B of light-emitting devices, a partition 1025, an EL layer 1028, a second electrode 1029 of the light-emitting devices, a sealing substrate 1031, a sealant 1032, and the like.

In FIGS. 8A and 8B, coloring layers (a red coloring layer 1034R, a green coloring layer 1034G, and a blue coloring layer 1034B) are provided on a transparent base material 1033. A black layer (black matrix) 1035 may be additionally provided. The transparent base material 1033 provided with the coloring layers and the black layer is positioned and fixed to the substrate 1001. Note that the coloring layers and the black layer are covered with an overcoat layer 1036. In FIG. 8A, light emitted from some of the light-emitting layers does not pass through the coloring layers, while light emitted from the others of the light-emitting layers passes through the coloring layers. Since light that does not pass through the coloring layers is white and light that passes through any one of the coloring layers is red, blue, or green, an image can be displayed using pixels of the four colors.

FIG. 8B illustrates an example in which the red coloring layer 1034R, the green coloring layer 1034G, and the blue coloring layer 1034B are formed between the gate insulating film 1003 and the first interlayer insulating film 1020. As illustrated in FIG. 8B, the coloring layers may be provided between the substrate 1001 and the sealing substrate 1031.

The above-described light-emitting apparatus has a structure in which light is extracted from the substrate 1001 side where the TFTs are formed (bottom emission structure), but may have a structure in which light is extracted from the sealing substrate 1031 side (top emission structure).

<Structure Example 2 of Light-Emitting Apparatus>

FIGS. 9A and 9B are each a cross-sectional view of a light-emitting apparatus having a top emission structure. In this case, a substrate that does not transmit light can be used as the substrate 1001. The process up to the step of forming of a connection electrode which connects the TFT and the anode of the light-emitting device is performed in a manner similar to that of the light-emitting apparatus having a bottom emission structure. Then, a third interlayer insulating film 1037 is formed to cover an electrode 1022. This insulating film may have a planarization function. The third interlayer insulating film 1037 can be formed using a material similar to that of the second interlayer insulating film 1021, or can be formed using any other various materials.

Lower electrodes 1025W, 1025R, 1025G, and 1025B of the light-emitting devices each function as an anode here, but may function as a cathode. Furthermore, in the case of the light-emitting apparatus having a top emission structure as illustrated in FIGS. 9A and 9B, the lower electrodes 1025W, 1025R, 1025G, and 1025B are preferably reflective electrodes. Note that the second electrode 1029 preferably has a function of reflecting light and a function of transmitting light. It is preferred that a microcavity structure be used between the second electrode 1029 and the lower electrodes 1025W, 1025R, 1025G, and 1025B, in which case light having a specific wavelength is amplified. The EL layer 1028 is formed to have a structure similar to the structures described in Embodiment 1 and Embodiment 3, with which white light emission can be obtained.

In FIGS. 8A and 8B and FIGS. 9A and 9B, the structure of the EL layer for providing white light emission can be achieved by, for example, using a plurality of light-emitting layers or using a plurality of light-emitting units. Note that the structure providing white light emission is not limited to the above.

In the case of a top emission structure as illustrated in FIGS. 9A and 9B, sealing can be performed with the sealing substrate 1031 on which the coloring layers (the red coloring layer 1034R, the green coloring layer 1034G, and the blue coloring layer 1034B) are provided. The sealing substrate 1031 may be provided with the black layer (the black matrix) 1030 which is positioned between pixels. The coloring layers (the red coloring layer 1034R, the green coloring layer 1034G, and the blue coloring layer 1034B) and the black layer (the black matrix) may be covered with the overcoat layer. Note that a light-transmitting substrate is used as the sealing substrate 1031.

FIG. 9A illustrates a structure in which full color display is performed using three colors of red, green, and blue; alternatively, full color display may be performed using four colors of red, green, blue, and white as illustrated in FIG. 9B. Note that the structure for performing full color display is not limited to them. For example, full color display using four colors of red, green, blue, and yellow may be performed.

In the light-emitting device of one embodiment of the present invention, which includes a fluorescent material and a phosphorescent material or a TADF material as guest materials, can emit multicolor light with high efficiency. Accordingly, with the use of the light-emitting apparatus, the light-emitting apparatus described in this embodiment can have high luminous efficiency.

In the above manner, the light-emitting apparatuses including the light-emitting devices described in Embodiment 1 and Embodiment 3 can be obtained.

This embodiment can be combined with any of the other embodiments as appropriate.

Embodiment 5

In this embodiment, electronic devices and display devices of embodiments of the present invention will be described.

According to one embodiment of the present invention, it is possible to manufacture an electronic device and a display device that include a flat surface and have favorable luminous efficiency and high reliability. In addition, according to one embodiment of the present invention, it is possible to manufacture an electronic device and a display device that include a curved surface and have favorable luminous efficiency and high reliability. Furthermore, a light-emitting device having high color reproducibility as described above can be obtained.

Examples of electronic devices include a television set, a desktop or laptop personal computer, a monitor of a computer or the like, a digital camera, a digital video camera, a digital photo frame, a mobile phone, a portable game machine, a portable information terminal, an audio reproducing device, and a large game machine such as a pachinko machine.

Figure 10A:
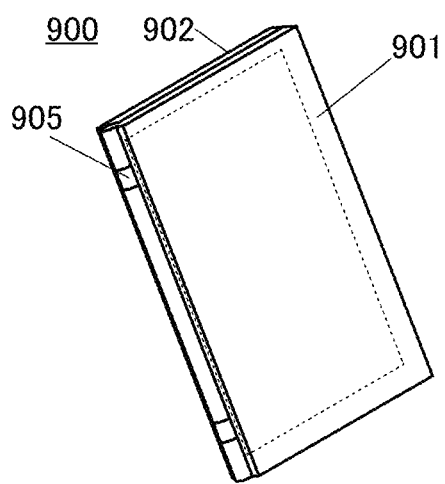
FIGS. 10A to 10D are perspective views illustrating display modules of embodiments of the present invention.
Figure 10B:
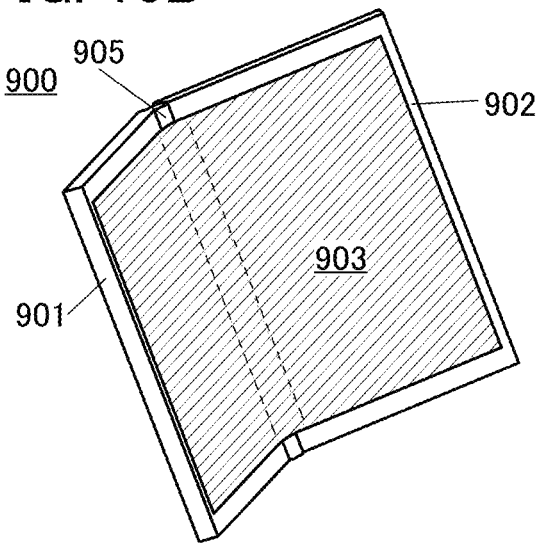

A portable information terminal 900 illustrated in FIGS. 10A and 10B includes a housing 901, a housing 902, a display portion 903, a hinge portion 905, and the like.

The housing 901 and the housing 902 are joined together with the hinge portion 905. The portable information terminal 900 can be opened as illustrated in FIG. 10B from a closed state (FIG. 10A). Thus, the portable information terminal 900 has high portability when carried and excels in visibility when used because of its large display region.

In the portable information terminal 900, the flexible display portion 903 is provided across the housing 901 and the housing 902 that are joined to each other with the hinge portion 905.

The light-emitting apparatus manufactured using one embodiment of the present invention can be used for the display portion 903. Thus, the portable information terminal can have high reliability.

The display portion 903 can display at least one of document data, a still image, a moving image, and the like. When document data is displayed on the display portion 903, the portable information terminal 900 can be used as an e-book reader.

When the portable information terminal 900 is opened, the display portion 903 is held with a large radius of curvature. For example, the display portion 903 is held while including a curved portion with a radius of curvature ranging from 1 mm to 50 mm, preferably from 5 mm to 30 mm. Part of the display portion 903 can display an image while being bent because pixels are continuously arranged from the housing 901 to the housing 902.

The display portion 903 functions as a touch panel and can be controlled with a finger, a stylus, or the like.

The display portion 903 is preferably formed using one flexible display, in which case a continuous image can be displayed between the housing 901 and the housing 902. Note that each of the housings 901 and 902 may be provided with a display.

The hinge portion 905 preferably includes a locking mechanism so that an angle formed between the housing 901 and the housing 902 does not become larger than a predetermined angle when the portable information terminal 900 is opened. For example, an angle at which the housing 901 and the housing 902 become locked (they are not opened any further) is preferably greater than or equal to 90° and less than 1800 and can typically be 90°, 120°, 135°, 150°, 175°, or the like. Consequently, the convenience, safety, and reliability of the portable information terminal 900 can be improved.

When the hinge portion 905 includes a locking mechanism, excessive force is not applied to the display portion 903; thus, breakage of the display portion 903 can be prevented. Therefore, a highly reliable portable information terminal can be provided.

The housing 901 and the housing 902 may include a power button, an operation button, an external connection port, a speaker, a microphone, or the like.

One of the housing 901 and the housing 902 is provided with a wireless communication module, and data can be transmitted and received through a computer network such as the Internet, a local area network (LAN), or Wi-Fi (registered trademark).

Figure 10C:
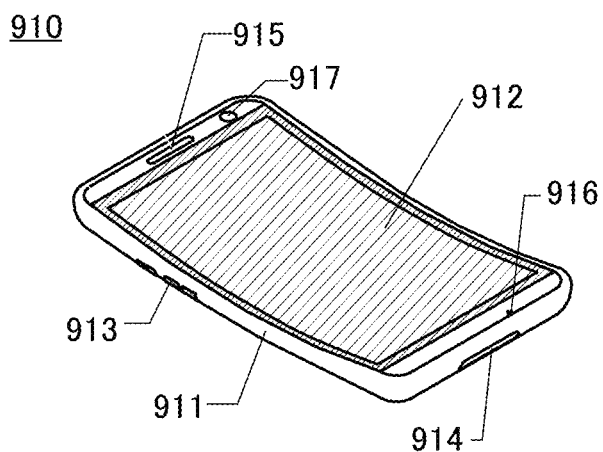

A portable information terminal 910 illustrated in FIG. 10C includes a housing 911, a display portion 912, an operation button 913, an external connection port 914, a speaker 915, a microphone 916, a camera 917, and the like.

The light-emitting apparatus manufactured using one embodiment of the present invention can be used for the display portion 912. Thus, the portable information terminal can be manufactured with high yield.

The portable information terminal 910 includes a touch sensor in the display portion 912. Operations such as making a call and inputting letters can be performed by touch on the display portion 912 with a finger, a stylus, or the like.

With the operation button 913, the power can be turned on or off. In addition, types of images displayed on the display portion 912 can be switched; for example, switching an image from a mail creation screen to a main menu screen is performed with the operation button 913.

When a sensing device such as a gyroscope sensor or an acceleration sensor is provided inside the portable information terminal 910, the direction of display on the screen of the display portion 912 can be automatically changed by determining the orientation of the portable information terminal 910 (whether the portable information terminal 910 is placed horizontally or vertically). Furthermore, the direction of display on the screen can be changed by touch on the display portion 912, operation with the operation button 913, or sound input using the microphone 916, for example.

The portable information terminal 910 functions as, for example, one or more of a telephone set, a notebook, and an information browsing system. Specifically, the portable information terminal 910 can be used as a smartphone. The portable information terminal 910 is capable of executing a variety of applications such as mobile phone calls, e-mailing, viewing and editing texts, music reproduction, video replay, Internet communication, and computer games, for example.

Figure 10D:
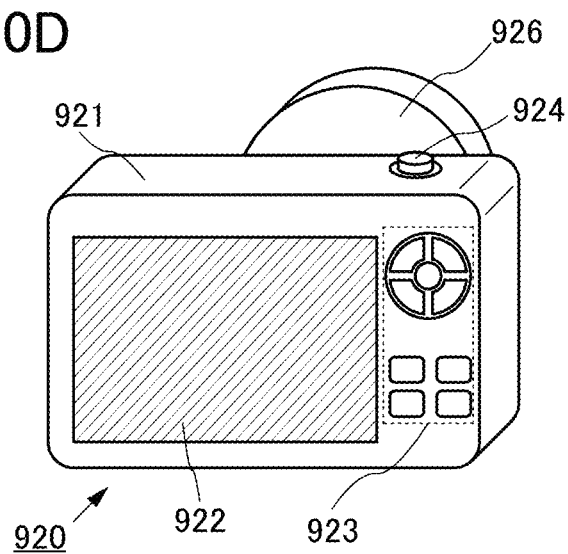

A camera 920 illustrated in FIG. 10D includes a housing 921, a display portion 922, operation buttons 923, a shutter button 924, and the like. Furthermore, an attachable lens 926 is attached to the camera 920.

The light-emitting apparatus manufactured using one embodiment of the present invention can be used for the display portion 922. Thus, the camera can be highly reliable.

Although the lens 926 of the camera 920 here is detachable from the housing 921 for replacement, the lens 926 may be incorporated into the housing 921.

Still images or moving images can be taken with the camera 920 at the press of the shutter button 924. Images can also be taken by the touch on the display portion 922 that has a function of a touch panel.

Note that a stroboscope, a viewfinder, or the like can be additionally attached to the camera 920 or may alternatively be incorporated into the housing 921.

Figure 11A:
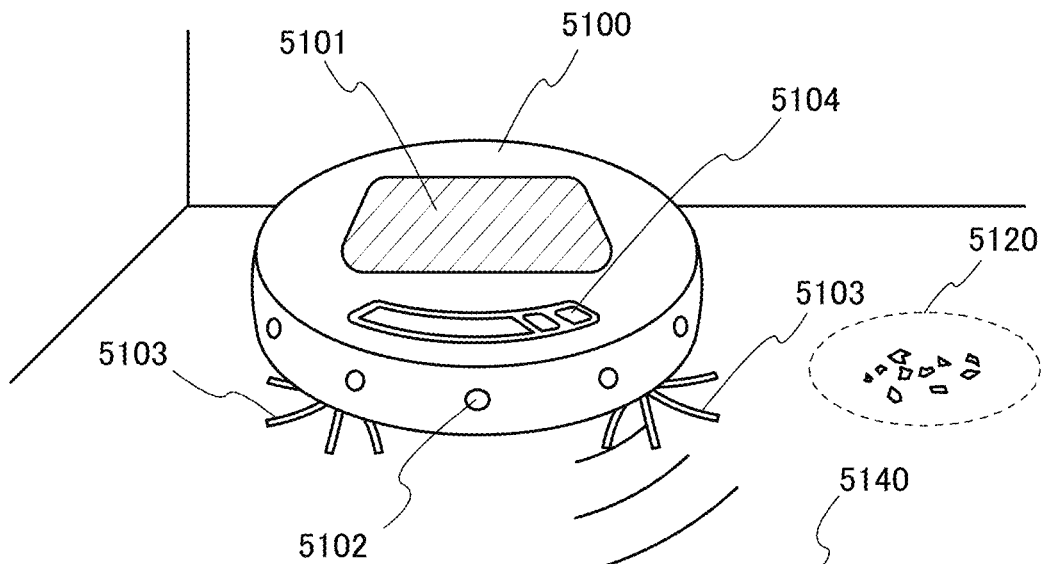
FIGS. 11A to 11C illustrate electronic devices of embodiments of the present invention.

FIG. 11A is a schematic view illustrating an example of a cleaning robot.

A cleaning robot 5100 includes a display 5101 on its top surface, a plurality of cameras 5102 on its side surface, a brush 5103, and operation buttons 5104. Although not illustrated, the bottom surface of the cleaning robot 5100 is provided with a tire, an inlet, and the like. Furthermore, the cleaning robot 5100 includes various sensors such as an infrared sensor, an ultrasonic sensor, an acceleration sensor, a piezoelectric sensor, an optical sensor, and a gyroscope sensor. The cleaning robot 5100 has a wireless communication means.

The cleaning robot 5100 is self-propelled, detects dust 5120, and sucks up the dust through the inlet provided on the bottom surface.

The cleaning robot 5100 can determine whether there is an obstacle such as a wall, furniture, or a step by analyzing images taken by the cameras 5102. When the cleaning robot 5100 detects an object that is likely to be caught in the brush 5103 (e.g., a wire) by image analysis, the rotation of the brush 5103 can be stopped.

The display 5101 can display the remaining capacity of a battery, the amount of collected dust, and the like. The display 5101 may display a path on which the cleaning robot 5100 has run. The display 5101 may be a touch panel, and the operation buttons 5104 may be provided on the display 5101.

The cleaning robot 5100 can communicate with a portable electronic device 5140 such as a smartphone. The portable electronic device 5140 can display images taken by the cameras 5102. Accordingly, an owner of the cleaning robot 5100 can monitor his/her room even when the owner is not at home. The owner can also check the display on the display 5101 by the portable electronic device 5140 such as a smartphone.

The light-emitting apparatus of one embodiment of the present invention can be used for the display 5101.

Figure 11B:
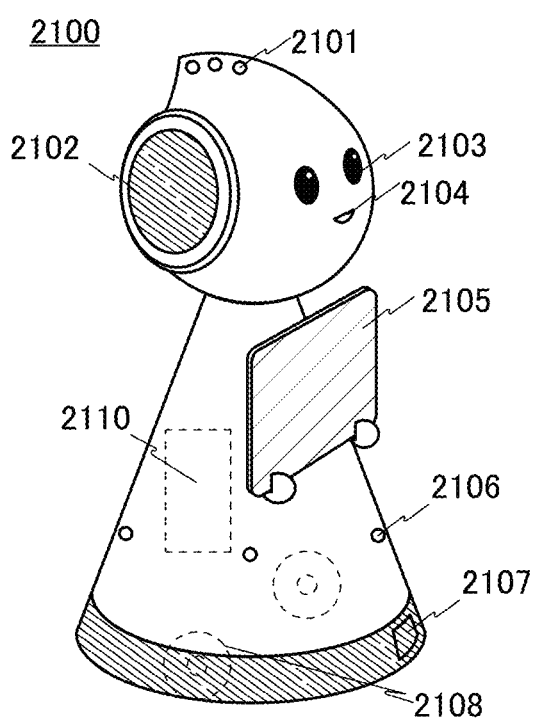

A robot 2100 illustrated in FIG. 11B includes an arithmetic device 2110, an illuminance sensor 2101, a microphone 2102, an upper camera 2103, a speaker 2104, a display 2105, a lower camera 2106, an obstacle sensor 2107, and a moving mechanism 2108.

The microphone 2102 has a function of detecting a speaking voice of a user, an environmental sound, and the like. The speaker 2104 also has a function of outputting sound. The robot 2100 can communicate with a user using the microphone 2102 and the speaker 2104.

The display 2105 has a function of displaying various kinds of information. The robot 2100 can display information desired by a user on the display 2105. The display 2105 may be provided with a touch panel. Moreover, the display 2105 may be a detachable information terminal, in which case charging and data communication can be performed when the display 2105 is set at the home position of the robot 2100.

The upper camera 2103 and the lower camera 2106 each have a function of capturing an image of the surroundings of the robot 2100. The obstacle sensor 2107 can detect an obstacle in the direction where the robot 2100 advances with the moving mechanism 2108. The robot 2100 can move safely by recognizing the surroundings with the upper camera 2103, the lower camera 2106, and the obstacle sensor 2107.

The light-emitting apparatus of one embodiment of the present invention can be used for the display 2105.

Figure 11C:
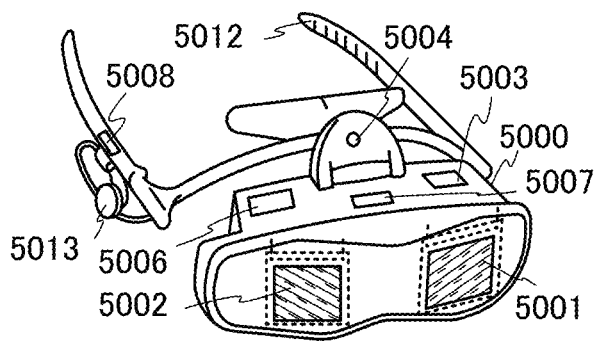

FIG. 11C illustrates an example of a goggle-type display. The goggle-type display includes, for example, a housing 5000, a display portion 5001, a speaker 5003, an LED lamp 5004, operation keys 5005 (including a power switch and an operation switch), a connection terminal 5006, a sensor 5007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 5008, a second display portion 5002, a support 5012, and an earphone 5013.

The light-emitting apparatus of one embodiment of the present invention can be used for the display portion 5001 and the second display portion 5002.

Figure 12A:
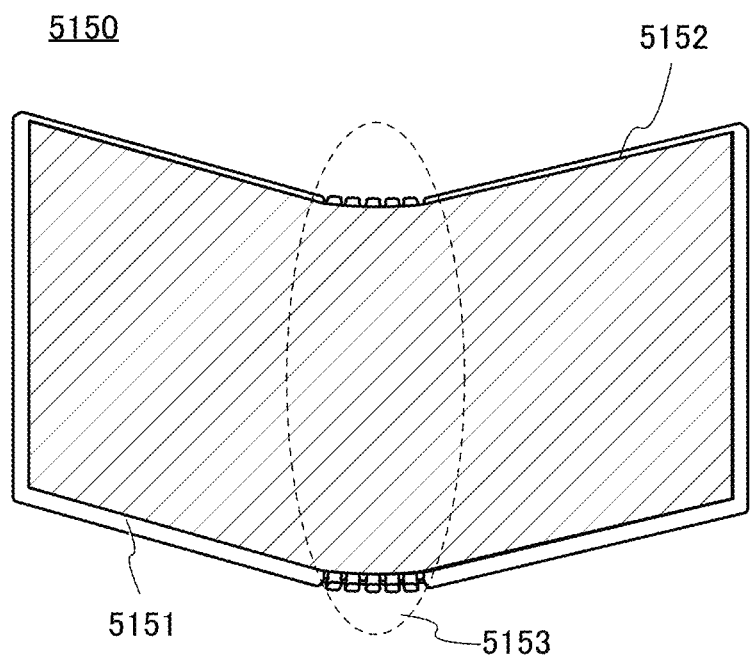
FIGS. 12A and 12B are perspective views illustrating a display device of one embodiment of the present invention.
Figure 12B:
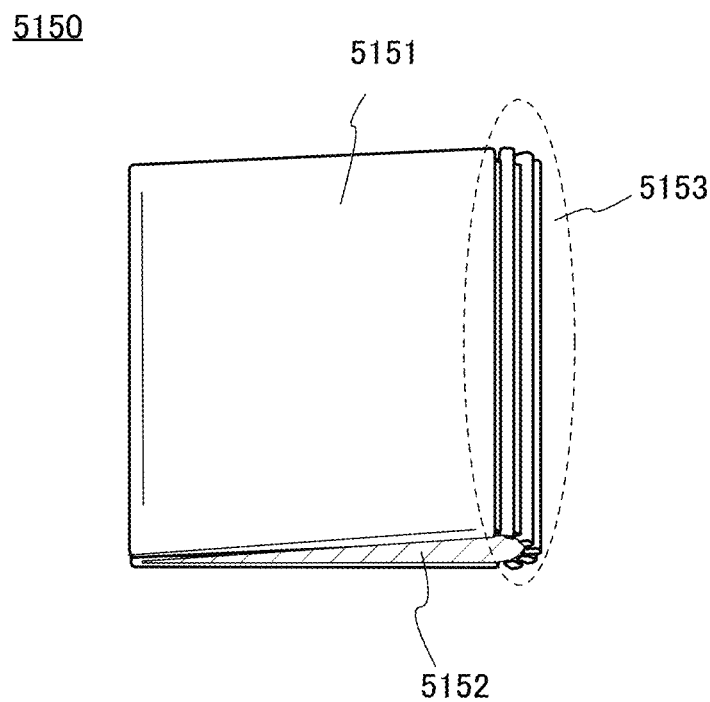

FIGS. 12A and 12B illustrate a foldable portable information terminal 5150. The foldable portable information terminal 5150 includes a housing 5151, a display region 5152, and a bend portion 5153. FIG. 12A illustrates the portable information terminal 5150 that is opened. FIG. 12B illustrates the portable information terminal 5150 that is folded. Despite its large display region 5152, the portable information terminal 5150 is compact in size and has excellent portability when folded.

The display region 5152 can be folded in half with the bend portion 5153. The bend portion 5153 includes a flexible member and a plurality of supporting members. When the display region is folded, the flexible member expands and the bend portion 5153 has a radius of curvature of 2 mm or more, preferably 5 mm or more.

Note that the display region 5152 may be a touch panel (input/output device) including a touch sensor (input device). The light-emitting apparatus of one embodiment of the present invention can be used for the display region 5152.

This embodiment can be combined with any of the other embodiments as appropriate.

Embodiment 6

In this embodiment, an example in which the light-emitting device of one embodiment of the present invention is used for various lighting devices will be described with reference to FIG. 13. With the use of the light-emitting device of one embodiment of the present invention, a highly reliable lighting device with favorable luminous efficiency can be manufactured.

Forming the light-emitting device of one embodiment of the present invention over a flexible substrate enables an electronic device and a lighting device to have a light-emitting region with a curved surface.

The light-emitting apparatus including the light-emitting device of one embodiment of the present invention can also be used for lighting for motor vehicles, specifically lighting for a windshield and a ceiling, for example.

Figure 13:
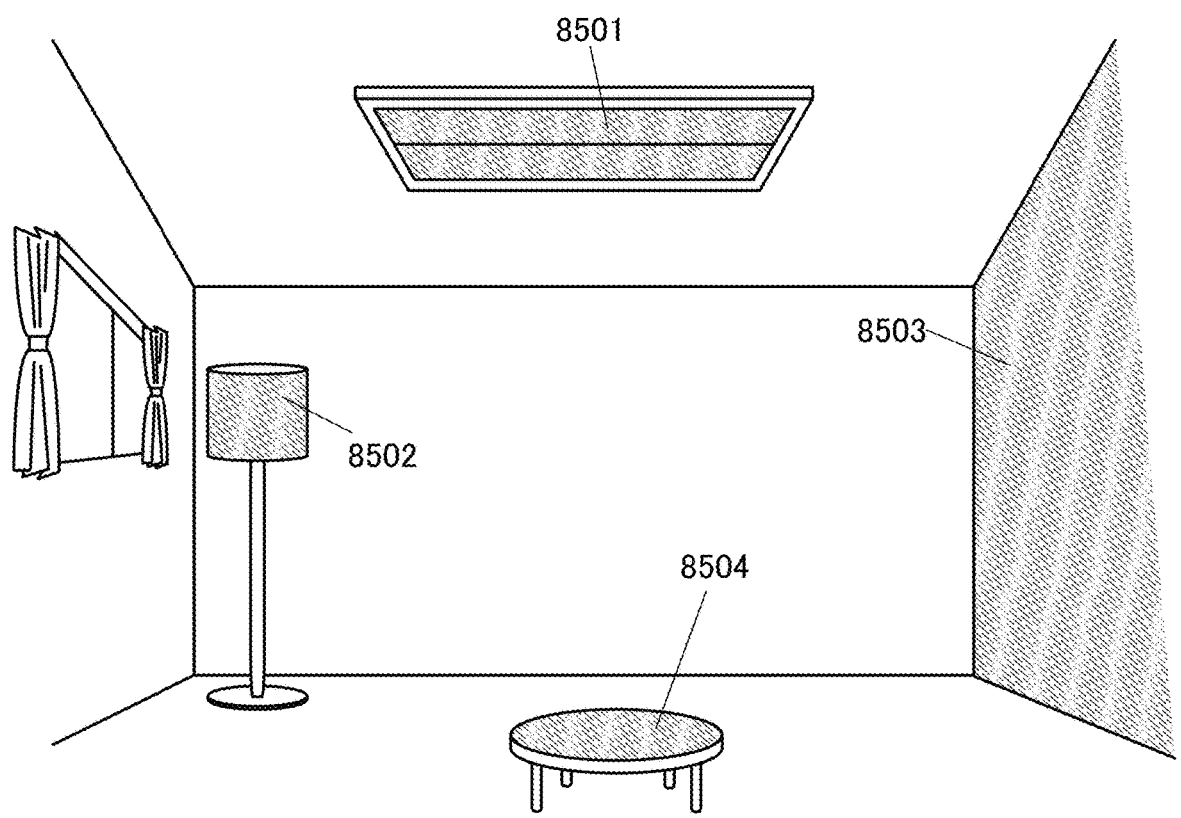
FIG. 13 illustrates a lighting device of one embodiment of the present invention.

FIG. 13 illustrates an example in which the light-emitting device is used for an indoor lighting device 8501. Since the light-emitting device can have a larger area, a large-area lighting device can also be formed. In addition, a lighting device 8502 whose light-emitting region has a curved surface can be formed with the use of a housing having a curved surface. The light-emitting device described in this embodiment is in the form of a thin film, which allows the housing to be designed more freely. Accordingly, the lighting device can be elaborately designed in a variety of ways. Furthermore, a wall of the room may be provided with a large-sized lighting device 8503. Touch sensors may be provided in the lighting devices 8501, 8502, and 8503 to control the power on/off of the lighting devices.

When the light-emitting device is provided on the top surface of a table, a lighting device 8504 that has a function of a table can be obtained. Note that when the light-emitting device is used as part of other furniture, a lighting device that has a function of the furniture can be obtained.

As described above, lighting devices and electronic devices can be obtained with the use of the light-emitting apparatus of one embodiment of the present invention. Note that the light-emitting device can be used for lighting devices and electronic devices in a variety of fields without being limited to those described in this embodiment.

The structures described in this embodiment can be combined with any of the structures described in the other embodiments as appropriate.

Example 1

In this example, fabrication examples and characteristics of light-emitting devices of embodiments of the present invention and a comparative light-emitting device will be described. The structure of each of the light-emitting devices fabricated in this example is the same as that illustrated in FIG. TA. Table 1 and Table 2 show the detailed structures of the devices. The structures and abbreviations of compounds used here are shown below.

[Chemical Formulae 37]
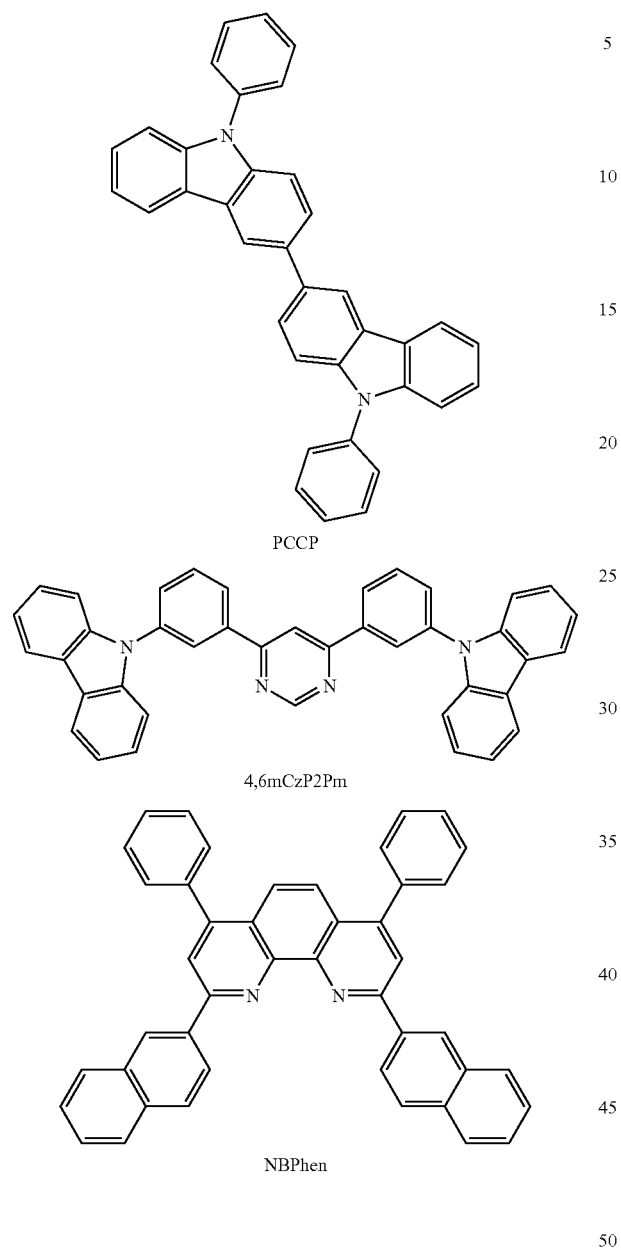
PCCP
4,6mCzP2Pm
NBPhen
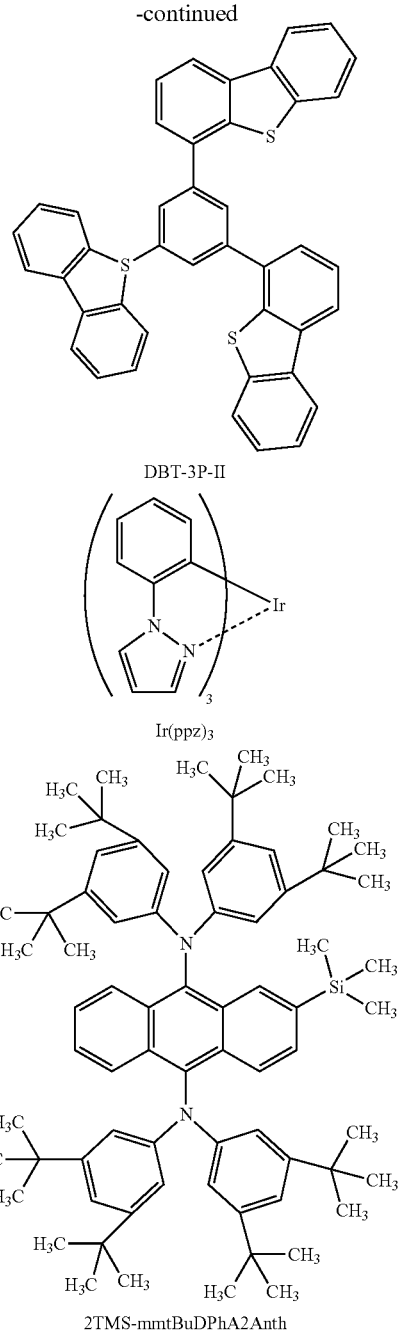
DBT-3P-II
Ir(ppz)₃
2TMS-mmtBuDPhA2Anth
TABLE 1
|  | Layer | Reference numeral | Thickness (nm) | Material | Weight ratio |
|---|---|---|---|---|---|
| Light-emitting Device 1 | Electrode | 102 | 200 | Al | — |
|  | Electron-injection layer | 119 | 1 | LiF | — |
|  | Electron-transport layer | 118(2) | 10 | NBPhen | — |
|  |  | 118(1) | 20 | 4,6mCzP2Pm | — |
|  | Light-emitting layer | 130 | 40 | 4,6mCzP2Pm: | 0.8: |
|  |  |  |  | Ir(ppz)₃: | 0.2: |
|  |  |  |  | 2TMS-mmtBuDPhA2Anth: | 0.025: |
|  |  |  |  | Ir(dmdppr-dmp)₂(dpm) | 0.01 |

TABLE 1-continued

|  | Layer | Reference numeral | Thickness (nm) | Material | Weight ratio |
|---|---|---|---|---|---|
| Light-emitting Device 2 | Hole-transport layer | 112 | 20 | PCCP | — |
|  | Hole-injection layer | 111 | 40 | DBT3P-II: MoO$_3$ | 1:0.5 |
|  | Electrode | 101 | 70 | ITSO | — |
|  | Electrode | 102 | 200 | Al | — |
|  | Electron-injection layer | 119 | 1 | LiF | — |
|  | Electron-transport layer | 118(2) | 10 | NBPhen | — |
|  |  | 118(1) | 20 | 4,6mCzP2Pm | — |
|  | Light-emitting layer | 130 | 40 | 4,6mCzP2Pm: Ir(ppz)$_3$: 2TMS-mmtBuDPhA2Anth: Ir(dmdppr-dmp)$_2$(dpm) | 0.8: 0.2: 0.05: 0.01 |
| Light-emitting Device 3 | Hole-transport layer | 112 | 20 | PCCP | — |
|  | Hole-injection layer | 111 | 40 | DBT3P-II: MoO$_3$ | 1:0.5 |
|  | Electrode | 101 | 70 | ITSO | — |
|  | Electrode | 102 | 200 | Al | — |
|  | Electron-injection layer | 119 | 1 | LiF | — |
|  | Electron-transport layer | 118(2) | 10 | NBPhen | — |
|  |  | 118(1) | 20 | 4,6mCzP2Pm | — |
|  | Light-emitting layer | 130 | 40 | 4,6mCzP2Pm: Ir(ppz)$_3$: 2TMS-mmtBuDPhA2Anth: Ir(dmdppr-dmp)$_2$(dpm) | 0.8: 0.2: 0.025: 0.005 |
|  | Hole-transport layer | 112 | 20 | PCCP | — |
|  | Hole-injection layer | 111 | 40 | DBT3P-II: MoO$_3$ | 1:0.5 |
|  | Electrode | 101 | 70 | ITSO | — |

TABLE 2

|  | Layer | Reference numeral | Thickness (nm) | Material | Weight ratio |
|---|---|---|---|---|---|
| Light-emitting Device 4 | Electrode | 102 | 200 | Al | — |
|  | Electron-injection layer | 119 | 1 | LiF | — |
|  | Electron-transport layer | 118(2) | 10 | NBPhen | — |
|  |  | 118(1) | 20 | 4,6mCzP2Pm | — |
|  | Light-emitting layer | 130 | 40 | 4,6mCzP2Pm: Ir(ppz)$_3$: 2TMS-mmtBuDPhA2Anth: Ir(dmdppr-dmp)$_2$(dpm) | 0.8: 0.2: 0.05: 0.005 |
|  | Hole-transport layer | 112 | 30 | PCCP | — |
|  | Hole-injection layer | 111 | 40 | DBT3P-II: MoO$_3$ | 1:0.5 |
|  | Electrode | 101 | 70 | ITSO | — |
| Comparative Light-emitting Device 5 | Electrode | 102 | 200 | Al | — |
|  | Electron-injection layer | 119 | 1 | LiF | — |
|  | Electron-transport layer | 118(2) | 10 | NBPhen | — |
|  |  | 118(1) | 20 | 4,6mCzP2Pm | — |
|  | Light-emitting layer | 130 | 40 | 4,6mCzP2Pm: Ir(ppz)$_3$: 2TMS-mmtBuDPhA2Anth | 0.8: 0.2: 0.05 |
|  | Hole-transport layer | 112 | 30 | PCCP | — |
|  | Hole-injection layer | 111 | 40 | DBT3P-II: MoO$_3$ | 1:0.5 |
|  | Electrode | 101 | 70 | ITSO | — |

<Fabrication of Light-Emitting Devices>

Fabrication methods for the light-emitting devices in this example will be described below.

<<Fabrication of Light-Emitting Device 1>>

As the electrode 101, an ITSO film was formed to a thickness of 70 nmover a glass substrate. Note that the electrode area of the electrode 101 was set to 4 mm$^2$ (2 mm×2 mm).

Next, as the hole-injection layer 111, DBT3P-II and molybdenum oxide (MoO$_3$) were deposited by co-evaporation on the electrode 101 to a thickness of 40 nm at a weight ratio of DBT3P-II: MoO$_3$=1:0.5.

Then, as the hole-transport layer 112, PCCP was deposited on the hole-injection layer 111 by evaporation to a thickness of 20 nm.

Then, 4,6mCzP2Pm, Ir(ppz)$_3$, 2-trimethylsilyl-N,N,N,N-tetrakis(3,5-di-tert-butylphenyl)-9,10-anthracenediamine (abbreviation: 2TMS-mmtBuDPhA2Anth), and Ir(dmdppr-dmp)$_2$(dpm) were deposited as the light-emitting layer 130 on the hole-transport layer 112 by co-evaporation to a thickness of 40 nm at a weight ratio of 4,6mCzP2Pm: Ir(ppz)$_3$: 2TMS-mmtBuDPhA2Anth: Ir(dmdppr-dmp)$_2$(dpm))=0.8:0.2:0.025:0.01. In the light-emitting layer 130, 4,6mCzP2Pm and Ir(ppz)$_3$ are a combination that forms an exciplex. 2TMS-mmtBuDPhA2Anth is a fluorescent material having protecting groups, and Ir(dmdppr-dmp)$_2$(dpm) is a phosphorescent material containing Ir.

Subsequently, as the electron-transport layer 118, 4,6mCzP2Pm and NBPhen were sequentially deposited by evaporation on the light-emitting layer 130 to thicknesses of 20 nm and 10 nm, respectively. Then, as the electron-injection layer 119, LiF was deposited by evaporation on the electron-transport layer 118 to a thickness of 1 nm.

Then, as the electrode 102, aluminum (Al) was deposited on the electron-injection layer 119 to a thickness of 200 nm.

Then, in a glove box containing a nitrogen atmosphere, the light-emitting device 1 was sealed by fixing a glass substrate for sealing to the glass substrate on which the organic materials were deposited, using a sealant for organic EL. Specifically, after the sealant was applied to surround the organic materials on the glass substrate and the glass substrate was bonded to the glass substrate for sealing, irradiation with ultraviolet light having a wavelength of 365 nm at 6 J/cm$^2$ and heat treatment at 80° C. for one hour were performed. Through the above steps, the light-emitting device 1 was fabricated.

<<Fabrication of Light-Emitting Devices 2 to 4 and Comparative Light-Emitting Device 5>>

The light-emitting devices 2 to 4 and the comparative light-emitting device 5 were fabricated through the same steps as those for the above-described light-emitting device 1 except the step of forming the structure of the light-emitting layer 130. The details of the device structures are shown in Table 1 and Table 2; thus, the details of the fabrication methods are omitted. Materials used for the light-emitting layers 130 in the light-emitting devices 1 to 4 are the same, but the mixing ratios thereof are different from each other. The comparative light-emitting device 5 contains 2TMS-mmtBuDPhA2Anth, a fluorescent material having protecting groups, but does not contain Ir(dmdppr-dmp)$_2$(dpm), a phosphorescent material.

<Characteristics of Light-Emitting Devices>

Next, the characteristics of the fabricated light-emitting devices 1 to 4 and comparative light-emitting device 5 were measured. Luminance and CIE chromaticity were measured with a luminance colorimeter (BM-5A manufactured by TOPCON TECHNOHOUSE CORPORATION), and electroluminescence spectra were measured with a multi-channel spectrometer (PMA-11 manufactured by Hamamatsu Photonics K.K.).

Figure 14:
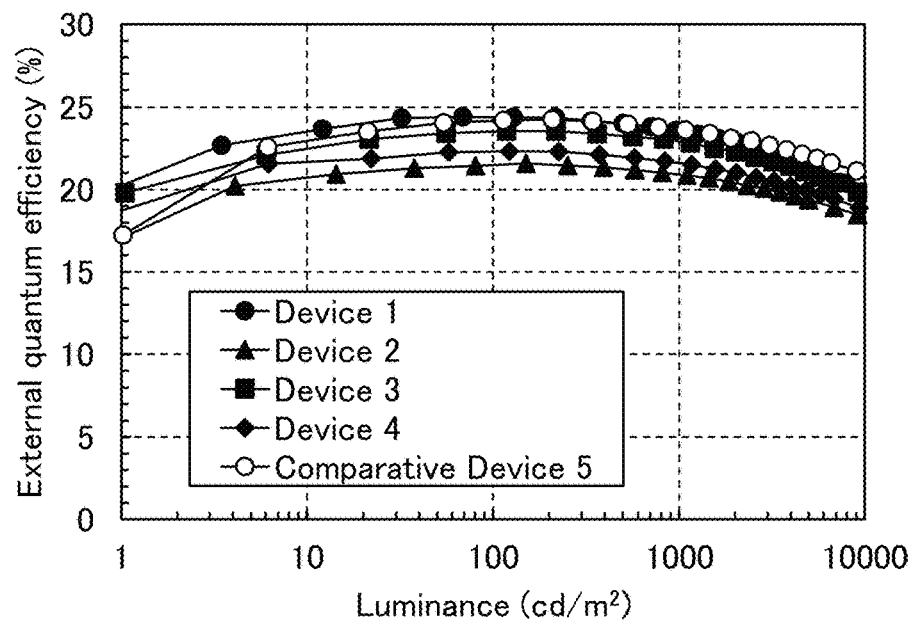
FIG. 14 shows the external quantum efficiency-luminance characteristics of light-emitting devices in Example.
Figure 15:
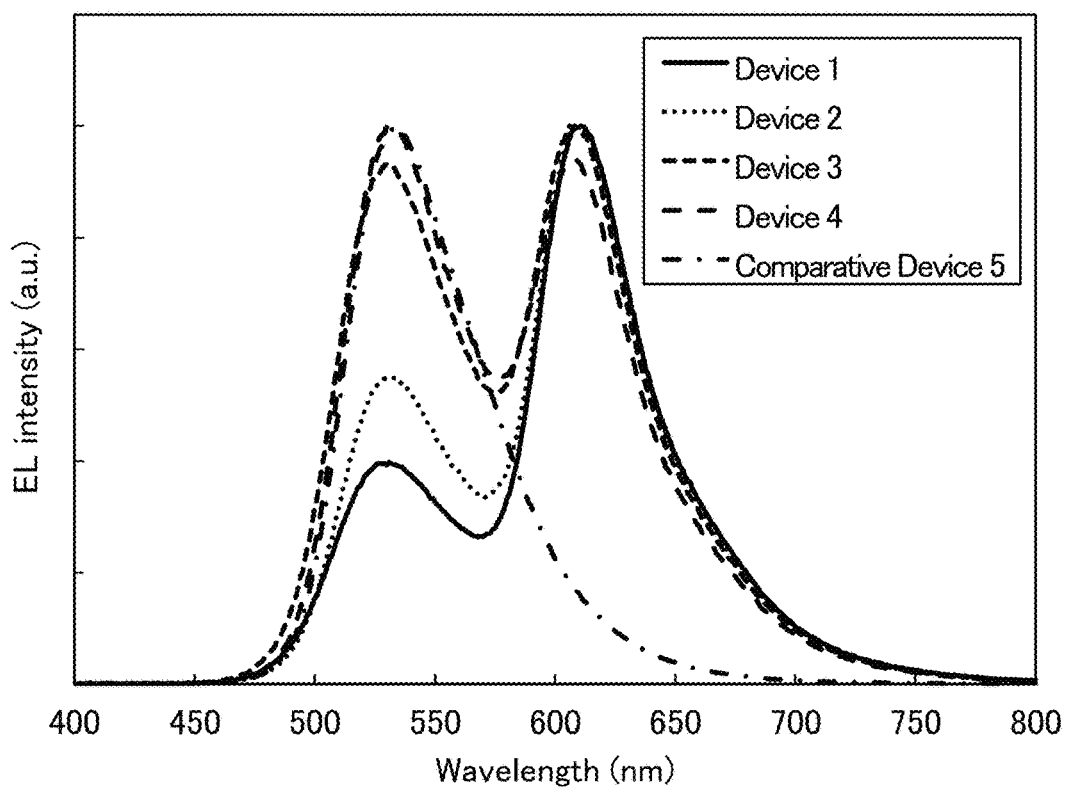
FIG. 15 shows the electroluminescence spectra of light-emitting devices in Example.
Figure 16:
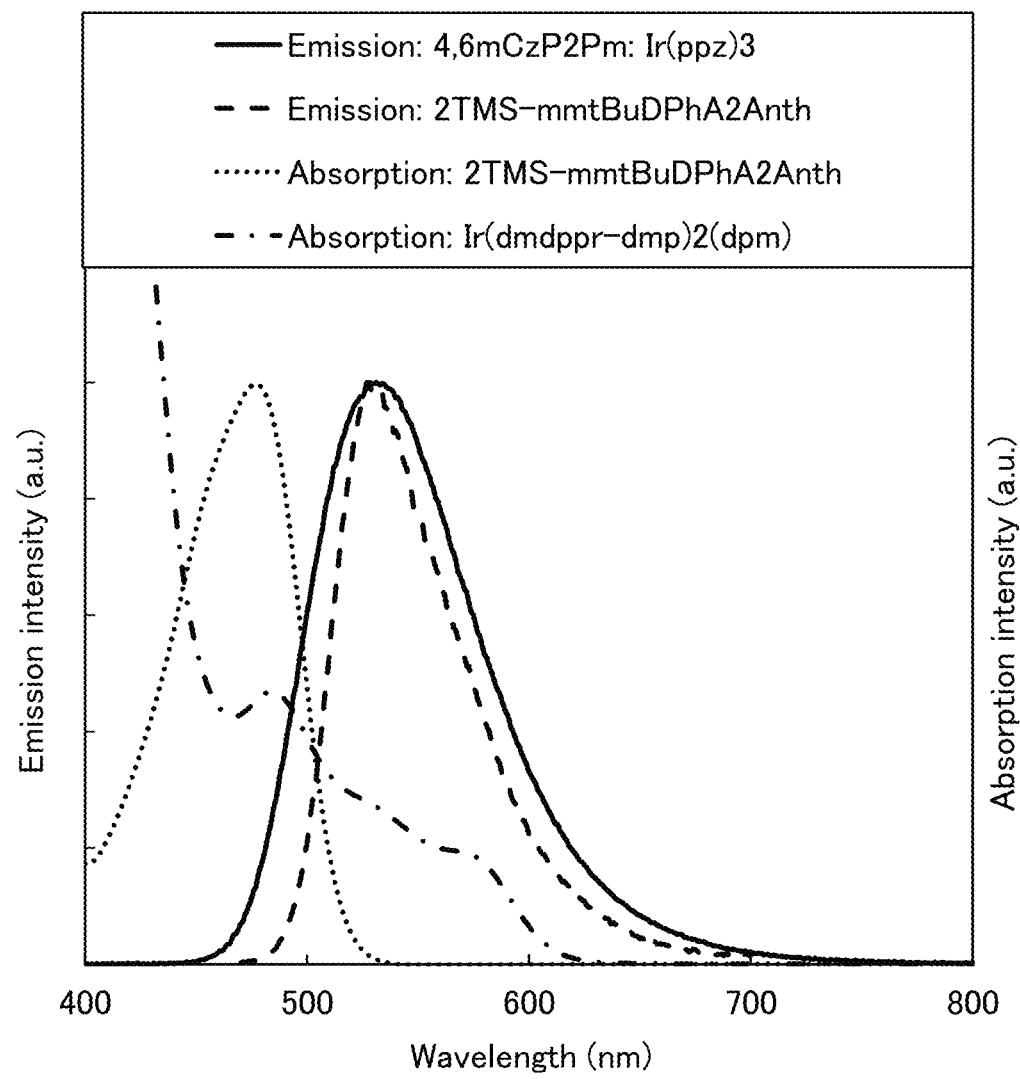
FIG. 16 shows the relationship among an electroluminescence spectrum of a light-emitting device and absorption spectra and an emission spectrum of compounds.

FIG. 14 shows the external quantum efficiency-luminance characteristics of the light-emitting devices 1 to 4 and the comparative light-emitting device 5. FIG. 15 shows the electroluminescence spectra obtained when a current with a density of 2.5 mA/cm$^2$ was supplied to the light-emitting devices 1 to 4 and the comparative light-emitting device 5. Note that the measurement of the light-emitting devices was performed at room temperature (in an atmosphere kept at 23° C.). FIG. 16 shows the absorption spectrum and the emission spectrum of 2TMS-mmtBuDPhA2Anth in a toluene solution, the absorption spectrum of Ir(dmdppr-dmp)$_2$(dpm) in a dichloromethane solution, and the EL spectrum of a comparative light-emitting device 9, which will be described later (the EL spectrum of an exciplex formed by 4,6mCzP2Pm and Ir(ppz)$_3$).

The absorption spectrum of 2TMS-mmtBuDPhA2Anth in a toluene solution and the absorption spectrum of Ir(dmdppr-dmp)$_2$(dpm) in a dichloromethane solution were measured using a UV-visible spectrophotometer (V550 type, manufactured by JASCO Corporation). FIG. 16 shows absorption spectra obtained by subtracting the spectrum of only a toluene solution in a quartz cell and the spectrum of only a dichloromethane solution in a quartz cell from the absorption spectra of 2TMS-mmtBuDPhA2Anth in a toluene solution and Ir(dmdppr-dmp)$_2$(dpm) in a dichloromethane solution, respectively. The emission spectrum was measured with a fluorescence spectrophotometer (μS920 produced by Hamamatsu Photonics K.K.).

Table 3 shows the device characteristics of the light-emitting devices 1 to 4 and the comparative light-emitting device 5 at around 1000 cd/m$^2$.

TABLE 3

|  | Voltage (V) | Current density (mA/cm$^2$) | CIE chromaticity (x, y) | Luminance (cd/m$^2$) | Current efficiency (cd/A) | Power efficiency (lm/W) | External quantum efficiency (%) |
|---|---|---|---|---|---|---|---|
| Light-emitting Device 1 | 3.30 | 1.88 | (0.522, 0.460) | 959 | 51.1 | 48.7 | 23.6 |
| Light-emitting Device 2 | 3.30 | 2.25 | (0.499, 0.484) | 1100 | 49.0 | 46.6 | 20.9 |
| Light-emitting Device 3 | 3.20 | 1.88 | (0.446, 0.529) | 1150 | 61.2 | 60.0 | 22.8 |
| Light-emitting Device 4 | 3.10 | 1.38 | (0.439, 0.540) | 839 | 60.6 | 61.5 | 21.7 |
| Comparative Light-emitting Device 5 | 3.20 | 1.19 | (0.323, 0.649) | 1081 | 90.7 | 89.0 | 23.6 |

As shown in FIG. 15, the emission spectra of the light-emitting devices 1 to 4 each have two peaks at around 530 nm and 610 nm. The peak at around 530 nm is attributed to 2TMS-mmtBuDPhA2Anth, and the peak at around 610 nm is attributed to Ir(dmdppr-dmp)$_2$(dpm). That is, the light-emitting devices 1 to 4 emitted both light derived from 2TMS-mmtBuDPhA2Anth and light derived from Ir(dmdppr-dmp)$_2$(dpm). The comparative light-emitting device 5 emitted green light with a peak wavelength of 534 nm and a half width of 65 nm. This indicates that light emission due to 2TMS-mmtBuDPhA2Anth was obtained from the comparative light-emitting device 5.

As shown in FIG. 14, although the light-emitting devices 1 to 4 and the comparative light-emitting device 5 exhibit light emission due to their fluorescent materials, light emission with high external quantum efficiency exceeding 20% was achieved. Since the maximum generation probability of singlet excitons by recombination of carriers (holes and electrons) injected from a pair of electrodes is 25%, the maximum external quantum efficiency of a typical fluorescent device would be 6.25% when the outcoupling efficiency is 25%. The external quantum efficiency of, for example, an EL device that emits light from a fluorescent material and a phosphorescent material at a ratio of 1:1 is 15.5%. However, the light-emitting devices 1 to 4 and the comparative light-emitting device have high efficiency compared with the case where only singlet excitons contribute to light emission and the typical case where both a fluorescent material and a phosphorescent material contribute to light emission. This is because in addition to light emission due to singlet excitons generated by recombination of carriers (holes and electrons) injected from a pair of electrodes, light emission due to energy transfer from triplet excitons or light emission due to singlet excitons generated from triplet excitons by reverse intersystem crossing in the exciplex are obtained. Thus, in the light-emitting devices each containing a fluorescent material having protecting groups, non-radiative decay of triplet excitons was inhibited, and both the singlet excitation energy and the triplet excitation energy were efficiently converted into light emission. Note that the light-emitting devices 1 to 4 and the comparative light-emitting device 5 are light-emitting devices utilizing ExEF.

In FIG. 14 and FIG. 15, the light-emitting devices 1 to 4 each containing both a phosphorescent material and a fluorescent material as light-emitting materials and the comparative light-emitting device 5 containing only a fluorescent material as a light-emitting material have equivalent efficiencies. That is, the use of a fluorescent material in which a luminophore has protecting groups allows fabrication of a light-emitting device having high luminous efficiency even in the case where the light-emitting device contains both a phosphorescent material and a fluorescent material as light-emitting materials. The comparative light-emitting device 5 can be regarded as a light-emitting device where the concentration of the phosphorescent material is 0. Thus, either or both of the concentrations of a fluorescent material having protecting groups and a phosphorescent material that contributes to light emission are adjusted, whereby emission color can be adjusted while high luminous efficiency is maintained. In this case, the concentration of the fluorescent material having protecting groups is preferably higher than the concentration of the phosphorescent material in order that a proper balance of light emission from the fluorescent material and light emission from the phosphorescent material can be obtained.

<CV Measurement Results>

Then, the electrochemical characteristics (oxidation reaction characteristics and reduction reaction characteristics) of 4,6mCzP2Pm and Ir(ppz)$_3$ used for the light-emitting layers of the light-emitting devices were measured by cyclic voltammetry (CV) measurement.

An electrochemical analyzer (ALS model 600A or 600C, manufactured by BAS Inc.) was used as the measurement apparatus. A solution for the CV measurement was prepared in the following manner: tetra-n-butylammonium perchlorate (n-Bu$_4$NClO$_4$, produced by Tokyo Chemical Industry Co., Ltd., catalog No. T0836) as a supporting electrolyte was dissolved in dehydrated dimethylformamide (DMF, produced by Sigma-Aldrich Co. LLC., 99.8%, catalog No. 22705-6) as a solvent at a concentration of 100 mmol/L, and the object to be measured was dissolved therein at a concentration of 2 mmol/L. A platinum electrode (PTE platinum electrode, manufactured by BAS Inc.) was used as a working electrode, another platinum electrode (Pt counter electrode for VC-3 (5 cm), manufactured by BAS Inc.) was used as an auxiliary electrode, and an Ag/Ag$^+$ electrode (RE7 reference electrode for nonaqueous solvent, manufactured by BAS Inc.) was used as a reference electrode. Note that the measurement was performed at room temperature (20° C. to 25° C.). In addition, the scan speed in the CV measurement was fixed to 0.1 V/see, and an oxidation potential Ea [V] and a reduction potential Ec [V] with respect to the reference electrode were measured. The potential Ea is an intermediate potential of an oxidation-reduction wave, and the potential Ec is an intermediate potential of a reduction-oxidation wave. Here, since the potential energy of the reference electrode used in this example with respect to the vacuum level is known to be −4.94 [eV], the HOMO level and the LUMO level can be calculated by the following formulae: HOMO level [eV]=−4.94−Ea and LUMO level [eV]=−4.94−Ec.

According to the CV measurement results, the oxidation potential and the reduction potential of 4,6mCzP2Pm were 0.95 V and −2.06 V, respectively. In addition, the HOMO level and the LUMO level of 4,6mCzP2Pm, which were calculated from the CV measurement results, were −5.89 eV and −2.88 eV, respectively. The oxidation potential and the reduction potential of Ir(ppz)$_3$ were 0.45 V and −3.17 V, respectively. In addition, the HOMO level and the LUMO level of Ir(ppz)$_3$, which were calculated from the CV measurement results, were −5.39 eV and −1.77 eV, respectively.

As described above, the LUMO level of 4,6mCzP2Pm is lower than that of Ir(ppz)$_3$, and the HOMO level of Ir(ppz)$_3$ is higher than that of 4,6mCzP2Pm. Thus, in the case where the compounds are used in a light-emitting layer, electrons and holes are efficiently injected into 4,6mCzP2Pm and Ir(ppz)$_3$, respectively, so that 4,6mCzP2Pm and Ir(ppz)$_3$ can form an exciplex. Note that the exciplex formed by 4,6mCzP2Pm and Ir(ppz)$_3$ has an emission peak at around 530 nm as shown in FIG. 16.

FIG. 16 shows that the emission spectrum of the exciplex formed by 4,6mCzP2Pm and Ir(ppz)$_3$ overlaps with both the absorption spectrum of 2TMS-mmtBuDPhA2Anth and the absorption spectrum of Ir(dmdppr-dmp)$_2$(dpm). Thus, the excitation energy of the exciplex can be efficiently transferred to 2TMS-mmtBuDPhA2Anth and Ir(dmdppr-dmp)$_2$(dpm). The emission spectrum of 2TMS-mmtBuDPhA2Anth overlaps with the absorption spectrum of Ir(dmdppr-dmp)$_2$(dpm). Thus, energy transfer from 2TMS-mmtBuDPhA2Anth to Ir(dmdppr-dmp)$_2$(dpm) is also possible. Consequently, one embodiment of the present invention allows fabrication of a multicolor light-emitting device having high luminous efficiency.

Example 2

In this example, fabrication examples and characteristics of light-emitting devices and comparative light-emitting devices of embodiments of the present invention, which are different from those in the above example, will be described. The structure of each of the light-emitting devices fabricated in this example is the same as that illustrated in FIG. 1. Table 4 and Table 5 show the details of the device structures. The structures and abbreviations of compounds used here are shown below. Note that Example 1 and the above embodiment can be referred to for other organic compounds.

[Chemical Formula 38]

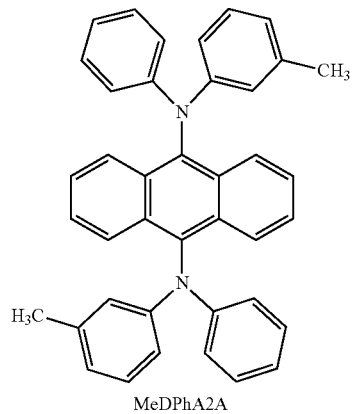

MeDPhA2A

TABLE 4

| | Layer | Reference numeral | Thickness (nm) | Material | Weight ratio |
|---|---|---|---|---|---|
| Light-emitting Device 4 | Electrode | 102 | 200 | Al | — |
| | Electron-injection layer | 119 | 1 | LiF | — |
| | Electron-transport layer | 118(2) | 10 | NBPhen | — |
| | | 118(1) | 20 | 4,6mCzP2Pm | — |
| | Light-emitting layer | 130 | 40 | 4,6mCzP2Pm: | 0.8: |
| | | | | Ir(ppz)$_3$: | 0.2: |
| | | | | 2TMS-mmtBuDPhA2Anth: | 0.05: |
| | | | | Ir(dmdppr-dmp)$_2$(dpm) | 0.005 |
| | Hole-transport layer | 112 | 30 | PCCP | — |
| | Hole-injection layer | 111 | 40 | DBT3P-II: MoO$_3$ | 1:0.5 |
| | Electrode | 101 | 70 | ITSO | — |
| Light-emitting Device 6 | Electrode | 102 | 200 | Al | — |
| | Electron-injection layer | 119 | 1 | LiF | — |
| | Electron-transport layer | 118(2) | 10 | NBPhen | — |
| | | 118(1) | 20 | 4,6mCzP2Pm | — |
| | Light-emitting layer | 130 | 40 | 4,6mCzP2Pm: | 0.8: |
| | | | | Ir(ppz)$_3$: | 0.2: |
| | | | | 2TMS-mmtBuDPhA2Anth: | 0.1: |
| | | | | Ir(dmdppr-dmp)$_2$ (dpm) | 0.005 |
| | Hole-transport layer | 112 | 20 | PCCP | — |
| | Hole-injection layer | 111 | 40 | DBT3P-II: MoO$_3$ | 1:0.5 |
| | Electrode | 101 | 70 | ITSO | — |

TABLE 5

| | Layer | Reference numeral | Thickness (nm) | Material | Weight ratio |
|---|---|---|---|---|---|
| Comparative Light-emitting Device 7 | Electrode | 102 | 200 | Al | — |
| | Electron-injection layer | 119 | 1 | LiF | — |
| | Electron-transport layer | 118(2) | 10 | NBPhen | — |
| | | 118(1) | 20 | 4,6mCzP2Pm | — |
| | Light-emitting layer | 130 | 40 | 4,6mCzP2Pm: | 0.8: |
| | | | | Ir(ppz)$_3$: | 0.2: |
| | | | | MeDPhA2A: | 0.05: |
| | | | | Ir(dmdppr-dmp)$_2$(dpm) | 0.005 |
| | Hole-transport layer | 112 | 30 | PCCP | — |
| | Hole-injection layer | 111 | 40 | DBT3P-II: MoO$_3$ | 1:0.5 |
| | Electrode | 101 | 70 | ITSO | — |
| Comparative Light-emitting Device 8 | Electrode | 102 | 200 | Al | — |
| | Electron-injection layer | 119 | 1 | LiF | — |
| | Electron-transport layer | 118(2) | 10 | NBPhen | — |
| | | 118(1) | 20 | 4,6mCzP2Pm | — |
| | Light-emitting layer | 130 | 40 | 4,6mCzP2Pm: | 0.8: |
| | | | | Ir(ppz)$_3$: | 0.2: |
| | | | | MeDPhA2A: | 0.1: |
| | | | | Ir(dmdppr-dmp)$_2$(dpm) | 0.005 |
| | Hole-transport layer | 112 | 20 | PCCP | — |
| | Hole-injection layer | 111 | 40 | DBT3P-II: MoO$_3$ | 1:0.5 |
| | Electrode | 101 | 70 | ITSO | — |
| Comparative Light-emitting Device 9 | Electrode | 102 | 200 | Al | — |
| | Electron-injection layer | 119 | 1 | LiF | — |
| | Electron-transport layer | 118(2) | 10 | NBPhen | — |
| | | 118(1) | 20 | 4,6mCzP2Pm | — |
| | Light-emitting layer | 130 | 40 | 4,6mCzP2Pm: | 0.8: |
| | | | | Ir(ppz)$_3$ | 0.2 |
| | Hole-transport layer | 112 | 20 | PCCP | — |
| | Hole-injection layer | 111 | 40 | DBT3P-II: MoO$_3$ | 1:0.5 |
| | Electrode | 101 | 70 | ITSO | — |

<<Fabrication of Light-emitting devices 4 and 6 and Comparative light-emitting devices 7 to 9>>

The light-emitting device 4 has the device structure shown in Example 1 and Table 3. The light-emitting device 6 and the comparative light-emitting devices 7 to 9 were fabricated through the same steps as those for the light-emitting device 1 described above except for the step of forming the light-emitting layer 130. The details of the device structure are shown in Table 3, and thus the detailed description thereof is omitted. The comparative light-emitting devices 7 and 8 are each a light-emitting device using MeDPhA2A, which is a fluorescent material having no protecting group, and the comparative light-emitting device 9 does not contain a fluorescent material.

<Characteristics of Light-Emitting Devices>

Next, the characteristics of the fabricated light-emitting devices 4 and 6 and comparative light-emitting devices 7 to 9 were measured. Note that the measurement method is similar to that used in Example 1.

Figure 17:
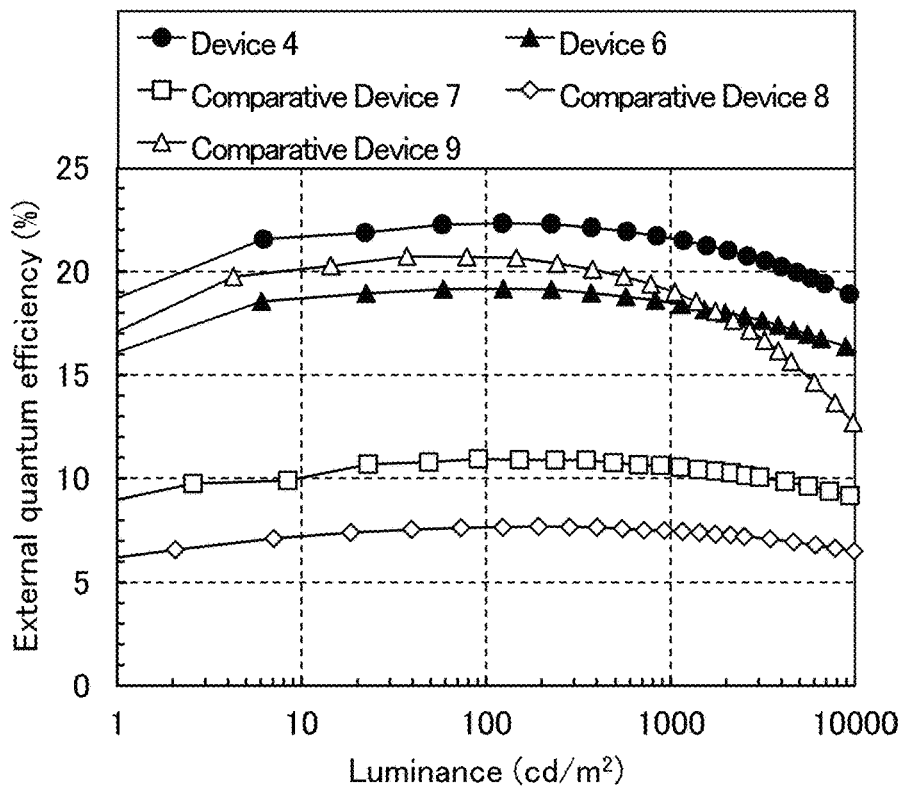
FIG. 17 shows the external quantum efficiency-luminance characteristics of light-emitting devices in Example.
Figure 18:
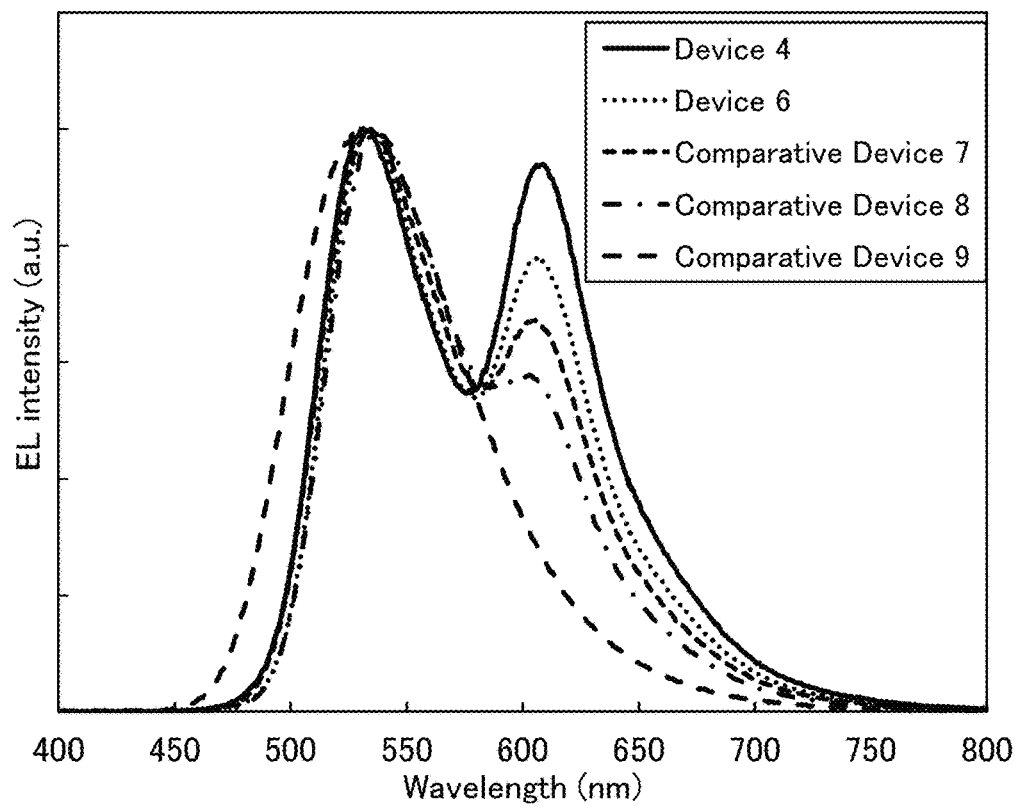
FIG. 18 shows the electroluminescence spectra of light-emitting devices in Example.

FIG. 17 shows the external quantum efficiency-luminance characteristics of the light-emitting devices 4 and 6 and the comparative light-emitting devices 7 to 9. FIG. 18 shows the electroluminescence spectra when a current with a density of 2.5 mA/cm$^2$ was supplied to the light-emitting devices 4 and 6 and the comparative light-emitting devices 7 to 9. Note that the measurement of the light-emitting devices was performed at room temperature (in an atmosphere kept at 23° C.).

Table 6 shows the device characteristics of the light-emitting devices 4 and 6 and the comparative light-emitting devices 7 to 9 at around 1000 cd/m$^2$.

As shown in FIG. 18, the emission spectra of the light-emitting devices 4 and 6 each have two peaks at around 530 nm and around 610 nm. The peak at around 530 nm is attributed to 2TMS-mmtBuDPhA2Anth, and the peak at around 610 nm is attributed to Ir(dmdppr-dmp)$_2$(dpm). That is, the light-emitting devices 4 and 6 emitted both light derived from 2TMS-mmtBuDPhA2Anth and light derived from Ir(dmdppr-dmp)$_2$(dpm). Similarly, the comparative light-emitting devices 7 and 8 each have two peaks at around 530 nm and around 610 nm. The peak at around 530 nm is attributed to MeDPhA2A, and the peak at around 610 nm is attributed to Ir(dmdppr-dmp)$_2$(dpm). That is, the comparative light-emitting devices 7 and 8 emitted both light derived from MeDPhA2A and light derived from Ir(dmdppr-dmp)$_2$(dpm). The comparative light-emitting device 9 emitted green light with a peak wavelength of 531 nm and a half width of 88 nm. This indicates that light emission due to an exciplex formed by 4,6mCzP2Pm and Ir(ppz)$_3$ was obtained from the comparative light-emitting device 9.

As shown in FIG. 17, although the light-emitting devices 4 and 6 emit light derived from the fluorescent material, they exhibit external quantum efficiency higher than or equal to that of the comparative light-emitting device 9. In contrast, the comparative light-emitting devices 7 and 8 exhibit external quantum efficiency noticeably lower than that of the comparative light-emitting device 9. The light-emitting devices 4 and 6 and the comparative light-emitting devices 7 and 8 can each be regarded as a device obtained by adding a fluorescent material and a phosphorescent material to the comparative light-emitting device 9. That is, regardless of containing a fluorescent material, the light-emitting devices 4 and 6 emitted multicolor light while maintaining luminous efficiency comparable to that of the comparative light-emitting device 9. In contrast, the comparative light-emitting devices 7 and 8 have low luminous efficiency due to addition of the fluorescent material and the phosphorescent material. Since the light-emitting devices 4 and 6 and the comparative light-emitting devices 7 and 8 use the same phosphorescent materials, the fluorescent material is presumably a cause of a decrease in the efficiency of the comparative light-emitting devices 7 and 8. It is suggested that the use of a fluorescent material having no protecting group caused deactivation of triplet excitons. In the light-emitting device of one embodiment of the present invention, however, non-radiative decay of triplet excitons is inhibited, contributing to efficient conversion into light emission. Thus, it is found that the use of a fluorescent material having protecting groups in a light-emitting layer can inhibit triplet excitation energy transfer from a host material and a phosphorescent material to a fluorescent material by the Dexter mechanism and non-radiative decay of triplet excitation energy.

The concentration of the fluorescent material having protecting groups is different between the light-emitting device 4 and the light-emitting device 6. Similarly, the concentration of the fluorescent material having no protecting group is different between the comparative light-emitting device 7 and the comparative light-emitting device 8. In Table 4, the decrease rate in external quantum efficiency between the light-emitting devices 4 and 6 ((the external quantum efficiency of the light-emitting device 4—the external quantum efficiency of the light-emitting device 6)/the external quantum efficiency of the light-emitting device 4×10$^0$) is approximately 15%, while the decrease rate in

TABLE 6

| | Voltage (V) | Current density (mA/cm$^2$) | CIE chromaticity (x, y) | Luminance (cd/m$^2$) | Current efficiency (cd/A) | Power efficiency (lm/W) | External quantum efficiency (%) |
|---|---|---|---|---|---|---|---|
| Light-emitting Device 4 | 3.10 | 1.38 | (0.439, 0.540) | 839 | 60.6 | 61.5 | 21.7 |
| Light-emitting Device 6 | 3.20 | 2.09 | (0.426, 0.557) | 1139 | 54.5 | 53.5 | 18.4 |
| Comparative Light-emitting Device 7 | 3.40 | 2.68 | (0.409, 0.569) | 879 | 32.8 | 30.3 | 10.6 |
| Comparative Light-emitting Device 8 | 3.50 | 3.76 | (0.402, 0.580) | 920 | 24.5 | 22.0 | 7.5 |
| Comparative Light-emitting Device 9 | 3.30 | 1.63 | (0.323, 0.610) | 1053 | 64.7 | 61.6 | 19.0 | external quantum efficiency between the comparative light-emitting devices 7 and 8 ((the external quantum efficiency of the comparative light-emitting device 7—the external quantum efficiency of the comparative light-emitting device 8)/the external quantum efficiency of the light-emitting device 7×10⁰) is approximately 30%. This suggests that the use of a fluorescent material having protecting groups inhibits a decrease in efficiency due to an increase in the concentration of the fluorescent materials.

<Changes in Luminances of Light-Emitting Devices>

Figure 19:
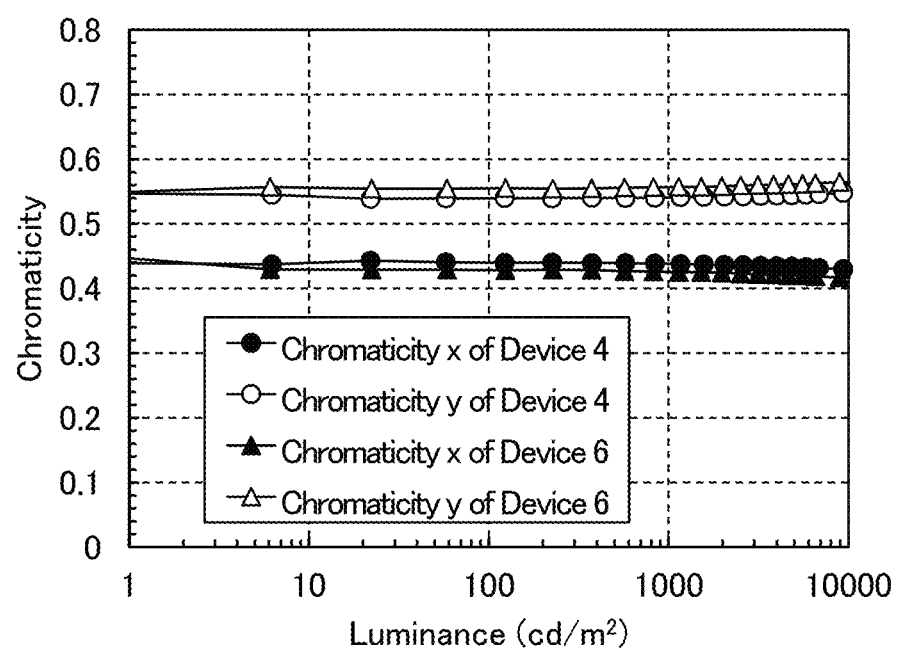
FIG. 19 is a graph showing the chromaticity-luminance characteristics of light-emitting devices in Example.

FIG. 19 shows the chromaticity-luminance characteristics of the light-emitting devices 4 and 6. According to FIG. 19, chromaticity x and chromaticity y of the light-emitting devices 4 and 6 were hardly changed depending on luminance. This means that the light-emitting devices 4 and 6 achieve stable emission colors with extremely small changes due to a luminance change. This is because in the light-emitting devices 4 and 6, the fluorescent material and the phosphorescent material emit light through transfer of excitation energy of the energy donor. This means that one embodiment of the present invention allows fabrication of a light-emitting device that emits multicolor light with a small change due to a luminance change.

<Reliability Test of Light-Emitting Devices>

Figure 20:
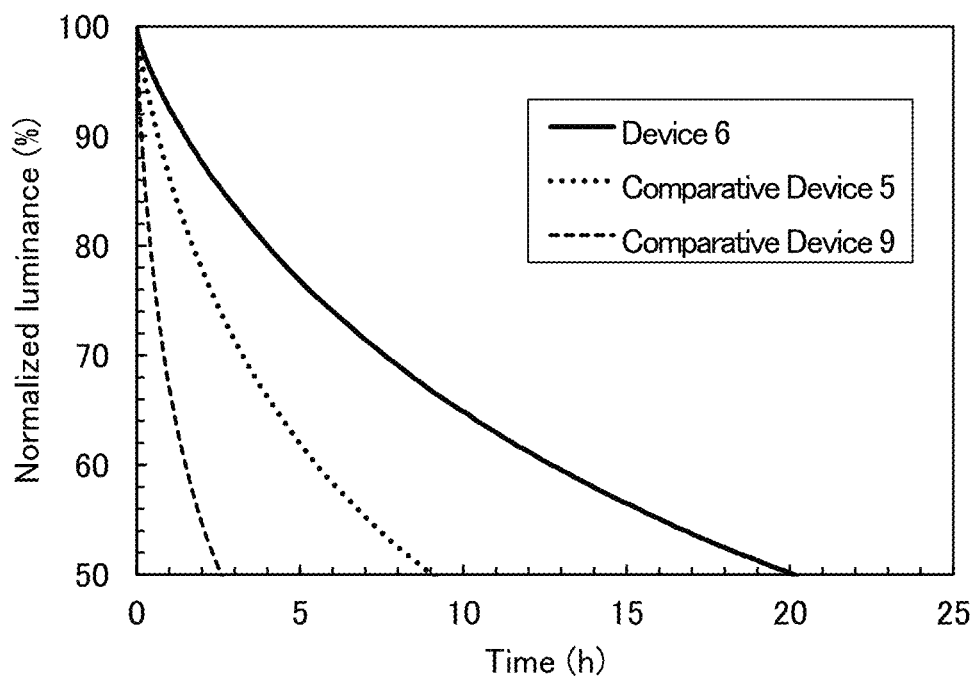
FIG. 20 is a graph showing reliability test results of light-emitting devices in Example.

Next, a driving test at a constant current of 2 mA was performed on the light-emitting device 6 and the comparative light-emitting devices 5 and 9. FIG. 20 shows the results. According to FIG. 20, the driving lifetime of the comparative light-emitting device 5 including the fluorescent material were longer than that of the comparative light-emitting device 9 including neither a fluorescent material nor a phosphorescent material, and the light-emitting device 6 including both the fluorescent material and the phosphorescent material has a longer driving lifetime. That is, according to one embodiment of the present invention, a highly efficient, highly reliable light-emitting device that emits multicolor light can be fabricated.

Figure 21:
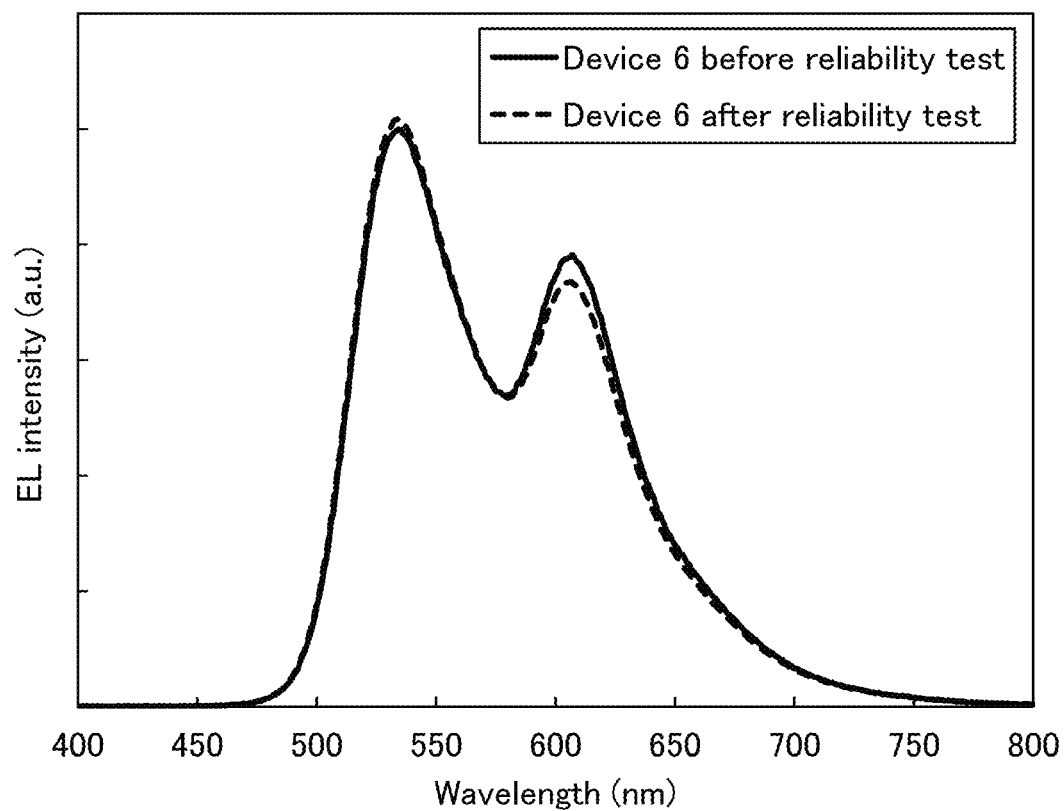
FIG. 21 shows the electroluminescence spectra of light-emitting devices before and after a reliability test.

Next, FIG. 21 shows electroluminescence spectra of the light-emitting device 6 with 2.5 mA/cm² before a reliability test and after a decrease in luminance to 50% through the reliability test. Note that the spectrum intensity shown in FIG. 21 is normalized for comparison of spectrum shapes. FIG. 21 shows that the electric field emission spectrum of the light-emitting device 6 has almost no change in its shape between before and after the reliability test. This is because in the light-emitting device 6, the fluorescent material and the phosphorescent material emit light through transfer of excitation energy from the energy donor. This means that one embodiment of the present invention allows fabrication of a light-emitting device that emits multicolor light with a small change between before and after driving.

Example 3

In this example, examples of fabricating light-emitting devices and comparative light-emitting devices of embodiments of the present invention, which are different from those in the above example, and the characteristics of the light-emitting devices will be described. The structure of each of the light-emitting devices fabricated in this example is the same as that illustrated in FIG. 1. Table 7 shows the details of the device structures. The structures and abbreviations of compounds used here are shown below. Note that the above example and the above embodiment can be referred to for other organic compounds.

[Chemical Formula 39]

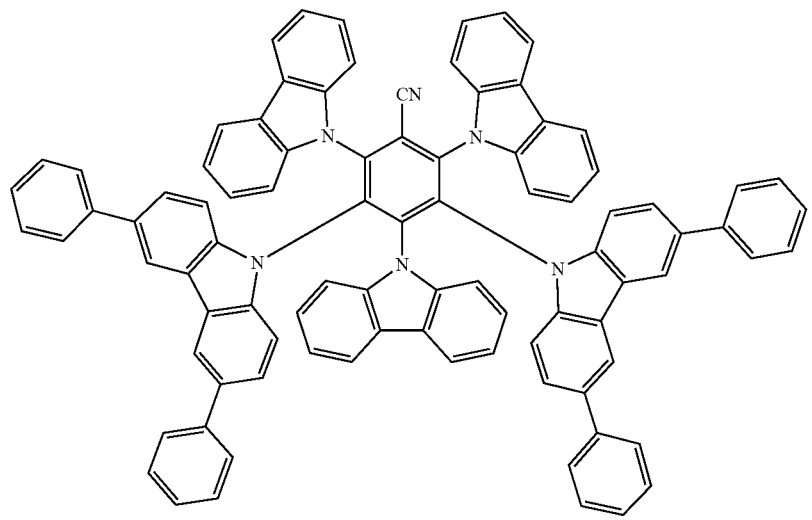

3Cz2DPhCzBN

-continued

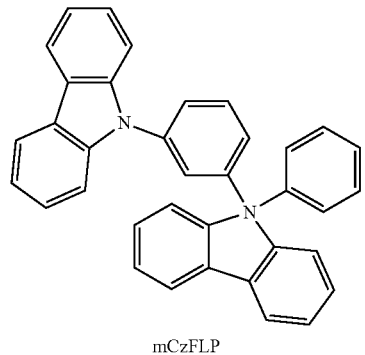

mCzFLP

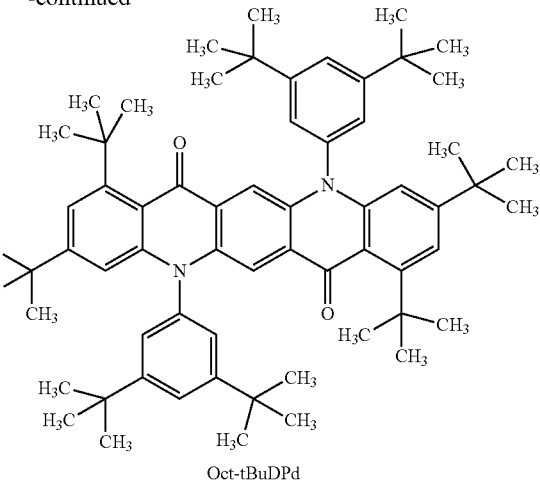

Oct-tBuDPd

TABLE 7

| | Layer | Reference numeral | Thickness (nm) | Material | Weight ratio |
|---|---|---|---|---|---|
| Light-emitting Device 10 | Electrode | 102 | 200 | Al | — |
| | Electron-injection layer | 119 | 1 | LiF | — |
| | Electron-transport layer | 118(2) | 10 | NBPhen | — |
| | | 118(1) | 20 | 4,6mCzP2Pm | — |
| | Light-emitting layer | 130 | 40 | 4,6mCzP2Pm: 3Cz2DPhCzBN: Oct-tBuDPQd: Ir(dmdppr-dmp)$_2$(dpm) | 1: 0.1: 0.025: 0.005 |
| | Hole-transport layer | 112 | 20 | mCzFLP | — |
| | Hole-injection layer | 111 | 40 | DBT3P-II: MoO$_3$ | 1:0.5 |
| | Electrode | 101 | 70 | ITSO | — |
| Comparative Light-emitting Device 11 | Electrode | 102 | 200 | Al | — |
| | Electron-injection layer | 119 | 1 | LiF | — |
| | Electron-transport layer | 118(2) | 10 | NBPhen | — |
| | | 118(1) | 20 | 4,6mCzP2Pm | — |
| | Light-emitting layer | 130 | 40 | 4,6mCzP2Pm: 3Cz2DPhCzBN: Oct-tBuDPQd | 1: 0.1: 0.025 |
| | Hole-transport layer | 112 | 20 | mCzFLP | — |
| | Hole-injection layer | 111 | 40 | DBT3P-II: MoO$_3$ | 1:0.5 |
| | Electrode | 101 | 70 | ITSO | — |
| Comparative Light-emitting Device 12 | Electrode | 102 | 200 | Al | — |
| | Electron-injection layer | 119 | 1 | LiF | — |
| | Electron-transport layer | 118(2) | 10 | NBPhen | — |
| | | 118(1) | 20 | 4,6mCzP2Pm | — |
| | Light-emitting layer | 130 | 30 | 4,6mCzP2Pm: 3Cz2DPhCzBN | 1: 0.1 |
| | Hole-transport layer | 112 | 20 | PCCP | — |
| | Hole-injection layer | 111 | 40 | DBT3P-II: MoO$_3$ | 1:0.5 |
| | Electrode | 101 | 70 | ITSO | — |

<<Fabrication of Light-Emitting Device 10 and Comparative Light-Emitting Devices 11 and 12>>

The light-emitting device 10 and the comparative light-emitting devices 11 and 12 were fabricated through the same steps as those for the light-emitting device 1 described above except for the step of forming the hole-transport layer 112 and the step of forming the light-emitting layer 130. The details of the device structure are shown in Table 7, and thus the detailed description thereof is omitted. In the light-emitting device 10, light emission is obtained from 1,3,8,10-tetra-tert-butyl-7,14-bis(3,5-di-tert-butylphenyl)-5,12-dihydroquino[2,3-b]acridine-7,14-dione (abbreviation: Oct-tBuDPQd), which is a fluorescent material having protecting groups, and Ir(dmdppr-dm)$_2$(dpm), which is a phosphorescent material. The details will be described later.

The light-emitting device 10 can be regarded as a light-emitting device obtained by adding a phosphorescent material to the comparative light-emitting device 11. The comparative light-emitting device 11 can be regarded as a light-emitting device obtained by adding a fluorescent material having protecting groups to the comparative light-emitting device 12. Thus, the light-emitting device 10 can be regarded as a light-emitting device obtained by adding a fluorescent material having protecting groups and a phosphorescent material to the comparative light-emitting device 12.

<Characteristics of Light-Emitting Devices>

Next, the characteristics of the fabricated light-emitting device 10 and comparative light-emitting devices 11 and 12 were measured. Note that the measurement method is similar to that used in Example 1.

Figure 26:
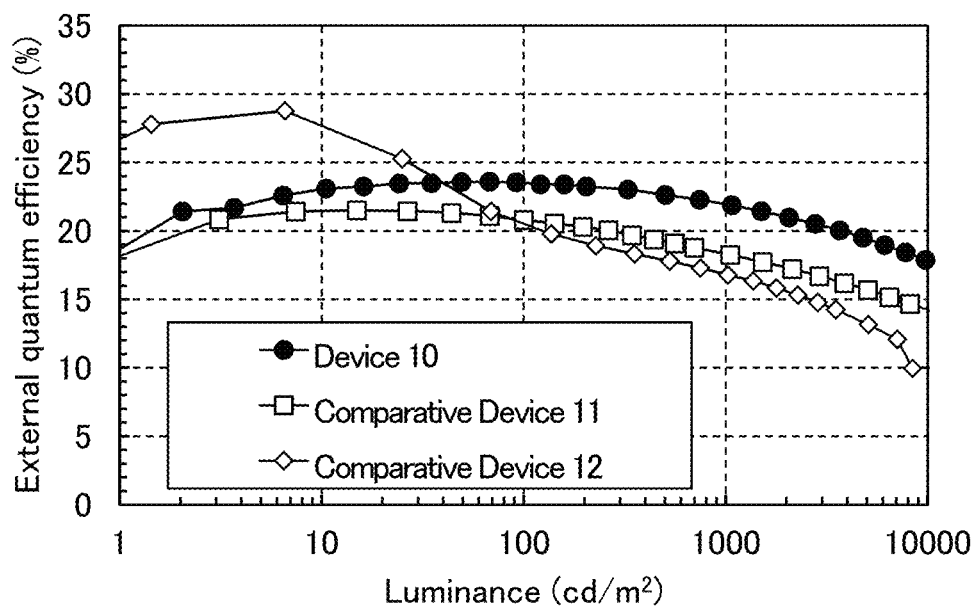
FIG. 26 shows the external quantum efficiency-luminance characteristics of light-emitting devices in Example.
Figure 27:
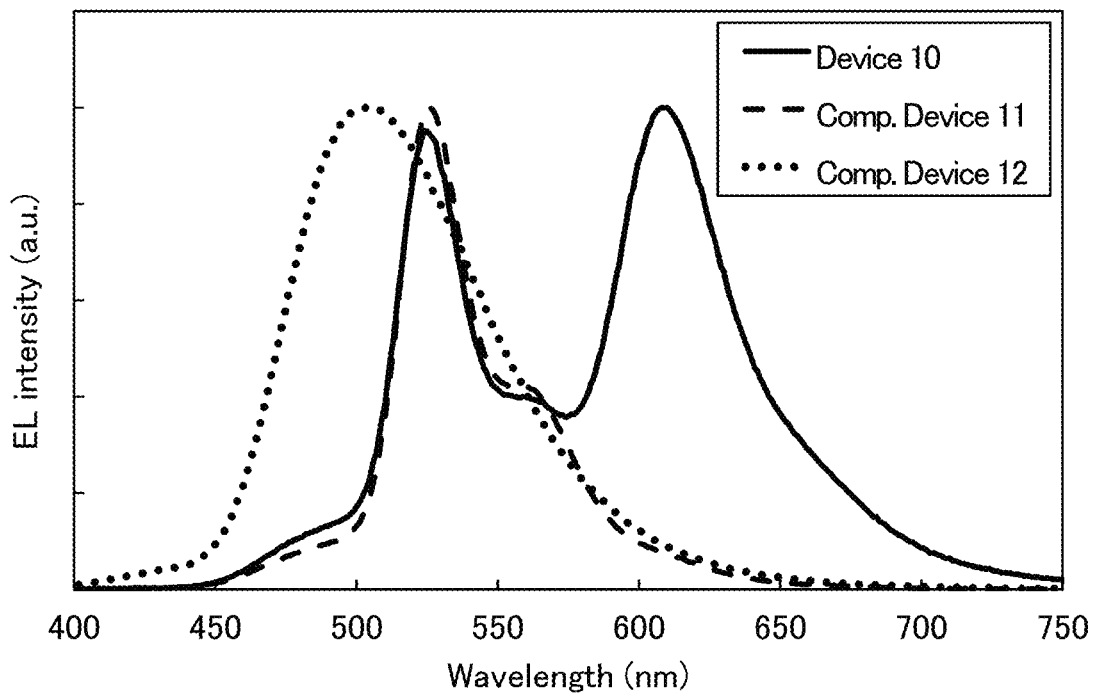
FIG. 27 shows the electroluminescence spectra of light-emitting devices in Example.

FIG. 26 shows the external quantum efficiency-luminance characteristics of the light-emitting device 10 and the comparative light-emitting devices 11 and 12. FIG. 27 shows the electroluminescence spectra when a current with a density of 2.5 mA/cm$^2$ was supplied to the light-emitting device 10 and the comparative light-emitting devices 11 and 12. Note that the measurement of the light-emitting devices was performed at room temperature (in an atmosphere kept at 23° C.).

Table 8 shows the device characteristics of the light-emitting device 10 and the comparative light-emitting devices 11 and 12 at around 1000 cd/m$^2$.

TABLE 8

| | Voltage (V) | Current density (mA/cm$^2$) | CIE chromaticity (x, y) | Luminance (cd/m$^2$) | Current efficiency (cd/A) | Power efficiency (lm/W) | External quantum efficiency (%) |
|---|---|---|---|---|---|---|---|
| Light-emitting Device 10 | 4.80 | 1.97 | (0.465, 0.495) | 1071 | 54.5 | 35.7 | 21.9 |
| Comparative Light-emitting Device 11 | 4.20 | 1.53 | (0.275, 0.661) | 1056 | 69.2 | 51.8 | 18.3 |
| Comparative Light-emitting Device 12 | 3.50 | 2.20 | (0.221, 0.507) | 1027 | 46.8 | 42.0 | 16.8 |

As shown in FIG. 27, the emission spectrum of the light-emitting device 10 has two peaks at around 526 nm and around 608 nm. The peak at around 526 nm is attributed to Oct-tBuDPQd, and the peak at around 608 nm is attributed to Ir(dmdppr-dmp)$_2$(dpm). That is, the light-emitting device 10 emitted both light derived from Oct-tBuDPQd and light derived from Ir(dmdppr-dmp)$_2$(dpm). The comparative light-emitting device 11 has a peak at around 526 nm. The peak at around 526 nm is attributed to Oct-tBuDPQd. The emission spectrum of the comparative light-emitting device 12 has a peak at around 506 nm and a half width of 81 nm. The light emission of the comparative light-emitting device 12 is derived from 3Cz2DPhCzBN. Note that Non-Patent Document 1 discloses that 3CzDPhCzBN is a TADF material.

As shown in FIG. 26, although the light-emitting device 10 emits light derived from the fluorescent material, the light-emitting device 10 exhibits external quantum efficiency higher than or equal to that of the comparative light-emitting device 12. Furthermore, the light-emitting device 10 exhibits higher external quantum efficiency than the comparative light-emitting device 11. Thus, the light-emitting device 10 exhibits light emission from both the fluorescent material and the phosphorescent material and exhibits higher luminous efficiency than that of the comparative light-emitting devices 11 and 12. This is because in the light-emitting device of one embodiment of the present invention, non-radiative decay of triplet excitons is inhibited, resulting in efficient conversion into light emission.

The light-emitting device 10 uses a TADF material as an energy donor. Thus, a TADF material can be favorably used in the light-emitting device of one embodiment of the present invention. The light-emitting device 10 also uses an organic compound in which a luminophore has a quinacridone skeleton as a fluorescent material having protecting groups. Thus, an organic compound having a quinacridone skeleton can be favorably used in the light-emitting device of one embodiment of the present invention.

Example 4

In this example, fabrication examples and characteristics of light-emitting devices and comparative light-emitting devices of embodiments of the present invention, which are different from those in the above example, will be described. The structure of each of the light-emitting devices fabricated in this example is the same as that illustrated in FIG. 1. Table 7 shows the details of the device structures. The structures and abbreviations of compounds used here are shown below. Note that Example 1 and the above embodiment can be referred to for other organic compounds.

[Chemical Formula 40]

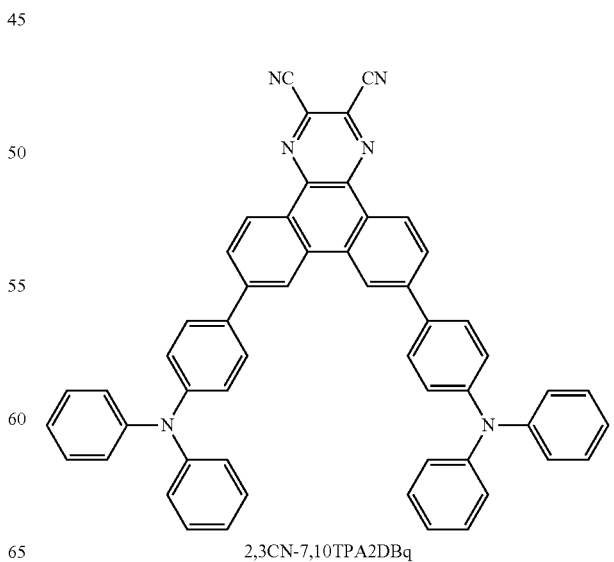

2,3CN-7,10TPA2DBq

TABLE 9

| Layer | | Reference numeral | Thickness (nm) | Material | Weight ratio |
|---|---|---|---|---|---|
| Light-emitting Device 13 | Electrode | 102 | 200 | Al | — |
| | Electron-injection layer | 119 | 1 | LiF | — |
| | Electron-transport layer | 118(2) | 10 | NBPhen | — |
| | | 118(1) | 20 | 4,6mCzP2Pm | — |
| | Light-emitting layer | 130 | 40 | 4,6mCzP2Pm: 3Cz2DPhCzBN: Oct-tBuDPQd: TPA-DCPP | 1: 0.1: 0.025: 0.005 |
| | Hole-transport layer | 112 | 20 | mCzFLP | — |
| | Hole-injection layer | 111 | 40 | DBT3P-II: MoO$_3$ | 1:0.5 |
| | Electrode | 101 | 70 | ITSO | — |

<<Fabrication of Light-Emitting Device 13>>

The light-emitting device 13 was fabricated through the same steps as those for the above-described light-emitting device 10 except the step of forming of the light-emitting layer 130. The details of the device structure are shown in Table 9; thus, the details of the fabrication method are omitted.

<Characteristics of Light-Emitting Devices>

Next, the device characteristics of the fabricated light-emitting device 13 were measured. Note that the measurement method is similar to that used in Example 1.

Figure 28:
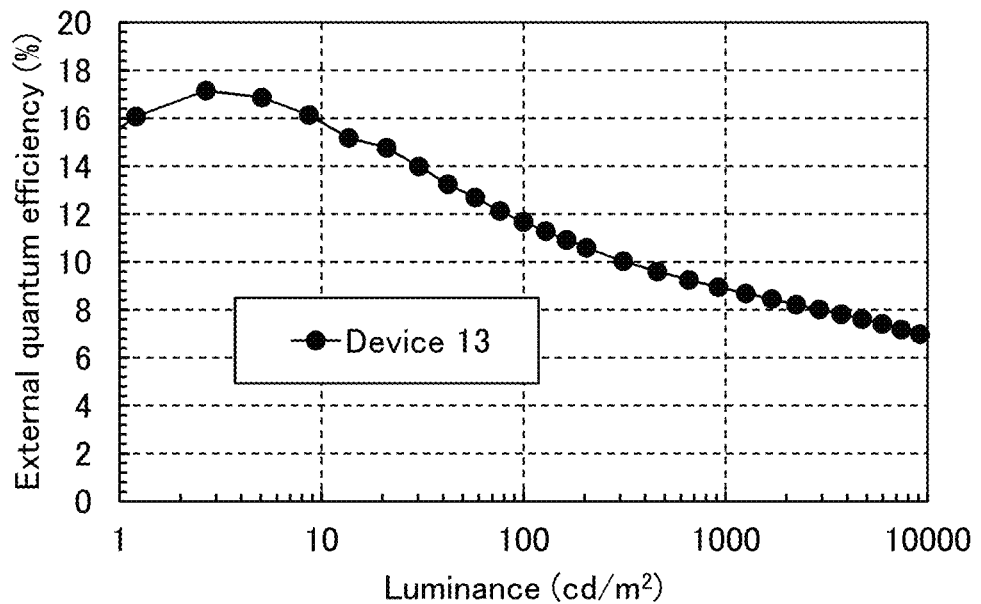
FIG. 28 shows the external quantum efficiency-luminance characteristics of a light-emitting device in Example.
Figure 29:
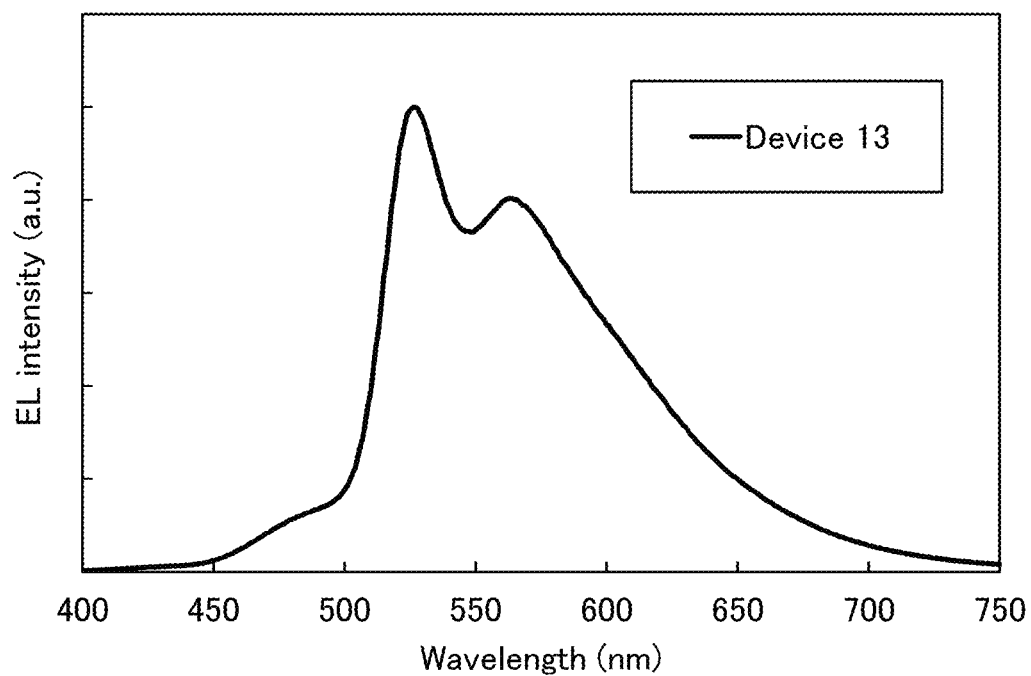
FIG. 29 shows the electroluminescence spectrum of the light-emitting device in Example.

FIG. 28 shows the external quantum efficiency-luminance characteristics of the light-emitting device 13. FIG. 29 shows the electroluminescence spectra when a current with a density of 2.5 mA/cm$^2$ was supplied to the light-emitting device 13. Note that the measurement of the light-emitting device was performed at room temperature (in an atmosphere kept at 23° C.).

Table 10 shows the device characteristics of the light-emitting device 13 at around 3 cd/m$^2$.

TABLE 10

| | Voltage (V) | Current density (mA/cm$^2$) | CIE chromaticity (x, y) | Luminance (cd/m$^2$) | Current efficiency (cd/A) | Power efficiency (lm/W) | External quantum efficiency (%) |
|---|---|---|---|---|---|---|---|
| Light-emitting Device 13 | 2.80 | 0.005 | (0.464, 0.529) | 3 | 53.8 | 60.4 | 17.2 |

As shown in FIG. 29, the emission spectrum of the light-emitting device 13 has two peaks at around 527 nm and around 567 nm. The peak at around 527 nm is attributed to Oct-tBuDPQd, and the peak at around 567 nm is attributed to 7,10-Bis(4-(diphenylamino)phenyl)-2,3-dicyanopyrazinophenanthrene (abbreviation: TPA-DCPP), which is a TADF material. That is, the light-emitting device 13 emitted both light derived from Oct-tBuDPQd and light derived from TPA-DCPP. Note that Non-Patent Document 2 discloses that TPA-DCPP is a TADF material.

As shown in FIG. 28, although the light-emitting device 13 emitted light derived from the fluorescent material, the light-emitting device 13 exhibited external quantum efficiency exceeding the theoretical efficiency of a typical fluorescent device.

Reference Example 1

In this reference example, a synthesis method of 2TMS-mmtBuDPhA2Anth (Structural Formula (229)), which is a fluorescent material having protecting groups used in Examples 1 and 2, will be described.

Step 1: Synthesis of 9,10-dibromo-2-trimethylsilylanthracene

First, 2.7 g (11 mmol) of 2-trimethylsilylanthracene was put into a 500 mL three-neck flask; the atmosphere in the flask was replaced with nitrogen; 110 mL of N,N-dimethyl sulfoxide was added thereto; and the mixture was stirred at room temperature. Then, 4.0 g (23 mmol) of N-bromosuccinimide was added thereto, and the mixture was stirred at room temperature for 15 hours. After the stirring, water was added to the reaction mixture to give an aqueous layer and an organic layer. The aqueous layer was subjected to extraction with toluene, the extracted solution and the organic layer were combined and washed with water and a saturated aqueous solution of sodium chloride, and then drying was performed with magnesium sulfate. This mixture was separated by gravity filtration, and the filtrate was concentrated to give a yellow brown solid. After 450 mL of hexane and 50 mL of toluene were added to the resulting yellow brown solid, suction filtration was performed through Florisil (Catalog No. 066-05265 produced by Wako Pure Chemical Industries, Ltd.), Celite (Catalog No. 537-02305 produced by Wako Pure Chemical Industries, Ltd.), and aluminum oxide to give a filtrate. The obtained filtrate was concentrated to give a yellow brown solid. The resulting solid was recrystallized from ethyl acetate/ethanol to give 2.4 g of a yellow solid with a yield of 54%. Synthesis scheme (F-1) of Step 1 is shown below.

[Chemical Formula 41]

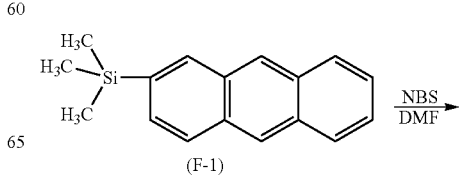

(F-1)

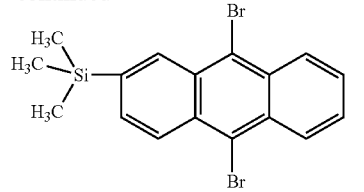

Figure 22A:
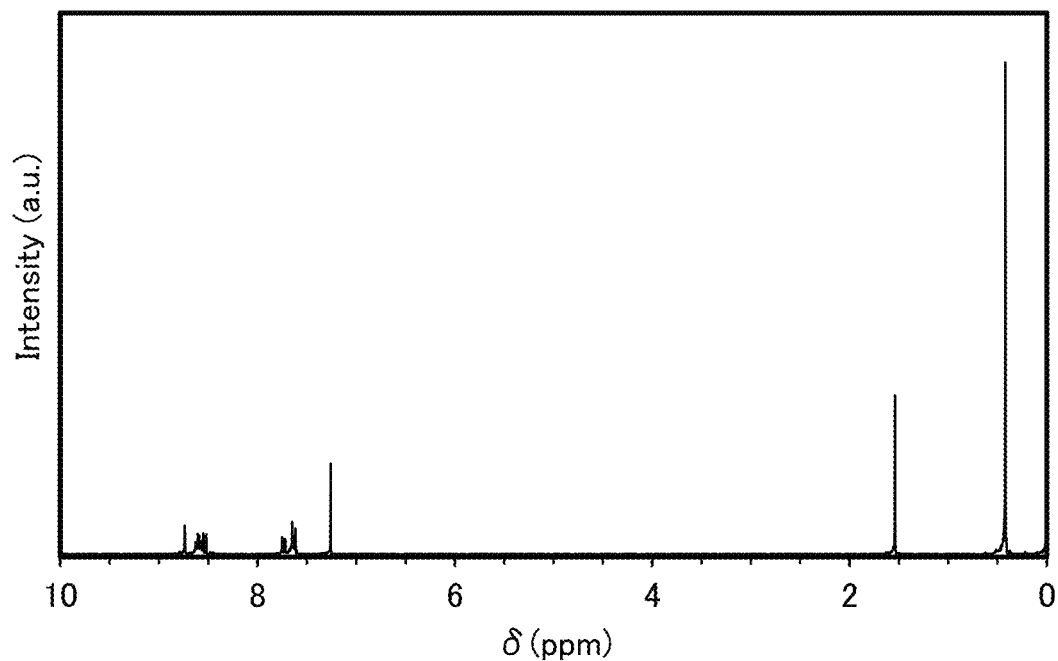
FIGS. 22A and 22B show NMR charts of a compound in Reference example.
Figure 22B:
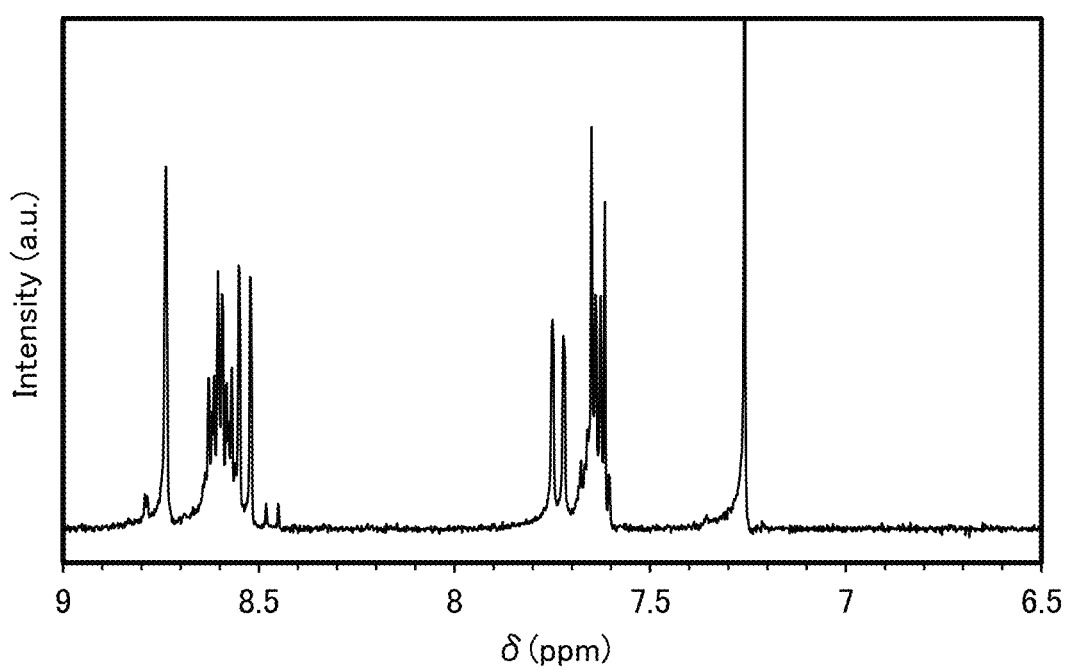
Figure 23:
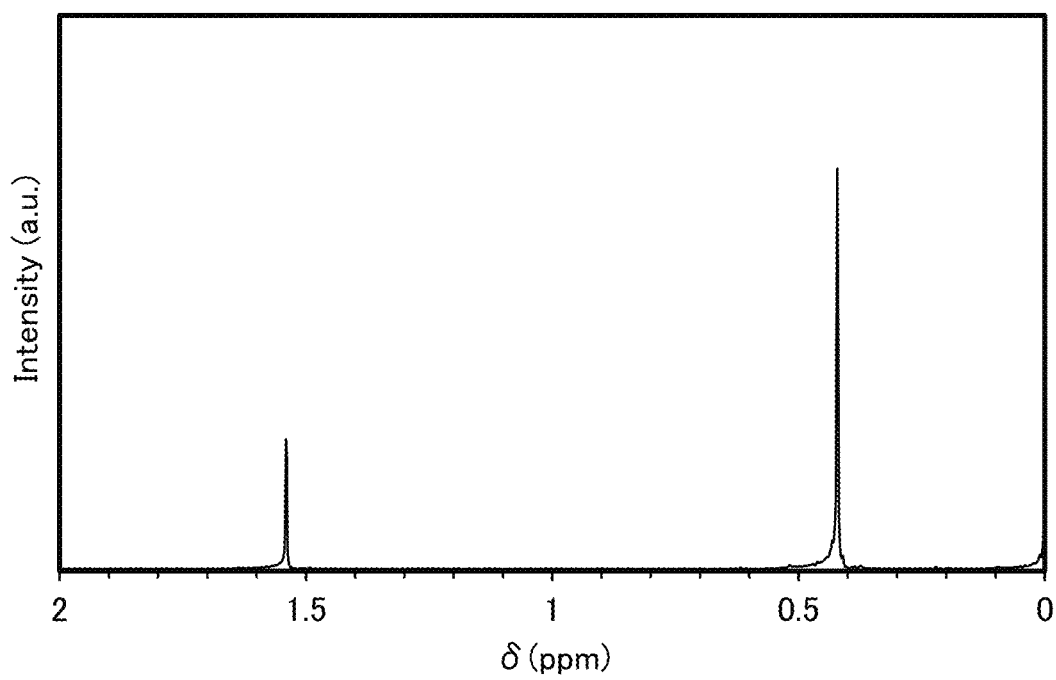
FIG. 23 shows an NMR chart of a compound in Reference example.

Results of $^1$H NMR measurement of the yellow solid obtained in Step 1 will be described below. The $^1$H NMR charts are shown in FIGS. 22A and 22B and FIG. 23. Note that FIG. 22B is an enlarged chart showing the range from 6.5 ppm to 9.0 ppm in FIG. 22A. FIG. 23 is an enlarged chart showing the range from 0.0 ppm to 2.0 ppm in FIG. 22A. The results indicate that 9,10-dibromo-2-trimethylsilylanthracene was obtained.

$^1$H NMR (CDCl$_3$, 300 MHz): σ=8.74 (s, 1H), 8.63-8.56 (m, 2H), 8.55 (d, J=8.8 Hz, 1H), 7.75 (d, J=8.3 Hz, 1H), 7.68-7.61 (m, 2H), 0.42 (s, 9H)

Step 2: Synthesis of 2TMS-mmtBuDPhA2Anth 1.4 g (3.3 mmol) of 9,10-dibromo-2-trimethylsilylanthracene, 2.6 g (6.6 mmol) of bis(3,5-tert-butylphenyl)amine, 1.3 g (14 mmol) of sodium tert-butoxide, 60 mg (0.15 mmol) of 2-dicyclohexylphosphino-2',6'-dimethoxy-1,1'-biphenyl (abbreviation: SPhos) were put into a 200 mL three-neck flask, and the air in the flask was replaced with nitrogen. 33 mL of xylene was added to this mixture, the resulting mixture was degassed under reduced pressure, 40 mg (70 mol) of bis(dibenzylideneacetone)palladium(0) was added to the mixture, and then, the resulting mixture was stirred for 6 hours at 150° C. under a nitrogen stream. After the stirring, 400 mL of toluene was added to the obtained mixture, and suction filtration was performed through Florisil, Celite, and aluminum oxide to give a filtrate. The obtained filtrate was concentrated to give a brown solid. This solid was purified by silica gel column chromatography (developing solvent: hexane: toluene=9:1) to give a yellow solid. The obtained yellow solid was recrystallized with ethyl acetate and ethanol to give 0.40 g of a target yellow solid, which was an objective substance, with a yield of 12%. The synthesis scheme (F-2) of Step 2 is shown below.

[Chemical Formula 42]

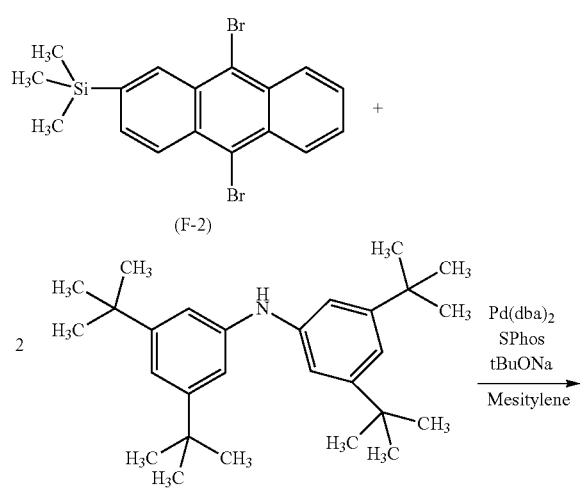

(F-2)

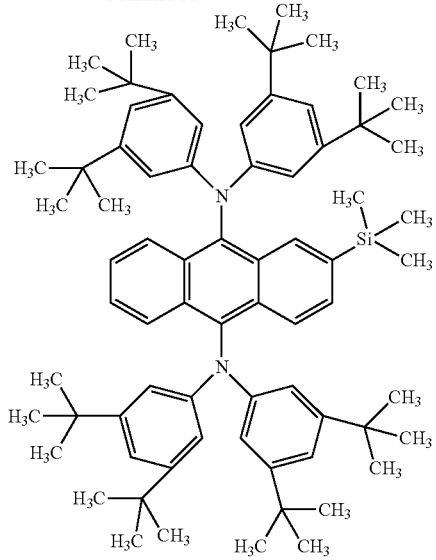

(229)

By a train sublimation method, 0.40 g of the obtained yellow solid was purified by sublimation. In the purification by sublimation, the yellow solid was heated at 260° C. under a pressure of 3.5 Pa for 15 hours. After the purification by sublimation, 0.35 g of an objective yellow solid was obtained at a collection rate of 87%.

Figure 24A:
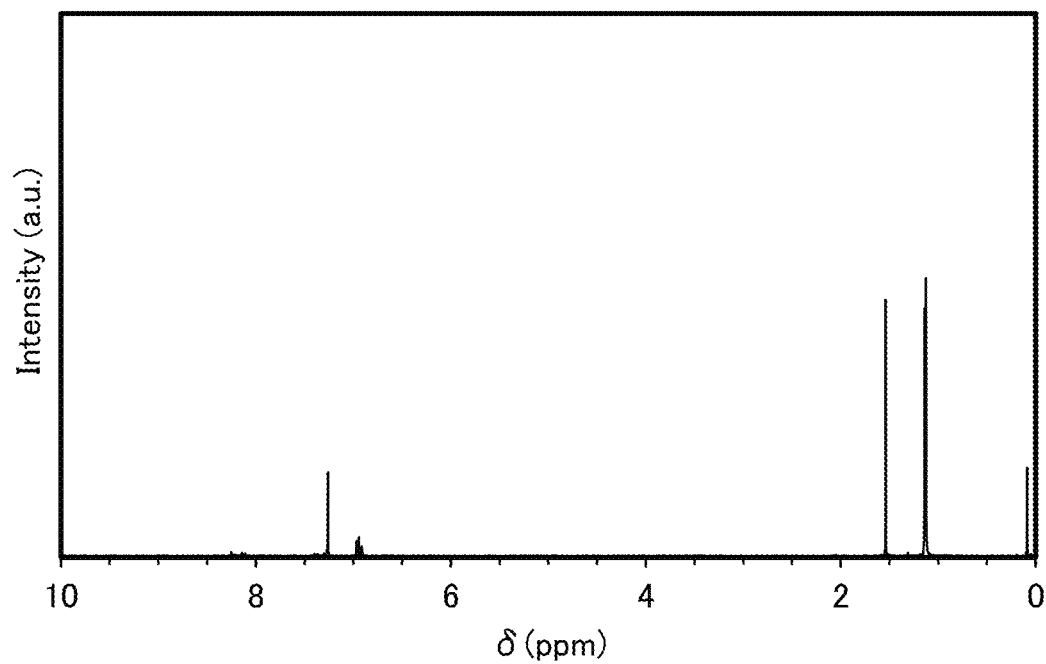
FIGS. 24A and 24B show NMR charts of a compound in Reference example.
Figure 24B:
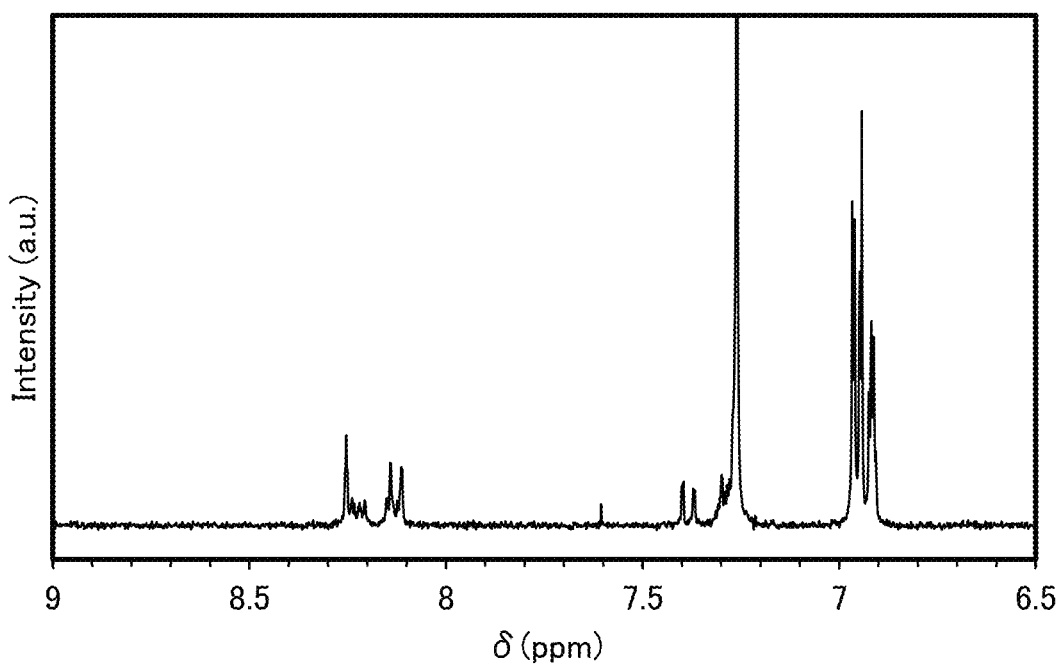
Figure 25:
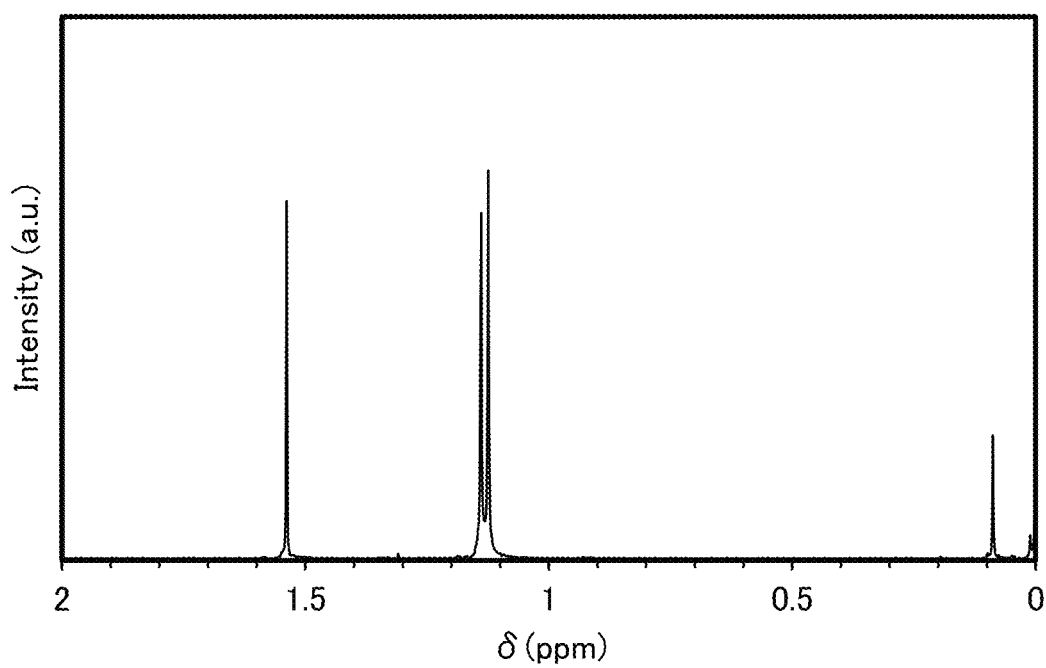
FIG. 25 shows an NMR chart of a compound in Reference example.

Results of $^1$H NMR measurement of the yellow solid obtained in Step 2 will be described below. The $^1$H NMR charts are shown in FIGS. 24A and 24B and FIG. 25. Note that FIG. 24B is an enlarged chart showing the range from 6.5 ppm to 9.0 ppm in FIG. 24A. FIG. 25 is an enlarged chart showing the range from 0.0 ppm to 2.0 ppm in FIG. 24A. The results indicate that 2TMS-mmtBuDPhA2Anth was obtained.

$^1$H NMR (CDCl$_3$, 300 MHz): σ=8.25 (s, 1H), 8.24-8.21 (m, 1H), 8.15-8.11 (m, 2H), 7.40-7.37 (m, 1H), 7.30-7.27 (m, 2H), 6.97-6.94 (m, 8H), 6.92-6.91 (m, 4H), 1.14 (s, 36H), 1.12 (m, 36H), 0.09 (s, 9H)

Reference Example 2

In this reference example, a synthesis method of OcttBuDPQd (Structural Formula (104)), which is a fluorescent material having protecting groups used in Examples 3 and 4, will be described.

Step 1: Synthesis of 1,4-cyclohexadiene-1,4-dicarboxylic acid and 2,5-bis{(3,5-di-tert-butylphenyl) amino}-dimethylester 5.6 g (24 mmol) of 1,4-cyclohexanedione-2,5-dicarboxylic dimethyl and 10 g (48 mmol) of 3,5-di-tert-butyl aniline were put into a 200 mL three-neck flask equipped with a reflux pipe, and this mixture was stirred at 170° C. for 2 hours. Methanol was added to the obtained red orange solid to form a slurry, and the mixture was collected by suction filtration. The resulting solid was washed with hexane and methanol and dried, so that 12 g of an objective red orange solid was obtained with a yield of 82%. Synthesis scheme (E-1) of Step 1 is shown below.

[Chemical Formula 43]

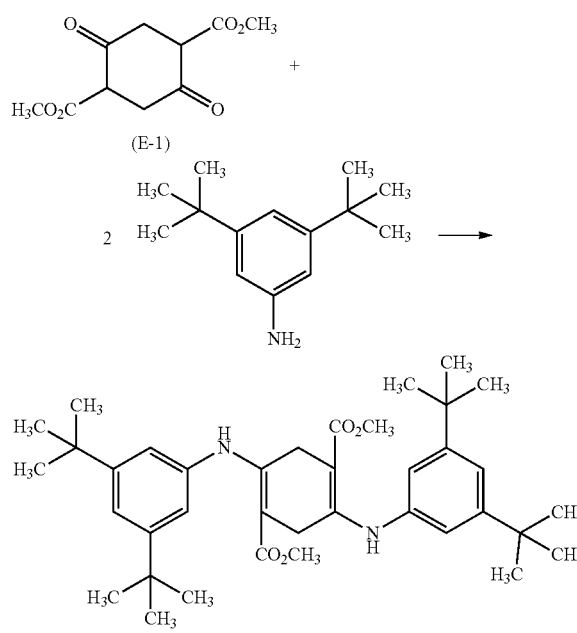

(E-1)

¹H NMR numerical data of the resulting solid are as follows. The data reveal that an objective compound was obtained.

¹H NMR (chloroform-d, 500 MHz): δ=10.6 (s, 2H), 7.20 (t, J=1.5 Hz, 2H), 6.94 (d, J=2.0 Hz, 4H), 3.65 (s, 6H), 3.48 (s, 4H), 1.33 (s, 36H)

Step 2: Synthesis of 1,4-benzenedicarboxylic acid and 2,5-bis{(3,5-di-tert-butylphenyl)amino}-dimethylester 12 g (20 mmol) of 1,4-cyclohexadiene-1,4-dicarboxylic acid obtained in Step 1 and 2,5-bis{(3,5-di-tert-butylphenyl)amino}-dimethylester, and 150 mL of toluene were put into a 300 mL three-neck flask equipped with a reflux pipe. The mixture was refluxed for 15 hours with air bubbles. After the stirring, the precipitated solid was collected by suction filtration and the resulting solid was washed with hexane and methanol, so that 7.3 g of an objective red solid was obtained. The obtained filtrate was concentrated to further give a solid. This solid was washed with hexane and methanol and collected by suction filtration, so that 3.1 g of an objective red solid was obtained. Thus, 10.4 g of the objective compounds were obtained in total with a yield of 85%. Synthesis scheme (E-2) of Step 2 is shown below.

[Chemical Formula 44]

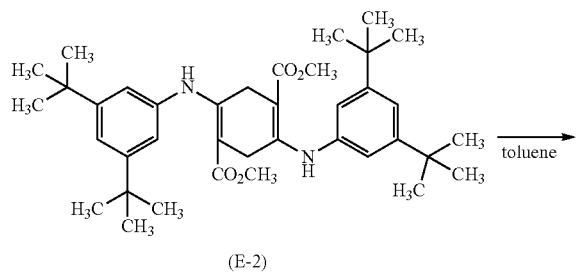

(E-2)

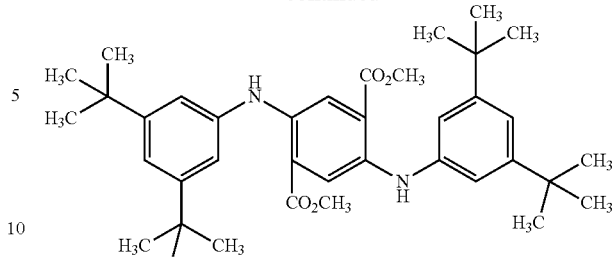

¹H NMR numerical data of the resulting solid are as follows. The data reveal that an objective compound was obtained.

¹H NMR (chloroform-d, 500 MHz): δ=8.84 (s, 2H), 8.18 (s, 2H), 7.08 (d, J=2.0 Hz, 4H), 7.20 (t, J=1.0 Hz, 2H), 3.83 (s, 6H), 1.34 (s, 36H)

Step 3: Synthesis of 1,4-benzenedicarboxylic acid and 2,5-bis[N,N-bis(3,5-di-tert-butylphenyl)amino]-dimethylester 4.0 g (6.7 mmol) of 1,4-benzenedicarboxylic acid and 2,5-bis{(3,5-di-tert-butylphenyl)amino}-dimethylester, which were obtained in Step 2, 3.9 g (14.6 mmol) of 1-bromo-3,5-di-tert-butylbenzene, 0.46 g (7.3 mmol) of copper, 50 mg (0.26 mmol) of copper iodide, 1.0 g (7.3 mmol) of potassium carbonate, and 10 mL of xylene were put into a 200 mL three-neck flask equipped with a reflux pipe, the mixture was degassed at reduced pressure, and the air in the flask was replaced with nitrogen. This mixture was refluxed for 20 hours. To the resulting mixture, 0.46 g (7.3 mmol) of copper and 50 mg of copper iodide (0.26 mmol) were added, and the mixture was further refluxed for 16 hours. Dichloromethane was added to the resulting mixture to form a slurry. The solid was removed by suction filtration, and the obtained filtrate was concentrated. The obtained solid was washed with hexane and ethanol. The washed solid was recrystallized from hexane/toluene to give 4.4 g of a yellow solid, which was an objective compound, with a yield of 72%. Synthesis Scheme (E-3) of Step 3 is shown below.

[Chemical Formula 45]

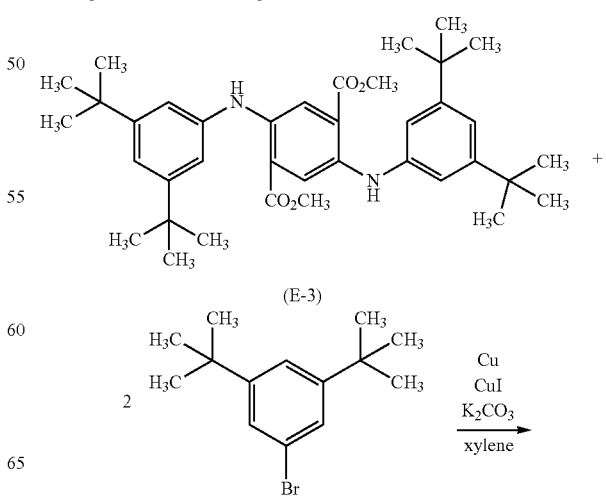

(E-3)

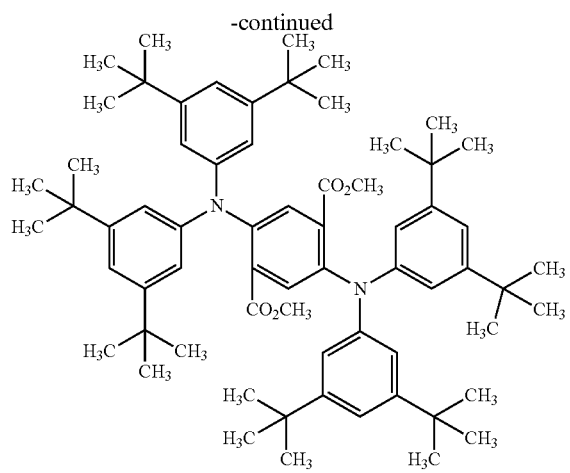

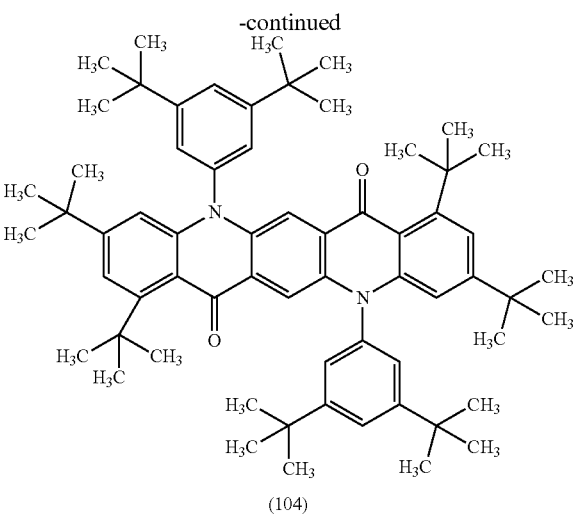

(104)

¹H NMR numerical data of the resulting solid are as follows. The data reveal that an objective compound was obtained.

¹H NMR (chloroform-d, 500 MHz): δ=7.48 (s, 2H), 6.97 (t, J=2.0 Hz, 4H), 7.08 (d, J=1.5 Hz, 8H), 3.25 (s, 6H), 1.23 (s, 72H)

Step 4: Synthesis of 1,3,8,10-tetra-tert-butyl-7,14-bis(3,5-di-tert-butylphenyl)-5,12-dihydroquino[2,3-b]acridine-7,14-dione (abbreviation: Oct-tBuDPQd)

4.4 g (4.8 mmol) of 1,4-benzenedicarboxylic acid and 2,5-bis[N,N-bis(3,5-di-tert-butylphenyl)amino]-dimethyl ester, which were obtained in Step 3, and 20 mL of methanesulfonate were put into a 100 mL three-neck flask equipped with a reflux pipe, and the mixture was stirred at 160° C. for 7 hours. The mixture was cooled to room temperature, slowly poured into 300 mL of ice water, and then left until it reached room temperature. This mixture was filtered by gravity filtration, and the resulting solid was washed with water and a saturated aqueous solution of sodium hydrogencarbonate. This solid was dissolved in toluene, the obtained toluene solution was washed with water and saturated saline, and drying was performed with magnesium sulfate. This mixture was filtered through Celite (produced by Wako Pure Chemical Industries, Ltd., Catalog No.: 537-02305) and aluminum oxide. The obtained filtrate was concentrated to give 3.3 g of a blackish-brown solid. The resulting solid was purified by silica gel column chromatography (developing solvent: hexane:ethyl acetate=20:1) to give 150 mg of a red orange solid, which was an objective compound, with a yield of 5%. The synthesis scheme (E-4) of Step 4 is shown below.

[Chemical Formula 46]

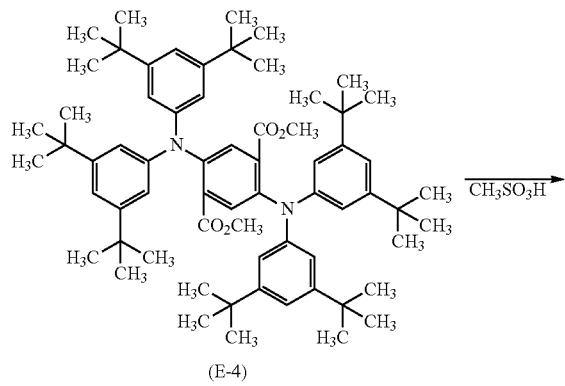

(E-4)

Figure 30A:
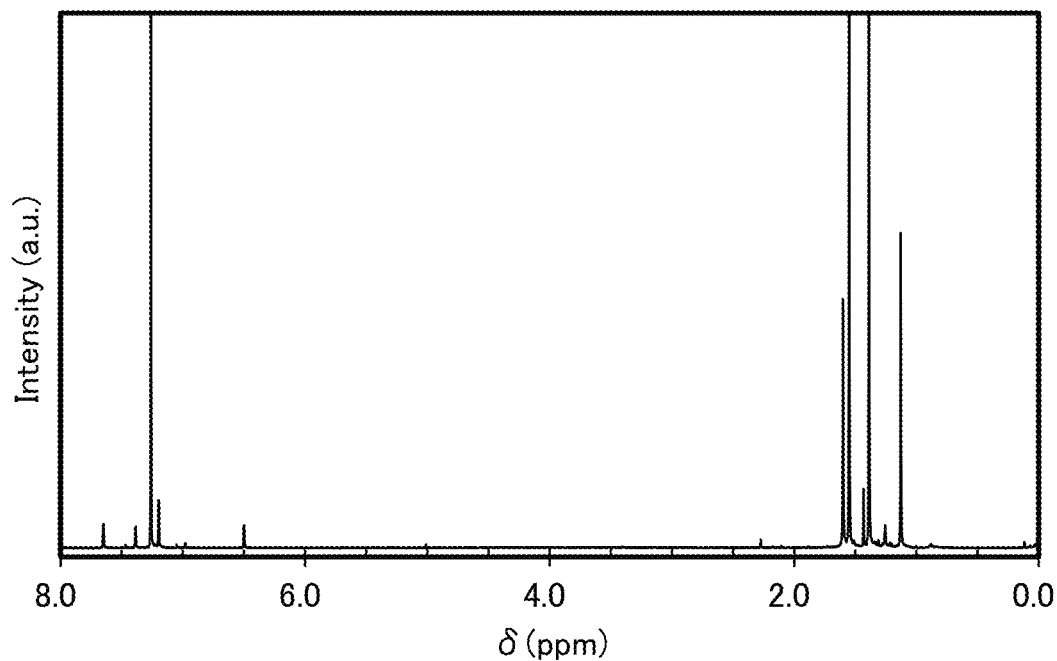
FIGS. 30A and 30B show NMR charts of a compound in Reference example.
Figure 30B:
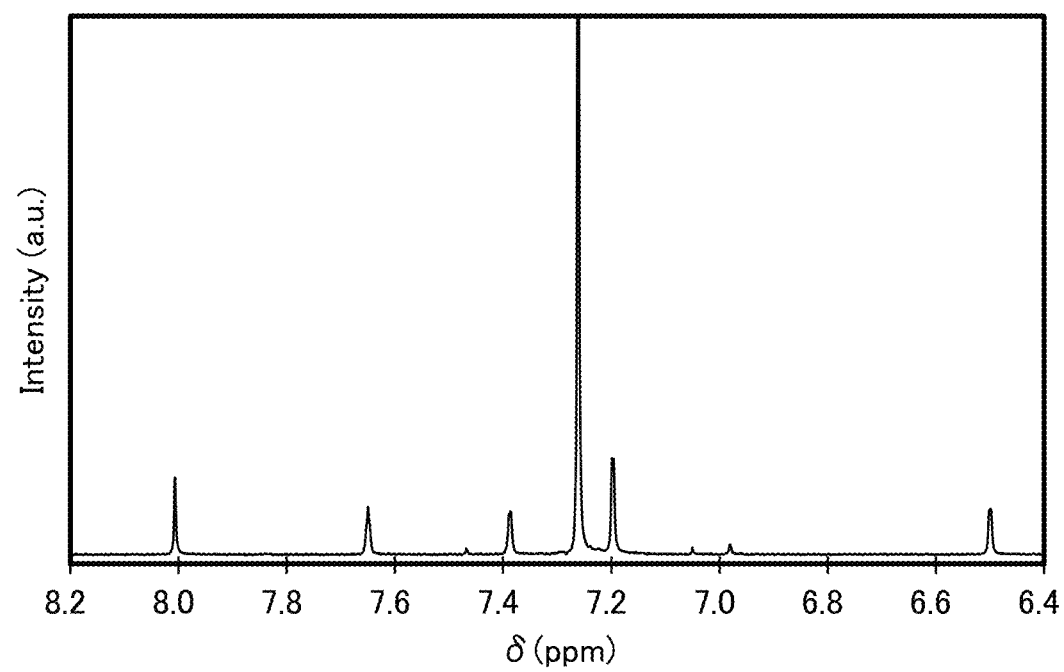
Figure 31:
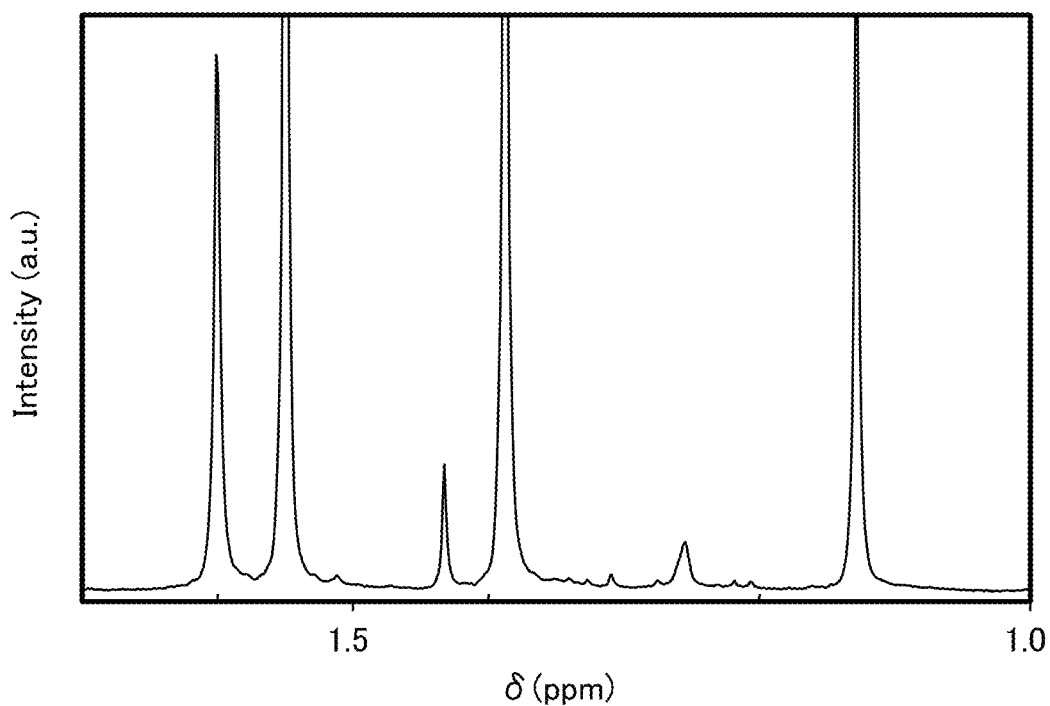
FIG. 31 shows an NMR chart of a compound in Reference example.

Results of ¹H NMR measurement of the yellow solid obtained in Step 4 will be described below. The ¹H NMR charts are shown in FIGS. 30A and 30B and FIG. 31. Note that FIG. 30B is an enlarged chart showing the range from 6.5 ppm to 9.0 ppm in FIG. 30A. FIG. 31 is an enlarged chart showing the range from 0.5 ppm to 2.0 ppm in FIG. 30A. The results indicate that Oct-tBuDPQd was obtained.

¹H NMR (chloroform-d, 500 MHz): δ=8.00 (s, 2H), 7.65 (t, J=2.0 Hz, 2H), 7.39 (d, J=1.0 Hz, 4H), 7.20 (d, J=2.0 Hz, 2H), 6.50 (d, J=1.0 Hz, 2H), 1.60 (s, 18H), 1.39 (s, 36H), 1.13 (s, 18H)

EXPLANATION OF REFERENCE

100: EL layer, 101: electrode, 102: electrode, 106: light-emitting unit, 108: light-emitting unit, 111: hole-injection layer, 112: hole-transport layer, 113: electron-transport layer, 114: electron-injection layer, 115: charge-generation layer, 116: hole-injection layer, 117: hole-transport layer, 118: electron-transport layer, 119: electron-injection layer, 120: light-emitting layer, 130: light-emitting layer, 131: compound, 132: compound, 133: compound, 135: compound, 136: compound, 150: light-emitting device, 170: light-emitting layer, 250: light-emitting device, 301: guest material, 302: guest material, 310: luminophore, 320: protecting group, 330: host material, 601: source driver circuit, 602: pixel portion, 603: gate driver circuit, 604: sealing substrate, 605: sealant, 607: space, 608: wiring, 609: FPC, 610: element substrate, 611: switching TFT, 612: current controlling TFT, 613: electrode, 614: insulator, 616: EL layer, 617: electrode, 618: light-emitting device, 623: n-channel TFT, 624: p-channel TFT, 625: desiccant, 900: portable information terminal, 901: housing, 902: housing, 903: display portion, 905: hinge portion, 910: portable information terminal, 911: housing, 912: display portion, 913: operation button, 914: external connection port, 915: speaker, 916: microphone, 917: camera, 920: camera, 921: housing, 922: display portion, 923: operation button, 924: shutter button, 926: lens, 1001: substrate, 1002: base insulating film, 1003: gate insulating film, 1006: gate electrode, 1007: gate electrode, 1008: gate electrode, 1020: interlayer insulating film, 1021: interlayer insulating film, 1022: electrode, 1024B: electrode, 1024G: electrode, 1024R: electrode, 1024W: electrode, 1025B: lower electrode, 1025G: lower electrode, 1025R: lower electrode, 1025W: lower electrode, 1026: partition, 1028: EL layer, 1029: electrode, 1031: sealing substrate, 1032:

sealant, 1033: base material, 1034B: coloring layer, 1034G: coloring layer, 1034R: coloring layer, 1036: overcoat layer, 1037: interlayer insulating film, 1040: pixel portion, 1041: driver circuit portion, 1042: peripheral portion, 2100: robot, 2101: illuminance sensor, 2102: microphone, 2103: upper camera, 2104: speaker, 2105: display, 2106: lower camera, 2107: obstacle sensor, 2108: moving mechanism, 2110: arithmetic unit, 5000: housing, 5001: display portion, 5002: display portion, 5003: speaker, 5004: LED lamp, 5005: operation key, 5006: connection terminal, 5007: sensor, 5008: microphone, 5012: support, 5013: earphone, 5100: cleaning robot, 5101: display, 5102: camera, 5103: brush, 5104: operation button, 5120: dust, 5140: portable electronic device, 5150: portable information terminal, 5151: housing, 5152: display region, 5153: bend portion, 8501: lighting device, 8502: lighting device, 8503: lighting device, 8504: lighting device This application is based on Japanese Patent Application Serial No. 2018-131254 filed with Japan Patent Office on Jul. 11, 2018, the entire contents of which are hereby incorporated by reference.

The invention claimed is:

1. A light-emitting device comprising:
a pair of electrodes; and
a light-emitting layer between the pair of electrodes,
wherein the light-emitting layer contains a first material capable of converting triplet excitation energy into light emission, a second material capable of converting singlet excitation energy into light emission, and a third material capable of converting triplet excitation energy into light emission,
wherein the first material, the second material, and the third material are mixed in the light-emitting layer,
wherein the second material contains a luminophore and four protecting groups,
wherein the luminophore is a condensed aromatic ring or a condensed heteroaromatic ring,
wherein the four protecting groups are not directly bonded to the condensed aromatic ring or the condensed heteroaromatic ring,
wherein the four protecting groups each independently include any one of an alkyl group having 3 to 10 carbon atoms, a substituted or unsubstituted cycloalkyl group having 3 to 10 carbon atoms, and a trialkylsilyl group having 3 to 12 carbon atoms,
wherein a lowest triplet excitation energy level (T1 level) of the first material is higher than the T1 level of the third material, and
wherein light emission is obtained from both the second material and the third material.

2. The light-emitting device according to claim 1, wherein each of the four protecting groups is bonded to the luminophore via at least a nitrogen atom.

3. The light-emitting device according to claim 1, wherein the alkyl group is a branched-chain alkyl group.

4. The light-emitting device according to claim 3, wherein the branched-chain alkyl group has quaternary carbon.

5. The light-emitting device according to claim 1, wherein the condensed aromatic ring or the condensed heteroaromatic ring contains any one of naphthalene, anthracene, fluorene, chrysene, triphenylene, tetracene, pyrene, perylene, coumarin, quinacridone, and naphthobisbenzofuran.

6. The light-emitting device according to claim 1,
wherein the first material contains a first organic compound and a second organic compound, and
wherein the first organic compound and the second organic compound are capable of forming an exciplex with each other.

7. The light-emitting device according to claim 6, wherein the first organic compound is a compound that emits phosphorescence.

8. The light-emitting device according to claim 1, wherein a peak of an emission spectrum of the first material has a shorter wavelength than a peak of an emission spectrum of the second material.

9. The light-emitting device according to claim 1, wherein the first material is a compound that emits phosphorescence.

10. The light-emitting device according to claim 1, wherein the first material is a compound that emits delayed fluorescence.

11. The light-emitting device according to claim 1, wherein an emission spectrum of the first material overlaps with an absorption band with a longest wavelength of an absorption spectrum of the second material.

12. The light-emitting device according to claim 1, wherein in the light-emitting layer, a concentration of the second material is higher than a concentration of the third material.

13. The light-emitting device according to claim 1, wherein the third material is a compound that emits phosphorescence.

14. The light-emitting device according to claim 1, wherein a peak wavelength of an emission spectrum of the second material has a shorter wavelength than a peak wavelength of an emission spectrum of the third material.

15. A light-emitting apparatus comprising:
the light-emitting device according to claim 1; and
at least one of a color filter and a transistor.

16. An electronic device comprising:
the light-emitting apparatus according to claim 15; and
at least one of a housing and a display portion.

17. A lighting device comprising:
the light-emitting device according to claim 1; and
a housing.

* * * * *